United States Patent
Nakagawa et al.

(10) Patent No.: US 11,888,461 B2
(45) Date of Patent: Jan. 30, 2024

(54) ACOUSTIC WAVE DEVICE, ACOUSTIC WAVE FILTER, AND COMPOSITE FILTER DEVICE

(71) Applicant: Murata Manufacturing Co., Ltd., Nagaokakyo (JP)

(72) Inventors: Ryo Nakagawa, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 247 days.

(21) Appl. No.: 17/183,431

(22) Filed: Feb. 24, 2021

(65) Prior Publication Data

US 2021/0194455 A1 Jun. 24, 2021

Related U.S. Application Data

(63) Continuation of application No. PCT/JP2019/035185, filed on Sep. 6, 2019.

(30) Foreign Application Priority Data

Sep. 7, 2018 (JP) ................................. 2018-168265

(51) Int. Cl.
*H03H 9/02* (2006.01)
*H03H 9/25* (2006.01)

(52) U.S. Cl.
CPC .... *H03H 9/02559* (2013.01); *H03H 9/02574* (2013.01); *H03H 9/02724* (2013.01); *H03H 9/25* (2013.01)

(58) Field of Classification Search
CPC ........... H03H 9/02559; H03H 9/02574; H03H 9/02724

(Continued)

(56) References Cited

U.S. PATENT DOCUMENTS

2010/0182101 A1 7/2010 Suzuki
2012/0262028 A1 10/2012 Yamane
(Continued)

FOREIGN PATENT DOCUMENTS

JP  2010-187373 A  8/2010
JP  2014-068123 A  4/2014
(Continued)

OTHER PUBLICATIONS

Official Communication issued in International Patent Application No. PCT/JP2019/035185, dated Nov. 29, 2019.

(Continued)

*Primary Examiner* — Derek J Rosenau
(74) *Attorney, Agent, or Firm* — KEATING & BENNETT, LLP

(57) ABSTRACT

An acoustic wave device includes a silicon oxide film, a lithium tantalate film, an IDT electrode, and a protection film that are laminated on a support substrate made of silicon. A wavelength normalized film thickness of a lithium tantalate film is denoted by $T_{LT}$, an Euler angle is $\theta_{LT}$, a wavelength normalized film thickness of the silicon oxide film is $T_S$, a wavelength normalized film thickness of the IDT electrode in terms of aluminum thickness is $T_E$, a wavelength normalized film thickness of a protection film is $T_P$, a propagation direction in the support substrate is $\psi_{Si}$, and a wavelength normalized film thickness of the support substrate is $T_{Si}$. Values of $T_{LT}$, $\theta_{LT}$, $T_S$, $T_E$, $T_P$, and $\psi_{Si}$ are set such that $I_h$ corresponding to an intensity of a response of a spurious response represented by Formula (1) is greater than about −2.4 in a spurious response.

20 Claims, 22 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2018/0097508 A1 | 4/2018 | Iwamoto et al. |
| 2018/0323769 A1 | 11/2018 | Yamamoto |
| 2019/0245519 A1 | 8/2019 | Takamine et al. |
| 2020/0177153 A1 | 6/2020 | Nakagawa et al. |

FOREIGN PATENT DOCUMENTS

| | | |
|---|---|---|
| WO | 2010/119796 A1 | 10/2010 |
| WO | 2016/208446 A1 | 12/2016 |
| WO | 2017/073425 A1 | 5/2017 |
| WO | 2018/092511 A1 | 5/2018 |
| WO | 2019/031202 A1 | 2/2019 |

OTHER PUBLICATIONS

The Chemical Society of Japan, Handbook of Chemistry: Pure Chemistry I, Maruzen Publishing Co., 5th edition, 2004, p. 30.
The Chemical Society of Japan, "Handbook of Chemistry: Pure Chemistry I", Maruzen Publishing Co., 5th edition, 2004, pp. 697.

ACOUSTIC WAVE DEVICE, ACOUSTIC WAVE FILTER, AND COMPOSITE FILTER DEVICE

CROSS REFERENCE TO RELATED APPLICATIONS

This application claims the benefit of priority to Japanese Patent Application No. 2018-168265 filed on Sep. 7, 2018 and is a Continuation Application of PCT Application No. PCT/JP2019/035185 filed on Sep. 6, 2019. The entire contents of each application are hereby incorporated herein by reference.

BACKGROUND OF THE INVENTION

1. Field of the Invention

The present invention relates to an acoustic wave device, an acoustic wave filter, and a composite filter device including a lithium tantalate film that is laminated on a support substrate made of silicon.

2. Description of the Related Art

A plurality of acoustic wave filters has been widely used in high frequency front end circuits of mobile phones and smartphones. For example, in a demultiplexer described in Japanese Unexamined Patent Application Publication No. 2014-68123, terminals of two or more band pass filters having different frequencies are connected in common. Each of the band pass filters is defined by a surface acoustic wave filter chip. Each surface acoustic wave filter chip includes a plurality of surface acoustic wave resonators.

An acoustic wave resonator described in Japanese Unexamined Patent Application Publication No. 2010-187373 discloses an acoustic wave device formed by laminating an insulation film made of silicon dioxide and a piezoelectric substrate made of lithium tantalate on a silicon support substrate. Bonding in the (111) plane of silicon enhances the heat resistance.

In an acoustic wave device described in Japanese Unexamined Patent Application Publication No. 2014-68123, a plurality of acoustic wave filters having different frequencies are connected in common on antenna terminal side.

The inventors of preferred embodiments of the present application have discovered that a plurality of spurious responses appear on a higher frequency side relative to the main mode used in an acoustic wave resonator in which a lithium tantalate film is laminated directly on or indirectly above a silicon support substrate. When such an acoustic wave resonator is used for an acoustic wave filter having a lower pass band in an acoustic wave device, a spurious response appearing in the acoustic wave filter may appear in a pass band of another acoustic wave filter having a higher pass band in the acoustic wave device. Thus, the filter characteristic of another acoustic wave filter may deteriorate.

SUMMARY OF THE INVENTION

Preferred embodiments of the present invention provide acoustic wave devices, acoustic wave filters, and composite filter devices that are each less likely to generate a ripple in another acoustic wave filter.

An acoustic wave device according to a preferred embodiment of the present invention includes a silicon support substrate, a silicon oxide film laminated above the silicon support substrate, a lithium tantalate film laminated above the silicon oxide film, an IDT electrode including an electrode finger and being provided above the lithium tantalate film, and a protection film covering at least a portion of the IDT electrode. When a wavelength determined by an electrode finger pitch of the IDT electrode is denoted by $\lambda$, a wavelength normalized film thickness of the lithium tantalate film is denoted by $T_{LT}$, $\theta$ of an Euler angle of the lithium tantalate film is denoted by $\theta_{LT}$, a wavelength normalized film thickness of the silicon oxide film is denoted by $T_S$, a wavelength normalized film thickness of the IDT electrode in terms of aluminum thickness being a product of a wavelength normalized film thickness of the IDT electrode and a value obtained when density of the IDT electrode is divided by density of aluminum is denoted by $T_E$, a wavelength normalized film thickness of the protection film being a product of a value obtained when density of the protection film is divided by density of silicon oxide and a wavelength normalized film thickness which is a thickness of the protection film normalized by the wavelength $\lambda$, is denoted by $T_P$, a propagation direction in the silicon support substrate is denoted by $\psi_{Si}$, and a wavelength normalized film thickness which is a thickness of the silicon support substrate normalized by the wavelength $\lambda$ is denoted by $T_{Si}$, $T_{LT}$, $\theta_{LT}$, $T_S$, $T_E$, $T_P$, and $\psi_{Si}$ are set such that a value represented by Formula (1) below is larger than about −2.4:

$$I_h = \left(a_{T_{LT}}^{(2)}\left((T_{LT} - c_{T_{LT}})^2 - b_{T_{LT}}^{(2)}\right) + \right.$$

$$a_{T_{LT}}^{(1)}(T_{LT} - c_{T_{LT}}) + a_{T_S}^{(2)}\left((T_S - c_{T_S})^2 - b_{T_S}^{(2)}\right) + a_{T_S}^{(1)}(T_S - c_{T_S}) +$$

$$a_{T_B}^{(4)}\left((T_E - c_{T_E})^4 - b_{T_E}^{(4)}\right) + a_{T_E}^{(3)}\left((T_E - c_{T_E})^3 - b_{T_E}^{(3)}\right) +$$

$$a_{T_E}^{(2)}\left((T_E - c_{T_E})^2 - b_{T_E}^{(2)}\right) + a_{T_E}^{(1)}(T_E - c_{T_E}) +$$

$$a_{\psi_{Si}}^{(6)}\left((\psi_{Si} - c_{\psi_{Si}})^6 - b_{\psi_{Si}}^{(6)}\right) + a_{\psi_{Si}}^{(5)}\left((\psi_{Si} - c_{\psi_{Si}})^5 - b_{\psi_{Si}}^{(5)}\right) +$$

$$a_{\psi_{Si}}^{(4)}\left((\psi_{Si} - c_{\psi_{Si}})^4 - b_{\psi_{Si}}^{(4)}\right) + a_{\psi_{Si}}^{(3)}\left((\psi_{Si} - c_{\psi_{Si}})^3 - b_{\psi_{Si}}^{(3)}\right) +$$

$$a_{\psi_{Si}}^{(2)}\left((\psi_{Si} - c_{\psi_{Si}})^2 - b_{\psi_{Si}}^{(2)}\right) + a_{\psi_{Si}}^{(1)}(\psi_{Si} - c_{\psi_{Si}}) +$$

$$a_{\theta_{LT}}^{(2)}\left((\theta_{LT} - c_{\theta_{LT}})^2 - b_{\theta_{LT}}^{(2)}\right) + a_{\theta_{LT}}^{(1)}(\theta_{LT} - c_{\theta_{LT}}) +$$

$$d_{T_{LT}T_S}(T_{LT} - c_{T_{LT}})(T_S - c_{T_S}) + d_{T_{LT}T_E}(T_{LT} - c_{T_{LT}})$$

$$(T_E - c_{T_E}) + d_{T_{LT}\psi_{Si}}(T_{LT} - c_{T_{LT}})(\psi_{Si} - c_{\psi_{Si}}) +$$

$$d_{T_{LT}\theta_{LT}}(T_{LT} - c_{T_{LT}})(\theta_{LT} - c_{\theta_{LT}}) + d_{T_S T_E}(T_S - c_{T_S})(T_E - c_{T_E}) +$$

$$d_{T_S\psi_{Si}}(T_S - c_{T_S})(\psi_{Si} - c_{\psi_{Si}}) + d_{T_S\theta_{LT}}(T_S - c_{T_S})(\theta_{LT} - c_{\theta_{LT}}) +$$

$$d_{T_E\psi_{Si}}(T_E - c_{T_E})(\psi_{Si} - c_{\psi_{Si}}) + d_{T_E\theta_{LT}}(T_E - c_{T_E})(\theta_{LT} - c_{\theta_{LT}}) +$$

$$d_{\psi_{Si}\theta_{LT}}(\psi_{Si} - c_{\psi_{Si}})(\theta_{LT} - c_{\theta_{LT}}) + e\right)$$

$$\left(a_{T_P}T_P^4 + b_{T_P}T_P^3 + c_{T_P}T_P^2 + d_{T_P}T_P + f_{T_P}\right).$$

Formula (1)

Coefficients a, b, c, d, e, and f in Formula (1) are values described in Table 1 to Table 12 below that are determined in accordance with the crystal orientation of the silicon support substrate and the range of $T_S$, $T_{LT}$, and $\psi_{Si}$:

TABLE 1

| | Si(100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | 0 | 0 |
| $b_{TLT}^{(2)}$ | 0 | 0 |
| $c_{TLT}$ | 0 | 0 |
| $a_{TS}^{(2)}$ | 0 | 0 |
| $a_{TS}^{(1)}$ | −5.857231176 | −5.857231176 |
| $b_{TS}^{(2)}$ | 0 | 0 |
| $c_{TS}$ | 0.148 | 0.148 |
| $a_{TE}^{(4)}$ | 0 | 0 |
| $a_{TE}^{(3)}$ | 0 | 0 |
| $a_{TE}^{(2)}$ | −19.75255913 | −19.75255913 |
| $a_{TE}^{(1)}$ | −2.877583447 | −2.877583447 |
| $b_{TE}^{(4)}$ | 0 | 0 |
| $b_{TE}^{(3)}$ | 0 | 0 |
| $b_{TE}^{(2)}$ | 0.022736 | 0.022736 |
| $c_{TE}$ | 0.242 | 0.242 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.004788767 | 0.004788767 |
| $a_{\psi Si}^{(1)}$ | 0.024306207 | 0.024306207 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 81.81 | 81.81 |
| $c_{\psi Si}$ | 8.7 | 8.7 |
| $a_{\theta LT}^{(2)}$ | −0.008235936 | −0.008235936 |
| $a_{\theta LT}^{(1)}$ | −0.021048278 | −0.021048278 |
| $b_{\theta LT}^{(2)}$ | 65.16 | 65.16 |
| $c_{\theta LT}$ | −52.2 | −52.2 |
| $d_{TLTTS}$ | 0 | 0 |
| $d_{TLTTE}$ | 0 | 0 |
| $d_{TLT\psi Si}$ | 0 | 0 |
| $T_{TLT\theta LT}$ | 0 | 0 |
| $d_{TSTE}$ | 0 | 0 |
| $d_{TS\psi Si}$ | 0 | 0 |
| $d_{TS\theta LT}$ | −0.786852571 | −0.786852571 |
| $d_{TE\psi Si}$ | 0 | 0 |
| $d_{TE\theta LT}$ | −0.237034335 | −0.237034335 |
| $d_{\psi Si\theta LT}$ | 0 | 0 |
| $e$ | −1.499248378 | −1.499248378 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495 |

TABLE 2

| | Si(100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{TLT}^{(2)}$ | 0 | 125.5342427 |
| $a_{TLT}^{(1)}$ | −13.43961051 | −7.643409732 |
| $b_{TLT}^{(2)}$ | 0 | 0.006076558 |
| $c_{TLT}$ | 0.329807692 | 0.321186441 |
| $a_{TS}^{(2)}$ | 0 | 0 |
| $a_{TS}^{(1)}$ | −11.80744788 | −10.05306878 |
| $b_{TS}^{(2)}$ | 0 | 0 |
| $c_{TS}$ | 0.158653846 | 0.153389831 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | −7.595099843 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0.366101695 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.003335792 | 0 |
| $a_{\psi Si}^{(1)}$ | 0.039268266 | −0.013700762 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 191.7159763 | 0 |
| $c_{\psi Si}$ | 13.26923077 | 16.01694915 |
| $a_{\theta LT}^{(2)}$ | −0.007476194 | 0 |
| $a_{\theta LT}^{(1)}$ | −0.010867175 | −0.053997369 |
| $b_{\theta LT}^{(2)}$ | 69.19378698 | 0 |
| $c_{\theta LT}$ | −50.19230769 | −50.59322034 |
| $d_{TLTTS}$ | 0 | 0 |
| $d_{TLTTE}$ | 0 | 0 |
| $d_{TLT\psi Si}$ | −0.629167148 | −0.724576033 |
| $T_{TLT\theta LT}$ | 0 | 0 |
| $d_{TSTE}$ | 0 | 0 |
| $d_{TS\psi Si}$ | 0 | 0.521919406 |
| $d_{TS\theta LT}$ | 0 | 0 |
| $d_{TE\psi Si}$ | 0 | −0.523966449 |
| $d_{TE\theta LT}$ | 0 | 0 |
| $d_{\psi Si\theta LT}$ | 0 | 0 |
| $e$ | −2.071831837 | −3.228508418 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495; |

TABLE 3

| | Si(100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −15.6141248 | −15.6141248 |
| $b_{TLT}^{(2)}$ | 0 | 0 |
| $c_{TLT}$ | 0.163309353 | 0.163309353 |
| $a_{TS}^{(2)}$ | 0 | 0 |
| $a_{TS}^{(1)}$ | −22.02440893 | −22.02440893 |
| $b_{TS}^{(2)}$ | 0 | 0 |
| $c_{TS}$ | 0.325179856 | 0.325179856 |
| $a_{TE}^{(4)}$ | 0 | 0 |
| $a_{TE}^{(3)}$ | −248.4374004 | −248.4374004 |
| $a_{TE}^{(2)}$ | −36.57127964 | −36.57127964 |
| $a_{TE}^{(1)}$ | 13.88180854 | 13.88180854 |
| $b_{TE}^{(4)}$ | 0 | 0 |
| $b_{TE}^{(3)}$ | 0.000480119 | 0.000480119 |
| $b_{TE}^{(2)}$ | 0.020416128 | 0.020416128 |
| $c_{TE}$ | 0.240647482 | 0.240647482 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002456326 | 0.002456326 |
| $a_{\psi Si}^{(1)}$ | 0.048553126 | 0.048553126 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 279.6050929 | 279.6050929 |
| $c_{\psi Si}$ | 22.3381295 | 22.3381295 |

TABLE 3-continued

| | Si(100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{\theta LT}^{(2)}$ | 0 | 0 |
| $a_{\theta LT}^{(1)}$ | 0.005427275 | 0.005427275 |
| $b_{\theta LT}^{(2)}$ | 0 | 0 |
| $c_{\theta LT}$ | −50.35971223 | −50.35971223 |
| $d_{TLTTS}$ | 0 | 0 |
| $d_{TLTTE}$ | 0 | 0 |
| $d_{TLT\psi Si}$ | 0 | 0 |
| $T_{TLT\theta LT}$ | 0 | 0 |
| $d_{TSTE}$ | 41.63149071 | 41.63149071 |
| $d_{TS\psi Si}$ | −0.577179204 | −0.577179204 |
| $d_{TS\theta LT}$ | 0.603866778 | 0.603866778 |
| $d_{TE\psi Si}$ | 0.134944598 | 0.134944598 |
| $d_{TE\theta LT}$ | 0 | 0 |
| $d_{\psi Si\theta LT}$ | 0 | 0 |
| e | −2.703317679 | −2.703317679 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495; |

TABLE 4

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 133.7896555 |
| $a_{TLT}^{(1)}$ | −7.761727985 | −9.701155851 |
| $b_{TLT}^{(2)}$ | 0 | 0.006281971 |
| $c_{TLT}$ | 0.315508021 | 0.306914894 |
| $a_{TS}^{(2)}$ | 0 | 0 |
| $a_{TS}^{(1)}$ | −20.35135077 | −6.186650236 |
| $b_{TS}^{(2)}$ | 0 | 0 |
| $c_{TS}$ | 0.297860963 | 0.298404255 |
| $a_{TE}^{(4)}$ | 0 | 0 |

TABLE 4-continued

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{TE}^{(3)}$ | 0 | 0 |
| $a_{TE}^{(2)}$ | 110.8304316 | 0 |
| $a_{TE}^{(1)}$ | 4.036561723 | −8.229960495 |
| $b_{TE}^{(4)}$ | 0 | 0 |
| $b_{TE}^{(3)}$ | 0 | 0 |
| $b_{TE}^{(2)}$ | 0.006431411 | 0 |
| $c_{TE}$ | 0.140374332 | 0.363297872 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002534654 | 0.001652947 |
| $a_{\psi Si}^{(1)}$ | 0.024168138 | −0.003241344 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 269.2484772 | 266.6845858 |
| $c_{\psi Si}$ | 21.4171123 | 20.26595745 |
| $a_{\theta LT}^{(2)}$ | 0 | 0 |
| $a_{\theta LT}^{(1)}$ | 0 | −0.066116428 |
| $b_{\theta LT}^{(2)}$ | 0 | 0 |
| $c_{\theta LT}$ | −90 | −50.4787234 |
| $d_{TLTTS}$ | 96.23533718 | 0 |
| $d_{TLTTE}$ | −66.46866878 | 0 |
| $d_{TLT\psi Si}$ | −0.404808481 | −0.688053172 |
| $T_{TLT\theta LT}$ | 0 | 0 |
| $d_{TSTE}$ | 0 | 0 |
| $d_{TS\psi Si}$ | −0.733337318 | 0 |
| $d_{TS\theta LT}$ | 0 | 0 |
| $d_{TE\psi Si}$ | 0.584322518 | −0.372994212 |
| $d_{TE\theta LT}$ | 0 | 0 |
| $d_{\psi Si\theta LT}$ | 0 | 0 |
| e | −3.679364607 | −4.30794513 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495 |

TABLE 5

| | Si (110) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −16.69742899 | −16.69742899 | −33.56520202 | 0 |
| $b_{TLT}^{(2)}$ | 0 | 0 | 0 | 0 |
| $c_{TLT}$ | 0.1675 | 0.1675 | 0.192857143 | 0 |
| $a_{TS}^{(2)}$ | 0 | 0 | 0 | 0 |
| $a_{TS}^{(1)}$ | 15.90196012 | 15.90196012 | 0 | 0 |
| $b_{TS}^{(2)}$ | 0 | 0 | 0 | 0 |
| $c_{TS}$ | 0.1525 | 0.1525 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 26.3030303 | 0 |
| $a_{TE}^{(1)}$ | 0 | 0 | −6.181053391 | 0 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006326531 | 0 |
| $c_{TE}$ | 0 | 0 | 0.378571429 | 0 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | −0.000183963 | −0.000183963 | 0 | −0.000177142 |
| $a_{\psi Si}^{(2)}$ | −0.003236307 | −0.003236307 | 0 | 0.002186084 |

TABLE 5-continued

| | Si (110) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{\psi Si}{}^{(1)}$ | 0.071460688 | 0.071460688 | 0.085067773 | 0.13561432 |
| $b_{\psi Si}{}^{(6)}$ | 0 | 0 | 0 | 0 |
| $b_{\psi Si}{}^{(5)}$ | 0 | 0 | 0 | 0 |
| $b_{\psi Si}{}^{(4)}$ | 0 | 0 | 0 | 0 |
| $b_{\psi Si}{}^{(3)}$ | −5768.71875 | −5768.71875 | 0 | 2642.857143 |
| $b_{\psi Si}{}^{(2)}$ | 399.9375 | 399.9375 | 0 | 500 |
| $c_{\psi Si}$ | 65.25 | 65.25 | 34.28571429 | 55 |
| $a_{\theta LT}{}^{(2)}$ | 0 | 0 | 0 | −0.00533662 |
| $a_{\theta LT}{}^{(1)}$ | 0 | 0 | 0.070255628 | 0.032718563 |
| $b_{\theta LT}{}^{(2)}$ | 0 | 0 | 0 | 65.75963719 |
| $c_{\theta LT}$ | −90 | −90 | −51.42857143 | −50.95238095 |
| $d_{TLTTS}$ | 0 | 0 | 0 | 0 |
| $d_{TLTTE}$ | 0 | 0 | 0 | 0 |
| $d_{TLT\psi Si}$ | 1.873870705 | 1.873870705 | 0 | 0 |
| $T_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0.716151515 | 0 |
| $d_{\psi Si\theta LT}$ | 0 | 0 | −0.00729303 | 0.002110378 |
| e | −0.957101918 | −0.957101918 | −1.63492254 | −1.290881853 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 6

| | Si (110) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}{}^{(2)}$ | 0 | 0 | 0 | 0 |
| $a_{TLT}{}^{(1)}$ | −23.96596978 | −4.695531045 | −7.344438725 | −5.603099398 |
| $b_{TLT}{}^{(2)}$ | 0 | 0 | 0 | 0 |
| $c_{TLT}$ | 0.34 | 0.3296875 | 0.338983051 | 0.306666667 |
| $a_{TS}{}^{(2)}$ | 0 | 0 | 0 | 0 |
| $a_{TS}{}^{(1)}$ | −23.18485905 | 0 | 0 | 0 |
| $b_{TS}{}^{(2)}$ | 0 | 0 | 0 | 0 |
| $c_{TS}$ | 0.175555556 | 0 | 0 | 0 |
| $a_{TE}{}^{(4)}$ | 0 | 0 | 0 | 0 |
| $a_{TE}{}^{(3)}$ | 0 | 0 | 0 | 0 |
| $a_{TE}{}^{(2)}$ | 0 | −43.48595551 | −70.50554427 | −41.95412638 |
| $a_{TE}{}^{(1)}$ | 0 | −2.467954545 | −5.460437635 | −2.19025056 |
| $b_{TE}{}^{(4)}$ | 0 | 0 | 0 | 0 |
| $b_{TE}{}^{(3)}$ | 0 | 0 | 0 | 0 |
| $b_{TE}{}^{(2)}$ | 0 | 0.006875 | 0.006716461 | 0.006819556 |
| $c_{TE}$ | 0 | 0.15 | 0.365254237 | 0.360666667 |
| $a_{\psi Si}{}^{(6)}$ | 0 | 0 | 0 | 0 |
| $a_{\psi Si}{}^{(5)}$ | 0 | 0 | 0 | 0 |
| $a_{\psi Si}{}^{(4)}$ | 0 | 0 | 0 | 0 |
| $a_{\psi Si}{}^{(3)}$ | 0 | 0 | 0.000119479 | −0.000172812 |
| $a_{\psi Si}{}^{(2)}$ | 0.018474062 | 0 | 0.003987724 | 0.002213009 |
| $a_{\psi Si}{}^{(1)}$ | 0.059131688 | 0 | −0.047908658 | 0.073831446 |
| $b_{\psi Si}{}^{(6)}$ | 0 | 0 | 0 | 0 |
| $b_{\psi Si}{}^{(5)}$ | 0 | 0 | 0 | 0 |
| $b_{\psi Si}{}^{(4)}$ | 0 | 0 | 0 | 0 |
| $b_{\psi Si}{}^{(3)}$ | 0 | 0 | −2384.203107 | 1647.952 |
| $b_{\psi Si}{}^{(2)}$ | 81.55555556 | 0 | 216.791152 | 242.24 |
| $c_{\psi Si}$ | 35.33333333 | 0 | 30.76271186 | 62.6 |
| $a_{\theta LT}{}^{(2)}$ | 0 | 0 | 0 | 0 |
| $a_{\theta LT}{}^{(1)}$ | 0.009475371 | 0 | 0.026725166 | 0 |
| $b_{\theta LT}{}^{(2)}$ | 0 | 0 | 0 | 0 |

TABLE 6-continued

| | Si (110) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $c_{\theta LT}$ | −49.3333333 | −90 | −49.83050847 | −90 |
| $d_{TLTTS}$ | 0 | 0 | 0 | 0 |
| $d_{TLTTE}$ | 0 | 0 | 0 | 42.3018696 |
| $d_{TLT\psi Si}$ | 0 | 0 | 0 | 0 |
| $T_{TLT\theta LT}$ | 0.617240199 | 0 | 0 | 0 |
| $d_{TSTE}$ | 0 | 0 | 0 | 0 |
| $d_{TS\psi Si}$ | 2.612107038 | 0 | 0 | 0 |
| $d_{TS\theta LT}$ | 2.129359248 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.871101002 | 0 | 0 | 0 |
| e | −2.851861362 | −2.210765625 | −2.573237283 | −2.440604203 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 7

| | Si (110) $0 < T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −10.87353735 | −17.74612134 | −16.74814911 | −16.74814911 |
| $b_{TLT}^{(2)}$ | 0 | 0 | 0 | 0 |
| $c_{TLT}$ | 0.167045455 | 0.158227848 | 0.168032787 | 0.168032787 |
| $a_{TS}^{(2)}$ | 92.14417413 | 275.6432031 | 0 | 0 |
| $a_{TS}^{(1)}$ | −6.141913324 | −0.713377524 | −9.071522271 | −9.071522271 |
| $b_{TS}^{(2)}$ | 0.004213585 | 0.004749239 | 0 | 0 |
| $c_{TS}$ | 0.339772727 | 0.317721519 | 0.314754098 | 0.314754098 |
| $a_{TE}^{(4)}$ | 0 | 0 | 0 | 0 |
| $a_{TE}^{(3)}$ | 0 | 0 | 0 | 0 |
| $a_{TE}^{(2)}$ | −37.82699975 | 0 | 0 | 0 |
| $a_{TE}^{(1)}$ | 4.315324766 | 3.259148162 | −5.270739047 | −5.270739047 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.007147469 | | 0 | 0 |
| $c_{TE}$ | 0.153409091 | 0.138607595 | 0.356557377 | 0.356557377 |
| $a_{\psi Si}^{(6)}$ | 0 | 0 | −3.73552E−09 | −3.73552E−09 |
| $a_{\psi Si}^{(5)}$ | 0 | 0 | −4.69013E−08 | −4.69013E−08 |
| $a_{\psi Si}^{(4)}$ | 0 | 0 | 1.07773E−05 | 1.07773E−05 |
| $a_{\psi Si}^{(3)}$ | 0.000254041 | −0.00026684 | 5.64997E−05 | 5.64997E−05 |
| $a_{\psi Si}^{(2)}$ | 0.00704637 | 0.003350583 | −0.007526984 | −0.007526984 |
| $a_{\psi Si}^{(1)}$ | −0.123432463 | 0.05687546 | −0.035719404 | −0.035719404 |
| $b_{\psi Si}^{(6)}$ | 0 | 0 | 1801696668 | 1801696668 |
| $b_{\psi Si}^{(5)}$ | 0 | 0 | 6726299.443 | 6726299.443 |
| $b_{\psi Si}^{(4)}$ | 0 | 0 | 1035415.498 | 1035415.498 |
| $b_{\psi Si}^{(3)}$ | −1197.310014 | 2539.305207 | 3573.665857 | 3573.665857 |
| $b_{\psi Si}^{(2)}$ | 188.2457386 | 286.0358917 | 720.1088417 | 720.1088417 |
| $c_{\psi Si}$ | 28.125 | 63.60759494 | 48.19672131 | 48.19672131 |
| $a_{\theta LT}^{(2)}$ | 0 | 0 | 0 | 0 |
| $a_{\theta LT}^{(1)}$ | 0.046748629 | 0.00460971 | 0 | 0 |
| $b_{\theta LT}^{(2)}$ | 0 | 0 | 0 | 0 |
| $c_{\theta LT}$ | −51.59090909 | −50.75949367 | −90 | −90 |
| $d_{TLTTS}$ | 0 | 0 | 0 | 0 |
| $d_{TLTTE}$ | 0 | 105.3055279 | 0 | 0 |
| $d_{TLT\psi Si}$ | 0 | 0 | 0 | 0 |
| $T_{TLT\theta LT}$ | 0 | 0 | 0 | 0 |
| $d_{TSTE}$ | 58.63016883 | 0 | 0 | 0 |
| $d_{TS\psi Si}$ | 0.443510572 | 0.274149566 | 0 | 0 |
| $d_{TS\theta LT}$ | 0 | 0 | 0 | 0 |
| $d_{TE\psi Si}$ | 0.293912516 | −0.280924747 | 0 | 0 |
| $d_{TE\theta LT}$ | 0 | 0.457718571 | 0 | 0 |

TABLE 7-continued

| | Si (110) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $d_{\psi Si\theta LT}$ | 0 | −0.005165328 | 0 | 0 |
| e | −1.722804167 | −2.484892701 | −2.976959016 | −2.976959016 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 8

| | Si (110) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 39.48011293 |
| $a_{TLT}^{(1)}$ | −5.239160454 | −5.820942031 | −4.867344296 | −2.496300587 |
| $b_{TLT}^{(2)}$ | 0 | 0 | 0 | 0.00654321 |
| $c_{TLT}$ | 0.309375 | 0.302702703 | 0.286363636 | 0.288888889 |
| $a_{TS}^{(2)}$ | 24.40391167 | 40.38499201 | 0 | 40.45660337 |
| $a_{TS}^{(1)}$ | −2.128595361 | −6.73354721 | −3.626479228 | −6.290401812 |
| $b_{TS}^{(2)}$ | 0.006013184 | 0.005624543 | 0 | 0.005617284 |
| $c_{TS}$ | 0.3265625 | 0.275675676 | 0.31 | 0.272222222 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −51.46488975 | 0 | 0 |
| $a_{TE}^{(1)}$ | −1.921891837 | −0.509929613 | −1.508039016 | −0.870147512 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006479182 | 0 | 0 |
| $c_{TE}$ | 0.153125 | 0.147297297 | 0.341818182 | 0.351388889 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | −0.000165117 | 0 | −9.55404E−05 |
| $a_{\psi Si}^{(2)}$ | 0.000936051 | 0.00475603 | 0 | 0.002198207 |
| $a_{\psi Si}^{(1)}$ | −0.02141106 | 0.040196571 | −0.017752634 | 0.036260775 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 2115.829763 | 0 | 1531.394676 |
| $b_{\psi Si}^{(2)}$ | 246.9177246 | 196.5668371 | 0 | 199.8263889 |
| $c_{\psi Si}$ | 24.140625 | 57.97297297 | 21.13636364 | 60.41666667 |
| $a_{\theta LT}^{(2)}$ | 0 | 0 | 0 | −0.003220943 |
| $a_{\theta LT}^{(1)}$ | 0.023743346 | 0.023741003 | 0.038368027 | 0.005042496 |
| $b_{\theta LT}^{(2)}$ | 0 | 0 | 0 | 72.22222222 |
| $c_{\theta LT}$ | −50.078125 | −48.51351351 | −50.81818182 | −50 |
| $d_{TLTTS}$ | 0 | 0 | 0 | −43.45862557 |
| $d_{TLTTE}$ | −35.16960363 | −48.00382984 | 23.6423037 | 52.46703277 |
| $d_{TLT\psi Si}$ | 0 | 0 | 0 | 0 |
| $T_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0.234382842 | 0 | 0 | −0.273892853 |
| $d_{\psi Si\theta LT}$ | 0 | −0.00130658 | −0.001221935 | 0 |
| e | −2.175330984 | −2.239116787 | −2.271294054 | −2.496300587 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 9

Si (111)
$0 < T_{LT} < 0.2$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 16.07631847 | 20.22733656 | 30.72650306 | 27.83979251 |
| $b_{TLT}^{(2)}$ | 0 | 0 | 0 | 0 |
| $c_{TLT}$ | 0.145833333 | 0.1625 | 0.159574468 | 0.158695652 |
| $a_{TS}^{(2)}$ | 0 | 0 | 0 | 0 |
| $a_{TS}^{(1)}$ | 17.08812597 | 27.84866827 | 31.28009383 | 12.67453621 |
| $b_{TS}^{(2)}$ | 0 | 0 | 0 | 0 |
| $c_{TS}$ | 0.154166667 | 0.172916667 | 0.161702128 | 0.163043478 |
| $a_{TE}^{(4)}$ | 0 | 0 | 0 | 0 |
| $a_{TE}^{(3)}$ | 0 | 0 | 0 | 0 |
| $a_{TE}^{(2)}$ | −96.15629371 | 0 | 138.3065683 | 0 |
| $a_{TE}^{(1)}$ | −1.263589744 | 2.883915191 | −9.345807167 | −7.807789594 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006649306 | 0 | 0.006229063 | 0 |
| $c_{TE}$ | 0.170833333 | 0.14375 | 0.369148936 | 0.345652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | −0.006862727 |
| $a_{\psi Si}^{(1)}$ | −0.101535567 | −0.012511908 | −0.101466433 | 0.176438509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 114.9456522 |
| $c_{\psi Si}$ | 24.375 | 44.375 | 22.0212766 | 37.5 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | −477.9162005 | −760.9473336 | −1054.386561 | −1044.340968 |
| $d_{TLTTE}$ | 0 | 0 | 0 | 0 |
| $d_{TLT\psi Si}$ | 0 | 1.332405924 | 0 | 0 |
| $T_{TLT\theta LT}$ | 0 | 0 | 0 | 0 |
| $d_{TSTE}$ | 0 | −250.1524613 | 102.33575 | 105.8611165 |
| $d_{TS\psi Si}$ | 0 | 0 | 0 | −2.093429604 |
| $d_{TS\theta LT}$ | 0 | 0 | 0 | 0 |
| $d_{TE\psi Si}$ | −0.613440559 | 0 | 1.201832187 | −0.525734733 |
| $d_{TE\theta LT}$ | 0 | 0 | 0 | 0 |
| $d_{\psi Si\theta LT}$ | 0 | 0 | 0 | 0 |
| e | −0.553295028 | −1.074792989 | −1.290770348 | −1.165057152 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 10

Si (111)
$0.2 \leq T_{LT} \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | −262.3995984 | −262.3995984 | 0 | 0 |
| $a_{TLT}^{(1)}$ | −59.70400634 | −59.70400634 | −18.45032018 | −20.44479246 |
| $b_{TLT}^{(2)}$ | 0.004691358 | 0.004691358 | 0 | 0 |
| $c_{TLT}$ | 0.355555556 | 0.355555556 | 0.332352941 | 0.331914894 |
| $a_{TS}^{(2)}$ | 0 | 0 | 0 | 0 |
| $a_{TS}^{(1)}$ | −73.33869606 | −73.33869606 | −9.963926388 | −24.5747574 |
| $b_{TS}^{(2)}$ | 0 | 0 | 0 | 0 |
| $c_{TS}$ | 0.185185185 | 0.185185185 | 0.166176471 | 0.165957447 |
| $a_{TE}^{(4)}$ | 0 | 0 | 0 | 0 |
| $a_{TE}^{(3)}$ | 0 | 0 | 0 | 0 |

TABLE 10-continued

Si (111)
$0.2 \leq T_{LT} \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TE}^{(2)}$ | 0 | 0 | 0 | 0 |
| $a_{TE}^{(1)}$ | −19.84024877 | −19.84024877 | −8.905455835 | −17.17093947 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.157407407 | 0.157407407 | 0.369117647 | 0.373404255 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | −4.69771E−05 | −4.69771E−05 | 0 | 0 |
| $a_{\psi Si}^{(3)}$ | −0.000362538 | −0.000362538 | 0 | 0 |
| $a_{\psi Si}^{(2)}$ | 0.055133453 | 0.055133453 | −0.004320224 | 0.021125116 |
| $a_{\psi Si}^{(1)}$ | 0.020862911 | 0.020862911 | −0.110606012 | −0.064218508 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 138552.1512 | 138552.1512 | 0 | 0 |
| $b_{\psi Si}^{(3)}$ | −78.36076818 | −78.36076818 | 0 | 0 |
| $b_{\psi Si}^{(2)}$ | 203.1635802 | 203.1635802 | 145.9775087 | 66.20642825 |
| $c_{\psi Si}$ | 33.05555556 | 33.05555556 | 19.41176471 | 34.46808511 |
| $a_{\theta LT}^{(2)}$ | 0 | 0 | 0 | 0 |
| $a_{\theta LT}^{(1)}$ | −0.079155699 | −0.079155699 | 0 | 0.057672719 |
| $b_{\theta LT}^{(2)}$ | 0 | 0 | 0 | 0 |
| $c_{\theta LT}$ | −49.81481481 | −49.81481481 | −90 | −49.14893617 |
| $d_{TLTTS}$ | 0 | 0 | 0 | 0 |
| $d_{TLTTE}$ | −254.5809235 | −254.5809235 | 80.69948416 | 99.56817027 |
| $d_{TLT\psi Si}$ | 2.260189055 | 2.260189055 | 0 | 0 |
| $T_{TLT\theta LT}$ | −0.785540829 | −0.785540829 | 0 | 0 |
| $d_{TSTE}$ | −292.5762951 | −292.5762951 | 0 | 0 |
| $d_{TS\psi Si}$ | −5.914103654 | −5.914103654 | −1.139436429 | 0 |
| $d_{TS\theta LT}$ | 0 | 0 | 0 | 0 |
| $d_{TE\psi Si}$ | 1.75463008 | 1.75463008 | 0.660099875 | −3.844659844 |
| $d_{TE\theta LT}$ | 0 | 0 | 0 | 0 |
| $d_{\psi Si\theta LT}$ | 0 | 0 | 0 | 0.006965097 |
| e | −1.304804416 | −1.304804416 | −2.734683251 | −3.115044468 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 11

Si (111)
$0 < T_{LT} < 0.2$
$0.2 \leq T_S \leq 2.0$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0.003649147 | 0 | 0 | 0 |
| $a_{TLT}^{(1)}$ | −17.27824731 | −24.3903101 | −38.65647339 | −21.91795924 |
| $b_{TLT}^{(2)}$ | 67.18624026 | 0 | 0 | 0 |
| $c_{TLT}$ | 0.154098361 | 0.15631068 | 0.17 | 0.1575 |
| $a_{TS}^{(2)}$ | 84.63185118 | 0 | 148.7691928 | 140.0125491 |
| $a_{TS}^{(1)}$ | −6.307527081 | −32.68184816 | −15.38083251 | −11.91949736 |
| $b_{TS}^{(2)}$ | 0.004461166 | 0 | 0.005012245 | 0.004623438 |
| $c_{TS}$ | 0.352459016 | 0.345631068 | 0.331428571 | 0.33875 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 2.909874306 | 8.840975559 | −16.54803788 | −0.024546617 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.135245902 | 0.148058252 | 0.372857143 | 0.33125 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |

TABLE 11-continued

Si (111)
$0 < T_{LT} < 0.2$
$0.2 \leq T_S \leq 2.0$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{\psi Si}^{(2)}$ | 0 | 0.006216698 | 0 | 0 |
| $a_{\psi Si}^{(1)}$ | −0.068574135 | −0.018885558 | −0.187578295 | 0.122573316 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 147.1439344 | 0 | 0 |
| $c_{\psi Si}$ | 22.62295082 | 43.10679612 | 22.71428571 | 39.1875 |
| $a_{\theta LT}^{(2)}$ | 0 | 0 | 0 | 0 |
| $a_{\theta LT}^{(1)}$ | 0.023219728 | 0.047846607 | 0.097088558 | 0.096327065 |
| $b_{\theta LT}^{(2)}$ | 0 | 0 | 0 | 0 |
| $c_{\theta LT}$ | −50.16393443 | −50.38834951 | −50.42857143 | −51.25 |
| $d_{TLTTS}$ | 0 | −144.763071 | 0 | 0 |
| $d_{TLTTE}$ | 0 | 0 | 161.23455326 | 0 |
| $d_{TLT\psi Si}$ | −0.827435588 | 0 | 0 | 1.107475984 |
| $T_{TLT\theta LT}$ | 0 | 0 | 0 | 0 |
| $d_{TSTE}$ | 0 | 103.0553675 | −65.68497311 | 0 |
| $d_{TS\psi Si}$ | 0 | −1.329400713 | 0.82928215 | −0.646921162 |
| $d_{TS\theta LT}$ | 0 | 0 | 0 | 0 |
| $d_{TE\psi Si}$ | −0.681669875 | 0.653050787 | 0.676734069 | 0.936807034 |
| $d_{TE\theta LT}$ | 0 | 0 | 0.481989709 | 0.52746173 |
| $d_{\psi Si\theta LT}$ | 0 | 0 | 0 | 0 |
| e | −1.560056382 | −2.656750279 | −2.259351603 | −1.805786084 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 12

Si (111)
$0.2 \leq T_{LT} \leq 3.5$
$0.2 \leq T_{LT} \leq 2.0$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 77.3065693 | 243.6937004 | 0 |
| $a_{TLT}^{(1)}$ | −13.49335267 | −9.878165228 | −6.309863061 | −12.90130633 |
| $b_{TLT}^{(2)}$ | 0 | 0.00674795 | 0.006522811 | 0 |
| $c_{TLT}$ | 0.300961538 | 0.297350993 | 0.29858156 | 0.306818182 |
| $a_{TS}^{(2)}$ | 133.2691939 | 160.4037443 | 82.71737336 | 100.5491122 |
| $a_{TS}^{(1)}$ | −9.215218873 | −21.20902158 | −9.283157312 | −7.984268054 |
| $b_{TS}^{(2)}$ | 0.006618898 | 0.005353274 | 0.006382979 | 0.005704201 |
| $c_{TS}$ | 0.314423077 | 0.303311258 | 0.3 | 0.311363636 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 90.39669198 | 0 | 0 |
| $a_{TE}^{(1)}$ | 0.170720276 | 3.925569914 | −15.08313602 | −9.451928755 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006615499 | 0 | 0 |
| $c_{TE}$ | 0.15 | 0.147350993 | 0.363475177 | 0.346212121 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00740803 | 0 | 0 | 0 |
| $a_{\psi Si}^{(1)}$ | −0.220502432 | 0.083594751 | −0.104344279 | 0.088096624 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 135.4659763 | 0 | 0 | 0 |
| $c_{\psi Si}$ | 20.76923077 | 43.70860927 | 17.87234043 | 41.47727273 |
| $a_{\theta LT}^{(2)}$ | 0 | 0 | 0 | 0 |
| $a_{\theta LT}^{(1)}$ | −0.017420386 | −0.012240534 | 0 | 0 |

TABLE 12-continued

| | Si (111) 0.2 ≤ T_LT ≤ 3.5; 0.2 ≤ T_LT ≤ 2.0 | | | |
|---|---|---|---|---|
| | 0.05 ≤ T_E < 0.25 | | 0.25 ≤ T_E ≤ 0.45 | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\theta LT}^{(2)}$ | 0 | 0 | 0 | 0 |
| $c_{\theta LT}$ | −50.28846154 | −50.26490066 | −90 | −90 |
| $d_{TLTTS}$ | 149.298265 | 220.9283416 | 135.5319056 | 135.1493422 |
| $d_{TLTTE}$ | 0 | 0 | 0 | −65.38520659 |
| $d_{TLT\psi Si}$ | 0 | 0 | 0 | −0.663828772 |
| $d_{TLT\theta LT}$ | −0.703824061 | −0.739197646 | 0 | 0 |
| $d_{TSTE}$ | 122.4270642 | 0 | −94.62792088 | 0 |
| $d_{TS\psi Si}$ | 0.714493384 | −1.189155195 | 0 | −1.017237669 |
| $d_{TS\theta LT}$ | 0 | 0 | 0 | 0 |
| $d_{TE\psi Si}$ | 0 | 0.558597609 | 0 | 0 |
| $d_{TE\theta LT}$ | 0.734424122 | 0.628956462 | 0 | 0 |
| $d_{\psi Si\theta LT}$ | −0.003900657 | 0.003268439 | 0 | 0 |
| e | −2.246432623 | −2.691572945 | −3.425676672 | −3.236112132 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

An acoustic wave device according to another preferred embodiment of the present invention includes a silicon support substrate, a silicon oxide film laminated above the silicon support substrate, a lithium tantalate film laminated above the silicon oxide film, an IDT electrode including an electrode finger and being provided above the lithium tantalate film, and a protection film covering at least a portion of the IDT electrode. When a wavelength determined by an electrode finger pitch of the IDT electrode is denoted by λ, a wavelength normalized film thickness of the lithium tantalate film is denoted by $T_{LT}$, θ of an Euler angle of the lithium tantalate film is denoted by $\theta_{LT}$, a wavelength normalized film thickness of the silicon oxide film is denoted by $T_S$, a wavelength normalized film thickness of the IDT electrode in terms of aluminum thickness being a product of a wavelength normalized film thickness of the IDT electrode and a value obtained when density of the IDT electrode is divided by density of aluminum is denoted by $T_E$, a wavelength normalized film thickness of the protection film being a product of a value obtained when density of the protection film is divided by density of silicon oxide and a wavelength normalized film thickness which is a thickness of the protection film normalized by the wavelength λ is denoted by $T_P$, a propagation direction in the silicon support substrate is denoted by $\psi_{Si}$, and a wavelength normalized film thickness which is a thickness of the silicon support substrate normalized by the wavelength λ is denoted by $T_{Si}$, $T_{LT}$, $\theta_{LT}$, $T_S$, $T_E$, $T_P$, and $\psi_{Si}$ are set such that a value represented by Formula (1) below is larger than about −2.4:

$$\begin{aligned}
I_h = &\; a_{T_{LT}}^{(2)}\left((T_{LT}-c_{T_{LT}})^2 - b_{T_{LT}}^{(2)}\right) + \\
& a_{T_{LT}}^{(1)}(T_{LT}-c_{T_{LT}}) + a_{T_S}^{(2)}\left((T_S-c_{T_S})^2 - b_{T_S}^{(2)}\right) + a_{T_S}^{(1)}(T_S-c_{T_S}) + \\
& a_{T_E}^{(4)}\left((T_E-c_{T_E})^4 - b_{T_E}^{(4)}\right) + a_{T_E}^{(3)}\left((T_E-c_{T_E})^3 - b_{T_E}^{(3)}\right) + \\
& a_{T_E}^{(2)}\left((T_E-c_{T_E})^2 - b_{T_E}^{(2)}\right) + a_{T_E}^{(1)}(T_E-c_{T_E}) + \\
& a_{\psi_{Si}}^{(6)}\left((\psi_{Si}-c_{\psi_{Si}})^6 - b_{\psi_{Si}}^{(6)}\right) + a_{\psi_{Si}}^{(5)}\left((\psi_{Si}-c_{\psi_{Si}})^5 - b_{\psi_{Si}}^{(5)}\right) + \\
& a_{\psi_{Si}}^{(4)}\left((\psi_{Si}-c_{\psi_{Si}})^4 - b_{\psi_{Si}}^{(4)}\right) + a_{\psi_{Si}}^{(3)}\left((\psi_{Si}-c_{\psi_{Si}})^3 - b_{\psi_{Si}}^{(3)}\right) + \\
& a_{\psi_{Si}}^{(2)}\left((\psi_{Si}-c_{\psi_{Si}})^2 - b_{\psi_{Si}}^{(2)}\right) + a_{\psi_{Si}}^{(1)}(\psi_{Si}-c_{\psi_{Si}}) + \\
& a_{\theta_{LT}}^{(2)}\left((\theta_{LT}-c_{\theta_{LT}})^2 - b_{\theta_{LT}}^{(2)}\right) + a_{\theta_{LT}}^{(1)}(\theta_{LT}-c_{\theta_{LT}}) + \\
& d_{T_{LT}T_S}(T_{LT}-c_{T_{LT}})(T_S-c_{T_S}) + d_{T_{LT}T_E}(T_{LT}-c_{T_{LT}})(T_E-c_{T_E}) + d_{T_{LT}\psi_{Si}}(T_{LT}-c_{T_{LT}})(\psi_{Si}-c_{\psi_{Si}}) + \\
& d_{T_{LT}\theta_{LT}}(T_{LT}-c_{T_{LT}})(\theta_{LT}-c_{\theta_{LT}}) + d_{T_S T_E}(T_S-c_{T_S})(T_E-c_{T_E}) + \\
& d_{T_S\psi_{Si}}(T_S-c_{T_S})(\psi_{Si}-c_{\psi_{Si}}) + d_{T_S\theta_{LT}}(T_S-c_{T_S})(\theta_{LT}-c_{\theta_{LT}}) + \\
& d_{T_E\psi_{Si}}(T_E-c_{T_E})(\psi_{Si}-c_{\psi_{Si}}) + d_{T_E\theta_{LT}}(T_E-c_{T_E})(\theta_{LT}-c_{\theta_{LT}}) + \\
& d_{\psi_{Si}\theta_{LT}}(\psi_{Si}-c_{\psi_{Si}})(\theta_{LT}-c_{\theta_{LT}}) + e \Big/ \\
& \left(a_{T_P}T_P^4 + b_{T_P}T_P^3 + c_{T_P}T_P^2 + d_{T_P}T_P + f_{T_P}\right).
\end{aligned}$$

Coefficients a, b, c, d, e, and f in Formula (1) are values described in Table 13 to Table 24 below that are determined in accordance with the crystal orientation of the silicon support substrate and the range of $T_S$, $T_{LT}$, and $\psi_{Si}$:

TABLE 13

| | Si (100) 0 < T_LT < 0.2; 0 ≤ T_S < 0.2 | |
|---|---|---|
| | 0.05 ≤ T_E < 0.25 | 0.25 ≤ T_E ≤ 0.45 |
| $a_{TLT}^{(2)}$ | 0 | 0 |
| $a_{TLT}^{(1)}$ | −5.687707928 | −5.687707928 |
| $b_{TLT}^{(2)}$ | 0 | 0 |
| $c_{TLT}$ | 0.139506173 | 0.139506173 |
| $a_{TS}^{(2)}$ | 0 | 0 |
| $a_{TS}^{(1)}$ | 5.653643283 | 5.653643283 |
| $b_{TS}^{(2)}$ | 0 | 0 |
| $c_{TS}$ | 0.148148148 | 0.148148148 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −1.004369706 | −1.004369706 |
| $b_{TE}^{(4)}$ | 0 | 0 |
| $b_{TE}^{(3)}$ | 0 | 0 |
| $b_{TE}^{(2)}$ | 0 | 0 |

TABLE 13-continued

| | Si (100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $c_{TE}$ | 0.255555556 | 0.255555556 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000197083 | −0.000197083 |
| $a_{\psi Si}^{(2)}$ | −0.003376583 | −0.003376583 |
| $a_{\psi Si}^{(1)}$ | 0.118081927 | 0.118081927 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −379.4708632 | −379.4708632 |
| $b_{\psi Si}^{(2)}$ | 278.0521262 | 278.0521262 |
| $c_{\psi Si}$ | 23.14814815 | 23.14814815 |
| $a_{\theta LT}^{(2)}$ | 0 | 0 |
| $a_{\theta LT}^{(1)}$ | 0.128631041 | 0.128631041 |
| $b_{\theta LT}^{(2)}$ | 0 | 0 |
| $c_{\theta LT}$ | −49.32098765 | −49.32098765 |
| $d_{TLTTS}$ | 0 | 0 |
| $d_{TLTTE}$ | 72.43278274 | 72.43278274 |
| $d_{TLT\psi Si}$ | 0.604747502 | 0.604747502 |
| $d_{TLT\theta LT}$ | −1.743618251 | −1.743618251 |
| $d_{TSTE}$ | 0 | 0 |
| $d_{TS\psi Si}$ | 0 | 0 |
| $d_{TS\theta LT}$ | 0.994157261 | 0.994157261 |
| $d_{TE\psi Si}$ | 0 | 0 |
| $d_{TE\theta LT}$ | 0.280889881 | 0.280889881 |
| $d_{\psi Si\theta LT}$ | 0.003095822 | 0.003095822 |
| e | −5.638096455 | −5.638096455 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 14

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | 7.809960834 | 4.249755245 |
| $b_{TLT}^{(2)}$ | 0 | 0 |
| $c_{TLT}$ | 0.30962963 | 0.302857143 |
| $a_{TS}^{(2)}$ | 0 | 0 |
| $a_{TS}^{(1)}$ | 0 | −0.800874586 |
| $b_{TS}^{(2)}$ | 0 | 0 |
| $c_{TS}$ | 0 | 0.150714286 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.563479635 | 9.07053135 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.148518519 | 0.353571429 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000160979 | 0 |
| $a_{\psi Si}^{(2)}$ | −0.000757552 | 0.001332545 |
| $a_{\psi Si}^{(1)}$ | 0.095765615 | 0.003836714 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 384.7407407 | 0 |
| $b_{\psi Si}^{(2)}$ | 278.2222222 | 285.0956633 |
| $c_{\psi Si}$ | 21.33333333 | 20.89285714 |
| $a_{\theta LT}^{(2)}$ | 0 | 0 0 |

TABLE 14-continued

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{\theta LT}^{(1)}$ | 0.043185248 | 0.033521037 |
| $b_{\theta LT}^{(2)}$ | 0 | 0 |
| $c_{\theta LT}$ | −50 | −50.92857143 |
| $d_{TLTTS}$ | 0 | 0 |
| $d_{TLTTE}$ | 0 | 0 |
| $d_{TLT\psi Si}$ | −0.383208698 | −0.220029295 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0.974573109 |
| $d_{TE\psi Si}$ | 0 | 0 |
| $d_{TE\theta LT}$ | 1.01389349 | −1.078939399 |
| $d_{\psi Si\theta LT}$ | 0 | 0.002899732 |
| e | −5.569590226 | −5.29442278 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 15

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −11.51287 | −11.51287 |
| $b_{TLT}^{(2)}$ | 0 | 0 |
| $c_{TLT}$ | 0.136328125 | 0.136328125 |
| $a_{TS}^{(2)}$ | 0 | 0 |
| $a_{TS}^{(1)}$ | 6.022608826 | 6.022608826 |
| $b_{TS}^{(2)}$ | 0 | 0 |
| $c_{TS}$ | 0.305859375 | 0.305859375 |
| $a_{TE}^{(4)}$ | 0 | 0 |
| $a_{TE}^{(3)}$ | −180.607873 | −180.607873 |
| $a_{TE}^{(2)}$ | −1.347493816 | −1.347493816 |
| $a_{TE}^{(1)}$ | 4.841204365 | 4.841204365 |
| $b_{TE}^{(4)}$ | 0 | 0 |
| $b_{TE}^{(3)}$ | −0.000227051 | −0.000227051 |
| $b_{TE}^{(2)}$ | 0.019179688 | 0.019179688 |
| $c_{TE}$ | 0.25625 | 0.25625 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001342794 | −0.001342794 |
| $a_{\psi Si}^{(1)}$ | 0.25625 | 0.25625 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 275.7568359 | 275.7568359 |
| $c_{\psi Si}$ | 0.25625 | 0.25625 |
| $a_{\theta LT}^{(2)}$ | 0 | 0 |
| $a_{\theta LT}^{(1)}$ | 0.153688205 | 0.153688205 |
| $b_{\theta LT}^{(2)}$ | 0 | 0 |
| $c_{\theta LT}$ | −49.140625 | −49.140625 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | −1.180623763 | −1.180623763 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.41394071 | 0.41394071 |
| $d_{\psi Si\theta LT}$ | 0.003203013 | 0.003203013 |
| e | −4.433641408 | −4.433641408 |

TABLE 15-continued

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 16

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 119.666412 | 118.2359738 |
| $a_{TLT}^{(1)}$ | 4.447768142 | 2.271979446 |
| $b_{TLT}^{(2)}$ | 0.006371047 | 0.00699901 |
| $c_{TLT}$ | 0.31147541 | 0.30631068 |
| $a_{TS}^{(2)}$ | 0 | 0 |
| $a_{TS}^{(1)}$ | 0 | −3.805216895 |
| $b_{TS}^{(2)}$ | 0 | 0 |
| $c_{TS}$ | 0 | 0.298543689 |
| $a_{TE}^{(4)}$ | 0 | 0 |
| $a_{TE}^{(3)}$ | 0 | 0 |
| $a_{TE}^{(2)}$ | 117.8354557 | 121.7109482 |
| $a_{TE}^{(1)}$ | 2.107193686 | −0.578851453 |
| $b_{TE}^{(4)}$ | 0 | 0 |
| $b_{TE}^{(3)}$ | 0 | 0 |
| $b_{TE}^{(2)}$ | 0.006775956 | 0.006610661 |
| $c_{TE}$ | 0.15 | 0.35631068 |
| $a_{\psi Si}^{(6)}$ | 0 | 0 |

TABLE 16-continued

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001658706 | 0 |
| $a_{\psi Si}^{(1)}$ | 0.005677734 | 0.003834195 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 272.5477022 | 0 |
| $c_{\psi Si}$ | 20.90163934 | 20.02427184 |
| $a_{\theta LT}^{(2)}$ | 0 | 0 |
| $a_{\theta LT}^{(1)}$ | 0.051921544 | 0.050011808 |
| $b_{\theta LT}^{(2)}$ | 0 | 0 |
| $c_{\theta LT}$ | −48.36065574 | −48.93203883 |
| $d_{TLTTS}$ | 0 | 0 |
| $d_{TLTTE}$ | 61.26575286 | 0 |
| $d_{TLT\psi Si}$ | 0 | 0 |
| $d_{TLT\theta LT}$ | 0 | 0 |
| $d_{TSTE}$ | 0 | −82.22932804 |
| $d_{TS\psi Si}$ | 0 | 0 |
| $d_{TS\theta LT}$ | 0 | −0.470524678 |
| $d_{TE\psi Si}$ | 0 | 0 |
| $d_{TE\theta LT}$ | 0.904198722 | −0.776132158 |
| $d_{\psi Si\theta LT}$ | 0.003410501 | 0.003906326 |
| e | −5.339814906 | −5.463687811 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 17

| | Si (110) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −7.587457615 | −7.587457615 | −7.587457615 | −7.587457615 |
| $b_{TLT}^{(2)}$ | 0 | 0 | 0 | 0 |
| $c_{TLT}$ | 0.174380165 | 0.174380165 | 0.174380165 | 0.174380165 |
| $a_{TS}^{(2)}$ | 0 | 0 | 0 | 0 |
| $a_{TS}^{(1)}$ | −3.979714537 | −3.979714537 | −3.979714537 | −3.979714537 |
| $b_{TS}^{(2)}$ | 0 | 0 | 0 | 0 |
| $c_{TS}$ | 0.150413223 | 0.150413223 | 0.150413223 | 0.150413223 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −0.865040993 | −0.865040993 | −0.865040993 | −0.865040993 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.245867769 | 0.245867769 | 0.245867769 | 0.245867769 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 5.87537E−07 | 5.87537E−07 | 5.87537E−07 | 5.87537E−07 |
| $a_{\psi Si}^{(3)}$ | −8.59015E−07 | −8.59015E−07 | −8.59015E−07 | −8.59015E−07 |
| $a_{\psi Si}^{(2)}$ | −0.001948222 | −0.001948222 | −0.001948222 | −0.001948222 |
| $a_{\psi Si}^{(1)}$ | −0.027558032 | −0.027558032 | −0.027558032 | −0.027558032 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 1129197.497 | 1129197.497 | 1129197.497 | 1129197.497 |
| $b_{\psi Si}^{(3)}$ | −1524.372996 | −1524.372996 | −1524.372996 | −1524.372996 |
| $b_{\psi Si}^{(2)}$ | 776.3813947 | 776.3813947 | 776.3813947 | 776.3813947 |
| $c_{\psi Si}$ | 41.52892562 | 41.52892562 | 41.52892562 | 41.52892562 |

TABLE 17-continued

| | Si (110) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{\theta LT}^{(2)}$ | 0 | 0 | 0 | 0 |
| $a_{\theta LT}^{(1)}$ | 0.018744549 | 0.018744549 | 0.018744549 | 0.018744549 |
| $b_{\theta LT}^{(2)}$ | 0 | 0 | 0 | 0 |
| $c_{\theta LT}$ | −49.25619835 | −49.25619835 | −49.25619835 | −49.25619835 |
| $d_{TLTTS}$ | 140.6234074 | 140.6234074 | 140.6234074 | 140.6234074 |
| $d_{TLTTE}$ | −25.20654793 | −25.20654793 | −25.20654793 | −25.20654793 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0 | 0 | 0 | 0 |
| e | −1.789519626 | −1.789519626 | −1.789519626 | −1.789519626 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 18

| | Si (110) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 39.68139696 | 39.68139696 |
| $a_{TLT}^{(1)}$ | −3.912934705 | −3.912934705 | −3.801935963 | −3.801935963 |
| $b_{TLT}^{(2)}$ | 0 | 0 | 0.00692398 | 0.00692398 |
| $c_{TLT}$ | 0.306451613 | 0.306451613 | 0.297857143 | 0.297857143 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 1.912614784 | 1.912614784 | −6.089810932 | −6.089810932 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.148924731 | 0.148924731 | 0.347857143 | 0.347857143 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 8.78847E−06 | 8.78847E−06 |
| $a_{\psi Si}^{(2)}$ | −0.0004718 | −0.0004718 | −0.000160567 | −0.000160567 |
| $a_{\psi Si}^{(1)}$ | 0.003265633 | 0.003265633 | −0.023574651 | −0.023574651 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 2351.597668 | 2351.597668 |
| $b_{\psi Si}^{(2)}$ | 847.4765869 | 847.4765869 | 880.2091837 | 880.2091837 |
| $c_{\psi Si}$ | 35.32258065 | 35.32258065 | 43.07142857 | 43.07142857 |
| $a_{\theta LT}^{(2)}$ | 0.005014741 | 0.005014741 | 0 | 0 |
| $a_{\theta LT}^{(1)}$ | 0.023115164 | 0.023115164 | 0.030121011 | 0.030121011 |
| $b_{\theta LT}^{(2)}$ | 67.0626662 | 67.0626662 | 0 | 0 |
| $c_{\theta LT}$ | −49.62365591 | −49.62365591 | −51.28571429 | −51.28571429 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0.125572529 | 0.125572529 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |

TABLE 18-continued

| | Si (110) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $d_{TS\theta LT}$ | 0 | 0 | 0 | 0 |
| $d_{TE\psi Si}$ | 0 | 0 | 0 | 0 |
| $d_{TE\theta LT}$ | 0.563162206 | 0.563162206 | −0.417002414 | −0.417002414 |
| $d_{\psi Si\theta LT}$ | 0 | 0 | 0 | 0 |
| e | −2.002512986 | −2.002512986 | −2.550158637 | −2.550158637 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 19

| | Si (110) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | 2.992014692 | 2.992014692 | −1.461725087 | −1.461725087 |
| $b_{TLT}^{(2)}$ | 0 | 0 | 0 | 0 |
| $c_{TLT}$ | 0.156390977 | 0.156390977 | 0.155345912 | 0.155345912 |
| $a_{TS}^{(2)}$ | 0 | 0 | 0 | 0 |
| $a_{TS}^{(1)}$ | −9.089925228 | −9.089925228 | −1.247751383 | −1.247751383 |
| $b_{TS}^{(2)}$ | 0 | 0 | 0 | 0 |
| $c_{TS}$ | 0.305263158 | 0.305263158 | 0.327672956 | 0.327672956 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −130.6388144 | −130.6388144 |
| $a_{TE}^{(1)}$ | 5.773590917 | 5.773590917 | −0.010504162 | −0.010504162 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006662711 | 0.006662711 |
| $c_{TE}$ | 0.166541353 | 0.166541353 | 0.341823899 | 0.341823899 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 1.03604E−05 | 1.03604E−05 |
| $a_{\psi Si}^{(2)}$ | −0.000377109 | −0.000377109 | −0.000138558 | −0.000138558 |
| $a_{\psi Si}^{(1)}$ | −0.013702515 | −0.013702515 | −0.028102653 | −0.028102653 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 3096.349671 | 3096.349671 |
| $b_{\psi Si}^{(2)}$ | 792.2381141 | 792.2381141 | 957.6361695 | 957.6361695 |
| $c_{\psi Si}$ | 41.39097744 | 41.39097744 | 43.20754717 | 43.20754717 |
| $a_{\theta LT}^{(2)}$ | 0 | 0 | 0 | 0 |
| $a_{\theta LT}^{(1)}$ | 0.015804666 | 0.015804666 | 0.028892246 | 0.028892246 |
| $b_{\theta LT}^{(2)}$ | 0 | 0 | 0 | 0 |
| $c_{\theta LT}$ | −49.32330827 | −49.32330827 | −49.62264151 | −49.62264151 |
| $d_{TLTTS}$ | 0 | 0 | −44.5976835 | −44.5976835 |
| $d_{TLTTE}$ | 80.90186655 | 80.90186655 | −150.2428298 | −150.2428298 |
| $d_{TLT\psi Si}$ | 0 | 0 | 0.225109644 | 0.225109644 |
| $d_{TLT\theta LT}$ | 0 | 0 | 0 | 0 |
| $d_{TSTE}$ | 29.68261053 | 29.68261053 | 47.35851038 | 47.35851038 |
| $d_{TS\psi Si}$ | 0.136750854 | 0.136750854 | 0 | 0 |
| $d_{TS\theta LT}$ | 0 | 0 | 0 | 0 |
| $d_{TE\psi Si}$ | −0.146211814 | −0.146211814 | 0 | 0 |
| $d_{TE\theta LT}$ | 0.41229257 | 0.41229257 | 0 | 0 |
| $d_{\psi Si\theta LT}$ | 0 | 0 | 0 | 0 |
| e | −2.596813807 | −2.596813807 | −2.049341112 | −2.049341112 |
| $a_{TP}$ | 0 | 0 | 0 | 0 |
| $b_{TP}$ | 0 | 0 | 0 | 0 |

TABLE 19-continued

Si (110)

$0 < T_{LT} < 0.2$ $0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 20

Si (110)

$0.2 \leq T_{LT} \leq 3.5$ $0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −2.80791074 | −2.80791074 | 0 | 0 |
| $b_{TLT}^{(2)}$ | 0 | 0 | 0 | 0 |
| $c_{TLT}$ | 0.3069869 | 0.3069869 | 0 | 0 |
| $a_{TS}^{(2)}$ | 0 | 0 | 0 | 0 |
| $a_{TS}^{(1)}$ | −5.618098986 | −5.618098986 | 0 | 0 |
| $b_{TS}^{(2)}$ | 0 | 0 | 0 | 0 |
| $c_{TS}$ | 0.286462882 | 0.286462882 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −73.23839461 | −73.23839461 |
| $a_{TE}^{(1)}$ | 8.962154821 | 8.962154821 | −5.710295136 | −5.710295136 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007310763 | 0.007310763 |
| $c_{TE}$ | 0.167467249 | 0.167467249 | 0.330930233 | 0.330930233 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.003677309 | 0.003677309 | 0 | 0 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 40.93886463 | 40.93886463 | 0 | 0 |
| $a_{\theta LT}^{(2)}$ | 0.00527863 | 0.00527863 | 0 | 0 |
| $a_{\theta LT}^{(1)}$ | 0.008431458 | 0.008431458 | 0 | 0 |
| $b_{\theta LT}^{(2)}$ | 66.00179249 | 66.00179249 | 0 | 0 |
| $c_{\theta LT}$ | −50.61135371 | −50.61135371 | −90 | −90 |
| $d_{TLTTS}$ | 63.6265441 | 63.6265441 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 57.20229582 | 57.20229582 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | −0.098212695 | −0.098212695 | 0 | 0 |
| $d_{TE\theta LT}$ | 0.32576925 | 0.32576925 | 0 | 0 |
| $d_{\psi Si\theta LT}$ | 0 | 0 | 0 | 0 |
| e | −2.431352404 | −2.431352404 | −2.39032093 | −2.39032093 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 21

Si (111)
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −26.67263869 | −6.49243933 | −20.61574251 | −21.06290014 |
| $b_{TLT}^{(2)}$ | 0 | 0 | 0 | 0 |
| $c_{TLT}$ | 0.15443038 | 0.175438596 | 0.160759494 | 0.156896552 |
| $a_{TS}^{(2)}$ | 0 | 0 | 0 | 0 |
| $a_{TS}^{(1)}$ | −7.971316395 | 7.232224634 | −16.40433051 | −3.920556446 |
| $b_{TS}^{(2)}$ | 0 | 0 | 0 | 0 |
| $c_{TS}$ | 0.14556962 | 0.133333333 | 0.144303797 | 0.144827586 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −110.7824708 | −133.1826499 | 0 |
| $a_{TE}^{(1)}$ | 12.77975858 | −10.04988717 | 5.027045348 | −5.686378626 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006463527 | 0.006582278 | 0 |
| $c_{TE}$ | 0.151265823 | 0.144736842 | 0.35 | 0.35862069 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | −0.007219474 | 0 |
| $a_{\psi Si}^{(1)}$ | 0.028716852 | 0.04192074 | 0.016815807 | 0.008780601 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 125.0280404 | 0 |
| $c_{\psi Si}$ | 9.683544304 | 50 | 11.58227848 | 48.10344828 |
| $a_{\theta LT}^{(2)}$ | 0.01035547 | 0 | 0 | 0.014789077 |
| $a_{\theta LT}^{(1)}$ | 0.162093889 | 0.106646805 | 0.164306798 | 0.04587348 |
| $b_{\theta LT}^{(2)}$ | 61.8811088 | 0 | 0 | 55.43995244 |
| $c_{\theta LT}$ | −49.62025316 | −50.35087719 | −51.01265823 | −51.20689655 |
| $d_{TLTTS}$ | −609.1883956 | −724.6623011 | −297.9828576 | −203.214973 |
| $d_{TLTTE}$ | −215.420422 | 0 | 159.6303697 | 0 |
| $d_{TLT\psi Si}$ | 0 | −3.771938969 | 2.003207828 | −2.014745526 |
| $d_{TLT\theta LT}$ | 1.80686724 | 0 | 2.218853872 | 0 |
| $d_{TSTE}$ | 0 | −307.4269587 | 0 | 0 |
| $d_{TS\psi Si}$ | 0 | 0 | −1.097992723 | 0 |
| $d_{TS\theta LT}$ | 1.985202008 | 0 | 2.104127874 | 0 |
| $d_{TE\psi Si}$ | 0 | 0 | −1.45135593 | 0 |
| $d_{TE\theta LT}$ | −203.386471 | 1.145649707 | 0 | 0 |
| $d_{\psi Si\theta LT}$ | 2.42647485 | 0.004357557 | 0 | 0 |
| e | −5.019952207 | −2.13826109 | −3.235663805 | −3.326865691 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 22

Si (111)
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 45.51074293 | −94.44342524 | 0 |
| $a_{TLT}^{(1)}$ | 0.788515154 | −3.454988617 | −9.832405019 | −3.192556866 |
| $b_{TLT}^{(2)}$ | 0 | 0.006485261 | 0.006459172 | 0 |
| $c_{TLT}$ | 0.298058252 | 0.295238095 | 0.298461538 | 0.298913043 |
| $a_{TS}^{(2)}$ | 0 | 0 | 0 | 0 |
| $a_{TS}^{(1)}$ | −8.97795964 | 1.31344944 | 0 | 0 |
| $b_{TS}^{(2)}$ | 0 | 0 | 0 | 0 |
| $c_{TS}$ | 0.142718447 | 0.147619048 | 0 | 0 |
| $a_{TE}^{(4)}$ | 0 | 0 | 0 | 0 |
| $a_{TE}^{(3)}$ | 0 | 0 | 0 | 0 |

TABLE 22-continued

Si (111)
$0.2 \leq T_{LT} \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TE}^{(2)}$ | 0 | 0 | 0 | 0 |
| $a_{TE}^{(1)}$ | 9.791468713 | 0.170587985 | −0.71523762 | −10.72534988 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.15776699 | 0.124603175 | 0.356153846 | 0.347826087 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0.003924448 | 0.001661439 | 0 | 0.00657999 |
| $a_{\psi Si}^{(1)}$ | 0.15776699 | −0.024952541 | 0.02404454 | −0.067389114 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 148.4588557 | 132.0861678 | 0 | 152.6937618 |
| $c_{\psi Si}$ | 15.29126214 | 46.9047619 | 14.19230769 | 43.04347826 |
| $a_{\theta LT}^{(2)}$ | 0 | 0 | 0 | 0 |
| $a_{\theta LT}^{(1)}$ | 0.06700163 | 0.042141715 | 0.055240362 | 0.061747926 |
| $b_{\theta LT}^{(2)}$ | 0 | 0 | 0 | 0 |
| $c_{\theta LT}$ | −48.73786408 | −50.15873016 | −49.76923077 | −49.45652174 |
| $d_{TLTTS}$ | 116.7290786 | −78.78450728 | 0 | 0 |
| $d_{TLTTE}$ | 0 | 85.46351406 | −49.85282875 | 0 |
| $d_{TLT\psi Si}$ | −0.70199108 | 0.445481139 | 0 | 0.604657146 |
| $d_{TLT\theta LT}$ | −0.726496636 | 0 | 0 | 0 |
| $d_{TSTE}$ | 0 | −116.360096 | 0 | 0 |
| $d_{TS\psi Si}$ | 0 | −0.622709588 | 0 | 0 |
| $d_{TS\theta LT}$ | 2.041329502 | −0.339115637 | 0 | 0 |
| $d_{TE\psi Si}$ | 0 | 0.20688896 | 0 | 0 |
| $d_{TE\theta LT}$ | 0.774150432 | 0.439880407 | −0.6608739 | −1.068569294 |
| $d_{\psi Si\theta LT}$ | −0.005400114 | 0.002667922 | −0.004937546 | 0.006290209 |
| e | −4.209434885 | −1.791078273 | −3.48174155 | −3.934527612 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 23

Si (111)
$0 < T_{LT} < 0.2$
$0.2 \leq T_S \leq 2.0$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −4.673850215 | 0 | −8.8586067 | −1.957300157 |
| $b_{TLT}^{(2)}$ | 0 | 0 | 0 | 0 |
| $c_{TLT}$ | 0.141509434 | 0 | 0.153125 | 0.16 |
| $a_{TS}^{(2)}$ | 82.42811022 | 0 | 87.42203531 | 0 |
| $a_{TS}^{(1)}$ | −7.905282467 | −4.948155925 | −0.569845134 | 0.521030757 |
| $b_{TS}^{(2)}$ | 0.006949092 | 0 | 0.006037326 | 0 |
| $c_{TS}$ | 0.294339623 | 0.314583333 | 0.297916667 | 0.285 |
| $a_{TE}^{(4)}$ | 0 | 0 | 0 | 0 |
| $a_{TE}^{(3)}$ | 0 | 0 | 0 | 0 |
| $a_{TE}^{(2)}$ | 53.51232744 | −79.38404758 | 0 | 0 |
| $a_{TE}^{(1)}$ | 10.58973083 | 10.26534018 | 8.135327356 | −7.251553825 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006016376 | 0.005677083 | 0 | 0 |
| $c_{TE}$ | 0.183962264 | 0.1375 | 0.336458333 | 0.37 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |

TABLE 23-continued

| | Si (111) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{\psi Si}^{(2)}$ | 0 | 0 | 0 | 0.001429494 |
| $a_{\psi Si}^{(1)}$ | 0.010122468 | 0.039888924 | −0.016592245 | −0.004853684 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 145.6875 |
| $c_{\psi Si}$ | 11.88679245 | 48.4375 | 14.0625 | 45.75 |
| $a_{\theta LT}^{(2)}$ | 0 | 0 | 0 | 0 |
| $a_{\theta LT}^{(1)}$ | −0.005093912 | 0.011098836 | 0.047530531 | 0.04750516 |
| $b_{\theta LT}^{(2)}$ | 0 | 0 | 0 | 0 |
| $c_{\theta LT}$ | −50 | −50.4166667 | −50.72916667 | −49.75 |
| $d_{TLTTS}$ | 0 | 0 | 91.19418307 | 251.5375225 |
| $d_{TLTTE}$ | 0 | 0 | −156.3654518 | 0 |
| $d_{TLT\psi Si}$ | 0.322255595 | 0 | 0 | −0.289820964 |
| $d_{TLT\theta LT}$ | −0.768436344 | 0 | −0.735737765 | 0 |
| $d_{TSTE}$ | 0 | 75.51836907 | 0 | 0 |
| $d_{TS\psi Si}$ | −0.512402643 | 0.300543357 | −0.724013025 | 0.245746891 |
| $d_{TS\theta LT}$ | 0 | 0 | 0 | 0 |
| $d_{TE\psi Si}$ | 0 | 0 | −0.50556971 | 0 |
| $d_{TE\theta LT}$ | 0 | 0 | 0 | 0 |
| $d_{\psi Si\theta LT}$ | 0 | 0.002842264 | 0 | 0 |
| e | −2.770026639 | −2.638591885 | −1.980941925 | −2.412296494 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 24

| | Si (111) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 4.449764983 | 0 | −13.78321665 | −10.59163435 |
| $b_{TLT}^{(2)}$ | 0 | 0 | 0 | 0 |
| $c_{TLT}$ | 0.321052632 | 0 | 0.309146341 | 0.303164557 |
| $a_{TS}^{(2)}$ | 0 | 0 | 0 | 0 |
| $a_{TS}^{(1)}$ | 0 | −3.433673203 | −1.746861763 | 3.363230821 |
| $b_{TS}^{(2)}$ | 0 | 0 | 0 | 0 |
| $c_{TS}$ | 0 | 0.283443709 | 0.287804878 | 0.293037975 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 86.18383552 | 0 |
| $a_{TE}^{(1)}$ | 3.853394073 | 8.768511808 | −1.86755053 | −15.6861606 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007157942 | 0 |
| $c_{TE}$ | 0.181578947 | 0.135430464 | 0.356097561 | 0.363291139 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.014178515 | 0.049910217 | −0.008697771 | 0.012742666 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 12.63157895 | 45.99337748 | 15.09146341 | 45 |
| $a_{\theta LT}^{(2)}$ | 0 | 0 | 0 | 0 |
| $a_{\theta LT}^{(1)}$ | 0 | 0.061867934 | 0.051566965 | 0.028929641 |

TABLE 24-continued

| | Si (111) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\theta LT}{}^{(2)}$ | 0 | 0 | 0 | 0 |
| $c_{\theta LT}$ | −90 | −50.59602649 | −50.30487805 | −50.56962025 |
| $d_{TLTTS}$ | 0 | 0 | 0 | −103.0440888 |
| $d_{TLTTE}$ | 0 | 0 | 0 | 0 |
| $d_{TLT\psi Si}$ | −0.181721459 | 0 | 0 | 0 |
| $d_{TLT\theta LT}$ | 0 | 0 | 0 | −0.608943868 |
| $d_{TSTE}$ | 0 | 113.1914268 | −75.04640382 | −82.04954672 |
| $d_{TS\psi Si}$ | 0 | 0 | −0.554356722 | 0.673316097 |
| $d_{TS\theta LT}$ | 0 | 0 | 0 | 0 |
| $d_{TE\psi Si}$ | 0 | 0 | −0.512800103 | 0 |
| $d_{TE\theta LT}$ | 0 | 0 | −0.656702553 | 0 |
| $d_{\psi Si\theta LT}$ | 0 | 0 | 0 | 0 |
| e | −2.401219798 | −3.18651044 | −3.93030224 | −4.143483981 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

An acoustic wave device according to another preferred embodiment of the present invention includes a silicon support substrate, a silicon oxide film laminated above the silicon support substrate, a lithium tantalate film laminated above the silicon oxide film, an IDT electrode including an electrode finger and being provided above the lithium tantalate film, and a protection film covering at least a portion of the IDT electrode. When a wavelength determined by an electrode finger pitch of the IDT electrode is denoted by λ, a wavelength normalized film thickness of the lithium tantalate film is denoted by $T_{LT}$, θ of an Euler angle of the lithium tantalate film is denoted by $\theta_{LT}$, a wavelength normalized film thickness of the silicon oxide film is denoted by $T_S$, a wavelength normalized film thickness of the IDT electrode in terms of aluminum thickness being a product of a wavelength normalized film thickness of the IDT electrode and a value obtained when density of the IDT electrode is divided by density of aluminum is denoted by $T_E$, a wavelength normalized film thickness of the protection film being a product of a value obtained when density of the protection film is divided by density of silicon oxide and a wavelength normalized film thickness which is a thickness of the protection film normalized by the wavelength λ is denoted by $T_P$, a propagation direction in the silicon support substrate is denoted by $\psi_{Si}$, and a wavelength normalized film thickness which is a thickness of the silicon support substrate normalized by the wavelength λ, is denoted by $T_{Si}$, $T_{LT}$, $\theta_{LT}$, $T_S$, $T_E$, $T_P$, and $\psi_{Si}$ are set such that a value represented by Formula (1) below is larger than about −2.4:

$$I_h = \left(a_{T_{LT}}^{(2)}\left((T_{LT}-c_{T_{LT}})^2 - b_{T_{LT}}^{(2)}\right) + \right.$$
$$a_{T_{LT}}^{(1)}(T_{LT}-c_{T_{LT}}) + a_{T_S}^{(2)}\left((T_S-c_{T_S})^2 - b_{T_S}^{(2)}\right) + a_{T_S}^{(1)}(T_S-c_{T_S}) +$$
$$a_{T_E}^{(4)}\left((T_E-c_{T_E})^4 - b_{T_E}^{(4)}\right) + a_{T_E}^{(3)}\left((T_E-c_{T_E})^3 - b_{T_E}^{(3)}\right) +$$
$$a_{T_E}^{(2)}\left((T_E-c_{T_E})^2 - b_{T_E}^{(2)}\right) + a_{T_E}^{(1)}(T_E-c_{T_E}) +$$
$$a_{\psi_{Si}}^{(6)}\left((\Psi_{Si}-c_{\Psi_{Si}})^6 - b_{\Psi_{Si}}^{(6)}\right) + a_{\psi_{Si}}^{(5)}\left((\Psi_{Si}-c_{\Psi_{Si}})^5 - b_{\Psi_{Si}}^{(5)}\right) +$$
$$a_{\psi_{Si}}^{(4)}\left((\Psi_{Si}-c_{\Psi_{Si}})^4 - b_{\Psi_{Si}}^{(4)}\right) + a_{\psi_{Si}}^{(3)}\left((\Psi_{Si}-c_{\Psi_{Si}})^3 - b_{\Psi_{Si}}^{(3)}\right) +$$
$$a_{\psi_{Si}}^{(2)}\left((\Psi_{Si}-c_{\Psi_{Si}})^2 - b_{\Psi_{Si}}^{(2)}\right) + a_{\psi_{Si}}^{(1)}(\Psi_{Si}-c_{\Psi_{Si}}) +$$
$$a_{\theta_{LT}}^{(2)}\left((\theta_{LT}-c_{\theta_{LT}})^2 - b_{\theta_{LT}}^{(2)}\right) + a_{\theta_{LT}}^{(1)}(\theta_{LT}-c_{\theta_{LT}}) +$$
$$d_{T_{LT}T_S}(T_{LT}-c_{T_{LT}})(T_S-c_{T_S}) + d_{T_{LT}T_E}(T_{LT}-c_{T_{LT}})$$
$$(T_E-c_{T_E}) + d_{T_{LT}\Psi_{Si}}(T_{LT}-c_{T_{LT}})(\Psi_{Si}-c_{\Psi_{Si}}) +$$
$$d_{T_{LT}\theta_{LT}}(T_{LT}-c_{T_{LT}})(\theta_{LT}-c_{\theta_{LT}}) + d_{T_S T_E}(T_S-c_{T_S})(T_E-c_{T_E}) +$$
$$d_{T_S \Psi_{Si}}(T_S-c_{T_S})(\Psi_{Si}-c_{\Psi_{Si}}) + d_{T_S \theta_{LT}}(T_S-c_{T_S})(\theta_{LT}-c_{\theta_{LT}}) +$$
$$d_{T_E \Psi_{Si}}(T_E-c_{T_E})(\Psi_{Si}-c_{\Psi_{Si}}) + d_{T_E \theta_{LT}}(T_E-c_{T_E})(\theta_{LT}-c_{\theta_{LT}}) +$$
$$d_{\Psi_{Si}\theta_{LT}}(\Psi_{Si}-c_{\Psi_{Si}})(\theta_{LT}-c_{\theta_{LT}}) + e\Big)$$
$$\left(a_{T_P}T_P^4 + b_{T_P}T_P^3 + c_{T_P}T_P^2 + d_{T_P}T_P + f_{T_P}\right).$$

Coefficients a, b, c, d, e, and f in Formula (1) are values described in Table 25 to Table 36 below that are determined in accordance with the crystal orientation of the silicon support substrate and the range of $T_S$, $T_{LT}$, and $\psi_{Si}$:

TABLE 25

| | Si (100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $a_{TLT}{}^{(2)}$ | 0 | 0 |
| $a_{TLT}{}^{(1)}$ | −16.39135605 | −16.39135605 |
| $b_{TLT}{}^{(2)}$ | 0 | 0 |
| $c_{TLT}$ | 0.196774194 | 0.196774194 |
| $a_{TS}{}^{(2)}$ | 0 | 0 |
| $a_{TS}{}^{(1)}$ | −4.824831305 | −4.824831305 |
| $b_{TS}{}^{(2)}$ | 0 | 0 |
| $c_{TS}$ | 0.170967742 | 0.170967742 |
| $a_{TE}{}^{(4)}$ | 0 | 0 |
| $a_{TE}{}^{(3)}$ | 0 | 0 |
| $a_{TE}{}^{(2)}$ | −45.57608817 | −45.57608817 |
| $a_{TE}{}^{(1)}$ | −10.80005563 | −10.80005563 |
| $b_{TE}{}^{(4)}$ | 0 | 0 |
| $b_{TE}{}^{(3)}$ | 0 | 0 |
| $b_{TE}{}^{(2)}$ | 0.018296046 | 0.018296046 |

TABLE 25-continued

| | Si (100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $c_{TE}$ | 0.303225806 | 0.303225806 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000172048 | 0.000172048 |
| $a_{\psi Si}^{(2)}$ | −0.00384923 | −0.00384923 |
| $a_{\psi Si}^{(1)}$ | −0.009826773 | −0.009826773 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 143.0843208 | 143.0843208 |
| $b_{\psi Si}^{(2)}$ | 215.8688866 | 215.8688866 |
| $c_{\psi Si}$ | 22.25806452 | 22.25806452 |
| $a_{\theta LT}^{(2)}$ | 0 | 0 |
| $a_{\theta LT}^{(1)}$ | 0.066799879 | 0.066799879 |
| $b_{\theta LT}^{(2)}$ | 0 | 0 |
| $c_{\theta LT}$ | −50.16129032 | −50.16129032 |
| $d_{TLTTS}$ | 0 | 0 |
| $d_{TLTTE}$ | −112.847682 | −112.847682 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | −1.750763196 | −1.750763196 |
| $d_{TS\theta LT}$ | 0 | 0 |
| $d_{TE\psi Si}$ | 0 | 0 |
| $d_{TE\theta LT}$ | 0.466692151 | 0.466692151 |
| $d_{\psi Si\theta LT}$ | 0 | 0 |
| e | −2.904746788 | −2.904746788 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 26

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −8.135537689 | −8.135537689 |
| $b_{TLT}^{(2)}$ | 0 | 0 |
| $c_{TLT}$ | 0.311659193 | 0.311659193 |
| $a_{TS}^{(2)}$ | 0 | 0 |
| $a_{TS}^{(1)}$ | −20.38200282 | −20.38200282 |
| $b_{TS}^{(2)}$ | 0 | 0 |
| $c_{TS}$ | 0.149327354 | 0.149327354 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.460675692 | −3.460675692 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.267488789 | 0.267488789 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.003759233 | −0.003759233 |
| $a_{\psi Si}^{(1)}$ | 0.015931998 | 0.015931998 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 239.0395946 | 239.0395946 |
| $c_{\psi Si}$ | 18.90134529 | 18.90134529 |
| $a_{\theta LT}^{(2)}$ | 0 | 0 |

TABLE 26-continued

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{\theta LT}^{(1)}$ | 0.017576249 | 0.017576249 |
| $b_{\theta LT}^{(2)}$ | 0 | 0 |
| $c_{\theta LT}$ | −49.9103139 | −49.9103139 |
| $d_{TLTTS}$ | −152.1817236 | −152.1817236 |
| $d_{TLTTE}$ | 0 | 0 |
| $d_{TLT\psi Si}$ | −0.359387178 | −0.359387178 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0.911415415 | 0.911415415 |
| $d_{TE\psi Si}$ | 0 | 0 |
| $d_{TE\theta LT}$ | 0.275815872 | 0.275815872 |
| $d_{\psi Si\theta LT}$ | 0 | 0 |
| e | −3.952626598 | −3.952626598 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 27

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −26.36951471 | −26.36951471 |
| $b_{TLT}^{(2)}$ | 0 | 0 |
| $c_{TLT}$ | 0.161538462 | 0.161538462 |
| $a_{TS}^{(2)}$ | 0 | 0 |
| $a_{TS}^{(1)}$ | −10.09828536 | −10.09828536 |
| $b_{TS}^{(2)}$ | 0 | 0 |
| $c_{TS}$ | 0.321025641 | 0.321025641 |
| $a_{TE}^{(4)}$ | 0 | 0 |
| $a_{TE}^{(3)}$ | 0 | 0 |
| $a_{TE}^{(2)}$ | −21.38297597 | −21.38297597 |
| $a_{TE}^{(1)}$ | −2.383287449 | −2.383287449 |
| $b_{TE}^{(4)}$ | 0 | 0 |
| $b_{TE}^{(3)}$ | 0 | 0 |
| $b_{TE}^{(2)}$ | 0.01947666 | 0.01947666 |
| $c_{TE}$ | 0.270512821 | 0.270512821 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000176024 | 0.000176024 |
| $a_{\psi Si}^{(2)}$ | −0.001397911 | −0.001397911 |
| $a_{\psi Si}^{(1)}$ | −0.107515297 | −0.107515297 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −282.3623122 | −282.3623122 |
| $b_{\psi Si}^{(2)}$ | 255.2071006 | 255.2071006 |
| $c_{\psi Si}$ | 23.84615385 | 23.84615385 |
| $a_{\theta LT}^{(2)}$ | 0 | 0 |
| $a_{\theta LT}^{(1)}$ | 0.085112984 | 0.085112984 |
| $b_{\theta LT}^{(2)}$ | 0 | 0 |
| $c_{\theta LT}$ | −48.97435897 | −48.97435897 |
| $d_{TLTTS}$ | 0 | 0 |
| $d_{TLTTE}$ | 0 | 0 |
| $d_{TLT\psi Si}$ | −0.816828716 | −0.816828716 |
| $d_{TLT\theta LT}$ | 0.865519967 | 0.865519967 |
| $d_{TSTE}$ | 0 | 0 |
| $d_{TS\psi Si}$ | −0.538336559 | −0.538336559 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.002971652 | 0.002971652 |
| e | −3.504362202 | −3.504362202 |

TABLE 27-continued

Si (100)
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 28

Si (100)
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −6.371850196 | −6.371850196 |
| $b_{TLT}^{(2)}$ | 0 | 0 |
| $c_{TLT}$ | 0.292192192 | 0.292192192 |
| $a_{TS}^{(2)}$ | 0 | 0 |
| $a_{TS}^{(1)}$ | −0.609606885 | −0.609606885 |
| $b_{TS}^{(2)}$ | 0 | 0 |
| $c_{TS}$ | 0.2996997 | 0.2996997 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | 0 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0 |
| $a_{\psi Si}^{(6)}$ | 0 | 0 |

TABLE 28-continued

Si (100)
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{\psi Si}^{(5)}$ | 0 | 0 |
| $a_{\psi Si}^{(4)}$ | 0 | 0 |
| $a_{\psi Si}^{(3)}$ | 0.000224133 | 0.000224133 |
| $a_{\psi Si}^{(2)}$ | −0.004048532 | −0.004048532 |
| $a_{\psi Si}^{(1)}$ | −0.126847922 | −0.126847922 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 1375.85979 | 1375.85979 |
| $b_{\psi Si}^{(2)}$ | 281.2555799 | 281.2555799 |
| $c_{\psi Si}$ | 19.77477477 | 19.77477477 |
| $a_{\theta LT}^{(2)}$ | 0 | 0 |
| $a_{\theta LT}^{(1)}$ | 0.056146223 | 0.056146223 |
| $b_{\theta LT}^{(2)}$ | 0 | 0 |
| $c_{\theta LT}$ | −49.48948949 | −49.48948949 |
| $d_{TLTTS}$ | 94.47145497 | 94.47145497 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.568942451 | −0.568942451 |
| $d_{TE\psi Si}$ | 0 | 0 |
| $d_{TE\theta LT}$ | 0 | 0 |
| $d_{\psi Si\theta LT}$ | 0.005654813 | 0.005654813 |
| e | −4.940340284 | −4.940340284 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 29

Si (110)
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −11.04825287 | −11.04825287 | −11.04825287 | −11.04825287 |
| $b_{TLT}^{(2)}$ | 0 | 0 | 0 | 0 |
| $c_{TLT}$ | 0.164705882 | 0.164705882 | 0.164705882 | 0.164705882 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.86806521 | −12.86806521 | −12.86806521 | −12.86806521 |
| $a_{TE}^{(1)}$ | 39.88235294 | 39.88235294 | 39.88235294 | 39.88235294 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.019258131 | 0.019258131 | 0.019258131 | 0.019258131 |
| $c_{TE}$ | 0.286470588 | 0.286470588 | 0.286470588 | 0.286470588 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.000762445 | −0.000762445 | −0.000762445 | −0.000762445 |
| $a_{\psi Si}^{(1)}$ | −0.031584918 | −0.031584918 | −0.031584918 | −0.031584918 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 749.7716263 | 749.7716263 | 749.7716263 | 749.7716263 |
| $c_{\psi Si}$ | 52.58823529 | 52.58823529 | 52.58823529 | 52.58823529 |

TABLE 29-continued

Si (110)
$0 < T_{LT} < 0.2$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{\theta LT}^{(2)}$ | −0.004115091 | −0.004115091 | −0.004115091 | −0.004115091 |
| $a_{\theta LT}^{(1)}$ | 0.023260981 | 0.023260981 | 0.023260981 | 0.023260981 |
| $b_{\theta LT}^{(2)}$ | 81.16262976 | 81.16262976 | 81.16262976 | 81.16262976 |
| $c_{\theta LT}$ | −50.11764706 | −50.11764706 | −50.11764706 | −50.11764706 |
| $d_{TLTTS}$ | 0 | 0 | 0 | 0 |
| $d_{TLTTE}$ | −32.35244505 | −32.35244505 | −32.35244505 | −32.35244505 |
| $d_{TLT\psi Si}$ | 0.348515389 | 0.348515389 | 0.348515389 | 0.348515389 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.000823202 | 0.000823202 | 0.000823202 | 0.000823202 |
| e | −1.678155024 | −1.678155024 | −1.678155024 | −1.678155024 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 30

Si (110)
$0.2 \leq TLT \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 34.01092867 | 34.01092867 |
| $a_{TLT}^{(1)}$ | −3.294448859 | −3.294448859 | −2.996122319 | −2.996122319 |
| $b_{TLT}^{(2)}$ | 0 | 0 | 0.005572031 | 0.005572031 |
| $c_{TLT}$ | 0.328378378 | 0.328378378 | 0.31344086 | 0.31344086 |
| $a_{TS}^{(2)}$ | 0 | 0 | 0 | 0 |
| $a_{TS}^{(1)}$ | 2.752851676 | 2.752851676 | −1.564359965 | −1.564359965 |
| $b_{TS}^{(2)}$ | 0 | 0 | 0 | 0 |
| $c_{TS}$ | 0.162837838 | 0.162837838 | 0.160752688 | 0.160752688 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −4.548790211 | −4.548790211 | −1.370514553 | −1.370514553 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.165540541 | 0.165540541 | 0.355913978 | 0.355913978 |
| $a_{\psi Si}^{(6)}$ | 0 | 0 | 0 | 0 |
| $a_{\psi Si}^{(5)}$ | −7.03888E−08 | −7.03888E−08 | −3.78178E−08 | −3.78178E−08 |
| $a_{\psi Si}^{(4)}$ | 1.4265E−06 | 1.4265E−06 | 9.79065E−07 | 9.79065E−07 |
| $a_{\psi Si}^{(3)}$ | 0.000180358 | 0.000180358 | 9.73597E−05 | 9.73597E−05 |
| $a_{\psi Si}^{(2)}$ | −0.002681874 | −0.002681874 | −0.00192926 | −0.00192926 |
| $a_{\psi Si}^{(1)}$ | −0.092266284 | −0.092266284 | −0.04329175 | −0.04329175 |
| $b_{\psi Si}^{(6)}$ | 0 | 0 | 0 | 0 |
| $b_{\psi Si}^{(5)}$ | 11701030.08 | 11701030.08 | 24265475.25 | 24265475.25 |
| $b_{\psi Si}^{(4)}$ | 1439156.296 | 1439156.296 | 1705613.393 | 1705613.393 |
| $b_{\psi Si}^{(3)}$ | 1798.436559 | 1798.436559 | 6938.899332 | 6938.899332 |
| $b_{\psi Si}^{(2)}$ | 930.5183985 | 930.5183985 | 1060.880593 | 1060.880593 |
| $c_{\psi Si}$ | 40.23648649 | 40.23648649 | 40.08064516 | 40.08064516 |
| $a_{\theta LT}^{(2)}$ | 0 | 0 | 0 | 0 |
| $a_{\theta LT}^{(1)}$ | 0.046000242 | 0.046000242 | 0.001380272 | 0.001380272 |
| $b_{\theta LT}^{(2)}$ | 0 | 0 | 0 | 0 |
| $c_{\theta LT}$ | −49.52702703 | −49.52702703 | −50.05376344 | −50.05376344 |
| $d_{TLTTS}$ | −136.9978702 | −136.9978702 | −73.06084164 | −73.06084164 |
| $d_{TLTTE}$ | 0 | 0 | 0 | 0 |
| $d_{TLT\psi Si}$ | 0 | 0 | 0.096651605 | 0.096651605 |
| $d_{TLT\theta LT}$ | 0 | 0 | 0 | 0 |
| $d_{TSTE}$ | 0 | 0 | −56.78924979 | −56.78924979 |
| $d_{TS\psi Si}$ | 0 | 0 | 0 | 0 |

TABLE 30-continued

Si (110)
0.2 ≤ TLT ≤ 3.5
0 ≤ $T_S$ < 0.2

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $d_{TS\theta LT}$ | 0 | 0 | 0 | 0 |
| $d_{TE\psi Si}$ | 0.081014811 | 0.081014811 | 0 | 0 |
| $d_{TE\theta LT}$ | 0 | 0 | −0.194432704 | −0.194432704 |
| $d_{\psi Si\theta LT}$ | 0 | 0 | 0.000875955 | 0.000875955 |
| e | −2.543790382 | −2.543790382 | −2.964933907 | −2.964933907 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 31

Si (110)
0 < $T_{LT}$ < 0.2
0.2 ≤ $T_S$ ≤ 2.0

| | 0.05 ≤ $T_E$ < 0.25 | | 0.25 ≤ $T_E$ ≤ 0.45 | |
|---|---|---|---|---|
| | 0 ≤ $\psi_{Si}$ < 45 | 45 ≤ $\psi_{Si}$ ≤ 90 | 0 ≤ $\psi_{Si}$ < 45 | 45 ≤ $\psi_{Si}$ ≤ 90 |
| $a_{TLT}^{(2)}$ | 0 | 0 | 0 | 0 |
| $a_{TLT}^{(1)}$ | −13.1565646 | −13.1565646 | −13.1565646 | −13.1565646 |
| $b_{TLT}^{(2)}$ | 0 | 0 | 0 | 0 |
| $c_{TLT}$ | 0.179661017 | 0.179661017 | 0.179661017 | 0.179661017 |
| $a_{TS}^{(2)}$ | −54.97015257 | −54.97015257 | 54.97015257 | 54.97015257 |
| $a_{TS}^{(1)}$ | 1.195559996 | 1.195559996 | 1.195559996 | 1.195559996 |
| $b_{TS}^{(2)}$ | 0.006496856 | 0.006496856 | 0.006496856 | 0.006496856 |
| $c_{TS}$ | 0.299435028 | 0.299435028 | 0.299435028 | 0.299435028 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.83875925 | −12.83875925 | −12.83875925 | −12.83875925 |
| $a_{TE}^{(1)}$ | −2.591177902 | −2.591177902 | −2.591177902 | −2.591177902 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.02062115 | 0.02062115 | 0.02062115 | 0.02062115 |
| $c_{TE}$ | 0.282768362 | 0.282768362 | 0.282768362 | 0.282768362 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00094978 | −0.00094978 | −0.00094978 | −0.00094978 |
| $a_{\psi Si}^{(1)}$ | −0.016861509 | −0.016861509 | −0.016861509 | −0.016861509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | −0.00094978 | −0.00094978 | −0.00094978 | −0.00094978 |
| $c_{\psi Si}$ | 44.83050847 | 44.83050847 | 44.83050847 | 44.83050847 |
| $a_{\theta LT}^{(2)}$ | 0 | 0 | 0 | 0 |
| $a_{\theta LT}^{(1)}$ | 0.020120147 | 0.020120147 | 0.020120147 | 0.020120147 |
| $b_{\theta LT}^{(2)}$ | 0 | 0 | 0 | 0 |
| $c_{\theta LT}$ | −50.50847458 | −50.50847458 | −50.50847458 | −50.50847458 |
| $d_{TLTTS}$ | 0 | 0 | 0 | 0 |
| $d_{TLTTE}$ | 0 | 0 | 0 | 0 |
| $d_{TLT\psi Si}$ | 0.250474306 | 0.250474306 | 0.250474306 | 0.250474306 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.031071552 | 0.031071552 | 0.031071552 | 0.031071552 |
| $d_{TE\theta LT}$ | 0 | 0 | 0 | 0 |
| $d_{\psi Si\theta LT}$ | 0 | 0 | 0 | 0 |
| e | −1.687640015 | −1.687640015 | −1.687640015 | −1.687640015 |
| $a_{TP}$ | 0 | 0 | 0 | 0 |
| $b_{TP}$ | 0 | 0 | 0 | 0 |

TABLE 31-continued

| | Si (110) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $c_{TP}$ | 19.811 | 19.811 | 19.811 | 19.811 |
| $d_{TP}$ | −11.953 | −11.953 | 11.953 | −11.953 |
| $f_{TP}$ | 1.1978 | 1.1978 | 1.1978 | 1.1978 |

TABLE 32

| | Si (110) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −8.387315737 | −8.387315737 | −11.34973266 | −6.017883428 |
| $b_{TLT}^{(2)}$ | 0 | 0 | 0 | 0 |
| $c_{TLT}$ | 0.313377926 | 0.313377926 | 0.291082803 | 0.294578313 |
| $a_{TS}^{(2)}$ | 0 | 0 | 0 | 0 |
| $a_{TS}^{(1)}$ | 0.140898252 | 0.140898252 | 3.107378473 | 2.287606243 |
| $b_{TS}^{(2)}$ | 0 | 0 | 0 | 0 |
| $c_{TS}$ | 0.299331104 | 0.299331104 | 0.277707006 | 0.296385542 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −1.209727849 | −1.209727849 | −4.259242642 | −1.280235687 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.152006689 | 0.152006689 | 0.343630573 | 0.351204819 |
| $a_{\psi Si}^{(6)}$ | 0 | 0 | 0 | 0 |
| $a_{\psi Si}^{(5)}$ | −2.33027E−08 | −2.33027E−08 | 0 | 0 |
| $a_{\psi Si}^{(4)}$ | 7.78115E−07 | 7.78115E−07 | 0 | 0 |
| $a_{\psi Si}^{(3)}$ | 5.59108E−05 | 5.59108E−05 | −0.000194818 | 0 |
| $a_{\psi Si}^{(2)}$ | −0.002410767 | −0.002410767 | 0.000247924 | 0 |
| $a_{\psi Si}^{(1)}$ | −0.027662563 | −0.027662563 | 0.12904143 | −0.026766472 |
| $b_{\psi Si}^{(6)}$ | 0 | 0 | 0 | 0 |
| $b_{\psi Si}^{(5)}$ | 2083705.649 | 2083705.649 | 0 | 0 |
| $b_{\psi Si}^{(4)}$ | 1386257.115 | 1386257.115 | 0 | 0 |
| $b_{\psi Si}^{(3)}$ | −1267.41343 | −1267.41343 | 1811.750092 | 0 |
| $b_{\psi Si}^{(2)}$ | 895.5856198 | 895.5856198 | 293.105197 | 0 |
| $c_{\psi Si}$ | 42.14046823 | 42.14046823 | 19.39490446 | 67.95180723 |
| $a_{\theta LT}^{(2)}$ | 0 | 0 | 0 | 0 |
| $a_{\theta LT}^{(1)}$ | 0.020067585 | 0.020067585 | −0.011988832 | 0.032566601 |
| $b_{\theta LT}^{(2)}$ | 0 | 0 | 0 | 0 |
| $c_{\theta LT}$ | −49.73244147 | −49.73244147 | −49.61783439 | −50.96385542 |
| $d_{TLTTS}$ | 0 | 0 | 0 | 0 |
| $d_{TLTTE}$ | 0 | 0 | 0 | 41.29194486 |
| $d_{TLT\psi Si}$ | 0 | 0 | −0.203585177 | 0.376861254 |
| $d_{TLT\theta LT}$ | 0 | 0 | −0.273779971 | 0 |
| $d_{TSTE}$ | 0 | 0 | 0 | 0 |
| $d_{TS\psi Si}$ | 0 | 0 | 0 | −0.20937463 |
| $d_{TS\theta LT}$ | −0.349110894 | −0.349110894 | 0 | 0 |
| $d_{TE\psi Si}$ | 0 | 0 | 0 | 0 |
| $d_{TE\theta LT}$ | −0.216865482 | −0.216865482 | 0 | 0 |
| $d_{\psi Si\theta LT}$ | 0 | 0 | 0.00120304 | 0 |
| e | −2.390757235 | −2.390757235 | −2.548464154 | 2.523994879 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 33

Si (111)
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −3.047618237 | −3.047618237 | −3.047618237 | −3.047618237 |
| $b_{TLT}^{(2)}$ | 0 | 0 | 0 | 0 |
| $c_{TLT}$ | 0.160869565 | 0.160869565 | 0.160869565 | 0.160869565 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 11.21750437 | 11.21750437 | 11.21750437 | 11.21750437 |
| $a_{TE}^{(2)}$ | −3.666215654 | −3.666215654 | −3.666215654 | −3.666215654 |
| $a_{TE}^{(1)}$ | −0.035248162 | −0.035248162 | −0.035248162 | −0.035248162 |
| $b_{TE}^{(4)}$ | 0 | 0 | 0 | 0 |
| $b_{TE}^{(3)}$ | 0.000381688 | 0.000381688 | 0.000381688 | 0.000381688 |
| $b_{TE}^{(2)}$ | 0.012589792 | 0.012589792 | 0.012589792 | 0.012589792 |
| $c_{TE}$ | 0.245652174 | 0.245652174 | 0.245652174 | 0.245652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.003582211 | −0.003582211 | −0.003582211 | −0.003582211 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 35.86956522 | 35.86956522 | 35.86956522 | 35.86956522 |
| $a_{\theta LT}^{(2)}$ | −0.000596775 | −0.000596775 | −0.000596775 | −0.000596775 |
| $a_{\theta LT}^{(1)}$ | 0.003385783 | 0.003385783 | 0.003385783 | 0.003385783 |
| $b_{\theta LT}^{(2)}$ | 77.88279773 | 77.88279773 | 77.88279773 | 77.88279773 |
| $c_{\theta LT}$ | −47.82608696 | −47.82608696 | −47.82608696 | −47.82608696 |
| $d_{TLTTS}$ | 0 | 0 | 0 | 0 |
| $d_{TLTTE}$ | −2.939323227 | −2.939323227 | −2.939323227 | −2.939323227 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.000442922 | −0.000442922 | −0.000442922 | −0.000442922 |
| $e$ | −0.277577227 | −0.277577227 | −0.277577227 | −0.277577227 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 34

Si (111)
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 6.03484153 | 6.03484153 | 6.03484153 | 6.03484153 |
| $b_{TS}^{(2)}$ | 0 | 0 | 0 | 0 |
| $c_{TS}$ | 0.183333333 | 0.183333333 | 0.183333333 | 0.183333333 |
| $a_{TE}^{(4)}$ | 215.3850281 | −215.3850281 | 215.3850281 | −215.3850281 |
| $a_{TE}^{(3)}$ | 54.12265846 | 54.12265846 | 54.12265846 | 54.12265846 |

TABLE 34-continued

| | Si (111) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TE}^{(2)}$ | 0.942905209 | 0.942905209 | 0.942905209 | 0.942905209 |
| $a_{TE}^{(1)}$ | −1.08045121 | −1.08045121 | −1.08045121 | −1.08045121 |
| $b_{TE}^{(4)}$ | 0.000339332 | 0.000339332 | 0.000339332 | 0.000339332 |
| $b_{TE}^{(3)}$ | 0.000317558 | 0.000317558 | 0.000317558 | 0.000317558 |
| $b_{TE}^{(2)}$ | 0.011265432 | 0.011265432 | 0.011265432 | 0.011265432 |
| $c_{TE}$ | 0.211111111 | 0.211111111 | 0.211111111 | 0.211111111 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004526908 | −0.004526908 | −0.004526908 | −0.004526908 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 27.5 | 27.5 | 27.5 | 27.5 |
| $a_{\theta LT}^{(2)}$ | −0.00046365 | −0.00046365 | −0.00046365 | −0.00046365 |
| $a_{\theta LT}^{(1)}$ | 0.005349146 | 0.005349146 | 0.005349146 | 0.005349146 |
| $b_{\theta LT}^{(2)}$ | 57.09876543 | 57.09876543 | 57.09876543 | 57.09876543 |
| $c_{\theta LT}$ | −46.11111111 | −46.11111111 | −46.11111111 | −46.11111111 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 45.80413521 | 45.80413521 | 45.80413521 | 45.80413521 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | −0.071786246 | −0.071786246 | −0.071786246 | −0.071786246 |
| $d_{\psi Si\theta LT}$ | −0.000425881 | −0.000425881 | −0.000425881 | −0.000425881 |
| e | −0.446604617 | −0.446604617 | −0.446604617 | −0.446604617 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 35

| | Si (111) $0 < T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −2.477108842 | −2.477108842 | −2.477108842 | −2.477108842 |
| $b_{TLT}^{(2)}$ | 0 | 0 | 0 | 0 |
| $c_{TLT}$ | 0.137349398 | 0.137349398 | 0.137349398 | 0.137349398 |
| $a_{TS}^{(2)}$ | 0 | 0 | 0 | 0 |
| $a_{TS}^{(1)}$ | −0.488747927 | −0.488747927 | −0.488747927 | −0.488747927 |
| $b_{TS}^{(2)}$ | 0 | 0 | 0 | 0 |
| $c_{TS}$ | 0.336144578 | 0.336144578 | 0.336144578 | 0.336144578 |
| $a_{TE}^{(4)}$ | 0 | 0 | 0 | 0 |
| $a_{TE}^{(3)}$ | 0 | 0 | 0 | 0 |
| $a_{TE}^{(2)}$ | −1.973253274 | −1.973253274 | −1.973253274 | −1.973253274 |
| $a_{TE}^{(1)}$ | −0.124870592 | −0.124870592 | −0.124870592 | −0.124870592 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.017915517 | 0.017915517 | 0.017915517 | 0.017915517 |
| $c_{TE}$ | 0.256024096 | 0.256024096 | 0.256024096 | 0.256024096 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 7.6083E−07 | 7.6083E−07 | 7.6083E−07 | 7.6083E−07 |
| $a_{\psi Si}^{(3)}$ | 7.21121E−06 | 7.21121E−06 | 7.21121E−06 | 7.21121E−06 |

TABLE 35-continued

| | Si (111) $0 < T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{\psi Si}^{(2)}$ | −0.000857107 | −0.000857107 | −0.000857107 | −0.000857107 |
| $a_{\psi Si}^{(1)}$ | −0.00490823 | −0.00490823 | −0.00490823 | −0.00490823 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 105622.9088 | 105622.9088 | 105622.9088 | 105622.9088 |
| $b_{\psi Si}^{(3)}$ | −217.2019476 | −217.2019476 | −217.2019476 | −217.2019476 |
| $b_{\psi Si}^{(2)}$ | 208.4409929 | 208.4409929 | 208.4409929 | 208.4409929 |
| $c_{\psi Si}$ | 30.54216867 | 30.54216867 | 30.54216867 | 30.54216867 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | 4.821777856 | 4.821777856 | 4.821777856 | 4.821777856 |
| $d_{TLTTE}$ | −4.14067246 | −4.14067246 | −4.14067246 | −4.14067246 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.024454063 | 0.024454063 | 0.024454063 | 0.024454063 |
| $d_{TE\theta LT}$ | 0 | 0 | 0 | 0 |
| $d_{\psi Si\theta LT}$ | 0 | 0 | 0 | 0 |
| e | −0.240178915 | −0.240178915 | −0.240178915 | −0.240178915 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 36

| | Si (111) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 0.380779889 | 0.380779889 | 0.380779889 | 0.380779889 |
| $b_{TS}^{(2)}$ | 0 | 0 | 0 | 0 |
| $c_{TS}$ | 0.285294118 | 0.285294118 | 0.285294118 | 0.285294118 |
| $a_{TE}^{(4)}$ | −165.3225345 | −165.3225345 | −165.3225345 | −165.3225345 |
| $a_{TE}^{(3)}$ | 23.65923214 | 23.65923214 | 23.65923214 | 23.65923214 |
| $a_{TE}^{(2)}$ | 2.256295059 | 2.256295059 | 2.256295059 | 2.256295059 |
| $a_{TE}^{(1)}$ | −0.292409126 | −0.292409126 | −0.292409126 | −0.292409126 |
| $b_{TE}^{(4)}$ | 0.00051583 | 0.00051583 | 0.00051583 | 0.00051583 |
| $b_{TE}^{(3)}$ | 0.00070344 | 0.00070344 | 0.00070344 | 0.00070344 |
| $b_{TE}^{(2)}$ | 0.015017301 | 0.015017301 | 0.015017301 | 0.015017301 |
| $c_{TE}$ | 0.220588235 | 0.220588235 | 0.220588235 | 0.220588235 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004846255 | −0.004846255 | −0.004846255 | −0.004846255 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 29.55882353 | 29.55882353 | 29.55882353 | 29.55882353 |
| $a_{\theta LT}^{(2)}$ | 0 | 0 | 0 | 0 |
| $a_{\theta LT}^{(1)}$ | 0.00165846 | 0.00165846 | 0.00165846 | 0.00165846 |

TABLE 36-continued

| | Si (111) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\theta LT}$ [(2)] | 0 | 0 | 0 | 0 |
| $c_{\theta LT}$ | −48.52941176 | −48.52941176 | −48.52941176 | −48.52941176 |
| $d_{TLTTS}$ | −0.04933649 | −0.04933649 | −0.04933649 | −0.04933649 |
| $d_{TLTTE}$ | −0.021023839 | −0.021023839 | −0.021023839 | 0.021023839 |
| $d_{TLT\psi Si}$ | 0 | 0 | 0 | 0 |
| $d_{TLT\theta LT}$ | 0 | 0 | 0 | 0 |
| $d_{TSTE}$ | −7.074776252 | −7.074776252 | −7.074776252 | −7.074776252 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.00049898 | −0.00049898 | −0.00049898 | −0.00049898 |
| e | −0.3405485 | −0.3405485 | −0.3405485 | −0.3405485 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

An acoustic wave filter according to a preferred embodiment of the present invention includes a plurality of resonators, and at least one of the plurality of resonators is defined by an acoustic wave device according to a preferred embodiment of the present invention.

A composite filter device according to a preferred embodiment of the present invention includes N band pass filters having different pass bands where N is two or more, and one terminal of each of the N band pass filters is connected in common on an antenna terminal side. At least one of the N band pass filters excluding a band pass filter having a highest pass band includes one or more acoustic wave resonators. At least one of the one or more acoustic wave resonators is defined by an acoustic wave device according to a preferred embodiment of the present invention.

According to preferred embodiments of the present invention, it is possible to provide acoustic wave devices that are each less likely to generate a ripple in another acoustic wave filter that is connected in common, and to provide acoustic wave filters and composite filter devices that each include an acoustic wave device according to a preferred embodiment of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by the description of preferred embodiments of the present invention with reference to drawings.

It should be noted that the preferred embodiments described in this description are merely exemplary, and that a partial replacement or a combination of configurations is possible between the different preferred embodiments.

Figure 1A:
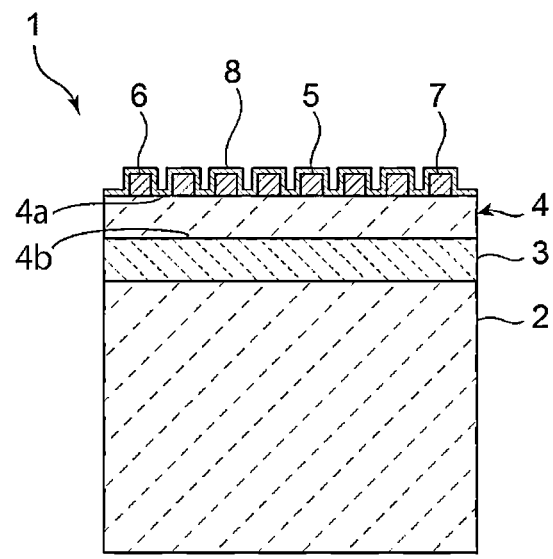
FIGS. 1A and 1B are a schematic front sectional view of an acoustic wave device according to a first preferred embodiment of the present invention, and a schematic plan view of the acoustic wave device according to the first preferred embodiment of the present invention illustrating an electrode structure thereof.
Figure 1B:
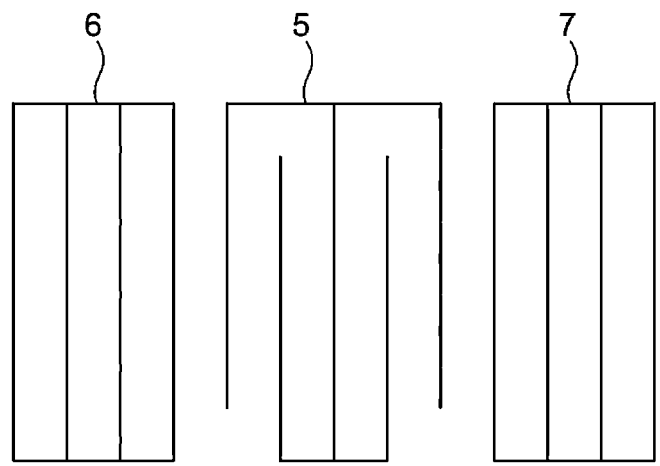

FIG. 1A is a schematic front sectional view of an acoustic wave device according to a first preferred embodiment of the present invention and FIG. 1B is a schematic plan view of an electrode structure thereof.

An acoustic wave device 1 is a one-port acoustic wave resonator. The acoustic wave device 1 includes a single crystal Si layer 2 defining and functioning as a support substrate. A SiO$_2$ film 3 as a silicon oxide film and a lithium tantalate film (LiTaO$_3$ film) 4 are laminated above the single crystal Si layer 2. The lithium tantalate film 4 includes a first main surface 4a and a second main surface 4b opposite to each other. An IDT electrode 5 is provided above the first main surface 4a. Reflectors 6 and 7 are provided on both sides of the IDT electrode 5 in an acoustic wave propagation direction. The SiO$_2$ film 3 as the silicon oxide film may include not only SiO$_2$, but also silicon oxide, for example, in which SiO$_2$ is doped with fluorine or the like. The silicon oxide film may be, for example, a multilayer structure including a plurality of layers made of silicon oxide. An intermediate layer made of, for example, titanium, nickel, or the like may be included between the plurality of layers. The thickness of the silicon oxide film in this case means the thickness of the entire multilayer structure.

A protection film 8 covers the IDT electrode 5 and the reflectors 6 and 7. The protection film 8 is preferably, for example, a silicon oxide film in the present preferred embodiment. However, the protection film 8 may be a film made of various dielectrics such as, for example, silicon oxynitride, silicon nitride, or the like. In addition, in the present preferred embodiment, the protection film 8 covers not only the upper side of an electrode finger of the IDT electrode 5, but also the upper surface of the lithium tantalate film 4 and the side surfaces of the electrode finger. However, the configuration of the protection film 8 is not limited thereto.

The inventors of preferred embodiments of the present application have discovered that responses are generated by spurious responses A, B, and C described below in the acoustic wave resonator in which a lithium tantalate film is laminated directly on or indirectly above the single crystal Si layer 2.

Figure 2:
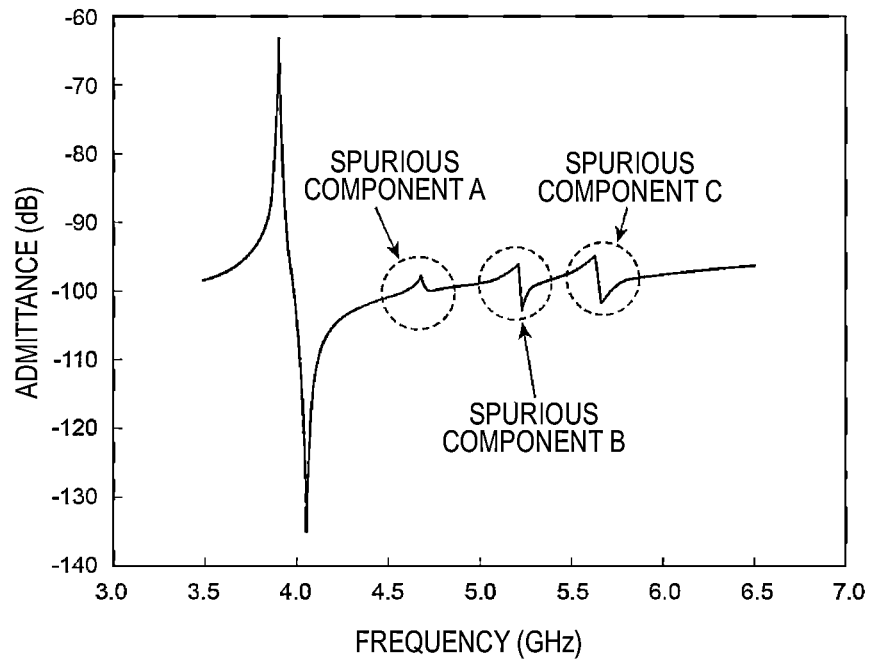
FIG. 2 is a graph showing the admittance characteristic of an acoustic wave resonator.
Figure 3:
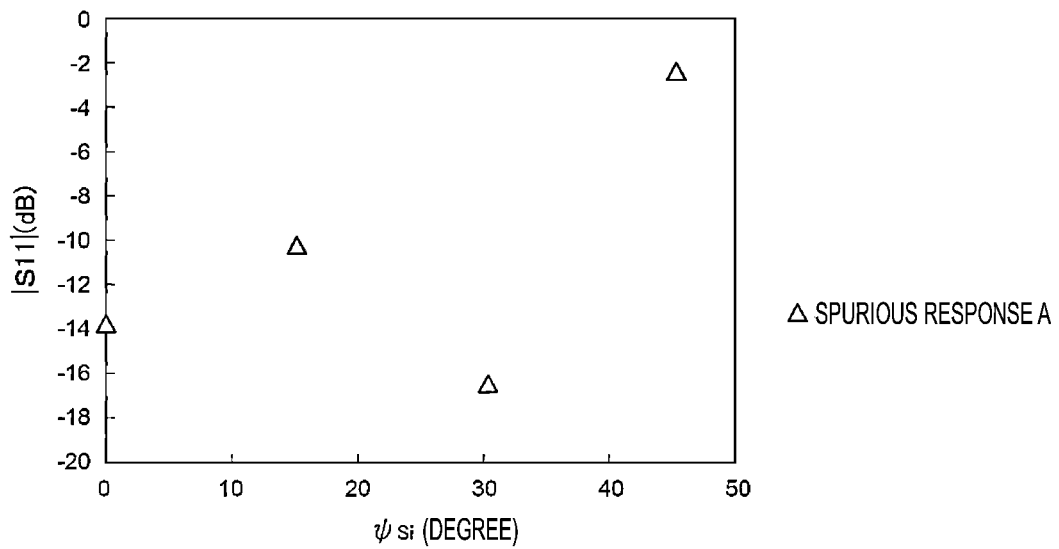
FIG. 3 is a graph showing the relationship between a propagation direction $\psi_{Si}$ in a single crystal Si layer and an intensity S11 of a response of a spurious response A.

FIG. 2 is a graph showing the admittance characteristic of the acoustic wave resonator for describing the spurious responses A, B, and C. The admittance characteristic described in FIG. 2 is the admittance characteristic of the acoustic wave resonator with the following design parameters, and not of a preferred embodiment of the present invention.

Euler angles ($\varphi_{Si}$, $\theta_{Si}$, $\psi_{Si}$) of the single crystal Si layer are (0°, 0°, 45°). The film thickness of the $SiO_2$ film is about 0.30λ, the film thickness of the lithium tantalate film is about 0.30λ, and the Euler angles ($\varphi_{LT}$, $\theta_{LT}$, $\psi_{LT}$) of the lithium tantalate film are (0°, −40°, 0°). The wavelength λ determined by the electrode finger pitch of the IDT electrode is about 1 μm. The IDT electrode includes laminated metal films in which an Al film and a Ti film are laminated, and has a thickness of about 0.05λ in terms of aluminum.

As shown in FIG. 2, the spurious responses A, B, and C appear on a higher frequency side relative to a main mode response in the acoustic wave resonator described above. The high and low order of frequencies of the spurious responses A, B, and C satisfies the relationship, spurious response A<spurious response B<spurious response C. The spurious response A is closest to the main mode.

In the acoustic wave device 1 of the present preferred embodiment, at least one of the responses of the spurious response A, the response of the spurious response B, and the response of the spurious response C is reduced or prevented.

The wavelength determined by the electrode finger pitch of the IDT electrode 5 is denoted by λ. The wavelength normalized film thickness of the lithium tantalate film 4 is denoted by $T_{LT}$, the Euler angle θ of the lithium tantalate film is denoted by $\theta_{LT}$, the wavelength normalized film thickness of the $SiO_2$ film 3 is denoted by $T_S$, the wavelength normalized film thickness of the IDT electrode 5 in terms of aluminum thickness is denoted by $T_E$. The wavelength normalized film thickness of the protection film 8 is denoted by $T_P$, where $T_P$ is the product of a value obtained when density of the protection film 8 is divided by density of silicon oxide and the wavelength normalized film thickness of the protection film 8 normalized by the wavelength λ. The propagation direction in the single crystal Si layer 2 is denoted by $\psi_{Si}$, and the wavelength normalized film thickness of the single crystal Si layer 2 is denoted by $T_{Si}$. $T_{LT}$, $\theta_{LT}$, $T_S$, $T_E$, $T_P$, and $\psi_{Si}$ are set such that the value $I_h$ represented by Formula (1) below for at least one of the spurious responses A, B, and C is greater than about −2.4 and the inequality $T_{Si}$> about 20 is satisfied at the same time. Thus, at least one of the responses of the spurious responses A, B and C is effectively reduced or prevented. This will be described in detail below.

Note that, in the present description, the wavelength normalized film thickness is the value obtained when a film thickness is normalized by the wavelength λ, determined by the electrode finger pitch of the IDT electrode. That is, the wavelength normalized film thickness is the value obtained when an actual thickness is divided by λ. The wavelength λ determined by the electrode finger pitch of the IDT electrode may be determined by an average value of the electrode finger pitches.

The density of the IDT electrode 5 is the value obtained from the density of the metal material constituting the IDT electrode 5, rather than a measured value. The density of aluminum is about 2698.9 kg/m³. This value is described in page 26 of "Handbook of Chemistry: Pure Chemistry II, 4th edition, The Chemical Society of Japan, published by Maruzen Publishing Co., Ltd. (1993)".

Here, the density of the protection film 8 is the value obtained based on the density of the material of the protection film 8, rather than a measured value. The density of silicon oxide is about 2200 kg/m³. This value is described in page 922 of "Handbook of Chemistry: Applied Chemistry II, Materials, 4th edition, The Chemical Society of Japan, published by Maruzen Publishing Co., Ltd. (1993)".

Note that, in the present description, the thickness of the protection film 8 refers to a thickness of the protection film in a portion positioned on the upper side of the electrode finger of the IDT electrode.

$$I_h = \left(a^{(2)}_{T_{LT}}\left((T_{LT} - c_{T_{LT}})^2 - b^{(2)}_{T_{LT}}\right) + \right. \quad \text{Formula (1)}$$
$$a^{(1)}_{T_{LT}}(T_{LT} - c_{T_{LT}}) + a^{(2)}_{T_S}\left((T_S - c_{T_S})^2 - b^{(2)}_{T_S}\right) + a^{(1)}_{T_S}(T_S - c_{T_S}) +$$
$$a^{(4)}_{T_E}\left((T_E - c_{T_E})^4 - b^{(4)}_{T_E}\right) + a^{(3)}_{T_E}\left((T_E - c_{T_E})^3 - b^{(3)}_{T_E}\right) +$$
$$a^{(2)}_{T_E}\left((T_E - c_{T_E})^2 - b^{(2)}_{T_E}\right) + a^{(1)}_{T_E}(T_E - c_{T_E}) +$$
$$a^{(6)}_{\psi_{Si}}\left((\psi_{Si} - c_{\psi_{Si}})^6 - b^{(6)}_{\psi_{Si}}\right) + a^{(5)}_{\psi_{Si}}\left((\psi_{Si} - c_{\psi_{Si}})^5 - b^{(5)}_{\psi_{Si}}\right) +$$
$$a^{(4)}_{\psi_{Si}}\left((\psi_{Si} - c_{\psi_{Si}})^4 - b^{(4)}_{\psi_{Si}}\right) + a^{(3)}_{\psi_{Si}}\left((\psi_{Si} - c_{\psi_{Si}})^3 - b^{(3)}_{\psi_{Si}}\right) +$$
$$a^{(2)}_{\psi_{Si}}\left((\psi_{Si} - c_{\psi_{Si}})^2 - b^{(2)}_{\psi_{Si}}\right) + a^{(1)}_{\psi_{Si}}(\psi_{Si} - c_{\psi_{Si}}) +$$
$$a^{(2)}_{\theta_{LT}}\left((\theta_{LT} - c_{\theta_{LT}})^2 - b^{(2)}_{\theta_{LT}}\right) + a^{(1)}_{\theta_{LT}}(\theta_{LT} - c_{\theta_{LT}}) +$$
$$d_{T_{LT}T_S}(T_{LT} - c_{T_{LT}})(T_S - c_{T_S}) + d_{T_{LT}T_E}(T_{LT} - c_{T_{LT}})$$
$$(T_E - c_{T_E}) + d_{T_{LT}\psi_{Si}}(T_{LT} - c_{T_{LT}})(\psi_{Si} - c_{\psi_{Si}}) +$$
$$d_{T_{LT}\theta_{LT}}(T_{LT} - c_{T_{LT}})(\theta_{LT} - c_{\theta_{LT}}) + d_{T_S T_E}(T_S - c_{T_S})(T_E - c_{T_E}) +$$
$$d_{T_S \psi_{Si}}(T_S - c_{T_S})(\psi_{Si} - c_{\psi_{Si}}) + d_{T_S \theta_{LT}}(T_S - c_{T_S})(\theta_{LT} - c_{\theta_{LT}}) +$$
$$d_{T_E \psi_{Si}}(T_E - c_{T_E})(\psi_{Si} - c_{\psi_{Si}}) + d_{T_E \theta_{LT}}(T_E - c_{T_E})(\theta_{LT} - c_{\theta_{LT}}) +$$
$$d_{\psi_{Si}\theta_{LT}}(\psi_{Si} - c_{\psi_{Si}})(\theta_{LT} - c_{\theta_{LT}}) + e\Big)$$
$$\left(a_{T_P}T_P^4 + b_{T_P}T_P^3 + c_{T_P}T_P^2 + d_{T_P}T_P + f_{T_P}\right).$$

The coefficients a, b, c, d, e, and f in Formula (1) are values in Table 37 to Table 72 below. The values are specified in accordance with the type of spurious responses, the orientation (100), (110), or (111) of the single crystal Si layer 2, and the range of the wavelength normalized film thicknesses of the $SiO_2$ film 3 and the lithium tantalate film 4, and the like.

TABLE 37

| | Si (100) 0 < $T_{LT}$ < 0.2 0 ≤ $T_S$ < 0.2 | |
|---|---|---|
| | 0.05 ≤ $T_E$ < 0.25 | 0.25 ≤ $T_E$ ≤ 0.45 |
| $a_{T_{LT}}$ (2) | 0 | 0 |
| $a_{T_{LT}}$ (1) | 0 | 0 |
| $b_{T_{LT}}$ (2) | 0 | 0 |
| $c_{T_{LT}}$ | 0 | 0 |

TABLE 37-continued

| | Si (100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $a_{TS}{}^{(2)}$ | 0 | 0 |
| $a_{TS}{}^{(1)}$ | −5.857231176 | −5.857231176 |
| $b_{TS}{}^{(2)}$ | 0 | 0 |
| $c_{TS}$ | 0.148 | 0.148 |
| $a_{TE}{}^{(4)}$ | 0 | 0 |
| $a_{TE}{}^{(3)}$ | 0 | 0 |
| $a_{TE}{}^{(2)}$ | −19.75255913 | −19.75255913 |
| $a_{TE}{}^{(1)}$ | −2.877583447 | −2.877583447 |
| $b_{TE}{}^{(4)}$ | 0 | 0 |
| $b_{TE}{}^{(3)}$ | 0 | 0 |
| $b_{TE}{}^{(2)}$ | 0.022736 | 0.022736 |
| $c_{TE}$ | 0.242 | 0.242 |
| $a_{\psi Si}{}^{(6)}$ | 0 | 0 |
| $a_{\psi Si}{}^{(5)}$ | 0 | 0 |
| $a_{\psi Si}{}^{(4)}$ | 0 | 0 |
| $a_{\psi Si}{}^{(3)}$ | 0 | 0 |
| $a_{\psi Si}{}^{(2)}$ | 0.004788767 | 0.004788767 |
| $a_{\psi Si}{}^{(1)}$ | 0.024306207 | 0.024306207 |
| $b_{\psi Si}{}^{(6)}$ | 0 | 0 |
| $b_{\psi Si}{}^{(5)}$ | 0 | 0 |
| $b_{\psi Si}{}^{(4)}$ | 0 | 0 |
| $b_{\psi Si}{}^{(3)}$ | 0 | 0 |
| $b_{\psi Si}{}^{(2)}$ | 81.81 | 81.81 |
| $c_{\psi Si}$ | 8.7 | 8.7 |
| $a_{\theta LT}{}^{(2)}$ | −0.008235936 | −0.008235936 |
| $a_{\theta LT}{}^{(1)}$ | −0.021048278 | −0.021048278 |
| $b_{\theta LT}{}^{(2)}$ | 65.16 | 65.16 |
| $c_{\theta LT}$ | −52.2 | −52.2 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.786852571 | −0.786852571 |
| $d_{TE\psi Si}$ | 0 | 0 |
| $d_{TE\theta LT}$ | −0.237034335 | −0.237034335 |
| $d_{\psi Si\theta LT}$ | 0 | 0 |
| e | −1.499248378 | −1.499248378 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495 |

TABLE 38

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{TLT}{}^{(2)}$ | 0 | 125.5342427 |
| $a_{TLT}{}^{(1)}$ | −13.43961051 | −7.643409732 |
| $b_{TLT}{}^{(2)}$ | 0 | 0.006076558 |
| $c_{TLT}$ | 0.329807692 | 0.321186441 |
| $a_{TS}{}^{(2)}$ | 0 | 0 |
| $a_{TS}{}^{(1)}$ | −11.80744788 | −10.05306878 |
| $b_{TS}{}^{(2)}$ | 0 | 0 |
| $c_{TS}$ | 0.158653846 | 0.153389831 |
| $a_{TE}{}^{(4)}$ | 0 | 0 |
| $a_{TE}{}^{(3)}$ | 0 | 0 |
| $a_{TE}{}^{(2)}$ | 0 | 0 |
| $a_{TE}{}^{(1)}$ | 0 | −7.595099843 |
| $b_{TE}{}^{(4)}$ | 0 | 0 |
| $b_{TE}{}^{(3)}$ | 0 | 0 |
| $b_{TE}{}^{(2)}$ | 0 | 0 |
| $c_{TE}$ | 0 | 0.366101695 |
| $a_{\psi Si}{}^{(6)}$ | 0 | 0 |
| $a_{\psi Si}{}^{(5)}$ | 0 | 0 |

TABLE 38-continued

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{\psi Si}{}^{(4)}$ | 0 | 0 |
| $a_{\psi Si}{}^{(3)}$ | 0 | 0 |
| $a_{\psi Si}{}^{(2)}$ | 0.003335792 | 0 |
| $a_{\psi Si}{}^{(1)}$ | 0.039268266 | −0.013700762 |
| $b_{\psi Si}{}^{(6)}$ | 0 | 0 |
| $b_{\psi Si}{}^{(5)}$ | 0 | 0 |
| $b_{\psi Si}{}^{(4)}$ | 0 | 0 |
| $b_{\psi Si}{}^{(3)}$ | 0 | 0 |
| $b_{\psi Si}{}^{(2)}$ | 191.7159763 | 0 |
| $c_{\psi Si}$ | 13.26923077 | 16.01694915 |
| $a_{\theta LT}{}^{(2)}$ | −0.007476194 | 0 |
| $a_{\theta LT}{}^{(1)}$ | −0.010867175 | −0.053997369 |
| $b_{\theta LT}{}^{(2)}$ | 69.19378698 | 0 |
| $c_{\theta LT}$ | −50.19230769 | −50.59322034 |
| $d_{TLTTS}$ | 0 | 0 |
| $d_{TLTTE}$ | 0 | 0 |
| $d_{TLT\psi Si}$ | −0.629167148 | −0.724576033 |
| $d_{TLT\theta LT}$ | 0 | 0 |
| $d_{TSTE}$ | 0 | 0 |
| $d_{TS\psi Si}$ | 0 | 0.521919406 |
| $d_{TS\theta LT}$ | 0 | 0 |
| $d_{TE\psi Si}$ | 0 | −0.523966449 |
| $d_{TE\theta LT}$ | 0 | 0 |
| $d_{\psi Si\theta LT}$ | 0 | 0 |
| e | −2.071831837 | −3.228508418 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495 |

TABLE 39

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{TLT}{}^{(2)}$ | 0 | 0 |
| $a_{TLT}{}^{(1)}$ | −15.6141248 | −15.6141248 |
| $b_{TLT}{}^{(2)}$ | 0 | 0 |
| $c_{TLT}$ | 0.163309353 | 0.163309353 |
| $a_{TS}{}^{(2)}$ | 0 | 0 |
| $a_{TS}{}^{(1)}$ | −22.02440893 | −22.02440893 |
| $b_{TS}{}^{(2)}$ | 0 | 0 |
| $c_{TS}$ | 0.325179856 | 0.325179856 |
| $a_{TE}{}^{(4)}$ | 0 | 0 |
| $a_{TE}{}^{(3)}$ | −248.4374004 | −248.4374004 |
| $a_{TE}{}^{(2)}$ | −36.57127964 | −36.57127964 |
| $a_{TE}{}^{(1)}$ | 13.88180854 | 13.88180854 |
| $b_{TE}{}^{(4)}$ | 0 | 0 |
| $b_{TE}{}^{(3)}$ | 0.000480119 | 0.000480119 |
| $b_{TE}{}^{(2)}$ | 0.020416128 | 0.020416128 |
| $c_{TE}$ | 0.240647482 | 0.240647482 |
| $a_{\psi Si}{}^{(6)}$ | 0 | 0 |
| $a_{\psi Si}{}^{(5)}$ | 0 | 0 |
| $a_{\psi Si}{}^{(4)}$ | 0 | 0 |
| $a_{\psi Si}{}^{(3)}$ | 0 | 0 |
| $a_{\psi Si}{}^{(2)}$ | 0.002456326 | 0.002456326 |
| $a_{\psi Si}{}^{(1)}$ | 0.048553126 | 0.048553126 |
| $b_{\psi Si}{}^{(6)}$ | 0 | 0 |
| $b_{\psi Si}{}^{(5)}$ | 0 | 0 |
| $b_{\psi Si}{}^{(4)}$ | 0 | 0 |
| $b_{\psi Si}{}^{(3)}$ | 0 | 0 |
| $b_{\psi Si}{}^{(2)}$ | 279.6050929 | 279.6050929 |
| $c_{\psi Si}$ | 22.3381295 | 22.3381295 |
| $a_{\theta LT}{}^{(2)}$ | 0 | 0 |
| $a_{\theta LT}{}^{(1)}$ | 0.005427275 | 0.005427275 |
| $b_{\theta LT}{}^{(2)}$ | 0 | 0 |
| $c_{\theta LT}$ | −50.35971223 | −50.35971223 |

TABLE 39-continued

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 41.63149071 | 41.63149071 |
| $d_{TS\psi Si}$ | −0.577179204 | −0.577179204 |
| $d_{TS\theta LT}$ | 0.603866778 | 0.603866778 |
| $d_{TE\psi Si}$ | 0.134944598 | 0.134944598 |
| $d_{TE\theta LT}$ | 0 | 0 |
| $d_{\psi Si\theta LT}$ | 0 | 0 |
| e | −2.703317679 | −2.703317679 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495 |

TABLE 40

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 133.7896555 |
| $a_{TLT}^{(1)}$ | −7.761727985 | −9.701155851 |
| $b_{TLT}^{(2)}$ | 0 | 0.006281971 |
| $c_{TLT}$ | 0.315508021 | 0.306914894 |
| $a_{TS}^{(2)}$ | 0 | 0 |
| $a_{TS}^{(1)}$ | −20.35135077 | −6.186650236 |
| $b_{TS}^{(2)}$ | 0 | 0 |
| $c_{TS}$ | 0.297860963 | 0.298404255 |
| $a_{TE}^{(4)}$ | 0 | 0 |
| $a_{TE}^{(3)}$ | 0 | 0 |
| $a_{TE}^{(2)}$ | 110.8304316 | 0 |

TABLE 40-continued

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{TE}^{(1)}$ | 4.036561723 | −8.229960495 |
| $b_{TE}^{(4)}$ | 0 | 0 |
| $b_{TE}^{(3)}$ | 0 | 0 |
| $b_{TE}^{(2)}$ | 0.006431411 | 0 |
| $c_{TE}$ | 0.140374332 | 0.363297872 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002534654 | 0.001652947 |
| $a_{\psi Si}^{(1)}$ | 0.024168138 | −0.003241344 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 269.2484772 | 266.6845858 |
| $c_{\psi Si}$ | 21.4171123 | 20.26595745 |
| $a_{\theta LT}^{(2)}$ | 0 | 0 |
| $a_{\theta LT}^{(1)}$ | 0 | −0.066116428 |
| $b_{\theta LT}^{(2)}$ | 0 | O |
| $c_{\theta LT}$ | −90 | −50.4787234 |
| $d_{TLTTS}$ | 96.23533718 | 0 |
| $d_{TLTTE}$ | −66.46866878 | 0 |
| $d_{TLT\psi Si}$ | −0.404808481 | −0.688053172 |
| $d_{TLT\theta LT}$ | 0 | 0 |
| $d_{TSTE}$ | 0 | 0 |
| $d_{TS\psi Si}$ | −0.733337318 | 0 |
| $d_{TS\theta LT}$ | 0 | 0 |
| $d_{TE\psi Si}$ | 0.584322518 | −0.372994212 |
| $d_{TE\theta LT}$ | 0 | 0 |
| $d_{\psi Si\theta LT}$ | 0 | 0 |
| e | −3.679364607 | −4.30794513 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495 |

TABLE 41

| | Si (110) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −16.69742899 | −16.69742899 | −33.56520202 | 0 |
| $b_{TLT}^{(2)}$ | 0 | 0 | 0 | 0 |
| $c_{TLT}$ | 0.1675 | 0.1675 | 0.192857143 | 0 |
| $a_{TS}^{(2)}$ | 0 | 0 | 0 | 0 |
| $a_{TS}^{(1)}$ | 15.90196012 | 15.90196012 | 0 | 0 |
| $b_{TS}^{(2)}$ | 0 | 0 | 0 | 0 |
| $c_{TS}$ | 0.1525 | 0.1525 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 26.3030303 | 0 |
| $a_{TE}^{(1)}$ | 0 | 0 | −6.181053391 | 0 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006326531 | 0 |
| $c_{TE}$ | 0 | 0 | 0.378571429 | 0 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | −0.000183963 | −0.000183963 | 0 | −0.000177142 |
| $a_{\psi Si}^{(2)}$ | −0.003236307 | −0.003236307 | 0 | 0.002186084 |
| $a_{\psi Si}^{(1)}$ | 0.071460688 | 0.071460688 | 0.085067773 | 0.13561432 |
| $b_{\psi Si}^{(6)}$ | 0 | 0 | 0 | 0 |

TABLE 41-continued

| | Si (110) $0 < T_{LT} < 0.2$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\psi Si}{}^{(5)}$ | 0 | 0 | 0 | |
| $b_{\psi Si}{}^{(4)}$ | 0 | 0 | 0 | 0 |
| $b_{\psi Si}{}^{(3)}$ | −5768.71875 | −5768.71875 | 0 | 2642.857143 |
| $b_{\psi Si}{}^{(2)}$ | 399.9375 | 399.9375 | 0 | 500 |
| $c_{\psi Si}$ | 65.25 | 65.25 | 34.28571429 | 55 |
| $a_{\theta LT}{}^{(2)}$ | 0 | 0 | 0 | −0.00533662 |
| $a_{\theta LT}{}^{(1)}$ | 0 | 0 | 0.070255628 | 0.032718563 |
| $b_{\theta LT}{}^{(2)}$ | 0 | 0 | 0 | 65.75963719 |
| $c_{\theta LT}$ | −90 | −90 | −51.42857143 | −50.95238095 |
| $d_{TLTTS}$ | 0 | 0 | 0 | 0 |
| $d_{TLTTE}$ | 0 | 0 | 0 | 0 |
| $d_{TLT\psi Si}$ | 1.873870705 | 1.873870705 | 0 | 0 |
| $d_{TLT\theta LT}$ | 0 | 0 | 0 | 0 |
| $d_{TSTE}$ | | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0.716151515 | 0 |
| $d_{\psi Si\theta LT}$ | 0 | 0 | −0.00729303 | 0.002110378 |
| e | −0.957101918 | −0.957101918 | −1.63492254 | −1.290881853 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 42

| | Si (110) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}{}^{(2)}$ | 0 | 0 | 0 | 0 |
| $a_{TLT}{}^{(1)}$ | −23.96596978 | −4.695531045 | −7.344438725 | −5.603099398 |
| $b_{TLT}{}^{(2)}$ | 0 | 0 | 0 | 0 |
| $c_{TLT}$ | 0.34 | 0.3296875 | 0.338983051 | 0.306666667 |
| $a_{TS}{}^{(2)}$ | 0 | 0 | 0 | 0 |
| $a_{TS}{}^{(1)}$ | −23.18485905 | 0 | 0 | 0 |
| $b_{TS}{}^{(2)}$ | 0 | 0 | 0 | 0 |
| $c_{TS}$ | 0.175555556 | 0 | 0 | 0 |
| $a_{TE}{}^{(4)}$ | 0 | 0 | 0 | 0 |
| $a_{TE}{}^{(3)}$ | 0 | 0 | 0 | 0 |
| $a_{TE}{}^{(2)}$ | 0 | −43.48595551 | −70.50554427 | −41.95412638 |
| $a_{TE}{}^{(1)}$ | 0 | −2.467954545 | −5.460437635 | −2.19025056 |
| $b_{TE}{}^{(4)}$ | 0 | 0 | 0 | 0 |
| $b_{TE}{}^{(3)}$ | 0 | 0 | 0 | 0 |
| $b_{TE}{}^{(2)}$ | 0 | 0.006875 | 0.006716461 | 0.006819556 |
| $c_{TE}$ | 0 | 0.15 | 0.365254237 | 0.360666667 |
| $a_{\psi Si}{}^{(6)}$ | 0 | 0 | 0 | 0 |
| $a_{\psi Si}{}^{(5)}$ | 0 | 0 | 0 | 0 |
| $a_{\psi Si}{}^{(4)}$ | 0 | 0 | 0 | 0 |
| $a_{\psi Si}{}^{(3)}$ | 0 | 0 | 0.000119479 | −0.000172812 |
| $a_{\psi Si}{}^{(2)}$ | 0.018474062 | 0 | 0.003987724 | 0.002213009 |
| $a_{\psi Si}{}^{(1)}$ | 0.059131688 | 0 | −0.047908658 | 0.073831446 |
| $b_{\psi Si}{}^{(6)}$ | 0 | 0 | 0 | 0 |
| $b_{\psi Si}{}^{(5)}$ | 0 | 0 | 0 | 0 |
| $b_{\psi Si}{}^{(4)}$ | 0 | 0 | 0 | 0 |
| $b_{\psi Si}{}^{(3)}$ | 0 | 0 | −2384.203107 | 1647.952 |
| $b_{\psi Si}{}^{(2)}$ | 81.55555556 | 0 | 216.791152 | 242.24 |
| $c_{\psi Si}$ | 35.33333333 | 0 | 30.76271186 | 62.6 |
| $a_{\theta LT}{}^{(2)}$ | 0 | 0 | 0 | 0 |
| $a_{\theta LT}{}^{(1)}$ | 0.009475371 | 0 | 0.026725166 | 0 |
| $b_{\theta LT}{}^{(2)}$ | 0 | 0 | 0 | 0 |
| $c_{\theta LT}$ | −49.3333333 | −90 | −49.83050847 | −90 |
| $d_{TLTTS}$ | 0 | 0 | 0 | 0 |

TABLE 42-continued

| | Si (110) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $d_{TLTTE}$ | 0 | 0 | 0 | 42.3018696 |
| $d_{TLT\psi Si}$ | 0 | 0 | 0 | 0 |
| $d_{TLT\theta LT}$ | 0.617240199 | 0 | 0 | 0 |
| $d_{TS TE}$ | 0 | 0 | 0 | 0 |
| $d_{TS\psi Si}$ | 2.612107038 | 0 | 0 | 0 |
| $d_{TS\theta LT}$ | 2.129359248 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.871101002 | 0 | 0 | 0 |
| e | −2.851861362 | −2.210765625 | −2.573237283 | −2.440604203 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 43

| | Si (110) $0 \leq T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −10.87353735 | −17.74612134 | −16.74814911 | −16.74814911 |
| $b_{TLT}^{(2)}$ | 0 | 0 | 0 | 0 |
| $c_{TLT}$ | 0.167045455 | 0.158227848 | 0.168032787 | 0.168032787 |
| $a_{TS}^{(2)}$ | 92.14417413 | 275.6432031 | 0 | 0 |
| $a_{TS}^{(1)}$ | −6.141913324 | −0.713377524 | −9.071522271 | −9.071522271 |
| $b_{TS}^{(2)}$ | 0.004213585 | 0.004749239 | 0 | 0 |
| $c_{TS}$ | 0.339772727 | 0.317721519 | 0.314754098 | 0.314754098 |
| $a_{TE}^{(4)}$ | 0 | 0 | 00 | 0 |
| $a_{TE}^{(3)}$ | 0 | 0 | 0 | 0 |
| $a_{TE}^{(2)}$ | −37.82699975 | 0 | 0 | 0 |
| $a_{TE}^{(1)}$ | 4.315324766 | 3.259148162 | −5.270739047 | −5.270739047 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.007147469 | 0 | 0 | 0 |
| $c_{TE}$ | 0.153409091 | 0.138607595 | 0.356557377 | 0.356557377 |
| $a_{\psi Si}^{(6)}$ | 0 | 0 | −3.73552E−09 | −3.73552E−09 |
| $a_{\psi Si}^{(5)}$ | 0 | 0 | −4.69013E−08 | −4.69013E−08 |
| $a_{\psi Si}^{(4)}$ | 0 | 0 | 1.07773E−05 | 1.07773E−05 |
| $a_{\psi Si}^{(3)}$ | 0.000254041 | −0.00026684 | 5.64997E−05 | 5.64997E−05 |
| $a_{\psi Si}^{(2)}$ | 0.00704637 | 0.003350583 | −0.007526984 | −0.007526984 |
| $a_{\psi Si}^{(1)}$ | −0.123432463 | 0.05687546 | −0.035719404 | −0.035719404 |
| $b_{\psi Si}^{(6)}$ | 0 | 0 | 1801696668 | 1801696668 |
| $b_{\psi Si}^{(5)}$ | 0 | 0 | 6726299.443 | 6726299.443 |
| $b_{\psi Si}^{(4)}$ | 0 | 0 | 1035415.498 | 1035415.498 |
| $b_{\psi Si}^{(3)}$ | −1197.310014 | 2539.305207 | 3573.665857 | 3573.665857 |
| $b_{\psi Si}^{(2)}$ | 188.2457386 | 286.0358917 | 720.1088417 | 720.1088417 |
| $c_{\psi Si}$ | 28.125 | 63.60759494 | 48.19672131 | 48.19672131 |
| $a_{\theta LT}^{(2)}$ | 0 | 0 | 0 | 0 |
| $a_{\theta LT}^{(1)}$ | 0.046748629 | 0.00460971 | 0 | 0 |
| $b_{\theta LT}^{(2)}$ | 0 | 0 | 0 | 0 |
| $c_{\theta LT}$ | −51.59090909 | −50.75949367 | −90 | −90 |
| $d_{TLTTS}$ | 0 | 0 | 0 | 0 |
| $d_{TLTTE}$ | 0 | 105.3055279 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 58.63016883 | 0 | 0 | 0 |
| $d_{TS\psi Si}$ | 0.443510572 | 0.274149566 | 0 | 0 |
| $d_{TS\theta LT}$ | 0 | 0 | 0 | 0 |
| $d_{TE\psi Si}$ | 0.293912516 | −0.280924747 | 0 | 0 |
| $d_{TE\theta LT}$ | 0 | 0.457718571 | 0 | 0 |
| $d_{\psi Si\theta LT}$ | 0 | −0.005165328 | 0 | 0 |
| e | −1.722804167 | −2.484892701 | −2.976959016 | −2.976959016 |

TABLE 43-continued

Si (110)
$0 \leq T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 44

Si (110)
$0.2 \leq T_{LT} \leq 3.5$
$0.2 \leq T_{LT} \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 39.48011293 |
| $a_{TLT}^{(1)}$ | −5.239160454 | −5.820942031 | −4.867344296 | −2.496300587 |
| $b_{TLT}^{(2)}$ | 0 | 0 | 0 | 0.00654321 |
| $c_{TLT}$ | 0.309375 | 0.302702703 | 0.286363636 | 0.288888889 |
| $a_{TS}^{(2)}$ | 24.40391167 | 40.38499201 | 0 | 40.45660337 |
| $a_{TS}^{(1)}$ | −2.128595361 | 6.73354721 | −3.626479228 | −6.290401812 |
| $b_{TS}^{(2)}$ | 0.006013184 | 0.005624543 | 0 | 0.005617284 |
| $c_{TS}$ | 0.3265625 | 0.275675676 | 0.31 | 0.272222222 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −51.46488975 | 0 | 0 |
| $a_{TE}^{(1)}$ | −1.921891837 | −0.509929613 | −1.508039016 | −0.870147512 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006479182 | 0 | 0 |
| $c_{TE}$ | 0.153125 | 0.147297297 | 0.341818182 | 0.351388889 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | −0.000165117 | 0 | −9.55404E−05 |
| $a_{\psi Si}^{(2)}$ | 0.000936051 | 0.00475603 | 0 | 0.002198207 |
| $a_{\psi Si}^{(1)}$ | −0.02141106 | 0.040196571 | −0.017752634 | 0.036260775 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 2115.829763 | 0 | 1531.394676 |
| $b_{\psi Si}^{(2)}$ | 246.9177246 | 196.5668371 | 0 | 199.8263889 |
| $c_{\psi Si}$ | 24.140625 | 57.97297297 | 21.13636364 | 60.41666667 |
| $a_{\theta LT}^{(2)}$ | 0 | 0 | 0 | −0.003220943 |
| $a_{\theta LT}^{(1)}$ | 0.023743346 | 0.023741003 | 0.038368027 | 0.005042496 |
| $b_{\theta LT}^{(2)}$ | 0 | 0 | 0 | 72.22222222 |
| $c_{\theta LT}$ | −50.078125 | −48.51351351 | −50.81818182 | −50 |
| $d_{TLTTS}$ | 0 | 0 | 0 | −43.45862557 |
| $d_{TLTTE}$ | −35.16960363 | −48.00382984 | 23.6423037 | 52.46703277 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | −0 | 0 | 0 |
| $d_{TE\theta LT}$ | 0.234382842 | 0 | 0 | −0.273892853 |
| $d_{\psi Si\theta LT}$ | 0 | −0.00130658 | −0.001221935 | 0 |
| $e$ | −2.175330984 | −2.239116787 | −2.271294054 | −2.496300587 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 45

Si (111)
$0 < T_{LT} < 0.2$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 16.07631847 | 20.22733656 | 30.72650306 | 27.83979251 |
| $b_{TLT}^{(2)}$ | 0 | 0 | 0 | 0 |
| $c_{TLT}$ | 0.145833333 | 0.1625 | 0.159574468 | 0.158695652 |
| $a_{TS}^{(2)}$ | 0 | 0 | 0 | 0 |
| $a_{TS}^{(1)}$ | 17.08812597 | 27.84866827 | 31.28009383 | 12.67453621 |
| $b_{TS}^{(2)}$ | 0 | 0 | 0 | 0 |
| $c_{TS}$ | 0.154166667 | 0.172916667 | 0.161702128 | 0.163043478 |
| $a_{TE}^{(4)}$ | 0 | 0 | 0 | 0 |
| $a_{TE}^{(3)}$ | 0 | 0 | 0 | 0 |
| $a_{TE}^{(2)}$ | −96.15629371 | 0 | 138.3065683 | 0 |
| $a_{TE}^{(1)}$ | −1.263589744 | 2.883915191 | −9.345807167 | −7.807789594 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006649306 | 0 | 0.006229063 | 0 |
| $c_{TE}$ | 0.170833333 | 0.14375 | 0.369148936 | 0.345652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | −0.006862727 |
| $a_{\psi Si}^{(1)}$ | −0.101535567 | −0.012511908 | −0.101466433 | 0.176438509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 114.9456522 |
| $c_{\psi Si}$ | 24.375 | 44.375 | 22.0212766 | 37.5 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | −477.9162005 | −760.9473336 | −1054.386561 | −1044.340968 |
| $d_{TLTTE}$ | 0 | 0 | 0 | 0 |
| $d_{TLT\psi Si}$ | 0 | 1.332405924 | 0 | 0 |
| $d_{TLT\theta LT}$ | 0 | 0 | 0 | 0 |
| $d_{TSTE}$ | 0 | −250.1524613 | 102.33575 | 105.8611165 |
| $d_{TS\psi Si}$ | 0 | 0 | 0 | −2.093429604 |
| $d_{TS\theta LT}$ | 0 | 0 | 0 | 0 |
| $d_{TE\psi Si}$ | −0.613440559 | 0 | 1.201832187 | −0.525734733 |
| $d_{TE\theta LT}$ | 0 | 0 | 0 | 0 |
| $d_{\psi Si\theta LT}$ | 0 | 0 | 0 | 0 |
| e | −0.553295028 | −1.074792989 | −1.290770348 | −1.165057152 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 46

Si (111)
$0.2 \leq T_{LT} \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | −262.3995984 | −262.3995984 | 0 | 0 |
| $a_{TLT}^{(1)}$ | −59.70400634 | −59.70400634 | −18.45032018 | −20.44479246 |
| $b_{TLT}^{(2)}$ | 0.004691358 | 0.004691358 | 0 | 0 |
| $c_{TLT}$ | 0.355555556 | 0.355555556 | 0.332352941 | 0.331914894 |
| $a_{TS}^{(2)}$ | 0 | 0 | 0 | 0 |
| $a_{TS}^{(1)}$ | −73.33869606 | −73.33869606 | −9.963926388 | 24.5747574 |
| $b_{TS}^{(2)}$ | 0 | 0 | 0 | 0 |
| $c_{TS}$ | 0.185185185 | 0.185185185 | 0.166176471 | 0.165957447 |
| $a_{TE}^{(4)}$ | 0 | 0 | 0 | 0 |
| $a_{TE}^{(3)}$ | 0 | 0 | 0 | 0 |

TABLE 46-continued

| | Si (111) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TE}^{(2)}$ | 0 | 0 | 0 | 0 |
| $a_{TE}^{(1)}$ | −19.84024877 | −19.84024877 | −8.905455835 | −17.17093947 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.157407407 | 0.157407407 | 0.369117647 | 0.373404255 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | −4.69771E−05 | −4.69771E−05 | 0 | 0 |
| $a_{\psi Si}^{(3)}$ | −0.000362538 | −0.000362538 | 0 | 0 |
| $a_{\psi Si}^{(2)}$ | 0.055133453 | 0.055133453 | −0.004320224 | 0.021125116 |
| $a_{\psi Si}^{(1)}$ | 0.020862911 | 0.020862911 | −0.110606012 | −0.064218508 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 138552.1512 | 138552.1512 | 0 | 0 |
| $b_{\psi Si}^{(3)}$ | −78.36076818 | −78.36076818 | 0 | 0 |
| $b_{\psi Si}^{(2)}$ | 203.1635802 | 203.1635802 | 145.9775087 | 66.20642825 |
| $c_{\psi Si}$ | 33.05555556 | 33.05555556 | 19.41176471 | 34.46808511 |
| $a_{\theta LT}^{(2)}$ | 0 | 0 | 0 | 0 |
| $a_{\theta LT}^{(1)}$ | −0.079155699 | −0.079155699 | 0 | 0.057672719 |
| $b_{\theta LT}^{(2)}$ | 0 | 0 | 0 | 0 |
| $c_{\theta LT}$ | −49.81481481 | −49.81481481 | −90 | −49.14893617 |
| $d_{TLTTS}$ | 0 | 0 | 0 | 0 |
| $d_{TLTTE}$ | −254.5809235 | −254.5809235 | 80.69948416 | 99.56817027 |
| $d_{TLT\psi Si}$ | 2.260189055 | 2.260189055 | 0 | 0 |
| $d_{TLT\theta LT}$ | −0.785540829 | −0.785540829 | 0 | 0 |
| $d_{TSTE}$ | −292.5762951 | −292.5762951 | 0 | 0 |
| $d_{TS\psi Si}$ | −5.914103654 | −5.914103654 | −1.139436429 | 0 |
| $d_{TS\theta LT}$ | 0 | 0 | 0 | 0 |
| $d_{TE\psi Si}$ | 1.75463008 | 1.75463008 | 0.660099875 | −3.844659844 |
| $d_{TE\theta LT}$ | 0 | 0 | 0 | 0 |
| $d_{\psi Si\theta LT}$ | 0 | 0 | 0 | 0.006965097 |
| e | −1.304804416 | −1.304804416 | −2.734683251 | −3.115044468 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 47

| | Si (111) $0 < T_{LT} < 0.2$ $0.2 \leq T_S \leq 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0.003649147 | 0 | 0 | 0 |
| $a_{TLT}^{(1)}$ | −17.27824731 | −24.3903101 | −38.65647339 | −21.91795924 |
| $b_{TLT}^{(2)}$ | 67.18624026 | 0 | 0 | 0 |
| $c_{TLT}$ | 0.154098361 | 0.15631068 | 0.17 | 0.1575 |
| $a_{TS}^{(2)}$ | 84.63185118 | 0 | 148.7691928 | 140.0125491 |
| $a_{TS}^{(1)}$ | −6.307527081 | −32.68184816 | −15.38083251 | −11.91949736 |
| $b_{TS}^{(2)}$ | 0.004461166 | 0 | 0.005012245 | 0.004623438 |
| $c_{TS}$ | 0.352459016 | 0.345631068 | 0.331428571 | 0.33875 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 2.909874306 | 8.840975559 | −16.54803788 | −0.024546617 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.135245902 | 0.148058252 | 0.372857143 | 0.33125 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |

TABLE 47-continued

| | Si (111) $0 < T_{LT} < 0.2$ $0.2 \leq T_S \leq 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{\psi Si}^{(2)}$ | 0 | 0.006216698 | 0 | 0 |
| $a_{\psi Si}^{(1)}$ | −0.068574135 | −0.018885558 | −0.187578295 | 0.122573316 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 147.1439344 | 0 | 0 |
| $c_{\psi Si}$ | 22.62295082 | 43.10679612 | 22.71428571 | 39.1875 |
| $a_{\theta LT}^{(2)}$ | 0 | 0 | 0 | 0 |
| $a_{\theta LT}^{(1)}$ | 0.023219728 | 0.047846607 | 0.097088558 | 0.096327065 |
| $b_{\theta LT}^{(2)}$ | 0 | 0 | 0 | 0 |
| $c_{\theta LT}$ | −50.16393443 | −50.38834951 | −50.42857143 | −51.25 |
| $d_{TLTTS}$ | 0 | −144.763071 | 0 | 0 |
| $d_{TLTTE}$ | 0 | 0 | −161.23455326 | 0 |
| $d_{TLT\psi Si}$ | −0.827435588 | 0 | 0 | 1.107475984 |
| $d_{TLT\theta LT}$ | 0 | 0 | 0 | 0 |
| $d_{TSTE}$ | 0 | 103.0553675 | −65.68497311 | 0 |
| $d_{TS\psi Si}$ | 0 | −1.329400713 | 0.82928215 | −0.646921162 |
| $d_{TS\theta LT}$ | 0 | 0 | 0 | 0 |
| $d_{TE\psi Si}$ | −0.681669875 | 0.653050787 | 0.676734069 | 0.936807034 |
| $d_{TE\theta LT}$ | 0 | 0 | 0.481989709 | 0.52746173 |
| $d_{\psi Si\theta LT}$ | 0 | 0 | 0 | 0 |
| e | −1.560056382 | −2.656750279 | −2.259351603 | −1.805786084 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 48

| | Si (111) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 77.3065693 | 243.6937004 | 0 |
| $a_{TLT}^{(1)}$ | −13.49335267 | −9.878165228 | −6.309863061 | −12.90130633 |
| $b_{TLT}^{(2)}$ | 0 | 0.00674795 | 0.006522811 | 0 |
| $c_{TLT}$ | 0.300961538 | 0.297350993 | 0.29858156 | 0.306818182 |
| $a_{TS}^{(2)}$ | 133.2691939 | 160.4037443 | 82.71737336 | 100.5491122 |
| $a_{TS}^{(1)}$ | −9.215218873 | −21.20902158 | −9.283157312 | −7.984268054 |
| $b_{TS}^{(2)}$ | 0.006618898 | 0.005353274 | 0.006382979 | 0.005704201 |
| $c_{TS}$ | 0.314423077 | 0.303311258 | 0.3 | 0.311363636 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 90.39669198 | 0 | 0 |
| $a_{TE}^{(1)}$ | 0.170720276 | 3.925569914 | −15.08313602 | −9.451928755 |
| $b_{TE}^{(4)}$ | 0 | 0 | 0 | 0 |
| $b_{TE}^{(3)}$ | 0 | 0 | | 0 |
| $b_{TE}^{(2)}$ | 0 | 0.006615499 | 0 | 0 |
| $c_{TE}$ | 0.15 | 0.147350993 | 0.363475177 | 0.346212121 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00740803 | 0 | 0 | 0 |
| $a_{\psi Si}^{(1)}$ | −0.220502432 | 0.083594751 | −0.104344279 | 0.088096624 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 135.4659763 | 0 | 0 | 0 |
| $c_{\psi Si}$ | 20.76923077 | 43.70860927 | 17.87234043 | 41.47727273 |
| $a_{\theta LT}^{(2)}$ | 0 | 0 | 0 | 0 |
| $a_{\theta LT}^{(1)}$ | −0.017420386 | −0.012240534 | 0 | 0 |

TABLE 48-continued

Si (111)
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\theta LT}^{(2)}$ | 0 | 0 | 0 | 0 |
| $c_{\theta LT}$ | −50.28846154 | −50.26490066 | −90 | −90 |
| $d_{TLTTS}$ | 149.298265 | 220.9283416 | 135.5319056 | 135.1493422 |
| $d_{TLTTE}$ | 0 | 0 | 0 | −65.38520659 |
| $d_{TLT\psi Si}$ | 0 | 0 | 0 | −0.663828772 |
| $d_{TLT\theta LT}$ | −0.703824061 | −0.739197646 | 0 | 0 |
| $d_{TSTE}$ | 122.4270642 | 0 | −94.62792088 | 0 |
| $d_{TS\psi Si}$ | 0.714493384 | −1.189155195 | 0 | −1.017237669 |
| $d_{TS\theta LT}$ | 0 | 0 | 0 | 0 |
| $d_{TE\psi Si}$ | 0 | 0.558597609 | 0 | 0 |
| $d_{TE\theta LT}$ | 0.734424122 | 0.628956462 | 0 | 0 |
| $d_{\psi Si\theta LT}$ | −0.003900657 | 0.003268439 | 0 | 0 |
| e | −2.246432623 | −2.691572945 | −3.425676672 | −3.236112132 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495 |

TABLE 49

Si (100)
$0 < T_{LT} < 0.2$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −5.687707928 | −5.687707928 |
| $b_{TLT}^{(2)}$ | 0 | 0 |
| $c_{TLT}$ | 0.139506173 | 0.139506173 |
| $a_{TS}^{(2)}$ | 0 | 0 |
| $a_{TS}^{(1)}$ | 5.653643283 | 5.653643283 |
| $b_{TS}^{(2)}$ | 0 | 0 |
| $c_{TS}$ | 0.148148148 | 0.148148148 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −1.004369706 | −1.004369706 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.255555556 | 0.255555556 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000197083 | −0.000197083 |
| $a_{\psi Si}^{(2)}$ | −0.003376583 | −0.003376583 |
| $a_{\psi Si}^{(1)}$ | 0.118081927 | 0.118081927 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −379.4708632 | −379.4708632 |
| $b_{\psi Si}^{(2)}$ | 278.0521262 | 278.0521262 |
| $c_{\psi Si}$ | 23.14814815 | 23.14814815 |
| $a_{\theta LT}^{(2)}$ | 0 | 0 |
| $a_{\theta LT}^{(1)}$ | 0.128631041 | 0.128631041 |
| $b_{\theta LT}^{(2)}$ | 0 | 0 |
| $c_{\theta LT}$ | −49.32098765 | −49.32098765 |
| $d_{TLTTS}$ | 0 | 0 |
| $d_{TLTTE}$ | 72.43278274 | 72.43278274 |
| $d_{TLT\psi Si}$ | 0.604747502 | 0.604747502 |
| $d_{TLT\theta LT}$ | −1.743618251 | −1.743618251 |
| $d_{TSTE}$ | 0 | 0 |
| $d_{TS\psi Si}$ | 0 | 0 |
| $d_{TS\theta LT}$ | 0.994157261 | 0.994157261 |
| $d_{TE\psi Si}$ | 0 | 0 |
| $d_{TE\theta LT}$ | 0.280889881 | 0.280889881 |
| $d_{\psi Si\theta LT}$ | 0.003095822 | 0.003095822 |

TABLE 49-continued

Si (100)
$0 < T_{LT} < 0.2$
$0 \leq T_S < 0.2$

| | $0.05 \leq T_E < 0.25$ | $0.25 \leq T_E \leq 0.45$ |
|---|---|---|
| e | −5.638096455 | −5.638096455 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 50

Si (100)
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | 7.809960834 | 4.249755245 |
| $b_{TLT}^{(2)}$ | 0 | 0 |
| $c_{TLT}$ | 0.30962963 | 0.302857143 |
| $a_{TS}^{(2)}$ | 0 | 0 |
| $a_{TS}^{(1)}$ | 0 | −0.800874586 |
| $b_{TS}^{(2)}$ | 0 | 0 |
| $c_{TS}$ | 0 | 0.150714286 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.563479635 | 9.07053135 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.148518519 | 0.353571429 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | −0.000160979 | 0 |
| $a_{\psi Si}^{(2)}$ | −0.000757552 | 0.001332545 |
| $a_{\psi Si}^{(1)}$ | 0.095765615 | 0.003836714 |
| $b_{\psi Si}^{(6)}$ | 0 | 0 |
| $b_{\psi Si}^{(5)}$ | 0 | 0 |
| $b_{\psi Si}^{(4)}$ | 0 | 0 |

TABLE 50-continued

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $b_{\psi Si}^{(3)}$ | 384.7407407 | 0 |
| $b_{\psi Si}^{(2)}$ | 278.2222222 | 285.0956633 |
| $c_{\psi Si}$ | 21.33333333 | 20.89285714 |
| $a_{\theta LT}^{(2)}$ | 0 | 0 |
| $a_{\theta LT}^{(1)}$ | 0.043185248 | 0.033521037 |
| $b_{\theta LT}^{(2)}$ | 0 | 0 |
| $c_{\theta LT}$ | −50 | −50.92857143 |
| $d_{TLTTS}$ | 0 | 0 |
| $d_{TLTTE}$ | 0 | 0 |
| $d_{TLT\psi Si}$ | −0.383208698 | −0.220029295 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0 | 0.974573109 |
| $d_{TE\psi Si}$ | 0 | 0 |
| $d_{TE\theta LT}$ | 1.01389349 | −1.078939399 |
| $d_{\psi Si\theta LT}$ | 0 | 0.002899732 |
| e | −5.569590226 | −5.29442278 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 51

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −11.51287 | −11.51287 |
| $b_{TLT}^{(2)}$ | 0 | 0 |
| $c_{TLT}$ | 0.136328125 | 0.136328125 |
| $a_{TS}^{(2)}$ | 0 | 0 |
| $a_{TS}^{(1)}$ | 6.022608826 | 6.022608826 |
| $b_{TS}^{(2)}$ | 0 | 0 |
| $c_{TS}$ | 0.305859375 | 0.305859375 |
| $a_{TE}^{(4)}$ | 0 | 0 |
| $a_{TE}^{(3)}$ | −180.607873 | −180.607873 |
| $a_{TE}^{(2)}$ | 1.347493816 | −1.347493816 |
| $a_{TE}^{(1)}$ | 4.841204365 | 4.841204365 |
| $b_{TE}^{(4)}$ | 0 | 0 |
| $b_{TE}^{(3)}$ | −0.000227051 | −0.000227051 |
| $b_{TE}^{(2)}$ | 0.019179688 | 0.019179688 |
| $c_{TE}$ | 0.25625 | 0.25625 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001342794 | −0.001342794 |
| $a_{\psi Si}^{(1)}$ | 0.25625 | 0.25625 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 275.7568359 | 275.7568359 |
| $c_{\psi Si}$ | 0.25625 | 0.25625 |
| $a_{\theta LT}^{(2)}$ | 0 | 0 |
| $a_{\theta LT}^{(1)}$ | 0.153688205 | 0.153688205 |
| $b_{\theta LT}^{(2)}$ | 0 | 0 |
| $c_{\theta LT}$ | −49.140625 | −49.140625 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | −1.180623763 | −1.180623763 |
| $d_{TSTE}$ | 0 | 0 |
| $d_{TS\psi Si}$ | 0 | 0 |
| $d_{TS\theta LT}$ | 0 | 0 |

TABLE 51-continued

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $d_{TE\psi Si}$ | 0 | 0 |
| $d_{TE\theta LT}$ | 0.41394071 | 0.41394071 |
| $d_{\psi Si\theta LT}$ | 0.003203013 | 0.003203013 |
| e | −4.433641408 | −4.433641408 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 52

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 119.666412 | 118.2359738 |
| $a_{TLT}^{(1)}$ | 4.447768142 | 2.271979446 |
| $b_{TLT}^{(2)}$ | 0.006371047 | 0.00699901 |
| $c_{TLT}$ | 0.31147541 | 0.30631068 |
| $a_{TS}^{(2)}$ | 0 | 0 |
| $a_{TS}^{(1)}$ | 0 | −3.805216895 |
| $b_{TS}^{(2)}$ | 0 | 0 |
| $c_{TS}$ | 0 | 0.298543689 |
| $a_{TE}^{(4)}$ | 0 | 0 |
| $a_{TE}^{(3)}$ | 0 | 0 |
| $a_{TE}^{(2)}$ | 117.8354557 | 121.7109482 |
| $a_{TE}^{(1)}$ | 2.107193686 | −0.578851453 |
| $b_{TE}^{(4)}$ | 0 | 0 |
| $b_{TE}^{(3)}$ | 0 | 0 |
| $b_{TE}^{(2)}$ | 0.006775956 | 0.006610661 |
| $c_{TE}$ | 0.15 | 0.35631068 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001658706 | 0 |
| $a_{\psi Si}^{(1)}$ | 0.005677734 | 0.003834195 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 272.5477022 | 0 |
| $c_{\psi Si}$ | 20.90163934 | 20.02427184 |
| $a_{\theta LT}^{(2)}$ | 0 | 0 |
| $a_{\theta LT}^{(1)}$ | 0.051921544 | 0.050011808 |
| $b_{\theta LT}^{(2)}$ | 0 | 0 |
| $c_{\theta LT}$ | −48.36065574 | −48.93203883 |
| $d_{TLTTS}$ | 0 | 0 |
| $d_{TLTTE}$ | 61.26575286 | 0 |
| $d_{TLT\psi Si}$ | 0 | 0 |
| $d_{TLT\theta LT}$ | 0 | 0 |
| $d_{TSTE}$ | 0 | −82.22932804 |
| $d_{TS\psi Si}$ | 0 | 0 |
| $d_{TS\theta LT}$ | 0 | −0.470524678 |
| $d_{TE\psi Si}$ | 0 | 0 |
| $d_{TE\theta LT}$ | 0.904198722 | −0.776132158 |
| $d_{\psi Si\theta LT}$ | 0.003410501 | 0.003906326 |
| e | −5.339814906 | −5.463687811 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599 |

TABLE 53

Si (110)
$0 < T_{LT} < 0.2$
$0 \leq T_S < 0.2$

| | $0.05 \leq T_F < 0.25$ | | $0.25 \leq T_F \leq 0.45$ | |
| --- | --- | --- | --- | --- |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −7.587457615 | −7.587457615 | −7.587457615 | −7.587457615 |
| $b_{TLT}^{(2)}$ | 0 | 0 | 0 | 0 |
| $c_{TLT}$ | 0.174380165 | 0.174380165 | 0.174380165 | 0.174380165 |
| $a_{TS}^{(2)}$ | 0 | 0 | 0 | 0 |
| $a_{TS}^{(1)}$ | −3.979714537 | −3.979714537 | −3.979714537 | −3.979714537 |
| $b_{TS}^{(2)}$ | 0 | 0 | 0 | 0 |
| $c_{TS}$ | 0.150413223 | 0.150413223 | 0.150413223 | 0.150413223 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −0.865040993 | −0.865040993 | −0.865040993 | −0.865040993 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.245867769 | 0.245867769 | 0.245867769 | 0.245867769 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 5.87537E-07 | 5.87537E-07 | 5.87537E-07 | 5.87537E-07 |
| $a_{\psi Si}^{(3)}$ | −8.59015E-07 | −8.59015E-07 | −8.59015E-07 | −8.59015E-07 |
| $a_{\psi Si}^{(2)}$ | −0.001948222 | −0.001948222 | −0.001948222 | −0.001948222 |
| $a_{\psi Si}^{(1)}$ | −0.027558032 | −0.027558032 | −0.027558032 | −0.027558032 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 1129197.497 | 1129197.497 | 1129197.497 | 1129197.497 |
| $b_{\psi Si}^{(3)}$ | −1524.372996 | −1524.372996 | −1524.372996 | −1524.372996 |
| $b_{\psi Si}^{(2)}$ | 776.3813947 | 776.3813947 | 776.3813947 | 776.3813947 |
| $c_{\psi Si}$ | 41.52892562 | 41.52892562 | 41.52892562 | 41.52892562 |
| $a_{\theta LT}^{(2)}$ | 0 | 0 | 0 | 0 |
| $a_{\theta LT}^{(1)}$ | 0.018744549 | 0.018744549 | 0.018744549 | 0.018744549 |
| $b_{\theta LT}^{(2)}$ | 0 | 0 | 0 | 0 |
| $c_{\theta LT}$ | −49.25619835 | −49.25619835 | −49.25619835 | −49.25619835 |
| $d_{TLTTS}$ | 140.6234074 | 140.6234074 | 140.6234074 | 140.6234074 |
| $d_{TLTTE}$ | −25.20654793 | −25.20654793 | −25.20654793 | −25.20654793 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0 | 0 | 0 | 0 |
| e | −1.789519626 | −1.789519626 | −1.789519626 | −1.789519626 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 54

Si (110)
$0.2 \leq T_{LT} \leq 3.5$
$0 \leq T_S < 0.2$

| | $0.05 \leq T_F < 0.25$ | | $0.25 \leq T_F \leq 0.45$ | |
| --- | --- | --- | --- | --- |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 39.68139696 | 39.68139696 |
| $a_{TLT}^{(1)}$ | −3.912934705 | −3.912934705 | −3.801935963 | −3.801935963 |
| $b_{TLT}^{(2)}$ | 0 | 0 | 0.00692398 | 0.00692398 |
| $c_{TLT}$ | 0.306451613 | 0.306451613 | 0.297857143 | 0.297857143 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |

TABLE 54-continued

| | Si (110) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TE}^{(2)}$ | | 0 | 0 | 0 |
| $a_{TE}^{(1)}$ | 1.912614784 | 1.912614784 | −6.089810932 | −6.089810932 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.148924731 | 0.148924731 | 0.347857143 | 0.347857143 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 8.78847E−06 | 8.78847E−06 |
| $a_{\psi Si}^{(2)}$ | −0.0004718 | −0.0004718 | −0.000160567 | −0.000160567 |
| $a_{\psi Si}^{(1)}$ | 0.003265633 | 0.003265633 | −0.023574651 | −0.023574651 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 2351.597668 | 2351.597668 |
| $b_{\psi Si}^{(2)}$ | 847.4765869 | 847.4765869 | 880.2091837 | 880.2091837 |
| $c_{\psi Si}$ | 35.32258065 | 35.32258065 | 43.07142857 | 43.07142857 |
| $a_{\theta LT}^{(2)}$ | 0.005014741 | 0.005014741 | 0 | 0 |
| $a_{\theta LT}^{(1)}$ | 0.023115164 | 0.023115164 | 0.030121011 | 0.030121011 |
| $b_{\theta LT}^{(2)}$ | 67.0626662 | 67.0626662 | 0 | 0 |
| $c_{\theta LT}$ | −49.62365591 | −49.62365591 | −51.28571429 | −51.28571429 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0.125572529 | 0.125572529 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0.563162206 | 0.563162206 | −0.417002414 | −0.417002414 |
| $d_{\psi Si\theta LT}$ | 0 | 0 | 0 | 0 |
| e | −2.002512986 | −2.002512986 | −2.550158637 | −2.550158637 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 55

| | Si (110) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | 2.992014692 | 2.992014692 | −1.461725087 | −1.461725087 |
| $b_{TLT}^{(2)}$ | 0 | 0 | 0 | 0 |
| $c_{TLT}$ | 0.156390977 | 0.156390977 | 0.155345912 | 0.155345912 |
| $a_{TS}^{(2)}$ | 0 | 0 | 0 | 0 |
| $a_{TS}^{(1)}$ | −9.089925228 | −9.089925228 | −1.247751383 | −1.247751383 |
| $b_{TS}^{(2)}$ | 0 | 0 | 0 | 0 |
| $c_{TS}$ | 0.305263158 | 0.305263158 | 0.327672956 | 0.327672956 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −130.6388144 | −130.6388144 |
| $a_{TE}^{(1)}$ | 5.773590917 | 5.773590917 | −0.010504162 | −0.010504162 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006662711 | 0.006662711 |
| $c_{TE}$ | 0.166541353 | 0.166541353 | 0.341823899 | 0.341823899 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 1.03604E−05 | 1.03604E−05 |

TABLE 55-continued

| | Si (110) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{\psi Si}^{(2)}$ | −0.000377109 | −0.000377109 | −0.000138558 | −0.000138558 |
| $a_{\psi Si}^{(1)}$ | −0.013702515 | −0.013702515 | −0.028102653 | −0.028102653 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 3096.349671 | 3096.349671 |
| $b_{\psi Si}^{(2)}$ | 792.2381141 | 792.2381141 | 957.6361695 | 957.6361695 |
| $c_{\psi Si}$ | 41.39097744 | 41.39097744 | 43.20754717 | 43.20754717 |
| $a_{\theta LT}^{(2)}$ | 0 | 0 | 0 | 0 |
| $a_{\theta LT}^{(1)}$ | 0.015804666 | 0.015804666 | 0.028892246 | 0.028892246 |
| $b_{\theta LT}^{(2)}$ | 0 | 0 | 0 | 0 |
| $c_{\theta LT}$ | −49.32330827 | −49.32330827 | −49.62264151 | −49.62264151 |
| $d_{TLTTS}$ | 0 | 0 | −44.5976835 | −44.5976835 |
| $d_{TLTTE}$ | 80.90186655 | 80.90186655 | −150.2428298 | −150.2428298 |
| $d_{TLT\psi Si}$ | 0 | 0 | 0.225109644 | 0.225109644 |
| $d_{TLT\theta LT}$ | 0 | 0 | 0 | 0 |
| $d_{TSTE}$ | 29.68261053 | 29.68261053 | 47.35851038 | 47.35851038 |
| $d_{TS\psi Si}$ | 0.136750854 | 0.136750854 | 0 | 0 |
| $d_{TS\theta LT}$ | 0 | 0 | 0 | 0 |
| $d_{TE\psi Si}$ | −0.146211814 | −0.146211814 | 0 | 0 |
| $d_{TE\theta LT}$ | 0.41229257 | 0.41229257 | 0 | 0 |
| $d_{\psi Si\theta LT}$ | 0 | 0 | 0 | 0 |
| e | −2.596813807 | −2.596813807 | −2.049341112 | −2.049341112 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 56

| | Si (110) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −2.80791074 | −2.80791074 | 0 | 0 |
| $b_{TLT}^{(2)}$ | 0 | 0 | 0 | 0 |
| $c_{TLT}$ | 0.3069869 | 0.3069869 | 0 | 0 |
| $a_{TS}^{(2)}$ | 0 | 0 | 0 | 0 |
| $a_{TS}^{(1)}$ | −5.618098986 | −5.618098986 | 0 | 0 |
| $b_{TS}^{(2)}$ | 0 | 0 | 0 | 0 |
| $c_{TS}$ | 0.286462882 | 0.286462882 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −73.23839461 | −73.23839461 |
| $a_{TE}^{(1)}$ | 8.962154821 | 8.962154821 | −5.710295136 | −5.710295136 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007310763 | 0.007310763 |
| $c_{TE}$ | 0.167467249 | 0.167467249 | 0.330930233 | 0.330930233 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.003677309 | 0.003677309 | 0 | 0 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 40.93886463 | 40.93886463 | 0 | 0 |
| $a_{\theta LT}^{(2)}$ | 0.00527863 | 0.00527863 | 0 | 0 |
| $a_{\theta LT}^{(1)}$ | 0.008431458 | 0.008431458 | 0 | 0 |

TABLE 56-continued

| | Si (110) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\theta LT}^{(2)}$ | 66.00179249 | 66.00179249 | 0 | 0 |
| $c_{\theta LT}$ | −50.61135371 | −50.61135371 | −90 | −90 |
| $d_{TLTTS}$ | 63.6265441 | 63.6265441 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 57.20229582 | 57.20229582 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | −0.098212695 | −0.098212695 | 0 | 0 |
| $d_{TE\theta LT}$ | 0.32576925 | 0.32576925 | 0 | 0 |
| $d_{\psi Si\theta LT}$ | 0 | 0 | 0 | 0 |
| e | −2.431352404 | −2.431352404 | −2.39032093 | −2.39032093 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 57

| | Si (111) $0 < T_{LT} < 0.2$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −26.67263869 | −6.49243933 | −20.61574251 | −21.06290014 |
| $b_{TLT}^{(2)}$ | 0 | 0 | 0 | 0 |
| $c_{TLT}$ | 0.15443038 | 0.175438596 | 0.160759494 | 0.156896552 |
| $a_{TS}^{(2)}$ | 0 | 0 | 0 | 0 |
| $a_{TS}^{(1)}$ | −7.971316395 | 7.232224634 | −16.40433051 | −3.920556446 |
| $b_{TS}^{(2)}$ | 0 | 0 | 0 | 0 |
| $c_{TS}$ | 0.14556962 | 0.133333333 | 0.144303797 | 0.144827586 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −110.7824708 | −133.1826499 | 0 |
| $a_{TE}^{(1)}$ | 12.77975858 | 10.04988717 | 5.027045348 | −5.686378626 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006463527 | 0.006582278 | 0 |
| $c_{TE}$ | 0.151265823 | 0.144736842 | 0.35 | 0.35862069 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | −0.007219474 | 0 |
| $a_{\psi Si}^{(1)}$ | 0.028716852 | 0.04192074 | −0.016815807 | 0.008780601 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 125.0280404 | 0 |
| $c_{\psi Si}$ | 9.683544304 | 0 | 11.58227848 | 48.10344828 |
| $a_{\theta LT}^{(2)}$ | 0.01035547 | 0 | 0 | 0.014789077 |
| $a_{\theta LT}^{(1)}$ | 0.162093889 | 0.106646805 | 0.164306798 | 0.04587348 |
| $b_{\theta LT}^{(2)}$ | 61.8811088 | 0 | 0 | 55.43995244 |
| $c_{\theta LT}$ | −49.62025316 | −50.35087719 | −51.01265823 | −51.20689655 |
| $d_{TLTTS}$ | −609.1883956 | −724.6623011 | −297.9828576 | −203.214973 |
| $d_{TLTTE}$ | −215.420422 | 0 | 159.6303697 | 0 |
| $d_{TLT\psi Si}$ | 0 | −3.771938969 | 2.003207828 | −2.014745526 |
| $d_{TLT\theta LT}$ | 1.80686724 | 0 | 2.218853872 | 0 |
| $d_{TSTE}$ | 0 | −307.4269587 | 0 | 0 |
| $d_{TS\psi Si}$ | 0 | 0 | −1.097992723 | 0 |
| $d_{TS\theta LT}$ | 1.985202008 | 0 | 2.104127874 | 0 |
| $d_{TE\psi Si}$ | 0 | 0 | −1.45135593 | 0 |

TABLE 57-continued

| | Si (111) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\theta LT}$ | −203.386471 | 1.145649707 | 0 | 0 |
| $d_{\psi Si\theta LT}$ | 2.42647485 | 0.004357557 | 0 | 0 |
| e | −5.019952207 | −2.13826109 | −3.235663805 | −3.326865691 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 58

| | Si (111) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 45.51074293 | −94.44342524 | 0 |
| $a_{TLT}^{(1)}$ | 0.788515154 | −3.454988617 | −9.832405019 | −3.192556866 |
| $b_{TLT}^{(2)}$ | 0 | 0.006485261 | 0.006459172 | 0 |
| $c_{TLT}$ | 0.298058252 | 0.295238095 | 0.298461538 | 0.298913043 |
| $a_{TS}^{(2)}$ | 0 | 0 | 0 | 0 |
| $a_{TS}^{(1)}$ | −8.97795964 | 1.31344944 | 0 | 0 |
| $b_{TS}^{(2)}$ | 0 | 0 | 0 | 0 |
| $c_{TS}$ | 0.142718447 | 0.147619048 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 9.791468713 | 0.170587985 | −0.71523762 | −10.72534988 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.15776699 | 0.124603175 | 0.356153846 | 0.347826087 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0.003924448 | 0.001661439 | 0 | 0.00657999 |
| $a_{\psi Si}^{(1)}$ | 0.15776699 | −0.024952541 | 0.02404454 | −0.067389114 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 148.4588557 | 132.0861678 | 0 | 152.6937618 |
| $c_{\psi Si}$ | 15.29126214 | 46.9047619 | 14.19230769 | 43.04347826 |
| $a_{\theta LT}^{(2)}$ | 0 | 0 | 0 | 0 |
| $a_{\theta LT}^{(1)}$ | 0.06700163 | 0.042141715 | 0.055240362 | 0.061747926 |
| $b_{\theta LT}^{(2)}$ | 0 | 0 | 0 | 0 |
| $c_{\theta LT}$ | −48.73786408 | −50.15873016 | −49.76923077 | −49.45652174 |
| $d_{TLTTS}$ | 116.7290786 | −78.78450728 | 0 | 0 |
| $d_{TLTTE}$ | 0 | 85.46351406 | −49.85282875 | 0 |
| $d_{TLT\psi Si}$ | −0.70199108 | 0.445481139 | 0 | 0.604657146 |
| $d_{TLT\theta LT}$ | −0.726496636 | 0 | 0 | 0 |
| $d_{TSTE}$ | 0 | −116.360096 | 0 | 0 |
| $d_{TS\psi Si}$ | 0 | −0.622709588 | 0 | 0 |
| $d_{TS\theta LT}$ | 2.041329502 | −0.339115637 | 0 | 0 |
| $d_{TE\psi Si}$ | 0 | 0.20688896 | 0 | 0 |
| $d_{TE\theta LT}$ | 0.774150432 | 0.439880407 | −0.6608739 | −1.068569294 |
| $d_{\psi Si\theta LT}$ | −0.005400114 | 0.002667922 | −0.004937546 | 0.006290209 |
| e | −4.209434885 | −1.791078273 | −3.48174155 | −3.934527612 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 59

Si (111)
$0 < T_{LT} < 0.2$
$0.2 \leq T_S \leq 2.0$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −4.673850215 | 0 | −8.8586067 | −1.957300157 |
| $b_{TLT}^{(2)}$ | 0 | 0 | 0 | 0 |
| $c_{TLT}$ | 0.141509434 | 0 | 0.153125 | 0.16 |
| $a_{TS}^{(2)}$ | 82.42811022 | 0 | 87.42203531 | 0 |
| $a_{TS}^{(1)}$ | −7.905282467 | −4.948155925 | −0.569845134 | 0.521030757 |
| $b_{TS}^{(2)}$ | 0.006949092 | 0 | 0.006037326 | 0 |
| $c_{TS}$ | 0.294339623 | 0.314583333 | 0.297916667 | 0.285 |
| $a_{TE}^{(4)}$ | 0 | 0 | 0 | 0 |
| $a_{TE}^{(3)}$ | 0 | 0 | 0 | 0 |
| $a_{TE}^{(2)}$ | 53.51232744 | −79.38404758 | 0 | 0 |
| $a_{TE}^{(1)}$ | 10.58973083 | 10.26534018 | 8.135327356 | −7.251553825 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006016376 | 0.005677083 | 0 | 0 |
| $c_{TE}$ | 0.183962264 | 0.1375 | 0.336458333 | 0.37 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0.001429494 |
| $a_{\psi Si}^{(1)}$ | 0.010122468 | 0.039888924 | −0.016592245 | −0.004853684 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 145.6875 |
| $c_{\psi Si}$ | 11.88679245 | 48.4375 | 14.0625 | 45.75 |
| $a_{\theta LT}^{(2)}$ | 0 | 0 | 0 | 0 |
| $a_{\theta LT}^{(1)}$ | −0.005093912 | 0.011098836 | 0.047530531 | 0.04750516 |
| $b_{\theta LT}^{(2)}$ | 0 | 0 | 0 | 0 |
| $c_{\theta LT}$ | −50 | −50.4166667 | −50.72916667 | −49.75 |
| $d_{TLTTS}$ | 0 | 0 | 91.19418307 | 251.5375225 |
| $d_{TLTTE}$ | 0 | 0 | −156.3654518 | 0 |
| $d_{TLT\psi Si}$ | 0.322255595 | 0 | 0 | −0.289820964 |
| $d_{TLT\theta LT}$ | −0.768436344 | 0 | −0.735737765 | 0 |
| $d_{TSTE}$ | 0 | 75.51836907 | 0 | 0 |
| $d_{TS\psi Si}$ | −0.512402643 | 0.300543357 | −0.724013025 | 0.245746891 |
| $d_{TS\theta LT}$ | 0 | 0 | 0 | 0 |
| $d_{TE\psi Si}$ | 0 | 0 | −0.50556971 | 0 |
| $d_{TE\theta LT}$ | 0 | 0 | 0 | 0 |
| $d_{\psi Si\theta LT}$ | 0 | 0.002842264 | 0 | 0 |
| $e$ | −2.770026639 | −2.638591885 | −1.980941925 | −2.412296494 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 60

Si (111)
$0.2 \leq T_{LT} \leq 3.5$
$0.2 \leq T_S \leq 2.0$

| | $0.05 \leq T_F < 0.25$ | | $0.05 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 4.449764983 | 0 | −13.78321665 | −10.59163435 |
| $b_{TLT}^{(2)}$ | 0 | 0 | 0 | 0 |
| $c_{TLT}$ | 0.321052632 | 0 | 0.309146341 | 0.303164557 |
| $a_{TS}^{(2)}$ | 0 | 0 | 0 | 0 |
| $a_{TS}^{(1)}$ | 0 | −3.433673203 | −1.746861763 | 3.363230821 |
| $b_{TS}^{(2)}$ | 0 | 0 | 0 | 0 |
| $c_{TS}$ | 0 | 0.283443709 | 0.287804878 | 0.293037975 |
| $a_{TE}^{(4)}$ | 0 | 0 | 0 | 0 |
| $a_{TE}^{(3)}$ | 0 | 0 | 0 | 0 |

TABLE 60-continued

| | Si (111) $0.2 \leq T_{LT} \leq 3.5$ $0.2 \leq T_S \leq 2.0$ | | | |
|---|---|---|---|---|
| | $0.05 \leq T_E < 0.25$ | | $0.05 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TE}^{(2)}$ | 0 | 0 | 86.18383552 | 0 |
| $a_{TE}^{(1)}$ | 3.853394073 | 8.768511808 | −1.86755053 | −15.6861606 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007157942 | 0 |
| $c_{TE}$ | 0.181578947 | 0.135430464 | 0.356097561 | 0.363291139 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.014178515 | 0.049910217 | −0.008697771 | 0.012742666 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 12.63157895 | 45.99337748 | 15.09146341 | 45 |
| $a_{\theta LT}^{(2)}$ | 0 | 0 | 0 | 0 |
| $a_{\theta LT}^{(1)}$ | 0 | 0.061867934 | 0.051566965 | 0.028929641 |
| $b_{\theta LT}^{(2)}$ | 0 | 0 | 0 | 0 |
| $c_{\theta LT}$ | −90 | −50.59602649 | −50.30487805 | −50.56962025 |
| $d_{TLTTS}$ | 0 | 0 | 0 | −103.0440888 |
| $d_{TLTTE}$ | 0 | 0 | 0 | 0 |
| $d_{TLT\psi Si}$ | −0.181721459 | 0 | 0 | −0.608943868 |
| $d_{TLT\theta LT}$ | 0 | 0 | 0 | 0 |
| $d_{TSTE}$ | 0 | 113.1914268 | −75.04640382 | −82.04954672 |
| $d_{TS\psi Si}$ | 0 | 0 | −0.554356722 | 0.673316097 |
| $d_{TS\theta LT}$ | 0 | 0 | 0 | 0 |
| $d_{TE\psi Si}$ | 0 | 0 | −0.512800103 | 0 |
| $d_{TE\theta LT}$ | 0 | 0 | −0.656702553 | 0 |
| $d_{\psi Si\theta LT}$ | 0 | 0 | 0 | 0 |
| e | −2.401219798 | −3.18651044 | −3.93030224 | −4.143483981 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599 |

TABLE 61

| | Si (100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −16.39135605 | −16.39135605 |
| $b_{TLT}^{(2)}$ | 0 | 0 |
| $c_{TLT}$ | 0.196774194 | 0.196774194 |
| $a_{TS}^{(2)}$ | 0 | 0 |
| $a_{TS}^{(1)}$ | −4.824831305 | −4.824831305 |
| $b_{TS}^{(2)}$ | 0 | 0 |
| $c_{TS}$ | 0.170967742 | 0.170967742 |
| $a_{TE}^{(4)}$ | 0 | 0 |
| $a_{TE}^{(3)}$ | 0 | 0 |
| $a_{TE}^{(2)}$ | −45.57608817 | −45.57608817 |
| $a_{TE}^{(1)}$ | −10.80005563 | −10.80005563 |
| $b_{TE}^{(4)}$ | 0 | 0 |
| $b_{TE}^{(3)}$ | 0 | 0 |
| $b_{TE}^{(2)}$ | 0.018296046 | 0.018296046 |
| $c_{TE}$ | 0.303225806 | 0.303225806 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000172048 | 0.000172048 |
| $a_{\psi Si}^{(2)}$ | −0.00384923 | −0.00384923 |
| $a_{\psi Si}^{(1)}$ | −0.009826773 | −0.009826773 |

TABLE 61-continued

| | Si (100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 143.0843208 | 143.0843208 |
| $b_{\psi Si}^{(2)}$ | 215.8688866 | 215.8688866 |
| $c_{\psi Si}$ | 22.25806452 | 22.25806452 |
| $a_{\theta LT}^{(2)}$ | 0 | 0 |
| $a_{\theta LT}^{(1)}$ | 0.066799879 | 0.066799879 |
| $b_{\theta LT}^{(2)}$ | 0 | 0 |
| $c_{\theta LT}$ | −50.16129032 | −50.16129032 |
| $d_{TLTTS}$ | 0 | 0 |
| $d_{TLTTE}$ | −112.847682 | −112.847682 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | −1.750763196 | −1.750763196 |
| $d_{TS\theta LT}$ | 0 | 0 |
| $d_{TE\psi Si}$ | 0 | 0 |
| $d_{TE\theta LT}$ | 0.466692151 | 0.466692151 |
| $d_{\psi Si\theta LT}$ | 0 | 0 |
| e | −2.904746788 | −2.904746788 |
| $a_{TP}$ | 0 | 0 |

TABLE 61-continued

| | Si (100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 62

| | Si (100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −8.135537689 | −8.135537689 |
| $b_{TLT}^{(2)}$ | 0 | 0 |
| $c_{TLT}$ | 0.311659193 | 0.311659193 |
| $a_{TS}^{(2)}$ | 0 | 0 |
| $a_{TS}^{(1)}$ | −20.38200282 | −20.38200282 |
| $b_{TS}^{(2)}$ | 0 | 0 |
| $c_{TS}$ | 0.149327354 | 0.149327354 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | −3.460675692 | −3.460675692 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0.267488789 | 0.267488789 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.003759233 | −0.003759233 |
| $a_{\psi Si}^{(1)}$ | 0.015931998 | 0.015931998 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 239.0395946 | 239.0395946 |
| $c_{\psi Si}$ | 18.90134529 | 18.90134529 |
| $a_{\theta LT}^{(2)}$ | 0 | 0 |
| $a_{\theta LT}^{(1)}$ | 0.017576249 | 0.017576249 |
| $b_{\theta LT}^{(2)}$ | 0 | 0 |
| $c_{\theta LT}$ | −49.9103139 | −49.9103139 |
| $d_{TLTTS}$ | −152.1817236 | −152.1817236 |
| $d_{TLTTE}$ | 0 | 0 |
| $d_{TLT\psi Si}$ | −0.359387178 | −0.359387178 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | 0.911415415 | 0.911415415 |
| $d_{TE\psi Si}$ | 0 | 0 |
| $d_{TE\theta LT}$ | 0.275815872 | 0.275815872 |
| $d_{\psi Si\theta LT}$ | 0 | 0 |
| e | −3.952626598 | −3.952626598 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 63

| | Si (100) $0 < T_{LT} < 0.2$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −26.36951471 | −26.36951471 |
| $b_{TLT}^{(2)}$ | 0 | 0 |
| $c_{TLT}$ | 0.161538462 | 0.161538462 |
| $a_{TS}^{(2)}$ | 0 | 0 |
| $a_{TS}^{(1)}$ | −10.09828536 | −10.09828536 |
| $b_{TS}^{(2)}$ | 0 | 0 |
| $c_{TS}$ | 0.321025641 | 0.321025641 |
| $a_{TE}^{(4)}$ | 0 | 0 |
| $a_{TE}^{(3)}$ | 0 | 0 |
| $a_{TE}^{(2)}$ | −21.38297597 | −21.38297597 |
| $a_{TE}^{(1)}$ | −2.383287449 | −2.383287449 |
| $b_{TE}^{(4)}$ | 0 | 0 |
| $b_{TE}^{(3)}$ | 0 | 0 |
| $b_{TE}^{(2)}$ | 0.01947666 | 0.01947666 |
| $c_{TE}$ | 0.270512821 | 0.270512821 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000176024 | 0.000176024 |
| $a_{\psi Si}^{(2)}$ | −0.001397911 | −0.001397911 |
| $a_{\psi Si}^{(1)}$ | −0.107515297 | −0.107515297 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −282.3623122 | −282.3623122 |
| $b_{\psi Si}^{(2)}$ | 255.2071006 | 255.2071006 |
| $c_{\psi Si}$ | 23.84615385 | 23.84615385 |
| $a_{\theta LT}^{(2)}$ | 0 | 0 |
| $a_{\theta LT}^{(1)}$ | 0.085112984 | 0.085112984 |
| $b_{\theta LT}^{(2)}$ | 0 | 0 |
| $c_{\theta LT}$ | −48.97435897 | −48.97435897 |
| $d_{TLTTS}$ | 0 | 0 |
| $d_{TLTTE}$ | 0 | 0 |
| $d_{TLT\psi Si}$ | −0.816828716 | −0.816828716 |
| $T_{TLT\theta LT}$ | 0.865519967 | 0.865519967 |
| $d_{TSTE}$ | 0 | 0 |
| $d_{TS\psi Si}$ | −0.538336559 | −0.538336559 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.002971652 | 0.002971652 |
| e | −3.504362202 | −3.504362202 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 64

| | Si (100) $0.2 \leq T_{LT} \leq 3.5$ $0.2 \leq T_S \leq 2.0$ | |
|---|---|---|
| | $0.05 \leq T_E < 0.25$ | $0.25 \leq T_E \leq 0.45$ |
| $a_{TLT}^{(2)}$ | 0 | 0 |
| $a_{TLT}^{(1)}$ | −6.371850196 | −6.371850196 |
| $b_{TLT}^{(2)}$ | 0 | 0 |
| $c_{TLT}$ | 0.292192192 | 0.292192192 |
| $a_{TS}^{(2)}$ | 0 | 0 |
| $a_{TS}^{(1)}$ | −0.609606885 | −0.609606885 |
| $b_{TS}^{(2)}$ | 0 | 0 |
| $c_{TS}$ | 0.2996997 | 0.2996997 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | 0 |
| $b_{TE}^{(4)}$ | 0 | 0 |
| $b_{TE}^{(3)}$ | 0 | 0 |

TABLE 64-continued

Si (100)
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $b_{TE}^{(2)}$ | 0 | 0 |
| $c_{TE}$ | 0 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000224133 | 0.000224133 |
| $a_{\psi Si}^{(2)}$ | −0.004048532 | −0.004048532 |
| $a_{\psi Si}^{(1)}$ | −0.126847922 | −0.126847922 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 1375.85979 | 1375.85979 |
| $b_{\psi Si}^{(2)}$ | 281.2555799 | 281.2555799 |
| $c_{\psi Si}$ | 19.77477477 | 19.77477477 |
| $a_{\theta LT}^{(2)}$ | 0 | 0 |
| $a_{\theta LT}^{(1)}$ | 0.056146223 | 0.056146223 |
| $b_{\theta LT}^{(2)}$ | 0 | 0 |
| $c_{\theta LT}$ | −49.48948949 | −49.48948949 |
| $d_{TLTTS}$ | 94.47145497 | 94.47145497 |
| $d_{TLTTE}$ | 0 | 0 |
| $d_{TLT\psi Si}$ | 0 | 0 |
| $T_{TLT\theta LT}$ | 0 | 0 |
| $d_{TSTE}$ | 0 | 0 |
| $d_{TS\psi Si}$ | 0 | 0 |
| $d_{TS\theta LT}$ | −0.568942451 | −0.568942451 |
| $d_{TE\psi Si}$ | 0 | 0 |
| $d_{TE\theta LT}$ | 0 | 0 |
| $d_{\psi Si\theta LT}$ | 0.005654813 | 0.005654813 |
| $e$ | −4.940340284 | −4.940340284 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978 |

TABLE 65

Si (110)
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −11.04825287 | −11.04825287 | −11.04825287 | −11.04825287 |
| $b_{TLT}^{(2)}$ | 0 | 0 | 0 | 0 |
| $c_{TLT}$ | 0.164705882 | 0.164705882 | 0.164705882 | 0.164705882 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.86806521 | −12.86806521 | −12.86806521 | −12.86806521 |
| $a_{TE}^{(1)}$ | 39.88235294 | 39.88235294 | 39.88235294 | 39.88235294 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.019258131 | 0.019258131 | 0.019258131 | 0.019258131 |
| $c_{TE}$ | 0.286470588 | 0.286470588 | 0.286470588 | 0.286470588 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.000762445 | −0.000762445 | −0.000762445 | −0.000762445 |
| $a_{\psi Si}^{(1)}$ | −0.031584918 | −0.031584918 | −0.031584918 | −0.031584918 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 749.7716263 | 749.7716263 | 749.7716263 | 749.7716263 |
| $c_{\psi Si}$ | 52.58823529 | 52.58823529 | 52.58823529 | 52.58823529 |
| $a_{\theta LT}^{(2)}$ | −0.004115091 | −0.004115091 | −0.004115091 | −0.004115091 |
| $a_{\theta LT}^{(1)}$ | 0.023260981 | 0.023260981 | 0.023260981 | 0.023260981 |
| $b_{\theta LT}^{(2)}$ | 81.16262976 | 81.16262976 | 81.16262976 | 81.16262976 |
| $c_{\theta LT}$ | −50.11764706 | −50.11764706 | −50.11764706 | −50.11764706 |
| $d_{TLTTS}$ | 0 | 0 | 0 | 0 |
| $d_{TLTTE}$ | −32.35244505 | −32.35244505 | −32.35244505 | −32.35244505 |
| $d_{TLT\psi Si}$ | 0.348515389 | 0.348515389 | 0.348515389 | 0.348515389 |
| $T_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.000823202 | 0.000823202 | 0.000823202 | 0.000823202 |
| $e$ | −1.678155024 | −1.678155024 | −1.678155024 | −1.678155024 |

TABLE 65-continued

Si (110)
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 66

Si (110)
$0.2 \leq T_{LT} \leq 3.5$
$0 \leq T_S < 0.2$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 34.01092867 | 34.01092867 |
| $a_{TLT}^{(1)}$ | −3.294448859 | −3.294448859 | −2.996122319 | −2.996122319 |
| $b_{TLT}^{(2)}$ | 0 | 0 | 0.005572031 | 0.005572031 |
| $c_{TLT}$ | 0.328378378 | 0.328378378 | 0.31344086 | 0.31344086 |
| $a_{TS}^{(2)}$ | 0 | 0 | 0 | 0 |
| $a_{TS}^{(1)}$ | 2.752851676 | 2.752851676 | −1.564359965 | −1.564359965 |
| $b_{TS}^{(2)}$ | 0 | 0 | 0 | 0 |
| $c_{TS}$ | 0.162837838 | 0.162837838 | 0.160752688 | 0.160752688 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −4.548790211 | −4.548790211 | −1.370514553 | −1.370514553 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.165540541 | 0.165540541 | 0.355913978 | 0.355913978 |
| $a_{\psi Si}^{(6)}$ | 0 | 0 | 0 | 0 |
| $a_{\psi Si}^{(5)}$ | −7.03888E−08 | −7.03888E−08 | −3.78178E−08 | −3.78178E−08 |
| $a_{\psi Si}^{(4)}$ | 1.4265E−06 | 1.4265E−06 | 9.79065E−07 | 9.79065E−07 |
| $a_{\psi Si}^{(3)}$ | 0.000180358 | 0.000180358 | 9.73597E−05 | 9.73597E−05 |
| $a_{\psi Si}^{(2)}$ | −0.002681874 | −0.002681874 | −0.00192926 | −0.00192926 |
| $a_{\psi Si}^{(1)}$ | −0.092266284 | −0.092266284 | −0.04329175 | −0.04329175 |
| $b_{\psi Si}^{(6)}$ | 0 | 0 | 0 | 0 |
| $b_{\psi Si}^{(5)}$ | 11701030.08 | 11701030.08 | 24265475.25 | 24265475.25 |
| $b_{\psi Si}^{(4)}$ | 1439156.296 | 1439156.296 | 1705613.393 | 1705613.393 |
| $b_{\psi Si}^{(3)}$ | 1798.436559 | 1798.436559 | 6938.899332 | 6938.899332 |
| $b_{\psi Si}^{(2)}$ | 930.5183985 | 930.5183985 | 1060.880593 | 1060.880593 |
| $c_{\psi Si}$ | 40.23648649 | 40.23648649 | 40.08064516 | 40.08064516 |
| $a_{\theta LT}^{(2)}$ | 0 | 0 | 0 | 0 |
| $a_{\theta LT}^{(1)}$ | 0.046000242 | 0.046000242 | 0.001380272 | 0.001380272 |
| $b_{\theta LT}^{(2)}$ | 0 | 0 | 0 | 0 |
| $c_{\theta LT}$ | −49.52702703 | −49.52702703 | −50.05376344 | −50.05376344 |
| $d_{TLTTS}$ | −136.9978702 | −136.9978702 | −73.06084164 | −73.06084164 |
| $d_{TLTTE}$ | 0 | 0 | 0 | 0 |
| $d_{TLT\psi Si}$ | 0 | 0 | 0.096651605 | 0.096651605 |
| $T_{TLT\theta LT}$ | 0 | 0 | 0 | 0 |
| $d_{TSTE}$ | 0 | 0 | −56.78924979 | −56.78924979 |
| $d_{TS\psi Si}$ | 0 | 0 | 0 | 0 |
| $d_{TS\theta LT}$ | 0 | 0 | 0 | 0 |
| $d_{TE\psi Si}$ | 0.081014811 | 0.081014811 | 0 | 0 |
| $d_{TE\theta LT}$ | 0 | 0 | −0.194432704 | −0.194432704 |
| $d_{\psi Si\theta LT}$ | 0 | 0 | 0.000875955 | 0.000875955 |
| e | −2.543790382 | −2.543790382 | −2.964933907 | −2.964933907 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 67

Si (110)
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −13.1565646 | −13.1565646 | −13.1565646 | −13.1565646 |
| $b_{TLT}^{(2)}$ | 0 | 0 | 0 | 0 |
| $c_{TLT}$ | 0.179661017 | 0.179661017 | 0.179661017 | 0.179661017 |
| $a_{TS}^{(2)}$ | −54.97015257 | −54.97015257 | −54.97015257 | −54.97015257 |
| $a_{TS}^{(1)}$ | 1.195559996 | 1.195559996 | 1.195559996 | 1.195559996 |
| $b_{TS}^{(2)}$ | 0.006496856 | 0.006496856 | 0.006496856 | 0.006496856 |
| $c_{TS}$ | 0.299435028 | 0.299435028 | 0.299435028 | 0.299435028 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.83875925 | −12.83875925 | −12.83875925 | −12.83875925 |
| $a_{TE}^{(1)}$ | −2.591177902 | −2.591177902 | −2.591177902 | −2.591177902 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.02062115 | 0.02062115 | 0.02062115 | 0.02062115 |
| $c_{TE}$ | 0.282768362 | 0.282768362 | 0.282768362 | 0.282768362 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00094978 | −0.00094978 | −0.00094978 | −0.00094978 |
| $a_{\psi Si}^{(1)}$ | −0.016861509 | −0.016861509 | −0.016861509 | −0.016861509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | −0.00094978 | −0.00094978 | −0.00094978 | −0.00094978 |
| $c_{\psi Si}$ | 44.83050847 | 44.83050847 | 44.83050847 | 44.83050847 |
| $a_{\theta LT}^{(2)}$ | 0 | 0 | 0 | 0 |
| $a_{\theta LT}^{(1)}$ | 0.020120147 | 0.020120147 | 0.020120147 | 0.020120147 |
| $b_{\theta LT}^{(2)}$ | 0 | 0 | 0 | 0 |
| $c_{\theta LT}$ | −50.50847458 | −50.50847458 | −50.50847458 | −50.50847458 |
| $d_{TLTTS}$ | 0 | 0 | 0 | 0 |
| $d_{TLTTE}$ | 0 | 0 | 0 | 0 |
| $d_{TLT\psi Si}$ | 0.250474306 | 0.250474306 | 0.250474306 | 0.250474306 |
| $T_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.031071552 | 0.031071552 | 0.031071552 | 0.031071552 |
| $d_{TE\theta LT}$ | 0 | 0 | 0 | 0 |
| $d_{\psi Si\theta LT}$ | 0 | 0 | 0 | 0 |
| e | −1.687640015 | −1.687640015 | −1.687640015 | −1.687640015 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 68

Si (110)
$0.2 \leq T_{LT} \leq 3.5$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −8.387315737 | −8.387315737 | −11.34973266 | −6.017883428 |
| $b_{TLT}^{(2)}$ | 0 | 0 | 0 | 0 |
| $c_{TLT}$ | 0.313377926 | 0.313377926 | 0.291082803 | 0.294578313 |
| $a_{TS}^{(2)}$ | 0 | 0 | 0 | 0 |
| $a_{TS}^{(1)}$ | 0.140898252 | 0.140898252 | 3.107378473 | 2.287606243 |
| $b_{TS}^{(2)}$ | 0 | 0 | 0 | 0 |
| $c_{TS}$ | 0.299331104 | 0.299331104 | 0.277707006 | 0.296385542 |
| $a_{TE}^{(4)}$ | 0 | 0 | 0 | 0 |
| $a_{TE}^{(3)}$ | 0 | 0 | 0 | 0 |

TABLE 68-continued

Si (110)
$0.2 \leq T_{LT} \leq 3.5$
$0.2 \leq T_S \leq 2.0$

| | $0.05 \leq T_F < 0.25$ | | $0.25 \leq T_F \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TE}^{(2)}$ | 0 | 0 | 0 | 0 |
| $a_{TE}^{(1)}$ | −1.209727849 | −1.209727849 | −4.259242642 | −1.280235687 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.152006689 | 0.152006689 | 0.343630573 | 0.351204819 |
| $a_{\psi Si}^{(6)}$ | 0 | 0 | 0 | 0 |
| $a_{\psi Si}^{(5)}$ | −2.33027E−08 | −2.33027E−08 | 0 | 0 |
| $a_{\psi Si}^{(4)}$ | 7.78115E−07 | 7.78115E−07 | 0 | 0 |
| $a_{\psi Si}^{(3)}$ | 5.59108E−05 | 5.59108E−05 | −0.000194818 | 0 |
| $a_{\psi Si}^{(2)}$ | −0.002410767 | −0.002410767 | 0.000247924 | 0 |
| $a_{\psi Si}^{(1)}$ | −0.027662563 | −0.027662563 | 0.12904143 | −0.026766472 |
| $b_{\psi Si}^{(6)}$ | 0 | 0 | 0 | 0 |
| $b_{\psi Si}^{(5)}$ | 2083705.649 | 2083705.649 | 0 | 0 |
| $b_{\psi Si}^{(4)}$ | 1386257.115 | 1386257.115 | 0 | 0 |
| $b_{\psi Si}^{(3)}$ | −1267.41343 | −1267.41343 | 1811.750092 | 0 |
| $b_{\psi Si}^{(2)}$ | 895.5856198 | 895.5856198 | 293.105197 | 0 |
| $c_{\psi Si}$ | 42.14046823 | 42.14046823 | 19.39490446 | 67.95180723 |
| $a_{\theta LT}^{(2)}$ | 0 | 0 | 0 | 0 |
| $a_{\theta LT}^{(1)}$ | 0.020067585 | 0.020067585 | −0.011988832 | 0.032566601 |
| $b_{\theta LT}^{(2)}$ | 0 | 0 | 0 | 0 |
| $c_{\theta LT}$ | −49.73244147 | −49.73244147 | −49.61783439 | −50.96385542 |
| $d_{TLTTS}$ | 0 | 0 | 0 | 0 |
| $d_{TLTTE}$ | 0 | 0 | 0 | 41.29194486 |
| $d_{TLT\psi Si}$ | 0 | 0 | −0.203585177 | 0.376861254 |
| $T_{TLT\theta LT}$ | 0 | 0 | −0.273779971 | 0 |
| $d_{TSTE}$ | 0 | 0 | 0 | 0 |
| $d_{TS\psi Si}$ | 0 | 0 | 0 | −0.20937463 |
| $d_{TS\theta LT}$ | −0.349110894 | −0.349110894 | 0 | 0 |
| $d_{TE\psi Si}$ | 0 | 0 | 0 | 0 |
| $d_{TE\theta LT}$ | −0.216865482 | −0.216865482 | 0 | 0 |
| $d_{\psi Si\theta LT}$ | 0 | 0 | 0.00120304 | 0 |
| e | −2.390757235 | −2.390757235 | −2.548464154 | −2.523994879 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 69

Si (111)
$0 < T_{LT} < 0.2$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −3.047618237 | −3.047618237 | −3.047618237 | −3.047618237 |
| $b_{TLT}^{(2)}$ | 0 | 0 | 0 | 0 |
| $c_{TLT}$ | 0.160869565 | 0.160869565 | 0.160869565 | 0.160869565 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 11.21750437 | 11.21750437 | 11.21750437 | 11.21750437 |
| $a_{TE}^{(2)}$ | −3.666215654 | −3.666215654 | −3.666215654 | −3.666215654 |
| $a_{TE}^{(1)}$ | −0.035248162 | −0.035248162 | −0.035248162 | −0.035248162 |
| $b_{TE}^{(4)}$ | 0 | 0 | 0 | 0 |
| $b_{TE}^{(3)}$ | 0.000381688 | 0.000381688 | 0.000381688 | 0.000381688 |
| $b_{TE}^{(2)}$ | 0.012589792 | 0.012589792 | 0.012589792 | 0.012589792 |
| $c_{TE}$ | 0.245652174 | 0.245652174 | 0.245652174 | 0.245652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |

TABLE 69-continued

Si (111)
$0 < T_{LT} < 0.2$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{\psi Si}^{(2)}$ | 0 | 0 | 0 | 0 |
| $a_{\psi Si}^{(1)}$ | −0.003582211 | −0.003582211 | −0.003582211 | −0.003582211 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 35.86956522 | 35.86956522 | 35.86956522 | 35.86956522 |
| $a_{\theta LT}^{(2)}$ | −0.000596775 | −0.000596775 | −0.000596775 | −0.000596775 |
| $a_{\theta LT}^{(1)}$ | 0.003385783 | 0.003385783 | 0.003385783 | 0.003385783 |
| $b_{\theta LT}^{(2)}$ | 77.88279773 | 77.88279773 | 77.88279773 | 77.88279773 |
| $c_{\theta LT}$ | −47.82608696 | −47.82608696 | −47.82608696 | −47.82608696 |
| $d_{TLTTS}$ | 0 | 0 | 0 | 0 |
| $d_{TLTTE}$ | −2.939323227 | −2.939323227 | −2.939323227 | −2.939323227 |
| $d_{TLT\psi Si}$ | 0 | 0 | 0 | 0 |
| $T_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.000442922 | −0.000442922 | −0.000442922 | −0.000442922 |
| $e$ | −0.277577227 | −0.277577227 | −0.277577227 | −0.277577227 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 70

Si (111)
$0.2 \leq T_{LT} \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 6.03484153 | 6.03484153 | 6.03484153 | 6.03484153 |
| $b_{TS}^{(2)}$ | 0 | 0 | 0 | 0 |
| $c_{TS}$ | 0.183333333 | 0.183333333 | 0.183333333 | 0.183333333 |
| $a_{TE}^{(4)}$ | −215.3850281 | −215.3850281 | −215.3850281 | −215.3850281 |
| $a_{TE}^{(3)}$ | 54.12265846 | 54.12265846 | 54.12265846 | 54.12265846 |
| $a_{TE}^{(2)}$ | 0.942905209 | 0.942905209 | 0.942905209 | 0.942905209 |
| $a_{TE}^{(1)}$ | −1.08045121 | −1.08045121 | −1.08045121 | −1.08045121 |
| $b_{TE}^{(4)}$ | 0.000339332 | 0.000339332 | 0.000339332 | 0.000339332 |
| $b_{TE}^{(3)}$ | 0.000317558 | 0.000317558 | 0.000317558 | 0.000317558 |
| $b_{TE}^{(2)}$ | 0.011265432 | 0.011265432 | 0.011265432 | 0.011265432 |
| $c_{TE}$ | 0.211111111 | 0.211111111 | 0.211111111 | 0.211111111 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 10 |
| $a_{\psi Si}^{(2)}$ | 0 | 0 | 0 | 0 |
| $a_{\psi Si}^{(1)}$ | −0.004526908 | −0.004526908 | −0.004526908 | −0.004526908 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 27.5 | 27.5 | 27.5 | 27.5 |
| $a_{\theta LT}^{(2)}$ | −0.00046365 | −0.00046365 | −0.00046365 | −0.00046365 |
| $a_{\theta LT}^{(1)}$ | 0.005349146 | 0.005349146 | 0.005349146 | 0.005349146 |

TABLE 70-continued

Si (111)
$0.2 \leq T_{LT} \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $b_{\theta LT}^{(2)}$ | 57.09876543 | 57.09876543 | 57.09876543 | 57.09876543 |
| $c_{\theta LT}$ | −46.11111111 | −46.11111111 | −46.11111111 | −46.11111111 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0 | 0 |
| $T_{TLT\theta LT}$ | 0 | 0 | 0 | 0 |
| $d_{TSTE}$ | 45.80413521 | 45.80413521 | 45.80413521 | 45.80413521 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | −0.071786246 | −0.071786246 | −0.071786246 | −0.071786246 |
| $d_{\psi Si\theta LT}$ | −0.000425881 | −0.000425881 | −0.000425881 | −0.000425881 |
| $e$ | −0.446604617 | −0.446604617 | −0.446604617 | −0.446604617 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 71

Si (111)
$0 < T_{LT} < 0.2$
$0.2 \leq T_S \leq 2.0$

| | $0.05 \leq T_F < 0.25$ | | $0.25 \leq T_F \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −2.477108842 | −2.477108842 | −2.477108842 | −2.477108842 |
| $b_{TLT}^{(2)}$ | 0 | 0 | 0 | 0 |
| $c_{TLT}$ | 0.137349398 | 0.137349398 | 0.137349398 | 0.137349398 |
| $a_{TS}^{(2)}$ | 0 | 0 | 0 | 0 |
| $a_{TS}^{(1)}$ | −0.488747927 | −0.488747927 | −0.488747927 | −0.488747927 |
| $b_{TS}^{(2)}$ | 0 | 0 | 0 | 0 |
| $c_{TS}$ | 0.336144578 | 0.336144578 | 0.336144578 | 0.336144578 |
| $a_{TE}^{(4)}$ | 0 | 0 | 0 | 0 |
| $a_{TE}^{(3)}$ | 0 | 0 | 0 | 0 |
| $a_{TE}^{(2)}$ | −1.973253274 | −1.973253274 | −1.973253274 | −1.973253274 |
| $a_{TE}^{(1)}$ | −0.124870592 | −0.124870592 | −0.124870592 | −0.124870592 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.017915517 | 0.017915517 | 0.017915517 | 0.017915517 |
| $c_{TE}$ | 0.256024096 | 0.256024096 | 0.256024096 | 0.256024096 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 7.6083E−07 | 7.6083E−07 | 7.6083E−07 | 7.6083E−07 |
| $a_{\psi Si}^{(3)}$ | 7.21121E−06 | 7.21121E−06 | 7.21121E−06 | 7.21121E−06 |
| $a_{\psi Si}^{(2)}$ | −0.000857107 | −0.000857107 | −0.000857107 | −0.000857107 |
| $a_{\psi Si}^{(1)}$ | −0.00490823 | −0.00490823 | −0.00490823 | −0.00490823 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 105622.9088 | 105622.9088 | 105622.9088 | 105622.9088 |
| $b_{\psi Si}^{(3)}$ | −217.2019476 | −217.2019476 | −217.2019476 | −217.2019476 |
| $b_{\psi Si}^{(2)}$ | 208.4409929 | 208.4409929 | 208.4409929 | 208.4409929 |
| $c_{\psi Si}$ | 30.54216867 | 30.54216867 | 30.54216867 | 30.54216867 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | 4.821777856 | 4.821777856 | 4.821777856 | 4.821777856 |
| $d_{TLTTE}$ | −4.14067246 | −4.14067246 | −4.14067246 | −4.14067246 |
| $d_{TLT\psi Si}$ | 0 | 0 | 0 | 0 |
| $T_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.024454063 | 0.024454063 | 0.024454063 | 0.024454063 |

TABLE 71-continued

| | Si (111) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\theta LT}$ | 0 | 0 | 0 | 0 |
| $d_{\psi Si\theta LT}$ | 0 | 0 | 0 | 0 |
| e | −0.240178915 | −0.240178915 | −0.240178915 | −0.240178915 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

TABLE 72

| | Si (111) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 0.380779889 | 0.380779889 | 0.380779889 | 0.380779889 |
| $b_{TS}^{(2)}$ | 0 | 0 | 0 | 0 |
| $c_{TS}$ | 0.285294118 | 0.285294118 | 0.285294118 | 0.285294118 |
| $a_{TE}^{(4)}$ | −165.3225345 | −165.3225345 | −165.3225345 | −165.3225345 |
| $a_{TE}^{(3)}$ | 23.65923214 | 23.65923214 | 23.65923214 | 23.65923214 |
| $a_{TE}^{(2)}$ | 2.256295059 | 2.256295059 | 2.256295059 | 2.256295059 |
| $a_{TE}^{(1)}$ | −0.292409126 | −0.292409126 | −0.292409126 | −0.292409126 |
| $b_{TE}^{(4)}$ | 0.00051583 | 0.00051583 | 0.00051583 | 0.00051583 |
| $b_{TE}^{(3)}$ | 0.00070344 | 0.00070344 | 0.00070344 | 0.00070344 |
| $b_{TE}^{(2)}$ | 0.015017301 | 0.015017301 | 0.015017301 | 0.015017301 |
| $c_{TE}$ | 0.220588235 | 0.220588235 | 0.220588235 | 0.220588235 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004846255 | −0.004846255 | −0.004846255 | −0.004846255 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 29.55882353 | 29.55882353 | 29.55882353 | 29.55882353 |
| $a_{\theta LT}^{(2)}$ | 0 | 0 | 0 | 0 |
| $a_{\theta LT}^{(1)}$ | 0.00165846 | 0.00165846 | 0.00165846 | 0.00165846 |
| $b_{\theta LT}^{(2)}$ | 0 | 0 | 0 | 0 |
| $c_{\theta LT}$ | −48.52941176 | −48.52941176 | −48.52941176 | −48.52941176 |
| $d_{TLTTS}$ | −0.04933649 | −0.04933649 | −0.04933649 | −0.04933649 |
| $d_{TLTTE}$ | −0.021023839 | −0.021023839 | −0.021023839 | −0.021023839 |
| $d_{TLT\psi Si}$ | 0 | 0 | 0 | 0 |
| $T_{TLT\theta LT}$ | 0 | 0 | 0 | 0 |
| $d_{TSTE}$ | −7.074776252 | −7.074776252 | −7.074776252 | −7.074776252 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.00049898 | −0.00049898 | −0.00049898 | −0.00049898 |
| e | −0.3405485 | −0.3405485 | −0.3405485 | −0.3405485 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978 |

The inventors of preferred embodiments of the present application variously changed the design parameters $T_{LT}$, $\theta_{LT}$, $T_S$, $T_E$, $T_P$, $\psi_{Si}$, and $T_{Si}$, and determined how the intensity of the response becoming the spurious response A, B, or C changed.

Note that the absolute value of S11 was calculated as the intensity of the response of the spurious response when the above parameters were changed. The smaller the value of the absolute value of S11 in decibel is, the greater the intensity of the response of the spurious response is. When calculating S11, the overlap width of the electrode fingers was 20λ and the number of pairs of the electrode fingers was 94 pairs, and S11 was obtained with the one pair electrode finger model of the two-dimensional finite element method.

Note that the IDT electrode has a structure in which the metal films were laminated in the order of Ti/Pt/Ti/Al from the lithium tantalate film side. The thickness of the IDT electrode was changed by varying the thickness of the Pt film. Further, the wavelength normalized film thickness $T_E$ of the IDT electrode was calculated as the wavelength normalized film thickness in terms of aluminum thickness, using the mass of the entire IDT electrode estimated from the density of each metal film.

Spurious Response A

The acoustic wave resonator having the admittance characteristic shown in FIG. 2 is used as the reference structure. FIG. 3 to FIG. 8 are diagrams describing changes in the intensity S11 of the response of the spurious response A when the respective parameters are changed with respect to the reference structure. As described in FIG. 3, the intensity S11 of the response of the spurious response A changes when the propagation direction in the single crystal Si layer $\psi_{si}$ is changed within the range from about 0° to about 45° with respect to the reference structure.

Figure 4:
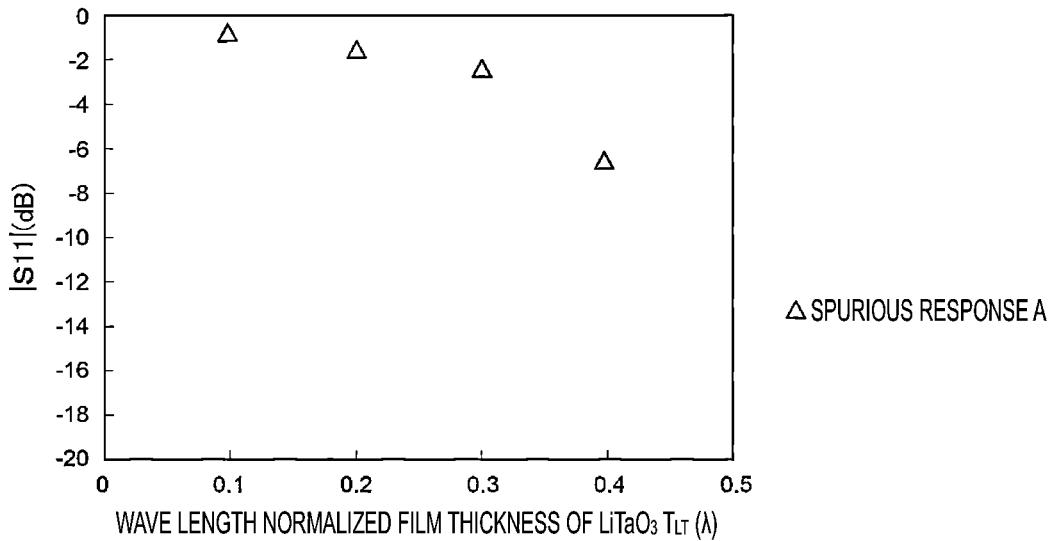
FIG. 4 is a graph showing the relationship between a wavelength normalized film thickness $T_{LT}$ of a lithium tantalate film and the intensity S11 of a response of the spurious response A.

Similarly, as described in FIG. 4, the intensity S11 of the response of the spurious response A also changes when the wavelength normalized film thickness $T_{LT}$ of the lithium tantalate film is changed.

Figure 5:
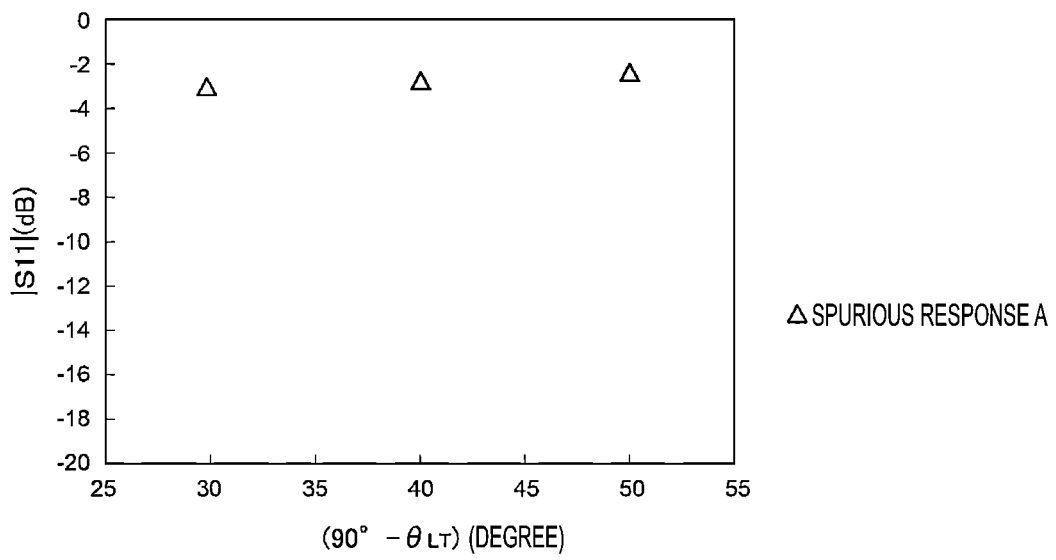
FIG. 5 is a graph showing the relationship between a cut angle $(90°−\theta_{LT})$ of the lithium tantalate film and the intensity S11 of a response of the spurious response A.

Further, as described in FIG. 5, the intensity S11 of the response of the spurious response A also changes when the cut angle (90°−$\theta_{LT}$) of the lithium tantalate film is changed.

Figure 6:
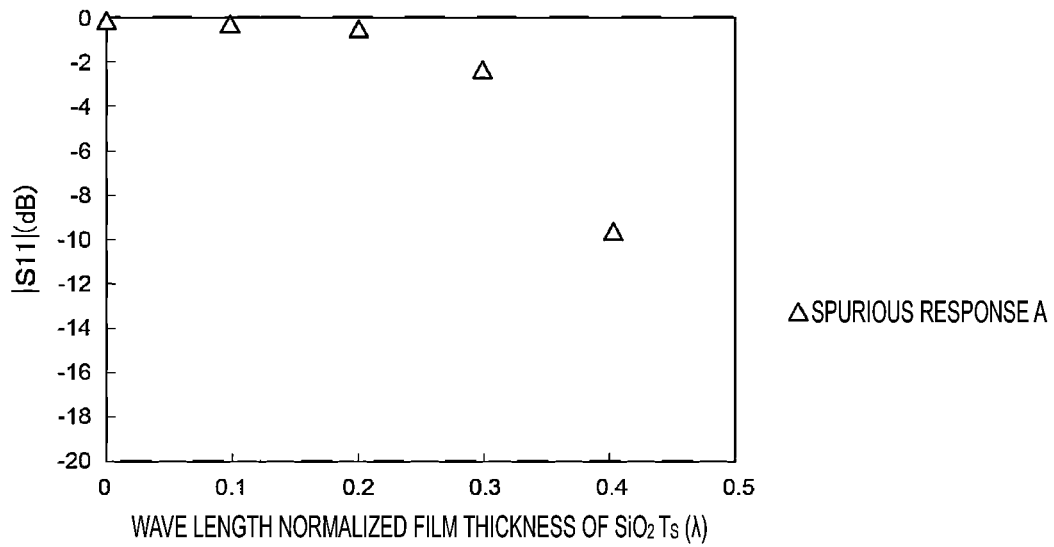
FIG. 6 is a graph showing the relationship between a wavelength normalized film thickness $T_S$ of a $SiO_2$ film and the intensity S11 of a response of the spurious response A.

As described in FIG. 6, the intensity S11 of the response of the spurious response A also changes when the wavelength normalized film thickness $T_S$ of the $SiO_2$ film is changed.

Figure 7:
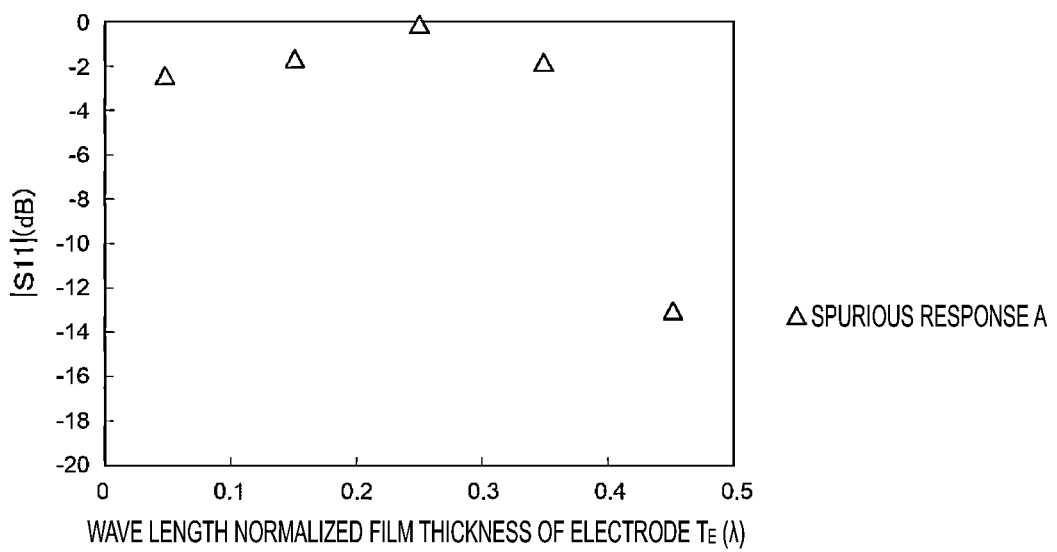
FIG. 7 is a graph showing the relationship between a wavelength normalized film thickness $T_E$ of an IDT electrode and the intensity S11 of a response of the spurious response A.

As described in FIG. 7, the intensity S11 of the response of the spurious response A also changes when the wavelength normalized film thickness $T_E$, which is the thickness of the IDT electrode in terms of aluminum, is changed.

Figure 8:
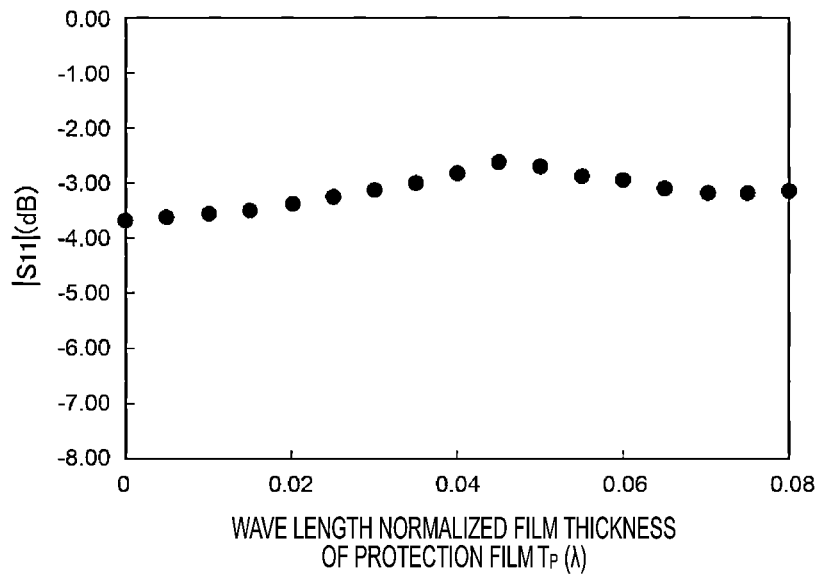
FIG. 8 is a graph showing the relationship between a wavelength normalized film thickness $T_P$ of a protection film being a silicon oxide film and the intensity S11 of a response of the spurious response A.

As described in FIG. 8, the intensity S11 of the response of the spurious response A changes when the wavelength normalized film thickness $T_P$ of the protection film defined by a silicon oxide film is changed.

From FIG. 3 to FIG. 8, it is understood that the intensity of the response of the spurious response A may be adjusted by changing the parameters above. That is, by selecting the values of the parameters described above, the intensity of the response of the spurious response A may be reduced while maintaining the response of the main mode.

The inventors of preferred embodiments of the present application have discovered that $I_h$ corresponding to the intensity of the response of the spurious response may be obtained by Formula (1) and the coefficients a, b, c, d, e, and f in Table 37 to Table 48, from the calculation results in FIG. 3 to FIG. 8 and the like.

The coefficients in Formula (1) have been discovered to be values described in Table 37 to Table 48 in accordance with the crystal orientation of the single crystal Si layer, the respective ranges of the wavelength normalized film thickness $T_{LT}$ of the lithium tantalate film, the Euler angle $\theta_{LT}$ of the lithium tantalate film, the wavelength normalized film thickness $T_S$ of the $SiO_2$ film, the wavelength normalized film thickness $T_E$ of the IDT electrode, and the wavelength normalized film thickness $T_P$ of the protection film, and the propagation direction $\psi_{Si}$ in the single crystal Si layer. Thus, the conditions of $T_{LT}$, $\theta_{LT}$, $T_S$, $T_E$, $T_P$, and $\psi_{Si}$ where $I_{h1}$ corresponding to the intensity of the response of the spurious response A is greater than about −2.4 are determined.

In the composite filter device in which the plurality of acoustic wave filters are connected at one end, the intensity of the response of the spurious response is required to be greater than about −2.4 dB in S11. This is to make the influence negligible on the bandpass characteristic of another acoustic wave filter other than one acoustic wave filter. Typically, the ripple appearing in the pass band is required to be equal to or greater than about −0.8 dB from the viewpoint of ensuring the reception sensitivity in a mobile phone or the like. Meanwhile, it has been known that when the spurious response is present in the pass band of another acoustic wave filter, a ripple of approximately ⅓ of the intensity of the response of the spurious response is generated in the pass band of another filter. Accordingly, in order to make the ripple in the pass band equal to or greater than about −0.8 dB, the intensity S11 of the response of the spurious response may be set to be greater than about −2.4 dB.

With $I_h$ for the spurious response A, the inequality $I_h$> about −2.4 is satisfied, and thus it is possible to effectively reduce or prevent the influence by the response of the spurious response A on the pass band of another acoustic wave filter. This will be described with reference to FIG. 9 to FIG. 12.

Figure 9:
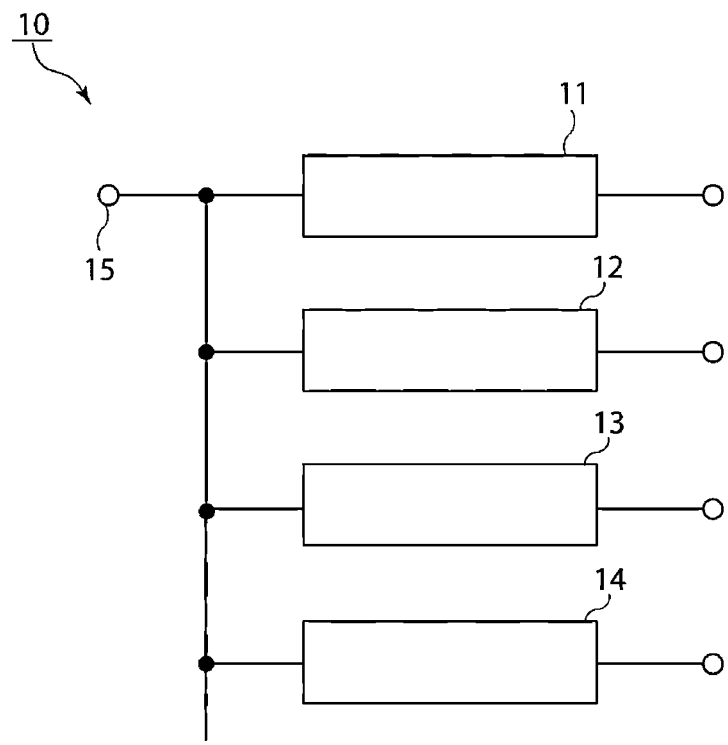
FIG. 9 is a circuit diagram of a composite filter device including the acoustic wave device of the first preferred embodiment of the present invention.
Figure 10:
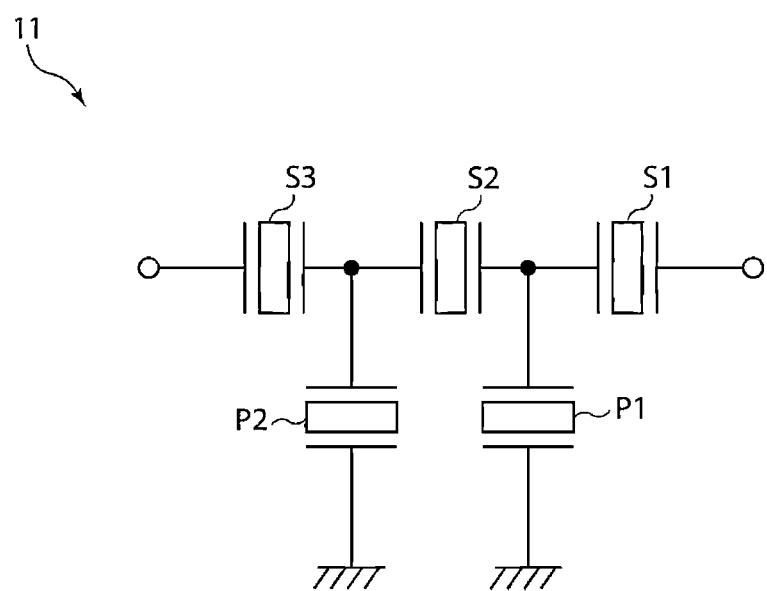
FIG. 10 is a circuit diagram illustrating an acoustic wave filter including the acoustic wave device of the first preferred embodiment of the present invention and being used in the composite filter device.

FIG. 9 is a circuit diagram of a composite filter device according to a preferred embodiment of the present invention. In a composite filter device 10, a first acoustic wave filter 11 to a fourth acoustic wave filter 14 are connected in common on an antenna terminal 15 side. FIG. 10 is a circuit diagram of the first acoustic wave filter 11. The first acoustic wave filter 11 includes a plurality of series arm resonators S1 to S3 and a plurality of parallel arm resonators P1 and P2. That is, the first acoustic wave filter 11 is a ladder filter, for example. The series arm resonators S1 to S3 and the parallel arm resonators P1 and P2 are defined by the acoustic wave device 1 according to the preferred embodiment described above.

Note that, in the present invention, the circuit configuration of the acoustic wave filter including the acoustic wave device according to a preferred embodiment of the present invention is not limited thereto. For example, an acoustic wave filter including a longitudinally coupled resonator acoustic wave filter may be employed. In this case, the longitudinally coupled resonator acoustic wave filter may be an acoustic wave device according to a preferred embodiment of the present invention. Alternatively, the acoustic wave resonator connected to the longitudinally coupled resonator acoustic wave filter may be defined by an acoustic wave device according to a preferred embodiment of the present invention.

Note that the pass bands of the first acoustic wave filter 11 to the fourth acoustic wave filter 14 are referred to as a first pass band to a fourth pass band.

The first pass band is on the lowest frequency side, and the pass band is higher in the order of the second pass band, the third pass band, and the fourth pass band. That is, the pass bands satisfy the relation, first pass band<second pass band<third pass band<fourth pass band.

Figure 11A:
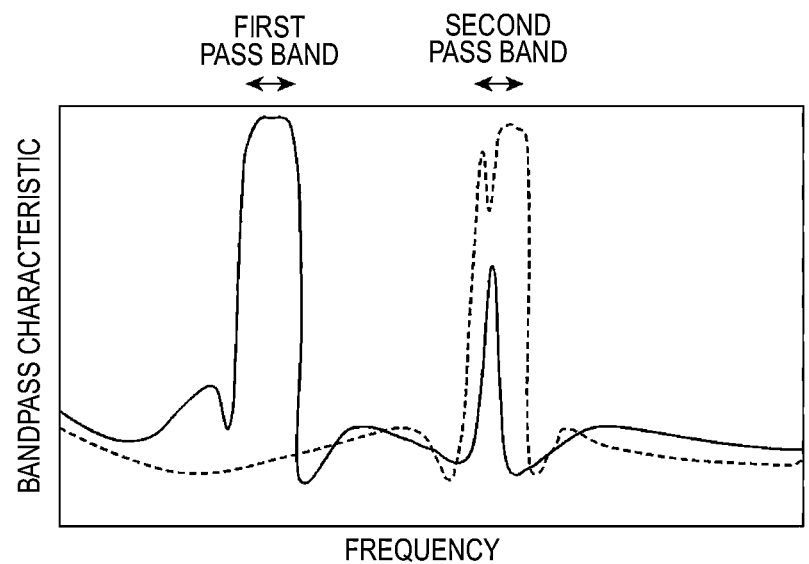
FIG. 11A is a graph showing the filter characteristic of a composite filter device including an acoustic wave device of a comparative example.

For a comparison, a composite filter device of a comparative example was prepared in which the first acoustic wave filter was configured in the same manner as in the preferred embodiment of the preferred embodiment described above, except that the acoustic wave resonator of the reference structure was used. FIG. 11A describes a filter characteristic of a first acoustic wave filter and a second acoustic wave filter in the composite filter device of the comparative example. The solid line indicates a filter characteristic of the first acoustic wave filter, and the dashed line indicates a filter characteristic of the second acoustic wave filter. A large ripple appears in the second pass band. This is because a large response appears due to the spurious response A of the acoustic wave resonator used in the first acoustic wave filter.

Figure 11B:
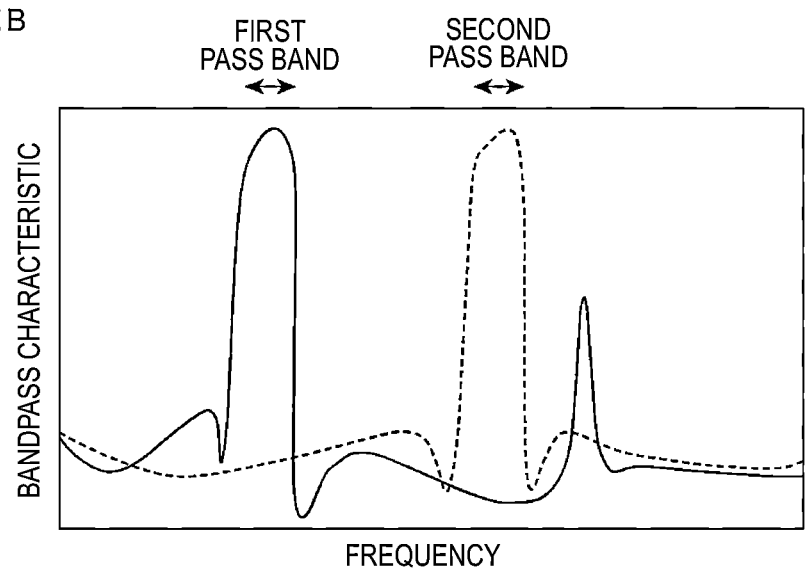
FIG. 11B is a graph showing the filter characteristic of the composite filter device as the preferred embodiment of the present invention.

FIG. 11B is a graph showing the filter characteristic of the composite filter device according to a preferred embodiment of the present invention. The solid line indicates a filter characteristic of the first acoustic wave filter, and the dashed line indicates a filter characteristic of the second acoustic wave filter. Here, the first acoustic wave filter is defined by the acoustic wave device of the preferred embodiment described above. Accordingly, no large ripple appears in the second pass band. That is, no large ripple appears in the pass band of the second acoustic wave filter being another filter. Thus, the deterioration of the filter characteristic in the second acoustic wave filter is less likely to occur.

As described above, in the composite filter device according to the present preferred embodiment, the response of the spurious response A is reduced or prevented in the acoustic wave filter defined by the acoustic wave device according to the preferred embodiment of the present invention described above. Thus, it is possible to effectively reduce or prevent the deterioration of the filter characteristic of another acoustic wave filter having a higher pass band relative to the pass band of the one acoustic wave filter.

Figure 12:
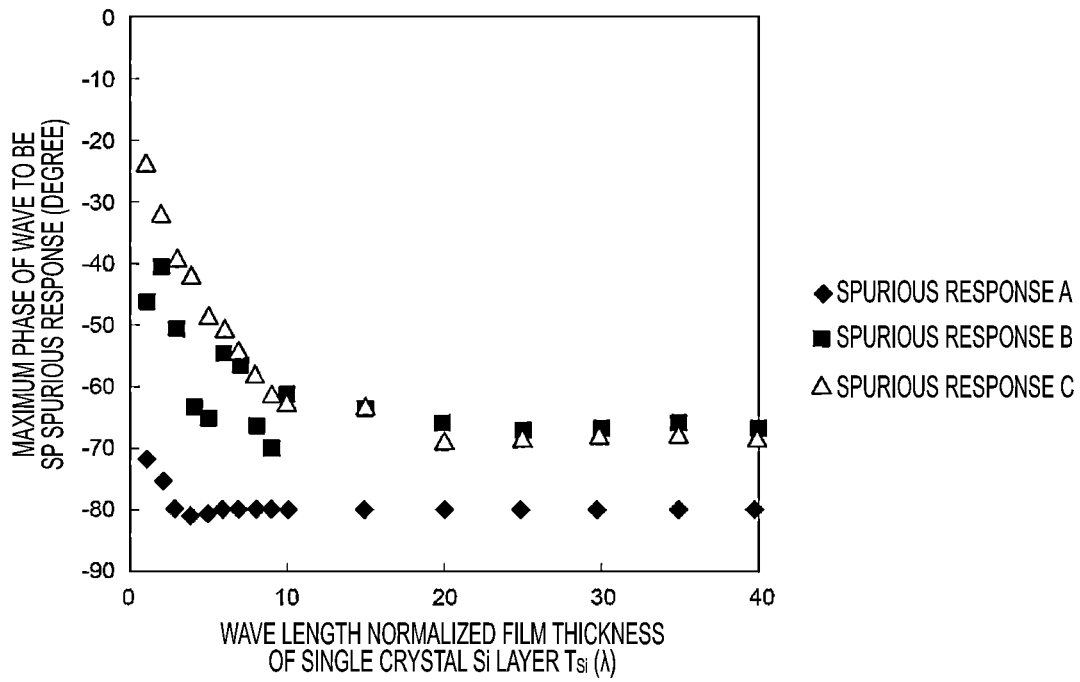
FIG. 12 is a graph showing the relationship between a wavelength normalized film thickness of the single crystal Si layer and responses of the spurious responses A, B, and C.

FIG. 12 is a graph showing the relationship between the wavelength normalized film thickness of the single crystal Si layer 2 and the intensity S11 of the response of spurious responses A, B, and C. As is apparent from FIG. 12, the intensity of the response of each of spurious responses A, B, and C may be more effectively reduced or prevented when the inequality $T_{Si}$> about 20 is satisfied.

Spurious Response B

Figure 13:
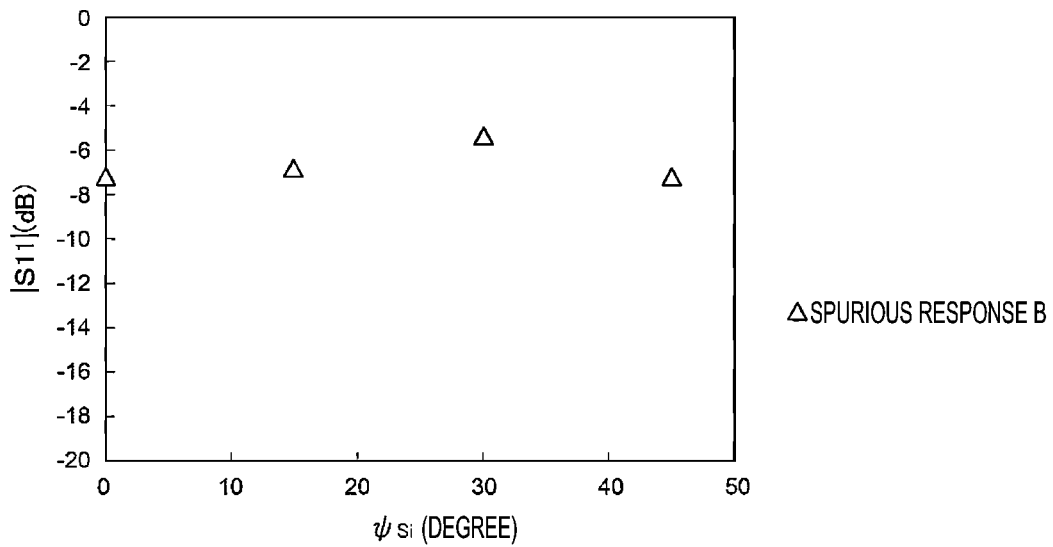
FIG. 13 is a graph showing the relationship between the propagation direction $\psi_{Si}$ in the single crystal Si layer and the intensity S11 of a response of the spurious response B.
Figure 14:
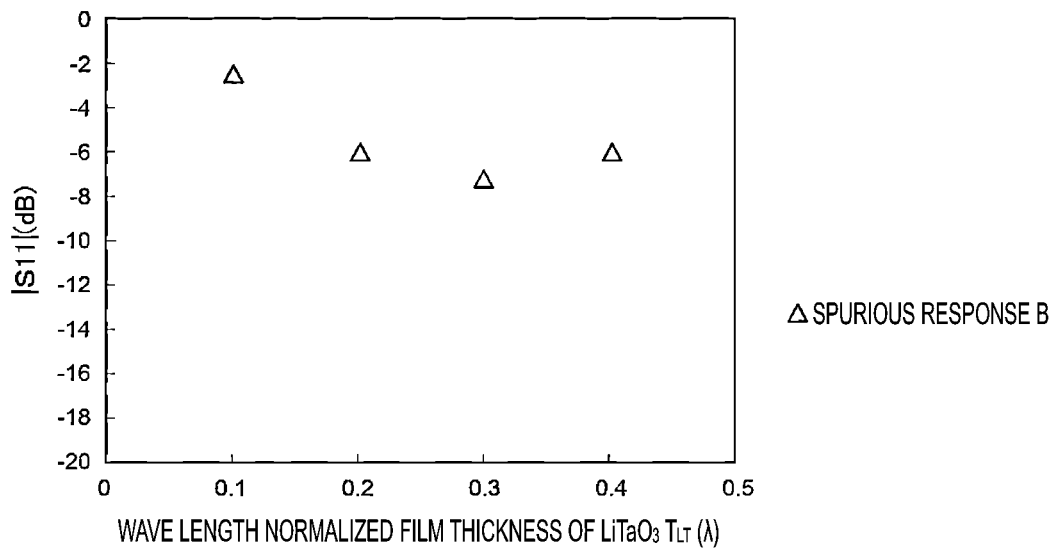
FIG. 14 is a graph showing the relationship between the wavelength normalized film thickness $T_{LT}$ of the lithium tantalate film and the intensity S11 of a response of the spurious response B.
Figure 15:
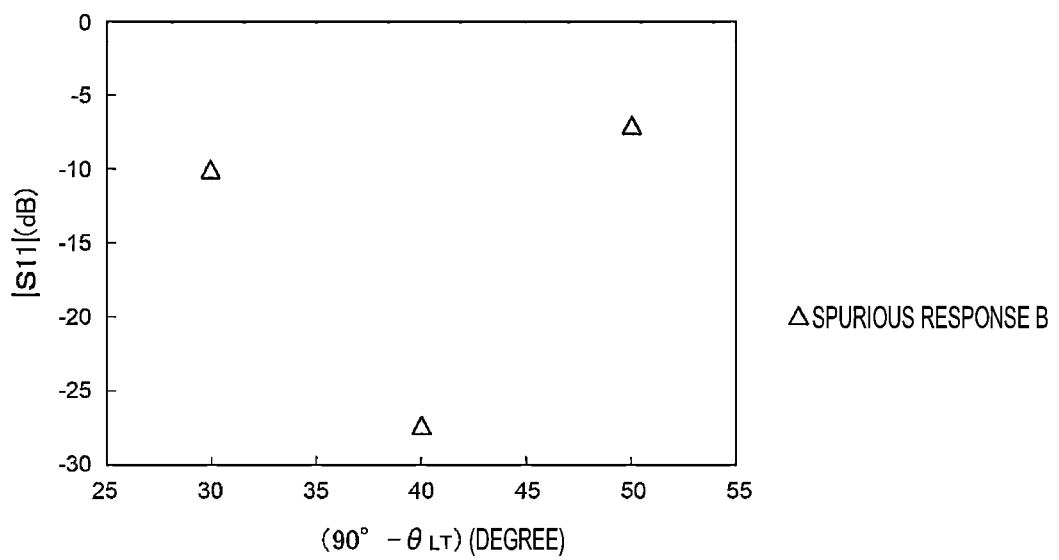
FIG. 15 is a graph showing the relationship between the cut angle $(90°−\theta_{LT})$ of the lithium tantalate film and the intensity S11 of a response of the spurious response B.
Figure 16:
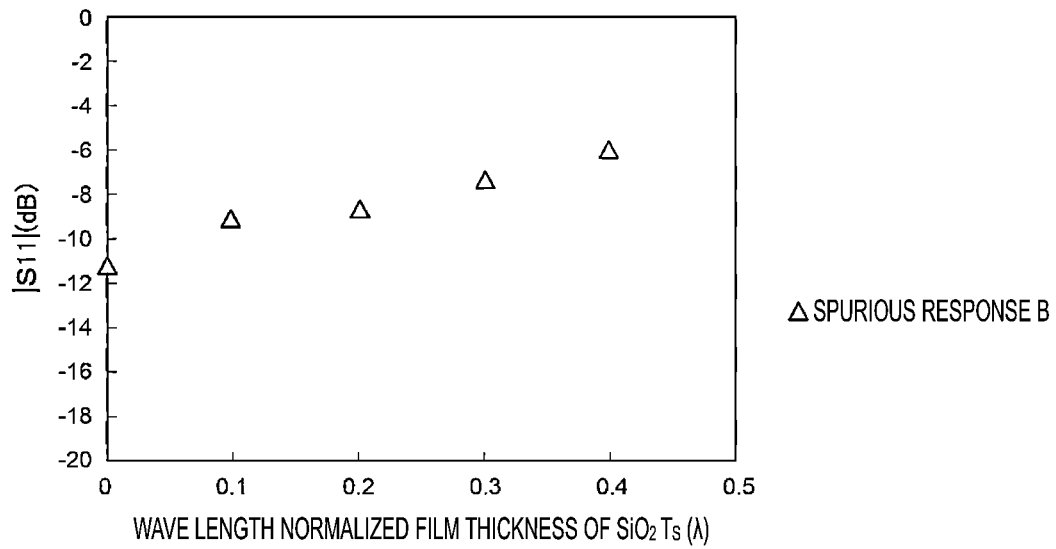
FIG. 16 is a graph showing the relationship between the wavelength normalized film thickness $T_S$ of the SiO$_2$ film and the intensity S11 of a response of the spurious response B.
Figure 17:
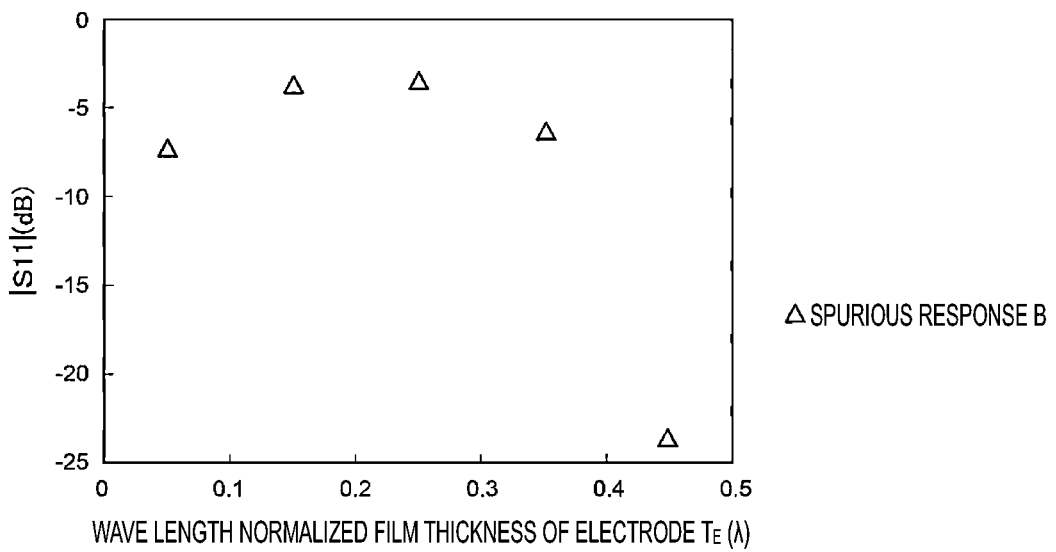
FIG. 17 is a graph showing the relationship between the wavelength normalized film thickness $T_E$ of the IDT electrode and the intensity S11 of a response of the spurious response B.

FIG. 13 is a graph showing the relationship between the propagation direction $\psi_{Si}$ in the single crystal Si layer and the intensity S11 of the response of the spurious response B. As is apparent from FIG. 13, the intensity S11 of the response of the spurious response B changes when $\psi_{Si}$ is changed. Similarly, as described in FIG. 14, the intensity S11 of the response of the spurious response B also changes when the wavelength normalized film thickness $T_{LT}$ of the lithium tantalate film is changed. As described in FIG. 15, the intensity S11 of the response of the spurious response B also changes when the cut angle (90°−$\theta_{LT}$) of the lithium tantalate film is changed. As described in FIG. 16, the intensity S11 of the response of the spurious response B also changes when the wavelength normalized film thickness $T_S$ of the SiO$_2$ film is changed. Further, as described in FIG. 17, the intensity S11 of the response of the spurious response B also changes when the wavelength normalized film thickness $T_E$ of the IDT electrode in terms of aluminum is changed.

Figure 18:
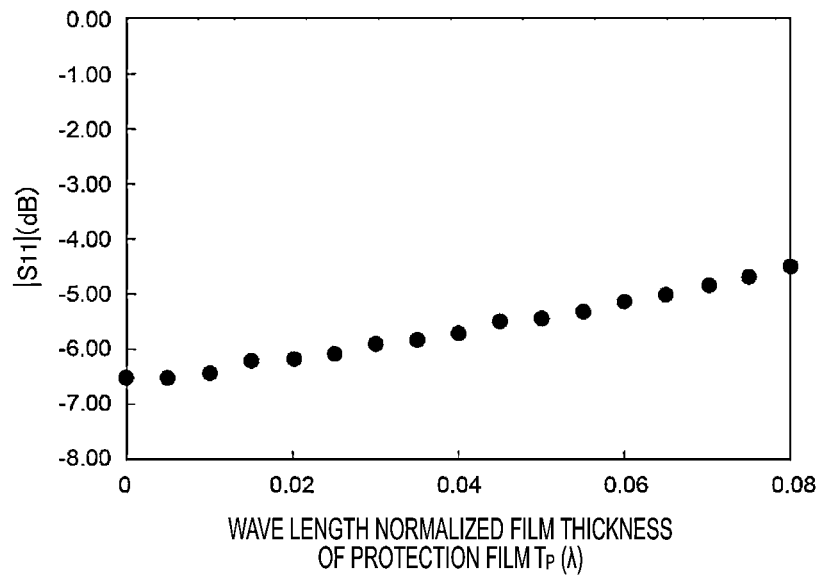
FIG. 18 is a graph showing the relationship between the wavelength normalized film thickness $T_P$ of the protection film being the silicon oxide film and the intensity S11 of a response of the spurious response B.

Still further, as described in FIG. 18, the intensity S11 of the response of the spurious response B also changes when the wavelength normalized film thickness $T_P$ of the protection film being a silicon oxide film is changed.

The coefficient values in Formula (1) for expressing $I_{h2}$ corresponding to the intensity of the response of the spurious response B were obtained from the calculation results in FIG. 13 to FIG. 18 and the like as in the case of the spurious response A. $I_{h2}$ corresponding to the intensity of the response of the spurious response B may be expressed when the coefficients in Formula (1) are determined as in Table 49 to Table 60 described above in accordance with the orientation (100), (110), or (111) of the single crystal Si layer, the respective ranges of the wavelength normalized film thickness $T_{LT}$ of the lithium tantalate film, the Euler angle $\theta_{LT}$ of the lithium tantalate film, the wavelength normalized film thickness $T_S$ of the SiO$_2$ film, the wavelength normalized film thickness $T_E$ of the IDT electrode, the wavelength normalized film thickness $T_P$ of the protection film, and the propagation direction $\psi_{Si}$. The response of the spurious response B may be made sufficiently small by determining the conditions of $T_{LT}$, $\theta_{LT}$, $T_S$, $T_E$, $T_P$, and $\psi_{Si}$ that make $I_{h1}$ greater than about −2.4, and by making the inequality $T_{Si}$> about 20 be satisfied.

Spurious Response C

Figure 19:
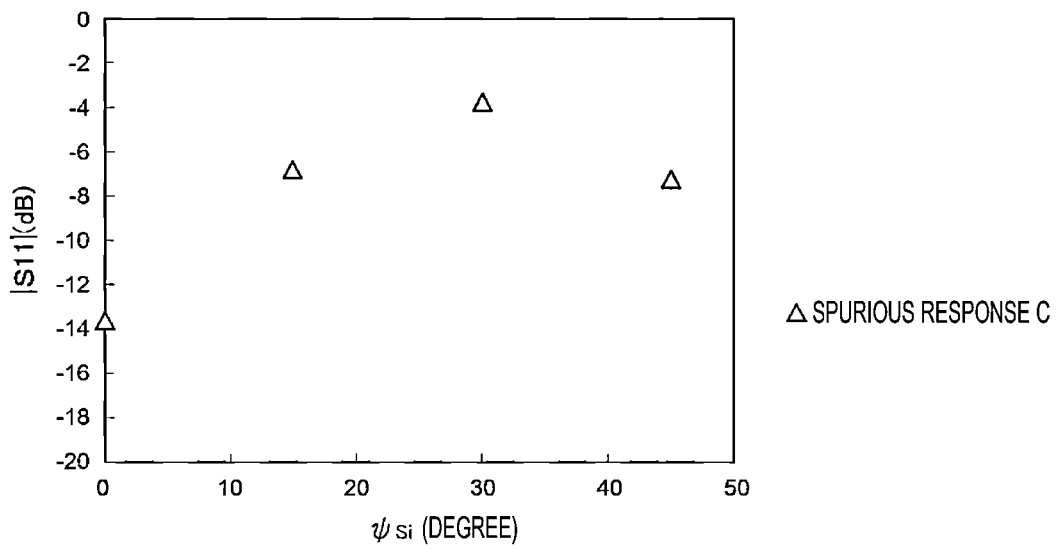
FIG. 19 is a graph showing the relationship between the propagation direction $\psi_{Si}$ in the single crystal Si layer and the intensity S11 of a response of the spurious response C.
Figure 20:
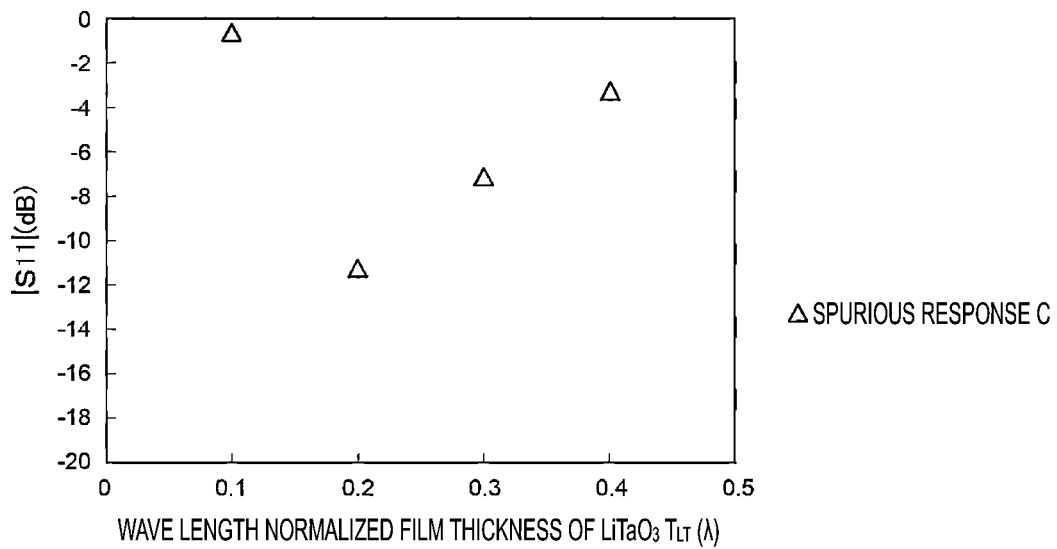
FIG. 20 is a graph showing the relationship between the wavelength normalized film thickness $T_{LT}$ of the lithium tantalate film and the intensity S11 of a response of the spurious response C.
Figure 21:
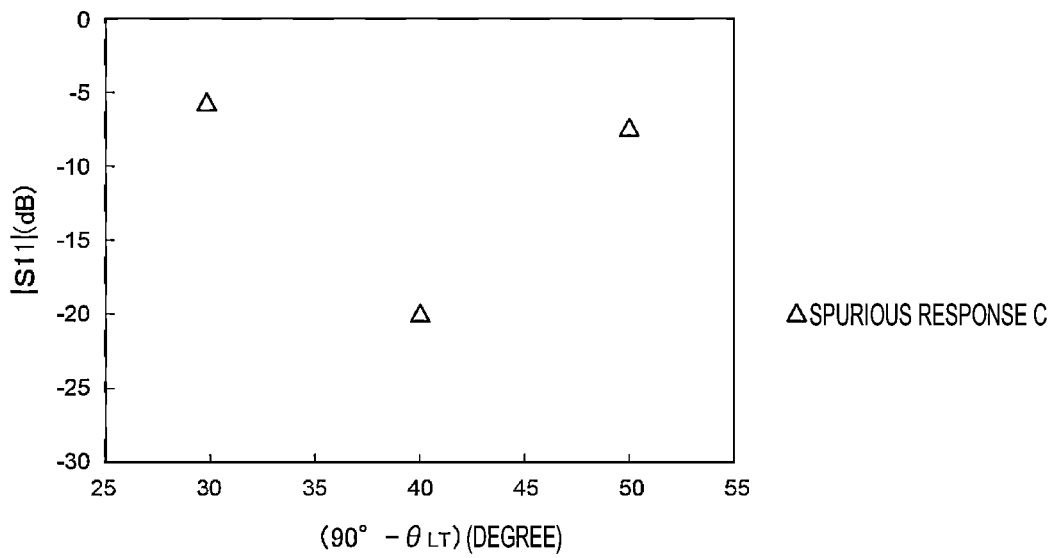
FIG. 21 is a graph showing the relationship between the cut angle (90°−$\theta_{LT}$) of the lithium tantalate film and the intensity S11 of a response of the spurious response C.
Figure 22:
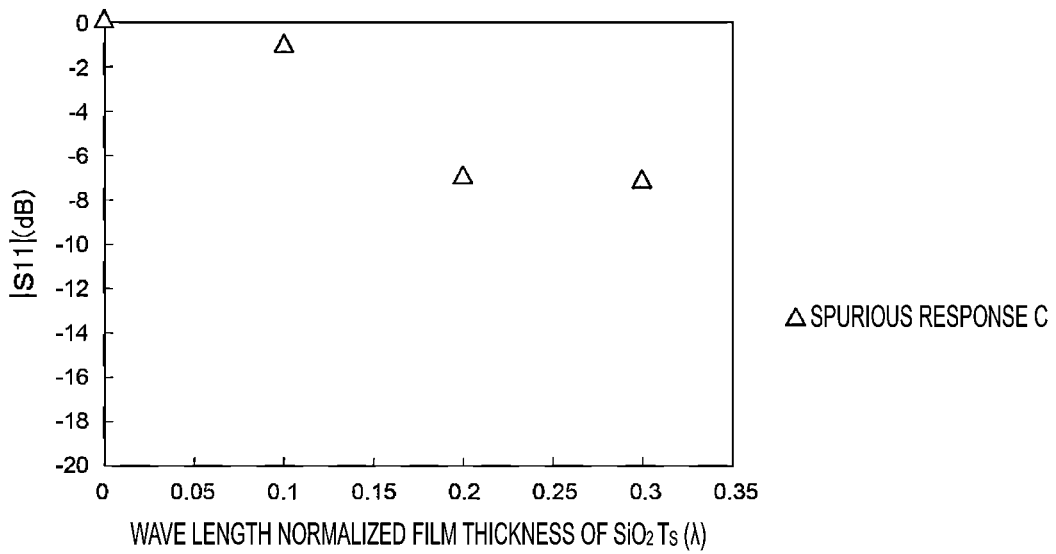
FIG. 22 is a graph showing the relationship between the wavelength normalized film thickness $T_S$ of the SiO$_2$ film and the intensity S11 of a response of the spurious response C.
Figure 23:
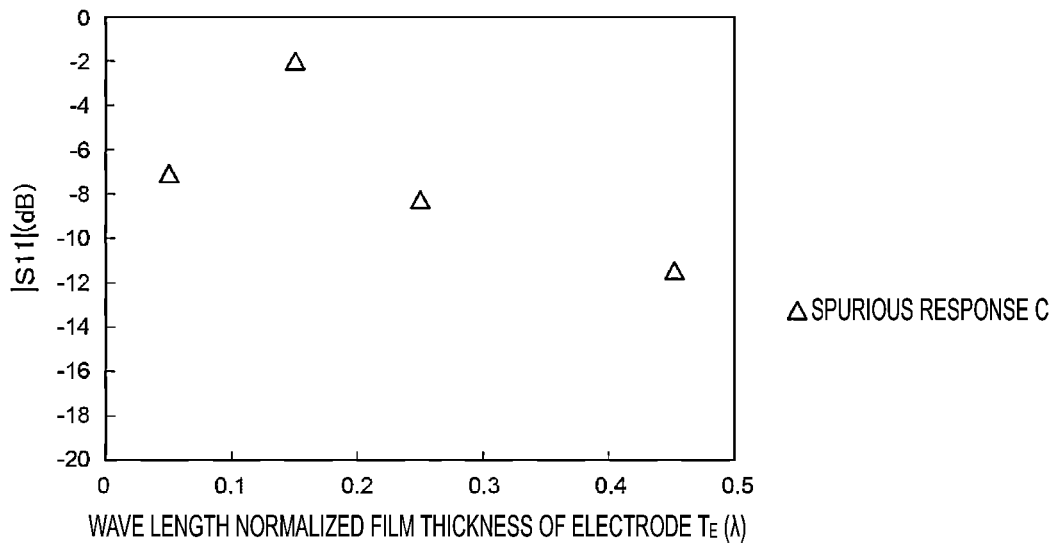
FIG. 23 is a graph showing the relationship between the wavelength normalized film thickness $T_E$ of the IDT electrode and the intensity S11 of a response of the spurious response C.

FIG. 19 is a graph showing the relationship between the propagation direction $\psi_{Si}$ in the single crystal Si layer and the intensity S11 of the response of the spurious response C. As is apparent from FIG. 19, the intensity S11 of the response of the spurious response C changes when $\psi_{Si}$ is changed. Similarly, as described in FIG. 20, the intensity S11 of the response of the spurious response C also changes when the wavelength normalized film thickness $T_{LT}$ of the lithium tantalate film is changed. As described in FIG. 21, the intensity S11 of the response of the spurious response C changes when the cut angle (90°−$\theta_{LT}$) of the lithium tantalate film is changed. As described in FIG. 22, the intensity S11 of the response of the spurious response C also changes when the wavelength normalized film thickness $T_S$ of the SiO$_2$ film is changed. Further, as described in FIG. 23, the intensity S11 of the response of the spurious response C also changes when the wavelength normalized film thickness $T_E$ of the IDT electrode in terms of aluminum is changed.

Figure 24:
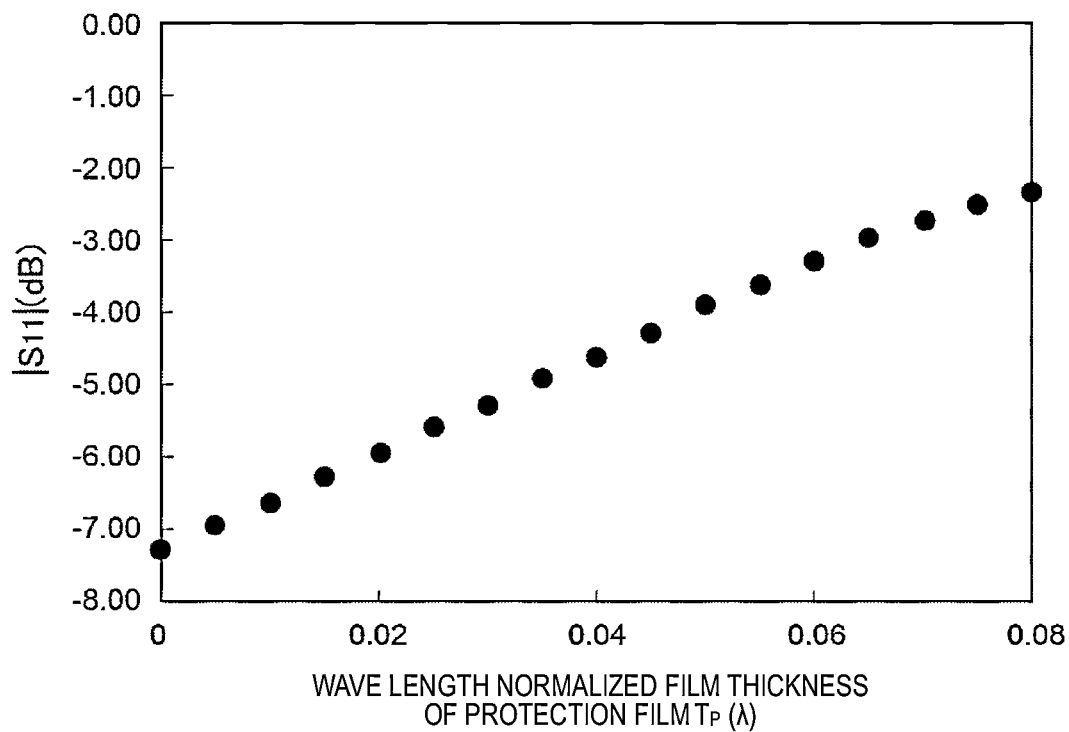
FIG. 24 is a graph showing the relationship between the wavelength normalized film thickness $T_P$ of the protection film being the silicon oxide film and the intensity S11 of a response of the spurious response C.

Still further, as described in FIG. 24, the intensity S11 of the response of the spurious response C also changes when the wavelength normalized film thickness $T_P$ of the protection film being a silicon oxide film is changed.

The coefficient values in Formula (1) for expressing $I_{h3}$ corresponding to the intensity of the response of the spurious response C were obtained from FIG. 19 to FIG. 24 and the like. That is, $I_{h3}$ corresponding to the intensity of the response of the spurious response C may be expressed when the coefficients in Formula (1) are determined as in Table 61 to Table 72 described above in accordance with Si (100), (110), or (111), further, the respective ranges of the wavelength normalized film thickness $T_{LT}$ of the lithium tantalate film, the Euler angle $\theta_{LT}$ of the lithium tantalate film, the wavelength normalized film thickness $T_S$ of the SiO$_2$ film, the wavelength normalized film thickness $T_E$ of the IDT electrode, the wavelength normalized film thickness $T_P$ of the protection film, and the propagation direction $\psi_{Si}$. The response of the spurious response C may be made sufficiently small by determining the conditions of $T_{LT}$, $\theta_{LT}$, $T_S$, $T_E$, $T_P$, and $\psi_{Si}$ that make $I_{h3}$ greater than about −2.4, and by making the inequality $T_{Si}$> about 20 be satisfied.

Preferably, the inequality $I_h$> about −2.4 is satisfied for all of the spurious responses A, B, and C. In this case, it is possible to effectively reduce or prevent the influence of the spurious responses A, B, and C on another acoustic wave filter. Alternatively, $I_h$ for the spurious response A and the spurious response B, $I_h$ for the spurious response A and the spurious response C, or $I_h$ for the spurious response B and the spurious response C may satisfy the inequality $I_h$> about −2.4. In this case, it is possible to reduce or prevent the influence of two of the spurious responses A, B, and C.

Thickness of Lithium Tantalate Film

With the structures of preferred embodiments of the present invention, as described above, the spurious response tends to be confined in a portion where the $SiO_2$ film 3 and the lithium tantalate film 4 are laminated. However, the spurious response is less likely to be confined by making the thickness of the lithium tantalate film 4 equal to or less than about 3.5λ, for example, since the laminated portion of the $SiO_2$ film 3 and the lithium tantalate film 4 becomes thin.

More preferably, the film thickness of the lithium tantalate film 4 is equal to or less than about 2.5λ, for example, and in this case, the absolute value of the frequency temperature coefficient TCF may be made small. Further, preferably, the film thickness of the lithium tantalate film 4 is equal to or less than about 1.5λ, for example. In this case, the electromechanical coupling coefficient may easily be adjusted. Further, more preferably, the film thickness of the lithium tantalate film 4 is equal to or less than about 0.5λ, for example. In this case, the electromechanical coupling coefficient may be easily adjusted in a wide range.

Note that in Formula (1) described above:
a) The range of $\psi_{Si}$ is 0°≤$\psi_{Si}$≤45° when Si (100) having the Euler angles ($\varphi_{Si}$=0°±5°, $\theta_{Si}$=0°±5°, $\psi_{Si}$) is preferably used. Meanwhile, due to the symmetricity of the crystal structure of Si (100), $\psi_{Si}$ and $\psi_{Si}$±(n×90°) are synonymous with each other (note that n=1, 2, 3 . . . ). Similarly, $\psi_{Si}$ and −$\psi_{Si}$ are synonymous with each other;
b) The range of $\psi_{Si}$ is 0°≤$\psi_{Si}$≤90° when Si (110) having the Euler angles ($\varphi_{Si}$=−45°±5°, $\theta_{Si}$=−90°±5°, $\psi_{Si}$) is used. Meanwhile, due to the symmetricity of the crystal structure of Si (110), $\psi_{Si}$ and $\psi_{Si}$±(n×180°) are synonymous with each other (note that n=1, 2, 3 . . . ). Similarly, $\psi_{Si}$ and −$\psi_{Si}$ are synonymous with each other; and
C) The range of $\psi_{Si}$ is 0°≤$\psi_{Si}$≤ about 60° when Si (111) having the Euler angles ($\varphi_{Si}$=−45°±5°, $\theta_{Si}$=−54.73561°±5°, $\psi_{Si}$) is used. Meanwhile, due to the symmetricity of the crystal structure of Si (111), $\psi_{Si}$ and $\psi_{Si}$±(n×120°) are synonymous with each other (note that n=1, 2, 3 . . . ).

Further, although the range of $\theta_{LT}$ is set to −180°<$\theta_{LT}$≤ about 0°, $\theta_{LT}$ and $\theta_{LT}$+180° may be treated as synonymous with each other.

In the present description, for example, when the Euler angles (within the range of 0°±5°, θ, within the range of 0°±15°) is cited, "within the range of 0°±5°" means "within the range of equal to or greater than −5° and equal to or less than +5°", and "within the range of 0°±15°" means "within the range of equal to or greater than −15° and equal to or less than +15°". In the present description, for example, "within the range of 0°±5°" may simply be denoted by "0°±5°".

Figure 25:
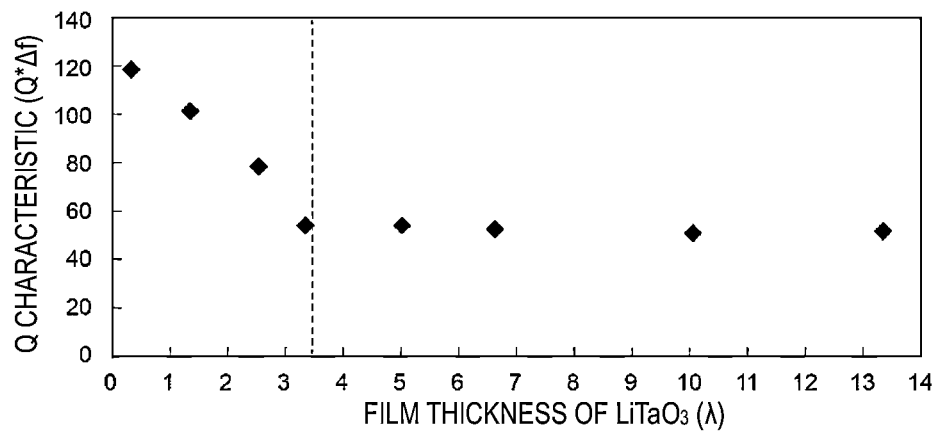
FIG. 25 is a graph showing the relationship between a film thickness of a LiTaO$_3$ film and a Q characteristic in the acoustic wave device.
Figure 26:
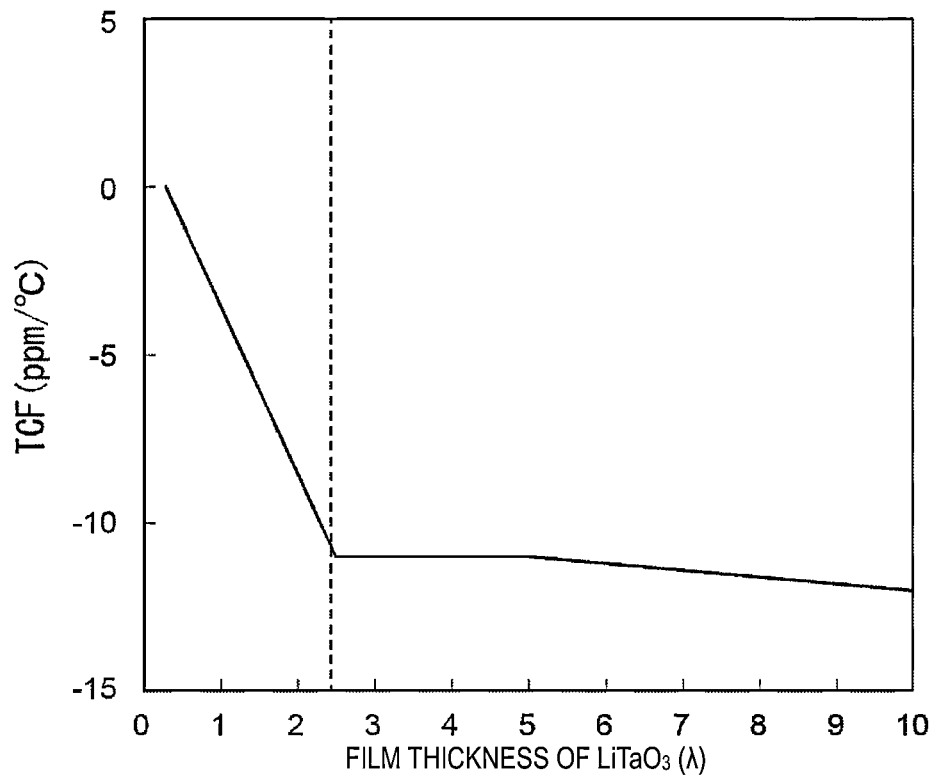
FIG. 26 is a graph showing the relationship between the film thickness of the LiTaO$_3$ film and a temperature coefficient of frequency TCF in the acoustic wave device.
Figure 27:
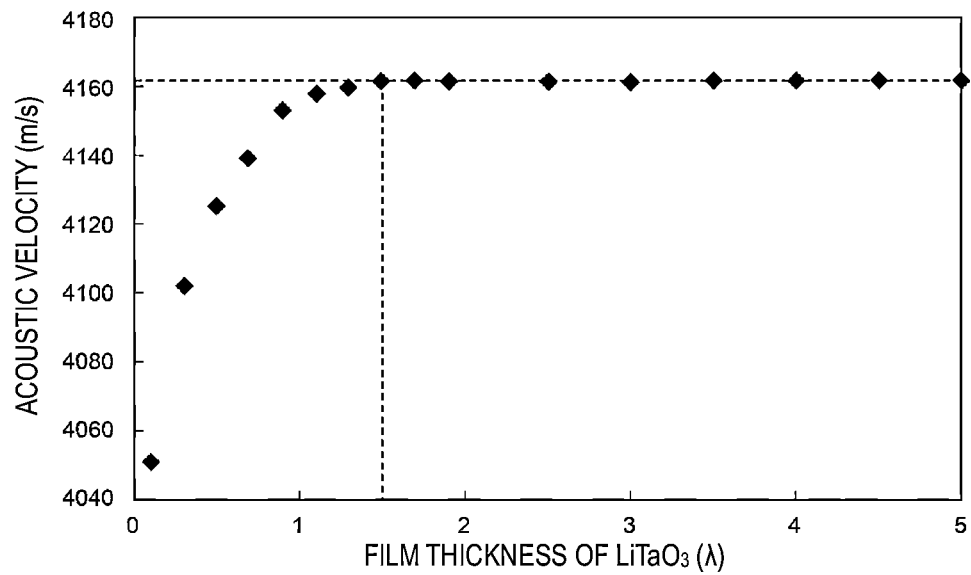
FIG. 27 is a graph showing the relationship between the film thickness of the LiTaO$_3$ film and an acoustic velocity in the acoustic wave device.

FIG. 25 is a graph showing the relationship between the film thickness of the $LiTaO_3$ film and the Q characteristic of an acoustic wave device in which a low acoustic velocity film made of $SiO_2$ film of thickness of about 0.35λ, and a piezoelectric film made of lithium tantalate having the Euler angles (0°, 140.0°, 0°) are laminated above a high acoustic velocity support substrate made of silicon. The vertical axis in FIG. 25 is a product of the Q factor and the fractional bandwidth (Δf) of the resonator. FIG. 26 is a graph showing the relationship between the film thickness of the $LiTaO_3$ film and the temperature coefficient of frequency TCF. FIG. 27 is a graph showing the relationship between the film thickness of the $LiTaO_3$ film and the acoustic velocity. From FIG. 25, it is preferable that the film thickness of the $LiTaO_3$ film be equal to or less than about 3.5λ, for example. In this case, the Q factor becomes higher relative to the case where the film thickness of the $LiTaO_3$ film exceeds about 3.5λ. More preferably, the film thickness of the $LiTaO_3$ film is equal to or less than about 2.5λ, for example, in order to further increase the Q factor.

From FIG. 26, when the film thickness of the $LiTaO_3$ film is equal to or less than about 2.5λ, the absolute value of the frequency temperature coefficient TCF may be made smaller than in the case where the film thickness of the $LiTaO_3$ film exceeds about 2.5λ. More preferably, the film thickness of the $LiTaO_3$ film is equal to or less than about 2λ, for example, and in that case, the absolute value of the frequency temperature coefficient TCF may be made equal to or less than about 10 ppm/° C. In order to reduce the absolute value of the frequency temperature coefficient TCF, it is further preferable that the film thickness of the $LiTaO_3$ film is reduced to equal to or less than about 1.5λ, for example.

From FIG. 27, when the film thickness of the $LiTaO_3$ film exceeds about 1.5λ, the change in the acoustic velocity is extremely small.

Figure 28:
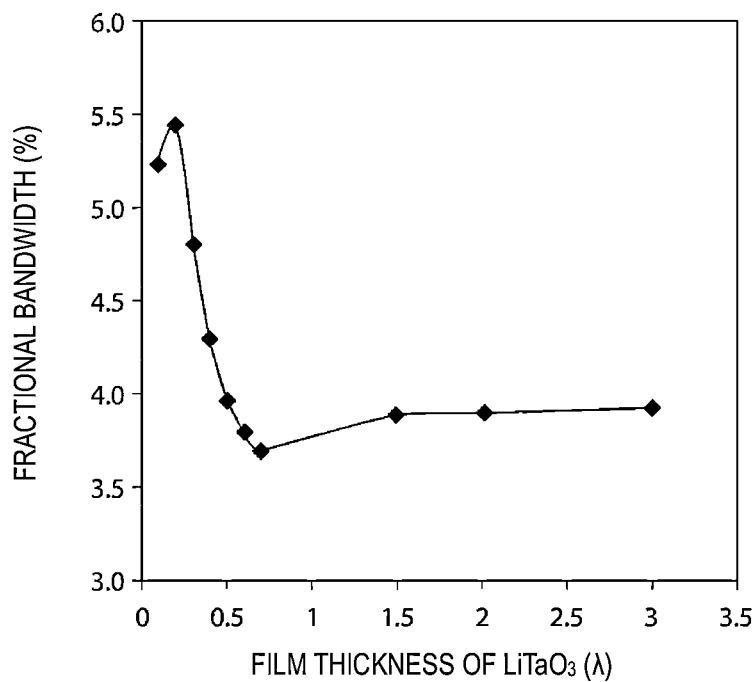
FIG. 28 is a graph showing the relationship between LiTaO$_3$ film thickness and a fractional bandwidth.

Meanwhile, as described in FIG. 28, the fractional bandwidth changes significantly when the film thickness of the $LiTaO_3$ film is in the range of equal to or greater than about 0.05λ and equal to or less than about 0.5λ. Accordingly, the electromechanical coupling coefficient may be adjusted in a wider range. In order to widen the adjustment range of the electromechanical coupling coefficient and the fractional bandwidth, therefore, it is preferable that the film thickness of the $LiTaO_3$ film is in a range of equal to or greater than about 0.05λ and equal to or less than about 0.5λ, for example.

Figure 29:
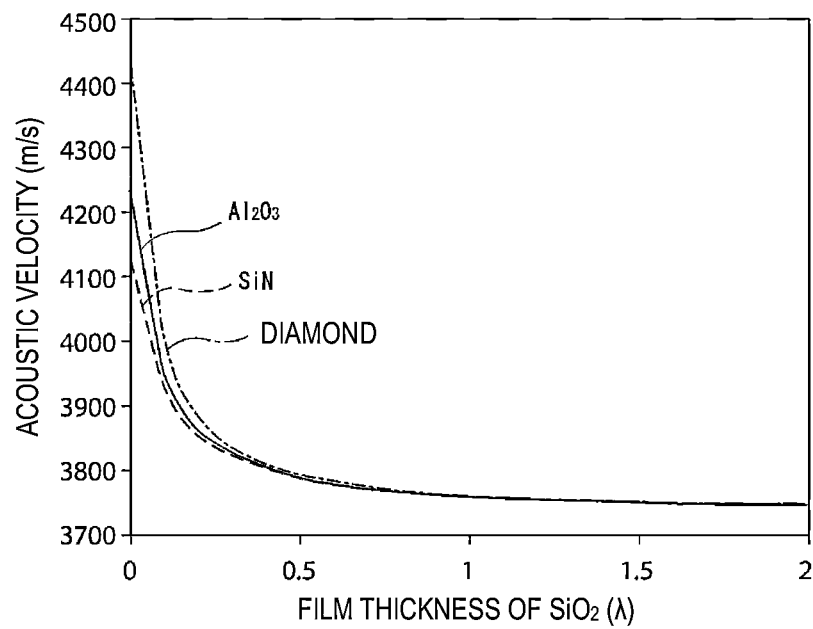
FIG. 29 is a graph showing the relationship among the film thickness of the SiO$_2$ film, material of a high acoustic velocity film, and the acoustic velocity.
Figure 30:
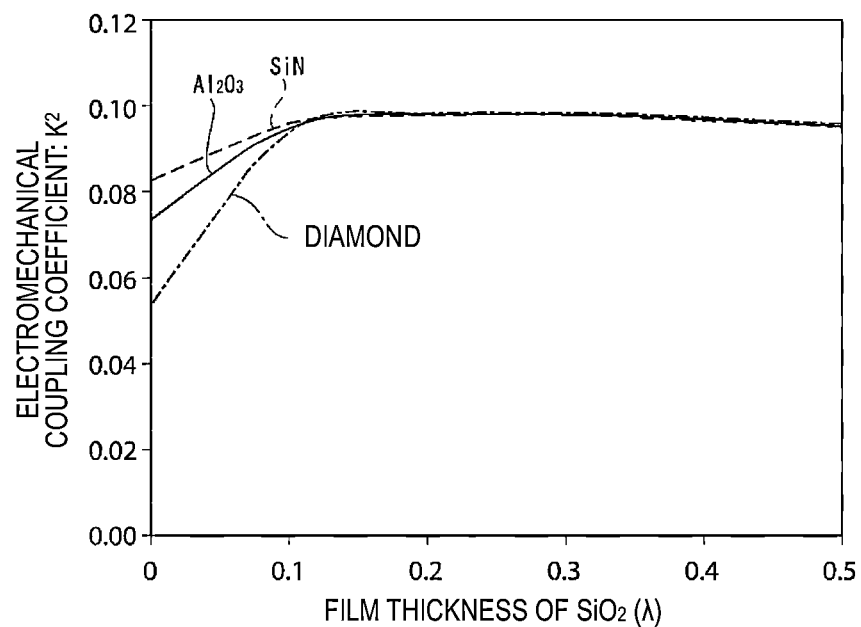
FIG. 30 is a graph showing the relationship among the film thickness of the SiO$_2$ film, an electromechanical coupling coefficient, and material of the high acoustic velocity film.

FIG. 29 is a graph showing the relationship between the film thickness (λ) of the $SiO_2$ film and the acoustic velocity, and FIG. 30 is a graph showing the relationship between the film thickness (λ) of the $SiO_2$ film and the electromechanical coupling coefficient. Here, each of a silicon nitride film, an aluminum oxide film, and a diamond film was used as the high acoustic velocity film under the low acoustic velocity film made of $SiO_2$. The film thickness of the high acoustic velocity film was about 1.5λ. The acoustic velocity of the bulk wave in silicon nitride is about 6000 m/s, the acoustic velocity of the bulk wave in aluminum oxide is about 6000 m/s, and the acoustic velocity of the bulk wave in diamond is about 12800 m/s. As described in FIG. 29 and FIG. 30, the electromechanical coupling coefficient and the acoustic velocity hardly change even when the material of the high acoustic velocity film and the film thickness of the $SiO_2$ film are changed. In particular, the electromechanical coupling coefficient hardly changes when the film thickness of the $SiO_2$ film is equal to or greater than about 0.1λ and equal to or less than about 0.5λ regardless of the material of the high acoustic velocity film. Further, from FIG. 29, it is discovered that the acoustic velocity does not change when the film thickness of the $SiO_2$ film is equal to or greater than about 0.3λ and equal to or less than about 2λ, regardless of the material of the high acoustic velocity film. Accordingly, preferably, the film thickness of the low acoustic velocity film made of silicon oxide is equal to or less than about 2λ, and more preferably equal to or less than about 0.5λ, for example.

Figure 31:
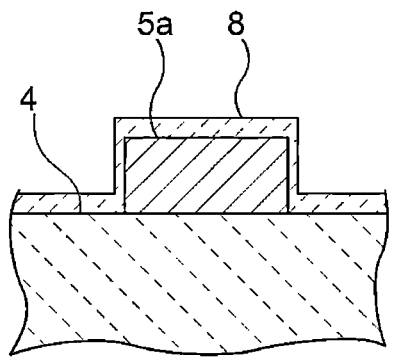
FIG. 31 is a partially enlarged front sectional view for describing a modification of an acoustic wave device according to a preferred embodiment of the present invention which thickness of the protection film is partially different.
Figure 32:
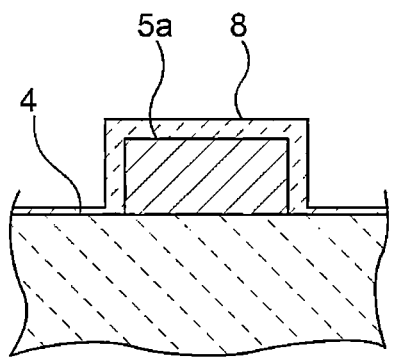
FIG. 32 is a partially enlarged front sectional view for describing another modification of an acoustic wave device according to a preferred embodiment of the present invention in which thickness of the protection film is partially different.
Figure 33:
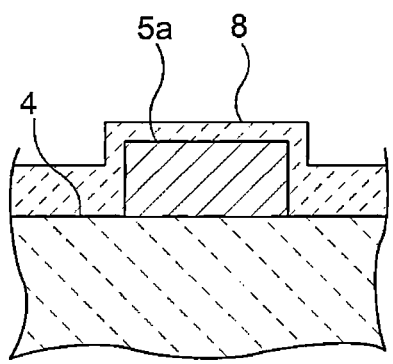
FIG. 33 is a partially enlarged front sectional view for describing another modification of an acoustic wave device according to a preferred embodiment of the present invention in which thickness of the protection film is partially different.

FIG. 31 to FIG. 33 are partially enlarged front sectional views for describing each of modifications of a preferred embodiment of the present invention in which the thickness of the protection film is partially different in the acoustic wave resonator. In each modification illustrated in FIG. 31 to FIG. 33, the protection film 8 covers the lithium tantalate film 4, and the upper surface and the side surfaces of an electrode finger 5a of the IDT electrode 5. In the modification illustrated in FIG. 31, the thickness of the protection film 8 covering the side surfaces of the electrode finger 5a is smaller than the thickness of the protection film 8 covering the upper surface of the electrode finger 5a. In this case, the Q factor may be increased, and the electromechanical coupling coefficient may be increased. In more detail, since Qm of the protection film 8 is small, the Q of the acoustic wave resonator may be increased when the protection film 8 on the side surfaces of the electrode finger 5a is thin. Accordingly, the loss of the acoustic wave filter may be reduced. Further, the difference in acoustic impedance between the portion where the electrode finger 5a is provided and the gap between the electrode fingers 5a becomes small when the protection film 8 is provided on the lithium tantalate film 4. With this, the electromechanical coupling coefficient is reduced. However, the electromechanical coupling coefficient may be increased when the thickness of the protection film 8 on the side surfaces of the electrode finger 5a is small.

In the modification illustrated in FIG. 32, on the other hand, the thickness of the protection film 8 on the lithium tantalate film 4 is smaller than the thickness of the protection film 8 covering the upper surface of the electrode finger 5a. In this case as well, the electromechanical coupling coefficient may be increased. That is, the electromechanical coupling coefficient may be increased by reducing the thickness of the protection film 8 in the portion covering the lithium tantalate film 4.

In the modification illustrated in FIG. 33, the thickness of the protection film 8 on the lithium tantalate film 4 is larger than the thickness of the protection film 8 covering the upper surface of the electrode finger 5a. In this case, the electromechanical coupling coefficient may be reduced and a narrower band may be achieved.

Figure 34:
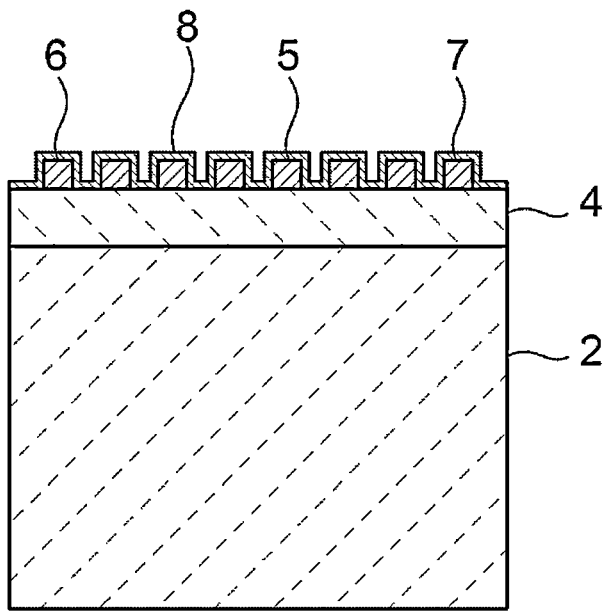
FIG. 34 is a front sectional view illustrating a modification of the acoustic wave resonator used in an acoustic wave device according to a preferred embodiment of the present invention.

FIG. 34 is a front sectional view for describing a modification of the acoustic wave resonator used in preferred embodiments of the present invention. The acoustic wave resonator of the present modification has the same or substantially the same configuration as that of the acoustic wave device 1 illustrated in FIG. 1A, except that the $SiO_2$ film 3 is not provided. As described above, the acoustic wave resonator used in preferred embodiments of the present invention may have a structure in which the lithium tantalate film 4 is directly laminated on the single crystal Si layer 2. In that case, the thickness of the $SiO_2$ film 3 is zero.

Figure 35:
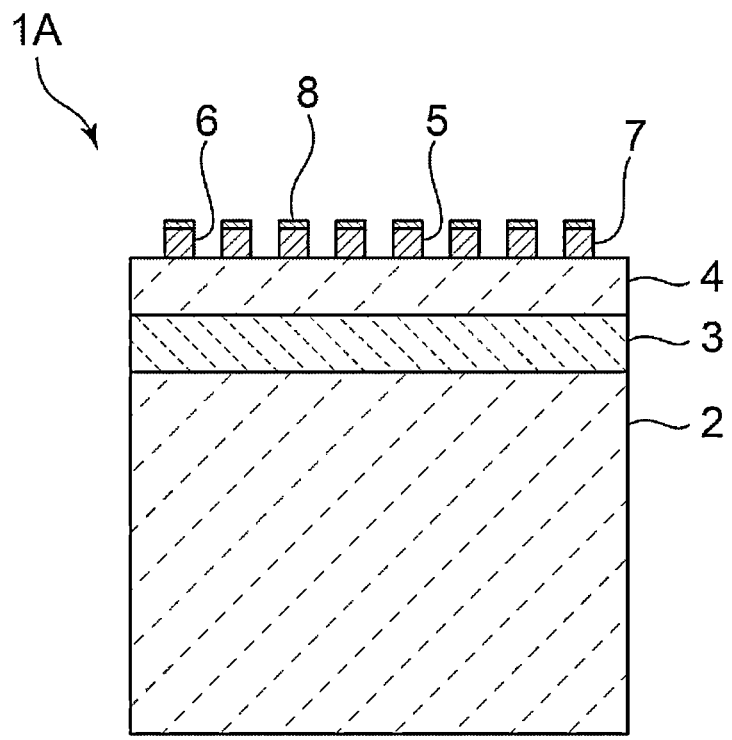
FIG. 35 is a front sectional view illustrating another modification of the acoustic wave resonator used in an acoustic wave device according to a preferred embodiment of the present invention.

FIG. 35 is a front sectional view illustrating another modification of the acoustic wave resonator used in preferred embodiments of the present invention. In an acoustic wave device 1A, the protection film 8 is laminated on the upper surface of the electrode finger of the IDT electrode 5. The protection film 8 does not extend to the side surfaces of the electrode finger of the IDT electrode 5. As described above, the protection film 8 may be laminated on only the upper surface of the electrode finger.

Figure 36:
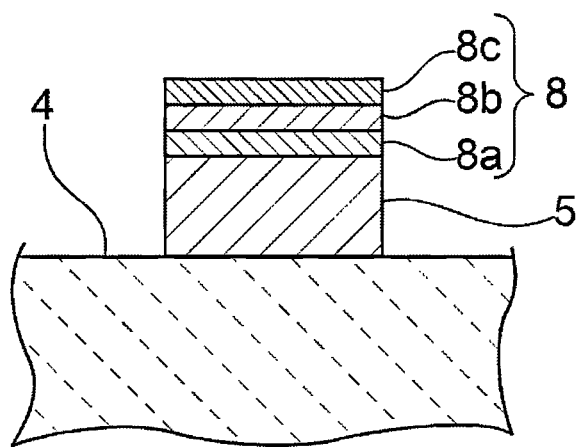
FIG. 36 is a partially enlarged front sectional view for describing a modification of an acoustic wave device according to a preferred embodiment of the present invention in which the protection film is a laminated film.

FIG. 36 is a partially enlarged front sectional view for describing the structure in the case where the protection film 8 is a laminated film. The protection film 8 has a structure in which a first protection film layer 8a, a second protection film layer 8b, and a third protection film layer 8c are laminated. As described above, the protection film 8 may be a laminated film including the plurality of protection film layers. In this case, the wavelength normalized film thickness $T_P$ of the protection film 8 is obtained by the total sum of values, where each value is a product of a value obtained when the density of a protection film layer is divided by the density of silicon oxide and the wavelength normalized film thickness of the protection film layer. For example, when the first protection film layer 8a has the density of d1 and the wavelength normalized film thickness of t1, the second protection film layer 8b has the density of d2 and the wavelength normalized film thickness of t2, the third protection film layer 8c has the density of d3 and the wavelength normalized film thickness of t3, and silicon oxide has the density of d0, the wavelength normalized film thickness $T_P$ of the protection film 8 is expressed as $T_P=(d1/d0)t1+(d2/d0)t2+(d3/d0)t3$.

Figure 37:
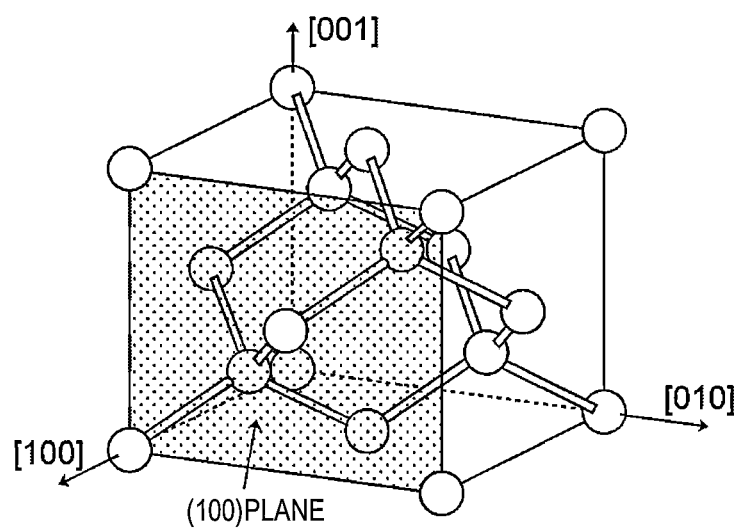
FIG. 37 is a schematic diagram for describing crystal orientation Si (100).

As illustrated in FIG. 37, Si (100) means a substrate that is cut in a (100) plane orthogonal or substantially orthogonal to a crystal axis represented by the Miller index in the crystal structure of silicon having a diamond structure. Note that a crystallographically equivalent plane, such as Si (010), for example, is also included.

Figure 38:
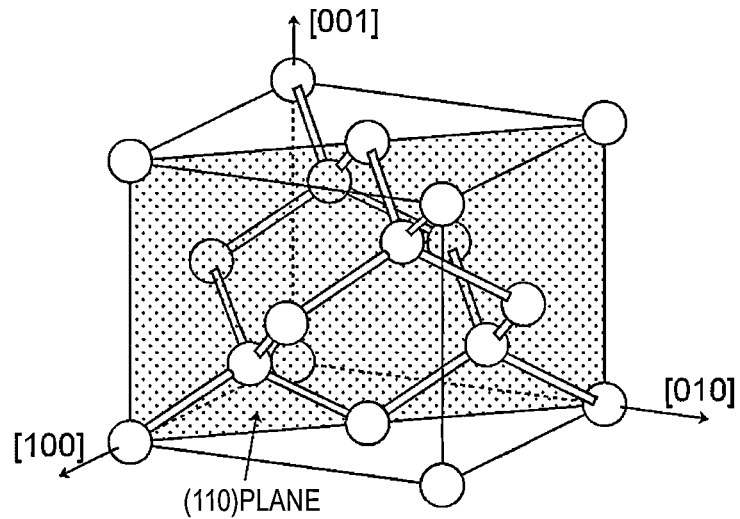
FIG. 38 is a schematic diagram for describing crystal orientation Si (110).

As illustrated in FIG. 38, Si (110) means a substrate that is cut in a (110) plane orthogonal or substantially orthogonal to a crystal axis represented by the Miller index in the crystal structure of silicon having a diamond structure. Note that other crystallographically equivalent planes are also included.

Figure 39:
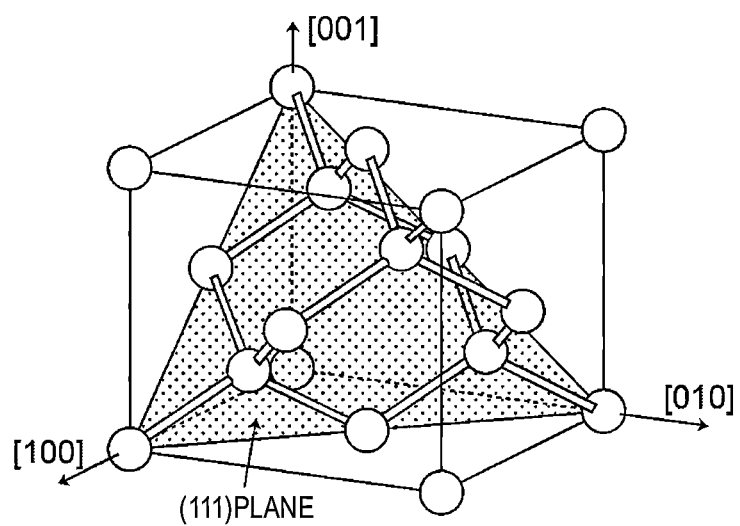
FIG. 39 is a schematic diagram for describing crystal orientation Si (111).

As illustrated in FIG. 39, Si (111) means a substrate that is cut in a (111) plane orthogonal or substantially orthogonal to a crystal axis represented by the Miller index in the crystal structure of silicon having a diamond structure. Note that other crystallographically equivalent planes are also included.

The acoustic wave device of each of the above-described preferred embodiments may be used as a component for such as the composite filter device in a high frequency front end circuit. An example of such high frequency front end circuit according to a preferred embodiment of the present invention will be described below.

Figure 40:
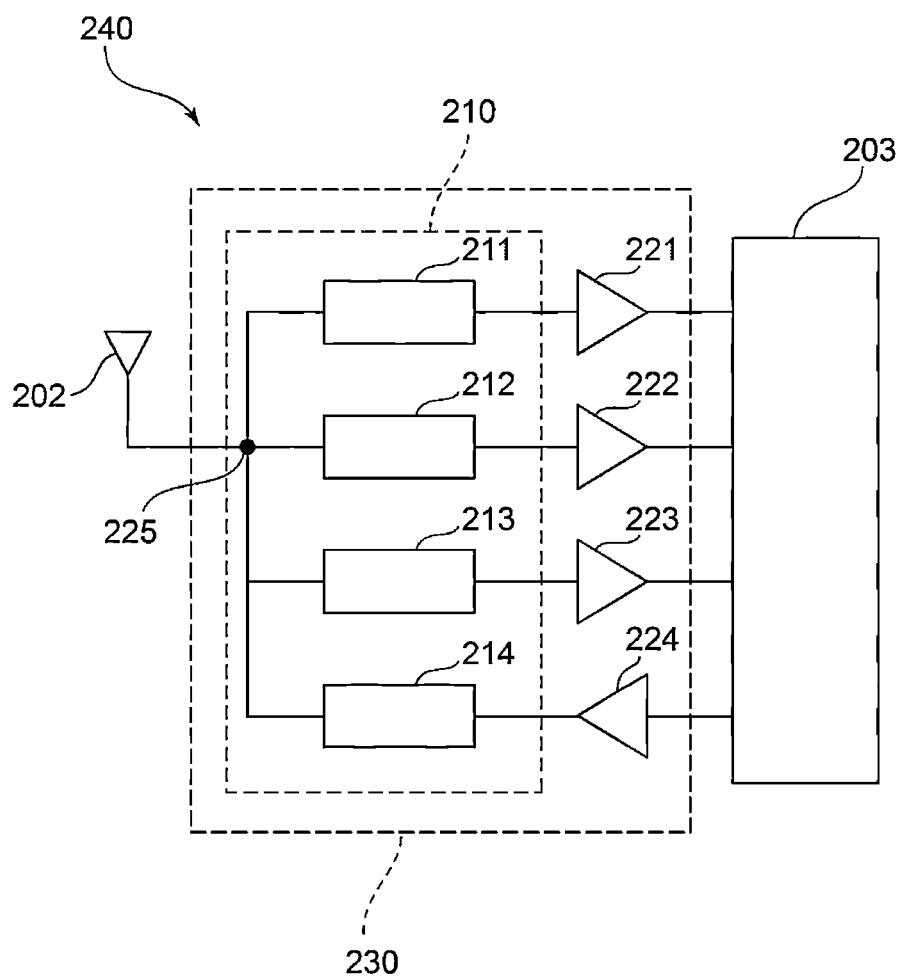
FIG. 40 is a schematic configuration diagram of a communication apparatus including a high frequency front end circuit according to a preferred embodiment of the present invention.

FIG. 40 is a schematic configuration diagram of a communication apparatus including a high frequency front end circuit. A communication apparatus 240 includes an antenna 202, a high frequency front end circuit 230, and an RF signal processing circuit 203. The high frequency front end circuit 230 is connected to the antenna 202. The high frequency front end circuit 230 includes a composite filter device 210 and amplifiers 221 to 224. The composite filter device 210 includes a first filter 211 to a fourth filter 214. As the composite filter device 210, the above-described composite filter device according to the present preferred embodiment may be used. The composite filter device 210 includes an antenna common terminal 225 connected to the antenna 202. One terminal of each of the first filter 211 to the third filter 213 defining and functioning as reception filters and one terminal of the fourth filter 214 defining and functioning as a transmission filter are connected in common to the antenna common terminal 225. The output terminals of the first filter 211 to the third filter 213 are connected to the amplifiers 221 to 223, respectively. Further, the amplifier 224 is connected to an input terminal of the fourth filter 214.

The output terminals of the amplifiers 221 to 223 are connected to the RF signal processing circuit 203. An input terminal of the amplifier 224 is connected to the RF signal processing circuit 203.

The composite filter device according to the present preferred embodiment may be suitably used as the composite filter device 210 in the communication apparatus 240 described above.

The acoustic wave device according to a preferred embodiment of the present invention is preferably the above-described acoustic wave resonator. The acoustic wave filter according to a preferred embodiment of the present invention includes a plurality of resonators and at least one of the plurality of resonators may be defined by an acoustic wave device according to a preferred embodiment of the present invention.

The composite filter device according to the present preferred embodiment includes N band pass filters (N is two or more) having different pass bands as in the composite filter device 210 described above, and one terminal of each of the N band pass filters is connected in common on the antenna terminal side. In this case, at least one of the N band pass filters excluding the band pass filter having the highest pass band includes one or more acoustic wave resonators, and at least one of the one or more acoustic wave resonators may be an acoustic wave device according to a preferred embodiment of the present invention. In addition, in the N band pass filters, at least one of the band pass filters other than the acoustic wave filters including the acoustic wave device according to a preferred embodiment of the present invention may not be an acoustic wave filter. That is, the band pass filters connected in common may include a band pass filter other than an acoustic wave filter, such as an LC filter, for example. Preferably, N is three or more, for example, and the three or more band pass filters define the composite filter device for simultaneously transmitting and receiving signals of a plurality of communication bands. Further, the acoustic wave filter may be a ladder filter, for example.

The acoustic wave devices according to preferred embodiments of the present invention may each be used in various communication bands, and preferably, the pass band in the acoustic wave filter is a pass band of a communication band defined by the 3GPP standard.

The composite filter devices according to preferred embodiments of the present invention may include only a plurality of transmission filters, or may include a plurality of reception filters.

Preferred embodiments of the present invention may widely be used in a communication device, such as a mobile phone, for example, as a filter or a composite filter device, a front end circuit, and a communication apparatus applicable to a multi-band system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a silicon support substrate;
   a silicon oxide film laminated above the silicon support substrate;
   a lithium tantalate film laminated above the silicon oxide film;
   an IDT electrode including an electrode finger and being provided above the lithium tantalate film; and
   a protection film covering at least a portion of the IDT electrode; wherein when a wavelength determined by an electrode finger pitch of the IDT electrode is denoted by $\lambda$, a wavelength normalized film thickness of the lithium tantalate film is denoted by $T_{LT}$, $\theta$ of an Euler angle of the lithium tantalate film is denoted by $\theta_{LT}$, a wavelength normalized film thickness of the silicon oxide film is denoted by $T_S$, a wavelength normalized film thickness of the IDT electrode in terms of aluminum thickness being a product of a wavelength normalized film thickness of the IDT electrode and a value obtained when density of the IDT electrode is divided by density of aluminum is denoted by $T_E$, a wavelength normalized film thickness of the protection film being a product of a value obtained when density of the protection film is divided by density of silicon oxide and a wavelength normalized film thickness which is a thickness of the protection film normalized by the wavelength $\lambda$ is denoted by $T_P$, a propagation direction in the silicon support substrate is denoted by $\psi_{Si}$, and a wavelength normalized film thickness which is a thickness of the silicon support substrate normalized by the wavelength $\lambda$ is denoted by $T_{Si}$, $T_{LT}$, $\theta_{LT}$, $T_S$, $T_E$, $T_P$, and $\psi_{Si}$ are set such that a value represented by Formula (1) below is larger than about $-2.4$:

$$I_h = \left(a^{(2)}_{T_{LT}}\left((T_{LT} - c_{T_{LT}})^2 - b^{(2)}_{T_{LT}}\right) + \right.$$
$$a^{(1)}_{T_{LT}}(T_{LT} - c_{T_{LT}}) + a^{(2)}_{T_S}\left((T_S - c_{T_S})^2 - b^{(2)}_{T_S}\right) + a^{(1)}_{T_S}(T_S - c_{T_S}) +$$
$$a^{(4)}_{T_B}\left((T_E - c_{T_E})^4 - b^{(4)}_{T_E}\right) + a^{(3)}_{T_E}\left((T_E - c_{T_E})^3 - b^{(3)}_{T_E}\right) +$$
$$a^{(2)}_{T_E}\left((T_E - c_{T_E})^2 - b^{(2)}_{T_E}\right) + a^{(1)}_{T_E}(T_E - c_{T_E}) +$$
$$a^{(6)}_{\Psi_{Si}}\left((\Psi_{Si} - c_{\Psi_{Si}})^6 - b^{(6)}_{\Psi_{Si}}\right) + a^{(5)}_{\Psi_{Si}}\left((\Psi_{Si} - c_{\Psi_{Si}})^5 - b^{(5)}_{\Psi_{Si}}\right) +$$
$$a^{(4)}_{\Psi_{Si}}\left((\Psi_{Si} - c_{\Psi_{Si}})^4 - b^{(4)}_{\Psi_{Si}}\right) + a^{(3)}_{\Psi_{Si}}\left((\Psi_{Si} - c_{\Psi_{Si}})^3 - b^{(3)}_{\Psi_{Si}}\right) +$$
$$a^{(2)}_{\Psi_{Si}}\left((\Psi_{Si} - c_{\Psi_{Si}})^2 - b^{(2)}_{\Psi_{Si}}\right) + a^{(1)}_{\Psi_{Si}}(\Psi_{Si} - c_{\Psi_{Si}}) +$$
$$a^{(2)}_{\theta_{LT}}\left((\theta_{LT} - c_{\theta_{LT}})^2 - b^{(2)}_{\theta_{LT}}\right) + a^{(1)}_{\theta_{LT}}(\theta_{LT} - c_{\theta_{LT}}) +$$
$$d_{T_{LT}T_S}(T_{LT} - c_{T_{LT}})(T_S - c_{T_S}) + d_{T_{LT}T_E}(T_{LT} - c_{T_{LT}})$$
$$(T_E - c_{T_E}) + d_{T_{LT}\Psi_{Si}}(T_{LT} - c_{T_{LT}})(\Psi_{Si} - c_{\Psi_{Si}}) +$$
$$d_{T_{LT}\theta_{LT}}(T_{LT} - c_{T_{LT}})(\theta_{LT} - c_{\theta_{LT}}) + d_{T_S T_E}(T_S - c_{T_S})(T_E - c_{T_E}) +$$
$$d_{T_S \Psi_{Si}}(T_S - c_{T_S})(\Psi_{Si} - c_{\Psi_{Si}}) + d_{T_S \theta_{LT}}(T_S - c_{T_S})(\theta_{LT} - c_{\theta_{LT}}) +$$
$$d_{T_E \Psi_{Si}}(T_E - c_{T_E})(\Psi_{Si} - c_{\Psi_{Si}}) + d_{T_E \theta_{LT}}(T_E - c_{T_E})(\theta_{LT} - c_{\theta_{LT}}) +$$
$$d_{\Psi_{Si}\theta_{LT}}(\Psi_{Si} - c_{\Psi_{Si}})(\theta_{LT} - c_{\theta_{LT}}) + e\bigg]$$
$$\left(a_{T_P}T_P^4 + b_{T_P}T_P^3 + c_{T_P}T_P^2 + d_{T_P}T_P + f_{T_P}\right);$$

Formula (1)

where, coefficients a, b, c, d, e, and f in Formula (1) are values described in Table 1 to Table 12 below that are determined in accordance with a crystal orientation of the silicon support substrate and a range of $T_S$, $T_{LT}$, and $\psi_{Si}$:

TABLE 1

| | Si(100) | |
| --- | --- | --- |
| | $0 < T_{LT} < 0.2$ | |
| | $0 \leq T_S < 0.2$ | |
| | $0.05 \leq T_E < 0.25$ | $0.25 \leq T_E \leq 0.45$ |
| $a_{T_{LT}}{}^{(2)}$ | 0 | 0 |
| $a_{T_{LT}}{}^{(1)}$ | 0 | 0 |

TABLE 1-continued

Si(100)
$0 < T_{LT} < 0.2$
$0 \leq T_S < 0.2$

| | $0.05 \leq T_E < 0.25$ | $0.25 \leq T_E \leq 0.45$ |
|---|---|---|
| $b_{TLT}^{(2)}$ | 0 | 0 |
| $c_{TLT}$ | 0 | 0 |
| $a_{TS}^{(2)}$ | 0 | 0 |
| $a_{TS}^{(1)}$ | −5.857231176 | −5.857231176 |
| $b_{TS}^{(2)}$ | 0 | 0 |
| $c_{TS}$ | 0.148 | 0.148 |
| $a_{TE}^{(4)}$ | 0 | 0 |
| $a_{TE}^{(3)}$ | 0 | 0 |
| $a_{TE}^{(2)}$ | −19.75255913 | −19.75255913 |
| $a_{TE}^{(1)}$ | −2.877583447 | −2.877583447 |
| $b_{TE}^{(4)}$ | 0 | 0 |
| $b_{TE}^{(3)}$ | 0 | 0 |
| $b_{TE}^{(2)}$ | 0.022736 | 0.022736 |
| $c_{TE}$ | 0.242 | 0.242 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.004788767 | 0.004788767 |
| $a_{\psi Si}^{(1)}$ | 0.024306207 | 0.024306207 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 81.81 | 81.81 |
| $c_{\psi Si}$ | 8.7 | 8.7 |
| $a_{\theta LT}^{(2)}$ | −0.008235936 | −0.008235936 |
| $a_{\theta LT}^{(1)}$ | −0.021048278 | −0.021048278 |
| $b_{\theta LT}^{(2)}$ | 65.16 | 65.16 |
| $c_{\theta LT}$ | −52.2 | −52.2 |
| $d_{TLTTS}$ | 0 | 0 |
| $d_{TLTTE}$ | 0 | 0 |
| $d_{TLT\psi Si}$ | 0 | 0 |
| $T_{TLT\theta LT}$ | 0 | 0 |
| $d_{TSTE}$ | 0 | 0 |
| $d_{TS\psi Si}$ | 0 | 0 |
| $d_{TS\theta LT}$ | −0.786852571 | −0.786852571 |
| $d_{TE\psi Si}$ | 0 | 0 |
| $d_{TE\theta LT}$ | −0.237034335 | −0.237034335 |
| $d_{\psi Si\theta LT}$ | 0 | 0 |
| e | −1.499248378 | −1.499248378 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495; |

TABLE 2

Si(100)
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{TLT}^{(2)}$ | 0 | 125.5342427 |
| $a_{TLT}^{(1)}$ | −13.43961051 | −7.643409732 |
| $b_{TLT}^{(2)}$ | 0 | 0.006076558 |
| $c_{TLT}$ | 0.329807692 | 0.321186441 |
| $a_{TS}^{(2)}$ | 0 | 0 |
| $a_{TS}^{(1)}$ | −11.80744788 | −10.05306878 |
| $b_{TS}^{(2)}$ | 0 | 0 |
| $c_{TS}$ | 0.158653846 | 0.153389831 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | −7.595099843 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0.366101695 |

TABLE 2-continued

Si(100)
$0.2 \leq T_{LT} \leq 3.5$
$0 \leq T_S < 0.2$

| | $0.05 \leq T_E < 0.25$ | $0.25 \leq T_E \leq 0.45$ |
|---|---|---|
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.003335792 | 0 |
| $a_{\psi Si}^{(1)}$ | 0.039268266 | −0.013700762 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 191.7159763 | 0 |
| $c_{\psi Si}$ | 13.26923077 | 16.01694915 |
| $a_{\theta LT}^{(2)}$ | −0.007476194 | 0 |
| $a_{\theta LT}^{(1)}$ | −0.010867175 | −0.053997369 |
| $b_{\theta LT}^{(2)}$ | 69.19378698 | 0 |
| $c_{\theta LT}$ | −50.19230769 | −50.59322034 |
| $d_{TLTTS}$ | 0 | 0 |
| $d_{TLTTE}$ | 0 | 0 |
| $d_{TLT\psi Si}$ | −0.629167148 | −0.724576033 |
| $T_{TLT\theta LT}$ | 0 | 0 |
| $d_{TSTE}$ | 0 | 0 |
| $d_{TS\psi Si}$ | 0 | 0.521919406 |
| $d_{TS\theta LT}$ | 0 | 0 |
| $d_{TE\psi Si}$ | 0 | −0.523966449 |
| $d_{TE\theta LT}$ | 0 | 0 |
| $d_{\psi Si\theta LT}$ | 0 | 0 |
| e | −2.071831837 | −3.228508418 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495; |

TABLE 3

Si(100)
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −15.6141248 | −15.6141248 |
| $b_{TLT}^{(2)}$ | 0 | 0 |
| $c_{TLT}$ | 0.163309353 | 0.163309353 |
| $a_{TS}^{(2)}$ | 0 | 0 |
| $a_{TS}^{(1)}$ | −22.02440893 | −22.02440893 |
| $b_{TS}^{(2)}$ | 0 | 0 |
| $c_{TS}$ | 0.325179856 | 0.325179856 |
| $a_{TE}^{(4)}$ | 0 | 0 |
| $a_{TE}^{(3)}$ | −248.4374004 | −248.4374004 |
| $a_{TE}^{(2)}$ | −36.57127964 | −36.57127964 |
| $a_{TE}^{(1)}$ | 13.88180854 | 13.88180854 |
| $b_{TE}^{(4)}$ | 0 | 0 |
| $b_{TE}^{(3)}$ | 0.000480119 | 0.000480119 |
| $b_{TE}^{(2)}$ | 0.020416128 | 0.020416128 |
| $c_{TE}$ | 0.240647482 | 0.240647482 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002456326 | 0.002456326 |
| $a_{\psi Si}^{(1)}$ | 0.048553126 | 0.048553126 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 279.6050929 | 279.6050929 |
| $c_{\psi Si}$ | 22.3381295 | 22.3381295 |
| $a_{\theta LT}^{(2)}$ | 0 | 0 |
| $a_{\theta LT}^{(1)}$ | 0.005427275 | 0.005427275 |

TABLE 3-continued

Si(100)
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $b_{\theta LT}^{(2)}$ | 0 | 0 |
| $c_{\theta LT}$ | −50.35971223 | −50.35971223 |
| $d_{TLTTS}$ | 0 | 0 |
| $d_{TLTTE}$ | 0 | 0 |
| $d_{TLT\psi Si}$ | 0 | 0 |
| $T_{TLT\theta LT}$ | 0 | 0 |
| $d_{TSTE}$ | 41.63149071 | 41.63149071 |
| $d_{TS\psi Si}$ | −0.577179204 | −0.577179204 |
| $d_{TS\theta LT}$ | 0.603866778 | 0.603866778 |
| $d_{TE\psi Si}$ | 0.134944598 | 0.134944598 |
| $d_{TE\theta LT}$ | 0 | 0 |
| $d_{\psi Si\theta LT}$ | 0 | 0 |
| e | −2.703317679 | −2.703317679 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495; |

TABLE 4

Si(100)
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 133.7896555 |
| $a_{TLT}^{(1)}$ | −7.761727985 | −9.701155851 |
| $b_{TLT}^{(2)}$ | 0 | 0.006281971 |
| $c_{TLT}$ | 0.315508021 | 0.306914894 |
| $a_{TS}^{(2)}$ | 0 | 0 |
| $a_{TS}^{(1)}$ | −20.35135077 | −6.186650236 |
| $b_{TS}^{(2)}$ | 0 | 0 |
| $c_{TS}$ | 0.297860963 | 0.298404255 |
| $a_{TE}^{(4)}$ | 0 | 0 |
| $a_{TE}^{(3)}$ | 0 | 0 |
| $a_{TE}^{(2)}$ | 110.8304316 | 0 |
| $a_{TE}^{(1)}$ | 4.036561723 | −8.229960495 |
| $b_{TE}^{(4)}$ | 0 | 0 |
| $b_{TE}^{(3)}$ | 0 | 0 |
| $b_{TE}^{(2)}$ | 0.006431411 | 0 |
| $c_{TE}$ | 0.140374332 | 0.363297872 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | 0.002534654 | 0.001652947 |
| $a_{\psi Si}^{(1)}$ | 0.024168138 | −0.003241344 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 269.2484772 | 266.6845858 |
| $c_{\psi Si}$ | 21.4171123 | 20.26595745 |
| $a_{\theta LT}^{(2)}$ | 0 | 0 |
| $a_{\theta LT}^{(1)}$ | 0 | −0.066116428 |
| $b_{\theta LT}^{(2)}$ | 0 | 0 |
| $c_{\theta LT}$ | −90 | −50.4787234 |
| $d_{TLTTS}$ | 96.23533718 | 0 |
| $d_{TLTTE}$ | −66.46866878 | 0 |
| $d_{TLT\psi Si}$ | −0.404808481 | −0.688053172 |
| $d_{TLT\theta LT}$ | 0 | 0 |
| $d_{TSTE}$ | 0 | 0 |
| $d_{TS\psi Si}$ | −0.733337318 | 0 |
| $d_{TS\theta LT}$ | 0 | 0 |
| $d_{TE\psi Si}$ | 0.584322518 | −0.372994212 |
| $d_{TE\theta LT}$ | 0 | 0 |
| $d_{\psi Si\theta LT}$ | 0 | 0 |
| e | −3.679364607 | −4.30794513 |
| $a_{TP}$ | −111692 | −111692 |
| $b_{TP}$ | 19239 | 19239 |
| $c_{TP}$ | −952.97 | −952.97 |
| $d_{TP}$ | 8.8027 | 8.8027 |
| $f_{TP}$ | 1.0495 | 1.0495; |

TABLE 5

Si(110)
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi Si < 45$ | $45 \leq \psi Si \leq 90$ | $0 \leq \psi Si < 45$ | $45 \leq \psi Si \leq 90$ |
| $a_{TLT}^{(2)}$ | 0 | 0 | 0 | 0 |
| $a_{TLT}^{(1)}$ | −16.69742899 | −16.69742899 | −33.56520202 | 0 |
| $b_{TLT}^{(2)}$ | 0 | 0 | 0 | 0 |
| $c_{TLT}$ | 0.1675 | 0.1675 | 0.192857143 | 0 |
| $a_{TS}^{(2)}$ | 0 | 0 | 0 | 0 |
| $a_{TS}^{(1)}$ | 15.90196012 | 15.90196012 | 0 | 0 |
| $b_{TS}^{(2)}$ | 0 | 0 | 0 | 0 |
| $c_{TS}$ | 0.1525 | 0.1525 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 26.3030303 | 0 |
| $a_{TE}^{(1)}$ | 0 | 0 | −6.181053391 | 0 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006326531 | 0 |
| $c_{TE}$ | 0 | 0 | 0.378571429 | 0 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | −0.000183963 | −0.000183963 | 0 | −0.000177142 |
| $a_{\psi Si}^{(2)}$ | −0.003236307 | −0.003236307 | 0 | 0.002186084 |
| $a_{\psi Si}^{(1)}$ | 0.071460688 | 0.071460688 | 0.085067773 | 0.13561432 |

TABLE 5-continued

| | Si(110) $0 < T_{LT} < 0.2$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | −5768.71875 | −5768.71875 | 0 | 2642.857143 |
| $b_{\psi Si}^{(2)}$ | 399.9375 | 399.9375 | 0 | 500 |
| $c_{\psi Si}$ | 65.25 | 65.25 | 34.28571429 | 55 |
| $a_{\theta LT}^{(2)}$ | 0 | 0 | 0 | −0.00533662 |
| $a_{\theta LT}^{(1)}$ | 0 | 0 | 0.070255628 | 0.032718563 |
| $b_{\theta LT}^{(2)}$ | 0 | 0 | 0 | 65.75963719 |
| $c_{\theta LT}$ | −90 | −90 | −51.42857143 | −50.95238095 |
| $d_{TLTTS}$ | 0 | 0 | 0 | 0 |
| $d_{TLTTE}$ | 0 | 0 | 0 | 0 |
| $d_{TLT\psi Si}$ | 1.873870705 | 1.873870705 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0.716151515 | 0 |
| $d_{TE\theta LT}$ | 0 | 0 | 0 | 0 |
| $d_{\psi Si\theta LT}$ | 0 | 0 | −0.00729303 | 0.002110378 |
| e | −0.957101918 | −0.957101918 | −1.63492254 | −1.290881853 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; |

TABLE 6

| | Si(110) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −23.96596978 | −4.695531045 | −7.344438725 | −5.603099398 |
| $b_{TLT}^{(2)}$ | 0 | 0 | 0 | 0 |
| $c_{TLT}$ | 0.34 | 0.3296875 | 0.338983051 | 0.306666667 |
| $a_{TS}^{(2)}$ | 0 | 0 | 0 | 0 |
| $a_{TS}^{(1)}$ | −23.18485905 | 0 | 0 | 0 |
| $b_{TS}^{(2)}$ | 0 | 0 | 0 | 0 |
| $c_{TS}$ | 0.175555556 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −43.48595551 | −70.50554427 | −41.95412638 |
| $a_{TE}^{(1)}$ | 0 | −2.467954545 | −5.460437635 | −2.19025056 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006875 | 0.006716461 | 0.006819556 |
| $c_{TE}$ | 0 | 0.15 | 0.365254237 | 0.360666667 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0.000119479 | −0.000172812 |
| $a_{\psi Si}^{(2)}$ | 0.018474062 | 0 | 0.003987724 | 0.002213009 |
| $a_{\psi Si}^{(1)}$ | 0.059131688 | 0 | −0.047908658 | 0.073831446 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | −2384.203107 | 1647.952 |
| $b_{\psi Si}^{(2)}$ | 81.55555556 | 0 | 216.791152 | 242.24 |
| $c_{\psi Si}$ | 35.33333333 | 0 | 30.76271186 | 62.6 |
| $a_{\theta LT}^{(2)}$ | 0 | 0 | 0 | 0 |
| $a_{\theta LT}^{(1)}$ | 0.009475371 | 0 | 0.026725166 | 0 |
| $b_{\theta LT}^{(2)}$ | 0 | 0 | 0 | 0 |
| $c_{\theta LT}$ | −49.3333333 | −90 | −49.83050847 | −90 |

TABLE 6-continued

Si(110)
$0.2 \leq T_{LT} \leq 3.5$
$0 \leq T_S < 0.2$

| | $0.05 \leq T_F < 0.25$ | | $0.25 \leq T_F \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $d_{TLTTS}$ | 0 | 0 | 0 | 0 |
| $d_{TLTTE}$ | 0 | 0 | 0 | 42.3018696 |
| $d_{TLT\psi Si}$ | 0 | 0 | 0 | 0 |
| $d_{TLT\theta LT}$ | 0.617240199 | 0 | 0 | 0 |
| $d_{TSTE}$ | 0 | 0 | 0 | 0 |
| $d_{TS\psi Si}$ | 2.612107038 | 0 | 0 | 0 |
| $d_{TS\theta LT}$ | 2.129359248 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.871101002 | 0 | 0 | 0 |
| e | −2.851861362 | −2.210765625 | −2.573237283 | −2.440604203 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; |

TABLE 7

Si(110)
$0 < T_{LT} < 0.2$
$0.2 \leq T_S \leq 2.0$

| | $0.05 \leq T_F < 0.25$ | | $0.25 \leq T_F \leq 0.45$ | |
|---|---|---|---|---|
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −10.87353735 | −17.74612134 | −16.74814911 | −16.74814911 |
| $b_{TLT}^{(2)}$ | 0 | 0 | 0 | 0 |
| $c_{TLT}$ | 0.167045455 | 0.158227848 | 0.168032787 | 0.168032787 |
| $a_{TS}^{(2)}$ | 92.14417413 | 275.6432031 | 0 | 0 |
| $a_{TS}^{(1)}$ | −6.141913324 | −0.713377524 | −9.071522271 | −9.071522271 |
| $b_{TS}^{(2)}$ | 0.004213585 | 0.004749239 | 0 | 0 |
| $c_{TS}$ | 0.339772727 | 0.317721519 | 0.314754098 | 0.314754098 |
| $a_{TE}^{(4)}$ | 0 | 0 | 0 | 0 |
| $a_{TE}^{(3)}$ | 0 | 0 | 0 | 0 |
| $a_{TE}^{(2)}$ | −37.82699975 | 0 | 0 | 0 |
| $a_{TE}^{(1)}$ | 4.315324766 | 3.259148162 | −5.270739047 | −5.270739047 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.007147469 | 0 | 0 | 0 |
| $c_{TE}$ | 0.153409091 | 0.138607595 | 0.356557377 | 0.356557377 |
| $a_{\psi Si}^{(6)}$ | 0 | 0 | −3.73552E−09 | −3.73552E−09 |
| $a_{\psi Si}^{(5)}$ | 0 | 0 | −4.69013E−08 | −4.69013E−08 |
| $a_{\psi Si}^{(4)}$ | 0 | 0 | 1.07773E−05 | 1.07773E−05 |
| $a_{\psi Si}^{(3)}$ | 0.000254041 | −0.00026684 | 5.64997E−05 | 5.64997E−05 |
| $a_{\psi Si}^{(2)}$ | 0.00704637 | 0.003350583 | −0.007526984 | −0.007526984 |
| $a_{\psi Si}^{(1)}$ | −0.123432463 | 0.05687546 | −0.035719404 | −0.035719404 |
| $b_{\psi Si}^{(6)}$ | 0 | 0 | 1801696668 | 1801696668 |
| $b_{\psi Si}^{(5)}$ | 0 | 0 | 6726299.443 | 6726299.443 |
| $b_{\psi Si}^{(4)}$ | 0 | 0 | 1035415.498 | 1035415.498 |
| $b_{\psi Si}^{(3)}$ | −1197.310014 | 2539.305207 | 3573.665857 | 3573.665857 |
| $b_{\psi Si}^{(2)}$ | 188.2457386 | 286.0358917 | 720.1088417 | 720.1088417 |
| $c_{\psi Si}$ | 28.125 | 63.60759494 | 48.19672131 | 48.19672131 |
| $a_{\theta LT}^{(2)}$ | 0 | 0 | 0 | 0 |
| $a_{\theta LT}^{(1)}$ | 0.046748629 | 0.00460971 | 0 | 0 |
| $b_{\theta LT}^{(2)}$ | 0 | 0 | 0 | 0 |
| $c_{\theta LT}$ | −51.59090909 | −50.75949367 | −90 | −90 |
| $d_{TLTTS}$ | 0 | 0 | 0 | 0 |
| $d_{TLTTE}$ | 0 | 105.3055279 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 58.63016883 | 0 | 0 | 0 |
| $d_{TS\psi Si}$ | 0.443510572 | 0.274149566 | 0 | 0 |
| $d_{TS\theta LT}$ | 0 | 0 | 0 | 0 |
| $d_{TE\psi Si}$ | 0.293912516 | −0.280924747 | 0 | 0 |
| $d_{TE\theta LT}$ | 0 | 0.457718571 | 0 | 0 |
| $d_{\psi Si\theta LT}$ | 0 | −0.005165328 | 0 | 0 |

TABLE 7-continued

| | Si(110) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| e | −1.722804167 | −2.484892701 | −2.976959016 | −2.976959016 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; |

TABLE 8

| | Si(110) $0.2 < T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 39.48011293 |
| $a_{TLT}^{(1)}$ | −5.239160454 | −5.820942031 | −4.867344296 | −2.496300587 |
| $b_{TLT}^{(2)}$ | 0 | 0 | 0 | 0.00654321 |
| $c_{TLT}$ | 0.309375 | 0.302702703 | 0.286363636 | 0.288888889 |
| $a_{TS}^{(2)}$ | 24.40391167 | 40.38499201 | 20 | 40.45660337 |
| $a_{TS}^{(1)}$ | −2.128595361 | −6.73354721 | −3.626479228 | −6.290401812 |
| $b_{TS}^{(2)}$ | 0.006013184 | 0.005624543 | 0 | 0.005617284 |
| $c_{TS}$ | 0.3265625 | 0.275675676 | 0.31 | 0.272222222 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −51.46488975 | 0 | 0 |
| $a_{TE}^{(1)}$ | −1.921891837 | −0.509929613 | −1.508039016 | −0.870147512 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006479182 | 0 | 0 |
| $c_{TE}$ | 0.153125 | 0.147297297 | 0.341818182 | 0.351388889 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | −0.000165117 | 0 | −9.55404E−05 |
| $a_{\psi Si}^{(2)}$ | 0.000936051 | 0.00475603 | 0 | 0.002198207 |
| $a_{\psi Si}^{(1)}$ | −0.02141106 | 0.040196571 | −0.017752634 | 0.036260775 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 2115.829763 | 0 | 1531.394676 |
| $b_{\psi Si}^{(2)}$ | 246.9177246 | 196.5668371 | 0 | 199.8263889 |
| $c_{\psi Si}$ | 24.140625 | 57.97297297 | 21.13636364 | 60.41666667 |
| $a_{\theta LT}^{(2)}$ | 0 | 0 | 0 | −0.003220943 |
| $a_{\theta LT}^{(1)}$ | 0.023743346 | 0.023741003 | 0.038368027 | 0.005042496 |
| $b_{\theta LT}^{(2)}$ | 0 | 0 | 0 | 72.22222222 |
| $c_{\theta LT}$ | −50.078125 | −48.51351351 | −50.81818182 | −50 |
| $d_{TLTTS}$ | 0 | 0 | 0 | −43.45862557 |
| $d_{TLTTE}$ | −35.16960363 | −48.00382984 | 23.6423037 | 52.46703277 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0.234382842 | 0 | 0 | −0.273892853 |
| $d_{\psi Si\theta LT}$ | 0 | −0.00130658 | −0.001221935 | 0 |
| e | −2.175330984 | −2.239116787 | −2.271294054 | −2.496300587 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; |

TABLE 9

| | Si(111) $0 < T_{LT} < 0.2$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 16.07631847 | 20.22733656 | 30.72650306 | 27.83979251 |
| $b_{TLT}^{(2)}$ | 0 | 0 | 0 | 0 |
| $c_{TLT}$ | 0.145833333 | 0.1625 | 0.159574468 | 0.158695652 |
| $a_{TS}^{(2)}$ | 0 | 0 | 0 | 0 |
| $a_{TS}^{(1)}$ | 17.08812597 | 27.84866827 | 31.28009383 | 12.67453621 |
| $b_{TS}^{(2)}$ | 0 | 0 | 0 | 0 |
| $c_{TS}$ | 0.154166667 | 0.172916667 | 0.161702128 | 0.163043478 |
| $a_{TE}^{(4)}$ | 0 | 0 | 0 | 0 |
| $a_{TE}^{(3)}$ | 0 | 0 | 0 | 0 |
| $a_{TE}^{(2)}$ | −96.15629371 | 0 | 138.3065683 | 0 |
| $a_{TE}^{(1)}$ | −1.263589744 | 2.883915191 | −9.345807167 | −7.807789594 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006649306 | 0 | 0.006229063 | 0 |
| $c_{TE}$ | 0.170833333 | 0.14375 | 0.369148936 | 0.345652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | −0.006862727 |
| $a_{\psi Si}^{(1)}$ | −0.101535567 | −0.012511908 | −0.101466433 | 0.176438509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 114.9456522 |
| $c_{\psi Si}$ | 24.375 | 44.375 | 22.0212766 | 37.5 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | −477.9162005 | −760.9473336 | −1054.386561 | −1044.340968 |
| $d_{TLTTE}$ | 0 | 0 | 0 | 0 |
| $d_{TLT\psi Si}$ | 0 | 1.332405924 | 0 | 0 |
| $d_{TLT\theta LT}$ | 0 | 0 | 0 | 0 |
| $d_{TSTE}$ | 0 | −250.1524613 | 102.33575 | 105.8611165 |
| $d_{TS\psi Si}$ | 0 | 0 | 0 | −2.093429604 |
| $d_{TS\theta LT}$ | 0 | 0 | 0 | 0 |
| $d_{TE\psi Si}$ | −0.613440559 | | 1.201832187 | −0.525734733 |
| $d_{TE\theta LT}$ | 0 | 0 | 0 | 0 |
| $d_{\psi Si\theta LT}$ | 0 | 0 | 0 | 0 |
| e | −0.553295028 | −1.074792989 | −1.290770348 | −1.165057152 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; |

TABLE 10

| | Si(111) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | −262.3995984 | −262.3995984 | 0 | 0 |
| $a_{TLT}^{(1)}$ | −59.70400634 | −59.70400634 | −18.45032018 | −20.44479246 |
| $b_{TLT}^{(2)}$ | 0.004691358 | 0.004691358 | 0 | 0 |
| $c_{TLT}$ | 0.355555556 | 0.355555556 | 0.332352941 | 0.331914894 |
| $a_{TS}^{(2)}$ | 0 | 0 | 0 | 0 |
| $a_{TS}^{(1)}$ | −73.33869606 | −73.33869606 | −9.963926388 | −24.5747574 |
| $b_{TS}^{(2)}$ | 0 | 0 | 0 | 0 |
| $c_{TS}$ | 0.185185185 | 0.185185185 | 0.166176471 | 0.165957447 |
| $a_{TE}^{(4)}$ | 0 | 0 | 0 | 0 |
| $a_{TE}^{(3)}$ | 0 | 0 | 0 | 0 |

TABLE 10-continued

| | Si(111) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TE}^{(2)}$ | 0 | 0 | 0 | 0 |
| $a_{TE}^{(1)}$ | −19.84024877 | −19.84024877 | −8.905455835 | −17.17093947 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.157407407 | 0.157407407 | 0.369117647 | 0.373404255 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | −4.69771E−05 | −4.69771E−05 | 0 | 0 |
| $a_{\psi Si}^{(3)}$ | −0.000362538 | −0.000362538 | 0 | 0 |
| $a_{\psi Si}^{(2)}$ | 0.055133453 | 0.055133453 | −0.004320224 | 0.021125116 |
| $a_{\psi Si}^{(1)}$ | 0.020862911 | 0.020862911 | −0.110606012 | −0.064218508 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 138552.1512 | 138552.1512 | 0 | 0 |
| $b_{\psi Si}^{(3)}$ | −78.36076818 | −78.36076818 | 0 | 0 |
| $b_{\psi Si}^{(2)}$ | 203.1635802 | 203.1635802 | 145.9775087 | 66.20642825 |
| $c_{\psi Si}$ | 33.05555556 | 33.05555556 | 19.41176471 | 34.46808511 |
| $a_{\theta LT}^{(2)}$ | 0 | 0 | 0 | 0 |
| $a_{\theta LT}^{(1)}$ | −0.079155699 | −0.079155699 | 000 | 0.057672719 |
| $b_{\theta LT}^{(2)}$ | 0 | 0 | 0 | 0 |
| $c_{\theta LT}$ | −49.81481481 | −49.81481481 | −90 | −49.14893617 |
| $d_{TLTTS}$ | 0 | 0 | 0 | 0 |
| $d_{TLTTE}$ | −254.5809235 | −254.5809235 | 80.69948416 | 99.56817027 |
| $d_{TLT\psi Si}$ | 2.260189055 | 2.260189055 | 0 | 0 |
| $d_{TLT\theta LT}$ | −0.785540829 | −0.785540829 | 000 | 0 |
| $d_{TSTE}$ | −292.5762951 | −292.5762951 | 0 | 0 |
| $d_{TS\psi Si}$ | −5.914103654 | −5.914103654 | −1.139436429 | 0 |
| $d_{TS\theta LT}$ | 0 | 0 | 0 | 0 |
| $d_{TE\psi Si}$ | 1.75463008 | 1.75463008 | 0.660099875 | −3.844659844 |
| $d_{TE\theta LT}$ | 0 | 0 | 0 | 0 |
| $d_{\psi Si\theta LT}$ | 0 | 0 | 0 | 0.006965097 |
| e | −1.304804416 | −1.304804416 | −2.734683251 | −3.115044468 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; |

TABLE 11

| | Si(111) $0 < T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0.003649147 | 0 | 0 | 0 |
| $a_{TLT}^{(1)}$ | −17.27824731 | −24.3903101 | −38.65647339 | −21.91795924 |
| $b_{TLT}^{(2)}$ | 67.18624026 | 0 | 0 | 0 |
| $c_{TLT}$ | 0.154098361 | 0.15631068 | 0.17 | 0.1575 |
| $a_{TS}^{(2)}$ | 84.63185118 | 0 | 148.7691928 | 140.0125491 |
| $a_{TS}^{(1)}$ | −6.307527081 | −32.68184816 | −15.38083251 | −11.91949736 |
| $b_{TS}^{(2)}$ | 0.004461166 | 0 | 0.005012245 | 0.004623438 |
| $c_{TS}$ | 0.352459016 | 0.345631068 | 0.331428571 | 0.33875 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 2.909874306 | 8.840975559 | −16.54803788 | −0.024546617 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.135245902 | 0.148058252 | 0.372857143 | 0.33125 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |

TABLE 11-continued

| | Si(111) $0 < T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{\psi Si}^{(2)}$ | 0 | 0.006216698 | 0 | 0 |
| $a_{\psi Si}^{(1)}$ | −0.068574135 | −0.018885558 | −0.187578295 | 0.122573316 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 147.1439344 | 0 | 0 |
| $c_{\psi Si}$ | 22.62295082 | 43.10679612 | 22.71428571 | 39.1875 |
| $a_{\theta LT}^{(2)}$ | 0 | 0 | 0 | 0 |
| $a_{\theta LT}^{(1)}$ | 0.023219728 | 0.047846607 | 0.097088558 | 0.096327065 |
| $b_{\theta LT}^{(2)}$ | 0 | 0 | 0 | 0 |
| $c_{\theta LT}$ | −50.16393443 | −50.38834951 | −50.42857143 | −51.25 |
| $d_{TLTTS}$ | 0 | −144.763071 | 0 | 0 |
| $d_{TLTTE}$ | 0 | 0 | −161.23455326 | 0 |
| $d_{TLT\psi Si}$ | −0.827435588 | 0 | 0 | 1.107475984 |
| $d_{TLT\theta LT}$ | 0 | 0 | 0 | 0 |
| $d_{TSTE}$ | 0 | 103.0553675 | −65.68497311 | 0 |
| $d_{TS\psi Si}$ | 0 | −1.329400713 | 0.82928215 | −0.646921162 |
| $d_{TS\theta LT}$ | 0 | 0 | 0 | 0 |
| $d_{TE\psi Si}$ | −0.681669875 | 0.653050787 | 0.676734069 | 0.936807034 |
| $d_{TE\theta LT}$ | 0 | 0 | 0.481989709 | 0.52746173 |
| $d_{\psi Si\theta LT}$ | 0 | 0 | 0 | 0 |
| e | −1.560056382 | −2.656750279 | −2.259351603 | −1.805786084 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; | and

TABLE 12

| | Si(111) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 77.3065693 | 243.6937004 | 0 |
| $a_{TLT}^{(1)}$ | −13.49335267 | −9.878165228 | −6.309863061 | −12.90130633 |
| $b_{TLT}^{(2)}$ | 0 | 0.00674795 | 0.006522811 | 0 |
| $c_{TLT}$ | 0.300961538 | 0.297350993 | 0.29858156 | 0.306818182 |
| $a_{TS}^{(2)}$ | 133.2691939 | 160.4037443 | 82.71737336 | 100.5491122 |
| $a_{TS}^{(1)}$ | −9.215218873 | −21.20902158 | −9.283157312 | −7.984268054 |
| $b_{TS}^{(2)}$ | 0.006618898 | 0.005353274 | 0.006382979 | 0.005704201 |
| $c_{TS}$ | 0.314423077 | 0.303311258 | 0.3 | 0.311363636 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 90.39669198 | 0 | 0 |
| $a_{TE}^{(1)}$ | 0.170720276 | 3.925569914 | −15.08313602 | −9.451928755 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006615499 | 0 | 0 |
| $c_{TE}$ | 0.15 | 0.147350993 | 0.363475177 | 0.346212121 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00740803 | 0 | 0 | 0 |
| $a_{\psi Si}^{(1)}$ | −0.220502432 | 0.083594751 | −0.104344279 | 0.088096624 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 135.4659763 | 0 | 0 | 0 |
| $c_{\psi Si}$ | 20.76923077 | 43.70860927 | 17.87234043 | 41.47727273 |
| $a_{\theta LT}^{(2)}$ | 0 | 0 | 0 | 0 |

TABLE 12-continued

| | Si(111) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{\theta LT}^{(1)}$ | −0.017420386 | −0.012240534 | 0 | 0 |
| $b_{\theta LT}^{(2)}$ | 0 | 0 | 0 | 0 |
| $c_{\theta LT}$ | −50.28846154 | −50.26490066 | −90 | −90 |
| $d_{TLTTS}$ | 149.298265 | 220.9283416 | 135.5319056 | 135.1493422 |
| $d_{TLTTE}$ | 0 | 0 | 0 | −65.38520659 |
| $d_{TLT\psi Si}$ | 0 | 0 | 0 | −0.663828772 |
| $d_{TLT\theta LT}$ | −0.703824061 | −0.739197646 | 0 | 0 |
| $d_{TSTE}$ | 122.4270642 | 0 | −94.62792088 | 0 |
| $d_{TS\psi Si}$ | 0.714493384 | −1.189155195 | 0 | −1.017237669 |
| $d_{TS\theta LT}$ | 0 | 0 | 0 | 0 |
| $d_{TE\psi Si}$ | 0 | 0.558597609 | 0 | 0 |
| $d_{TE\theta LT}$ | 0.734424122 | 0.628956462 | 0 | 0 |
| $d_{\psi Si\theta LT}$ | −0.003900657 | 0.003268439 | 0 | 0 |
| e | −2.246432623 | −2.691572945 | −3.425676672 | −3.236112132 |
| $a_{TP}$ | −111692 | −111692 | −111692 | −111692 |
| $b_{TP}$ | 19239 | 19239 | 19239 | 19239 |
| $c_{TP}$ | −952.97 | −952.97 | −952.97 | −952.97 |
| $d_{TP}$ | 8.8027 | 8.8027 | 8.8027 | 8.8027 |
| $f_{TP}$ | 1.0495 | 1.0495 | 1.0495 | 1.0495; |

2. The acoustic wave device according to claim 1, wherein the wavelength normalized film thickness $T_{Si}$ of the silicon support substrate is greater than about 20.

3. The acoustic wave device according to claim 1, wherein a thickness of the lithium tantalate film is equal to or less than about 3.5λ.

4. The acoustic wave device according to claim 1, wherein the protection film covers the lithium tantalate film and a side surface and an upper surface of the electrode finger of the IDT electrode, and a thickness of the protection film on the side surface of the electrode finger is smaller than a thickness of the protection film covering the upper surface of the electrode finger.

5. The acoustic wave device according to claim 1, wherein the protection film covers the lithium tantalate film and a side surface and an upper surface of the electrode finger of the IDT electrode, and a thickness of the protection film on the lithium tantalate film is smaller than a thickness of the protection film covering the upper surface of the electrode finger.

6. The acoustic wave device according to claim 1, wherein the protection film covers the lithium tantalate film and an upper surface and a side surface of the IDT electrode, and a thickness of the protection film on the lithium tantalate film is larger than a thickness of the protection film covering the upper surface of the electrode finger.

7. The acoustic wave device according to claim 1, wherein the acoustic wave device is an acoustic wave resonator.

8. An acoustic wave filter comprising:
a plurality of resonators; wherein
at least one of the plurality of resonators is defined by the acoustic wave device according to claim 1.

9. A composite filter device comprising:
N band pass filters having different pass bands where N is two or more; wherein
one terminal of each of the N band pass filters is connected in common on an antenna terminal side;
at least one of the N band pass filters excluding a band pass filter having a highest pass band includes one or more acoustic wave resonators; and
at least one of the one or more acoustic wave resonators is the acoustic wave device according to claim 1.

10. The composite filter device according to claim 9, wherein N is three or more, and the three or more band pass filters simultaneously transmit and receive signals of a plurality of communication bands.

11. The composite filter device according to claim 9, wherein N is three or more, and at least one of the three or more band pass filters is a ladder filter.

12. The acoustic wave device according to claim 2, wherein a thickness of the lithium tantalate film is equal to or less than about 3.5λ.

13. An acoustic wave device comprising:
a silicon support substrate;
a silicon oxide film laminated above the silicon support substrate;
a lithium tantalate film laminated above the silicon oxide film;
an IDT electrode including an electrode finger and being provided above the lithium tantalate film; and
a protection film covering at least a portion of the IDT electrode; wherein
when a wavelength determined by an electrode finger pitch of the IDT electrode is denoted by λ, a wavelength normalized film thickness of the lithium tantalate film is denoted by $T_{LT}$, θ of an Euler angle of the lithium tantalate film is denoted by $\theta_{LT}$, a wavelength normalized film thickness of the silicon oxide film is denoted by $T_S$, a wavelength normalized film thickness of the IDT electrode in terms of aluminum thickness being a product of a wavelength normalized film thickness of the IDT electrode and a value obtained when density of the IDT electrode is divided by density of aluminum is denoted by $T_E$, a wavelength normalized film thickness of the protection film being a product of a value obtained when density of the protection film is divided by density of silicon oxide and a wavelength normalized film thickness which is a thickness of the protection film normalized by the wavelength λ, is denoted by $T_P$, a propagation direction in the silicon support substrate is denoted by $\psi_{Si}$, and a wavelength normalized film thickness which is a thickness of the silicon support substrate normalized by the wavelength λ, is denoted by $T_{Si}$, $T_{LT}$, $\theta_{LT}$, $T_S$, $T_E$, $T_P$, and $\psi_{Si}$ are set such that a value represented by Formula (1) below is larger than about −2.4;

$$I_h = \left( a_{T_{LT}}^{(2)} \left( (T_{LT} - c_{T_{LT}})^2 - b_{T_{LT}}^{(2)} \right) + \right.$$

$$a_{T_{LT}}^{(1)} (T_{LT} - c_{T_{LT}}) + a_{T_S}^{(2)} \left( (T_S - c_{T_S})^2 - b_{T_S}^{(2)} \right) + a_{T_S}^{(1)} (T_S - c_{T_S}) +$$

$$a_{T_E}^{(4)} \left( (T_E - c_{T_E})^4 - b_{T_E}^{(4)} \right) + a_{T_E}^{(3)} \left( (T_E - c_{T_E})^3 - b_{T_E}^{(3)} \right) +$$

$$a_{T_E}^{(2)} \left( (T_E - c_{T_E})^2 - b_{T_E}^{(2)} \right) + a_{T_E}^{(1)} (T_E - c_{T_E}) +$$

$$a_{\psi_{Si}}^{(6)} \left( (\psi_{Si} - c_{\psi_{Si}})^6 - b_{\psi_{Si}}^{(6)} \right) + a_{\psi_{Si}}^{(5)} \left( (\psi_{Si} - c_{\psi_{Si}})^5 - b_{\psi_{Si}}^{(5)} \right) +$$

$$a_{\psi_{Si}}^{(4)} \left( (\psi_{Si} - c_{\psi_{Si}})^4 - b_{\psi_{Si}}^{(4)} \right) + a_{\psi_{Si}}^{(3)} \left( (\psi_{Si} - c_{\psi_{Si}})^3 - b_{\psi_{Si}}^{(3)} \right) +$$

$$a_{\psi_{Si}}^{(2)} \left( (\psi_{Si} - c_{\psi_{Si}})^2 - b_{\psi_{Si}}^{(2)} \right) + a_{\psi_{Si}}^{(1)} (\psi_{Si} - c_{\psi_{Si}}) +$$

$$a_{\theta_{LT}}^{(2)} \left( (\theta_{LT} - c_{\theta_{LT}})^2 - b_{\theta_{LT}}^{(2)} \right) + a_{\theta_{LT}}^{(1)} (\theta_{LT} - c_{\theta_{LT}}) +$$

$$d_{T_{LT} T_S} (T_{LT} - c_{T_{LT}})(T_S - c_{T_S}) + d_{T_{LT} T_E} (T_{LT} - c_{T_{LT}})$$

$$(T_E - c_{T_E}) + d_{T_{LT} \psi_{Si}} (T_{LT} - c_{T_{LT}})(\psi_{Si} - c_{\psi_{Si}}) +$$

$$d_{T_{LT} \theta_{LT}} (T_{LT} - c_{T_{LT}})(\theta_{LT} - c_{\theta_{LT}}) + d_{T_S T_E} (T_S - c_{T_S})(T_E - c_{T_E}) +$$

$$d_{T_S \psi_{Si}} (T_S - c_{T_S})(\psi_{Si} - c_{\psi_{Si}}) + d_{T_S \theta_{LT}} (T_S - c_{T_S})(\theta_{LT} - c_{\theta_{LT}}) +$$

$$d_{T_E \psi_{Si}} (T_E - c_{T_E})(\psi_{Si} - c_{\psi_{Si}}) + d_{T_E \theta_{LT}} (T_E - c_{T_E})(\theta_{LT} - c_{\theta_{LT}}) +$$

$$d_{\psi_{Si} \theta_{LT}} (\psi_{Si} - c_{\psi_{Si}})(\theta_{LT} - c_{\theta_{LT}}) + e \right)$$

$$\left( a_{T_P} T_P^4 + b_{T_P} T_P^3 + c_{T_P} T_P^2 + d_{T_P} T_P + f_{T_P} \right);$$

where, coefficients a, b, c, d, e, and f in Formula (1) are values described in Table 13 to Table 24 below that are determined in accordance with a crystal orientation of the silicon support substrate and a range of $T_S$, $T_{LT}$, and $\psi_{Si}$:

TABLE 13

| | Si(100) $0 < T_{LT} < 0.2$ $0 \le T_S < 0.2$ | |
|---|---|---|
| | $0.05 \le T_E < 0.25$ | $0.25 \le T_E \le 0.45$ |
| $a_{T_{LT}}^{(2)}$ | 0 | 0 |
| $a_{T_{LT}}^{(1)}$ | −5.687707928 | −5.687707928 |
| $b_{T_{LT}}^{(2)}$ | 0 | 0 |
| $c_{T_{LT}}$ | 0.139506173 | 0.139506173 |
| $a_{T_S}^{(2)}$ | 0 | 0 |
| $a_{T_S}^{(1)}$ | 5.653643283 | 5.653643283 |
| $b_{T_S}^{(2)}$ | 0 | 0 |
| $c_{T_S}$ | 0.148148148 | 0.148148148 |
| $a_{T_E}^{(4)}$ | 0 | 0 |
| $a_{T_E}^{(3)}$ | 0 | 0 |
| $a_{T_E}^{(2)}$ | 0 | 0 |
| $a_{T_E}^{(1)}$ | −1.004369706 | −1.004369706 |
| $b_{T_E}^{(4)}$ | 0 | 0 |
| $b_{T_E}^{(3)}$ | 0 | 0 |
| $b_{T_E}^{(2)}$ | 0 | 0 |
| $c_{T_E}$ | 0.255555556 | 0.255555556 |
| $a_{\psi_{Si}}^{(6)}$ | 0 | 0 |
| $a_{\psi_{Si}}^{(5)}$ | 0 | 0 |
| $a_{\psi_{Si}}^{(4)}$ | 0 | 0 |
| $a_{\psi_{Si}}^{(3)}$ | −0.000197083 | −0.000197083 |
| $a_{\psi_{Si}}^{(2)}$ | −0.003376583 | −0.003376583 |
| $a_{\psi_{Si}}^{(1)}$ | 0.118081927 | 0.118081927 |
| $b_{\psi_{Si}}^{(6)}$ | 0 | 0 |
| $b_{\psi_{Si}}^{(5)}$ | 0 | 0 |
| $b_{\psi_{Si}}^{(4)}$ | 0 | 0 |
| $b_{\psi_{Si}}^{(3)}$ | −379.4708632 | −379.4708632 |

TABLE 13-continued

| | Si(100) $0 < T_{LT} < 0.2$ $0 \le T_S < 0.2$ | |
|---|---|---|
| | $0.05 \le T_E < 0.25$ | $0.25 \le T_E \le 0.45$ |
| $b_{\psi_{Si}}^{(2)}$ | 278.0521262 | 278.0521262 |
| $c_{\psi_{Si}}$ | 23.14814815 | 23.14814815 |
| $a_{\theta_{LT}}^{(2)}$ | 0 | 0 |
| $a_{\theta_{LT}}^{(1)}$ | 0.128631041 | 0.128631041 |
| $b_{\theta_{LT}}^{(2)}$ | 0 | 0 |
| $c_{\theta_{LT}}$ | −49.32098765 | −49.32098765 |
| $d_{T_{LT}T_S}$ | 0 | 0 |
| $d_{T_{LT}T_E}$ | 72.43278274 | 72.43278274 |
| $d_{T_{LT}\psi_{Si}}$ | 0.604747502 | 0.604747502 |
| $d_{T_{LT}\theta_{LT}}$ | −1.743618251 | −1.743618251 |
| $d_{T_S T_E}$ | 0 | 0 |
| $d_{T_S \psi_{Si}}$ | 0 | 0 |
| $d_{T_S \theta_{LT}}$ | 0.994157261 | 0.994157261 |
| $d_{T_E \psi_{Si}}$ | 0 | 0 |
| $d_{T_E \theta_{LT}}$ | 0.280889881 | 0.280889881 |
| $d_{\psi_{Si} \theta_{LT}}$ | 0.003095822 | 0.003095822 |
| e | −5.638096455 | −5.638096455 |
| $a_{T_P}$ | 0 | 0 |
| $b_{T_P}$ | 0 | 0 |
| $c_{T_P}$ | −15.448 | −15.448 |
| $d_{T_P}$ | −2.9188 | −2.9188 |
| $f_{T_P}$ | 1.0599 | 1.0599; |

TABLE 14

| | Si(100) $0.2 \le T_{LT} \le 3.5$ $0 \le T_S < 0.2$ | |
|---|---|---|
| | $0.05 \le T_E < 0.25$ | $0.25 \le T_E < 0.45$ |
| $a_{T_{LT}}^{(2)}$ | 0 | 0 |
| $a_{T_{LT}}^{(1)}$ | 7.809960834 | 4.249755245 |
| $b_{T_{LT}}^{(2)}$ | 0 | 0 |
| $c_{T_{LT}}$ | 0.30962963 | 0.302857143 |
| $a_{T_S}^{(2)}$ | 0 | 0 |
| $a_{T_S}^{(1)}$ | 0 | −0.800874586 |
| $b_{T_S}^{(2)}$ | 0 | 0 |
| $c_{T_S}$ | 0 | 0.150714286 |
| $a_{T_E}^{(4)}$ | 0 | 0 |
| $a_{T_E}^{(3)}$ | 0 | 0 |
| $a_{T_E}^{(2)}$ | 0 | 0 |
| $a_{T_E}^{(1)}$ | −3.563479635 | 9.07053135 |
| $b_{T_E}^{(4)}$ | 0 | 0 |
| $b_{T_E}^{(3)}$ | 0 | 0 |
| $b_{T_E}^{(2)}$ | 0 | 0 |
| $c_{T_E}$ | 0.148518519 | 0.353571429 |
| $a_{\psi_{Si}}^{(6)}$ | 0 | 0 |
| $a_{\psi_{Si}}^{(5)}$ | 0 | 0 |
| $a_{\psi_{Si}}^{(4)}$ | 0 | 0 |
| $a_{\psi_{Si}}^{(3)}$ | −0.000160979 | 0 |
| $a_{\psi_{Si}}^{(2)}$ | −0.000757552 | 0.001332545 |
| $a_{\psi_{Si}}^{(1)}$ | 0.095765615 | 0.003836714 |
| $b_{\psi_{Si}}^{(6)}$ | 0 | 0 |
| $b_{\psi_{Si}}^{(5)}$ | 0 | 0 |
| $b_{\psi_{Si}}^{(4)}$ | 0 | 0 |
| $b_{\psi_{Si}}^{(3)}$ | 384.7407407 | 0 |
| $b_{\psi_{Si}}^{(2)}$ | 278.2222222 | 285.0956633 |
| $c_{\psi_{Si}}$ | 21.33333333 | 20.89285714 |
| $a_{\theta_{LT}}^{(2)}$ | 0 | 0 |
| $a_{\theta_{LT}}^{(1)}$ | 0.043185248 | 0.033521037 |
| $b_{\theta_{LT}}^{(2)}$ | 0 | 0 |
| $c_{\theta_{LT}}$ | −50 | −50.92857143 |
| $d_{T_{LT}T_S}$ | 0 | 0 |
| $d_{T_{LT}T_E}$ | 0 | 0 |
| $d_{T_{LT}\psi_{Si}}$ | −0.383208698 | −0.220029295 |
| $d_{T_{LT}\theta_{LT}}$ | 0 | 0 |
| $d_{T_S T_E}$ | 0 | 0 |
| $d_{T_S \psi_{Si}}$ | 0 | 0 |
| $d_{T_S \theta_{LT}}$ | 0 | 0.974573109 |
| $d_{T_E \psi_{Si}}$ | 0 | 0 |

TABLE 14-continued

Si(100)
$0.2 \leq T_{LT} \leq 3.5$
$0 \leq T_S < 0.2$

| | $0.05 \leq T_E < 0.25$ | $0.25 \leq T_E < 0.45$ |
|---|---|---|
| $d_{TE\theta LT}$ | 1.01389349 | −1.078939399 |
| $d_{\psi Si\theta LT}$ | 0 | 0.002899732 |
| e | −5.569590226 | −5.29442278 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599; |

TABLE 15

Si(100)
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −11.51287 | −11.51287 |
| $b_{TLT}^{(2)}$ | 0 | 0 |
| $c_{TLT}$ | 0.136328125 | 0.136328125 |
| $a_{TS}^{(2)}$ | 0 | 0 |
| $a_{TS}^{(1)}$ | 6.022608826 | 6.022608826 |
| $b_{TS}^{(2)}$ | 0 | 0 |
| $c_{TS}$ | 0.305859375 | 0.305859375 |
| $a_{TE}^{(4)}$ | 0 | 0 |
| $a_{TE}^{(3)}$ | −180.607873 | −180.607873 |
| $a_{TE}^{(2)}$ | −1.347493816 | −1.347493816 |
| $a_{TE}^{(1)}$ | 4.841204365 | 4.841204365 |
| $b_{TE}^{(4)}$ | 0 | 0 |
| $b_{TE}^{(3)}$ | −0.000227051 | −0.000227051 |
| $b_{TE}^{(2)}$ | 0.019179688 | 0.019179688 |
| $c_{TE}$ | 0.25625 | 0.25625 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001342794 | −0.001342794 |
| $a_{\psi Si}^{(1)}$ | 0.25625 | 0.25625 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 275.7568359 | 275.7568359 |
| $c_{\psi Si}$ | 0.25625 | 0.25625 |
| $a_{\theta LT}^{(2)}$ | 0 | 0 |
| $a_{\theta LT}^{(1)}$ | 0.153688205 | 0.153688205 |
| $b_{\theta LT}^{(2)}$ | 0 | 0 |
| $c_{\theta LT}$ | −49.140625 | −49.140625 |
| $d_{TLTTS}$ | 0 | 0 |
| $d_{TLTTE}$ | 0 | 0 |
| $d_{TLT\psi Si}$ | 0 | 0 |
| $d_{TLT\theta LT}$ | −1.180623763 | −1.180623763 |
| $d_{TSTE}$ | 0 | 0 |
| $d_{TS\psi Si}$ | 0 | 0 |
| $d_{TS\theta LT}$ | 0 | 0 |
| $d_{TE\psi Si}$ | 0 | 0 |
| $d_{TE\theta LT}$ | 0.41394071 | 0.41394071 |
| $d_{\psi Si\theta LT}$ | 0.003203013 | 0.003203013 |
| e | −4.433641408 | −4.433641408 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599; |

TABLE 16

Si(100)
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 119.666412 | 118.2359738 |
| $a_{TLT}^{(1)}$ | 4.447768142 | 2.271979446 |
| $b_{TLT}^{(2)}$ | 0.006371047 | 0.00699901 |
| $c_{TLT}$ | 0.31147541 | 0.30631068 |
| $a_{TS}^{(2)}$ | 0 | 0 |
| $a_{TS}^{(1)}$ | 0 | −3.805216895 |
| $b_{TS}^{(2)}$ | 0 | 0 |
| $c_{TS}$ | 0 | 0.298543689 |
| $a_{TE}^{(4)}$ | 0 | 0 |
| $a_{TE}^{(3)}$ | 0 | 0 |
| $a_{TE}^{(2)}$ | 117.8354557 | 121.7109482 |
| $a_{TE}^{(1)}$ | 2.107193686 | −0.578851453 |
| $b_{TE}^{(4)}$ | 0 | 0 |
| $b_{TE}^{(3)}$ | 0 | 0 |
| $b_{TE}^{(2)}$ | 0.006775956 | 0.006610661 |
| $c_{TE}$ | 0.15 | 0.35631068 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0 | 0 |
| $a_{\psi Si}^{(2)}$ | −0.001658706 | 0 |
| $a_{\psi Si}^{(1)}$ | 0.005677734 | 0.003834195 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 0 | 0 |
| $b_{\psi Si}^{(2)}$ | 272.5477022 | 0 |
| $c_{\psi Si}$ | 20.90163934 | 20.02427184 |
| $a_{\theta LT}^{(2)}$ | 0 | 0 |
| $a_{\theta LT}^{(1)}$ | 0.051921544 | 0.050011808 |
| $b_{\theta LT}^{(2)}$ | 0 | 0 |
| $c_{\theta LT}$ | −48.36065574 | −48.93203883 |
| $d_{TLTTS}$ | 0 | 0 |
| $d_{TLTTE}$ | 61.26575286 | 0 |
| $d_{TLT\psi Si}$ | 0 | 0 |
| $d_{TLT\theta LT}$ | 0 | 0 |
| $d_{TSTE}$ | 0 | −82.22932804 |
| $d_{TS\psi Si}$ | 0 | 0 |
| $d_{TS\theta LT}$ | 0 | −0.470524678 |
| $d_{TE\psi Si}$ | 0 | 0 |
| $d_{TE\theta LT}$ | 0.904198722 | −0.776132158 |
| $d_{\psi Si\theta LT}$ | 0.003410501 | 0.003906326 |
| e | −5.339814906 | −5.463687811 |
| $a_{TP}$ | 0 | 0 |
| $b_{TP}$ | 0 | 0 |
| $c_{TP}$ | −15.448 | −15.448 |
| $d_{TP}$ | −2.9188 | −2.9188 |
| $f_{TP}$ | 1.0599 | 1.0599; |

TABLE 17

Si(110)
$0 < T_{LT} < 0.2$
$0 \leq T_S < 0.2$

| | $0.05 \leq T_E < 0.25$ | | $0.25 \leq T_E \leq 0.45$ | |
| --- | --- | --- | --- | --- |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −7.587457615 | −7.587457615 | −7.587457615 | −7.587457615 |
| $b_{TLT}^{(2)}$ | 0 | 0 | 0 | 0 |
| $c_{TLT}$ | 0.174380165 | 0.174380165 | 0.174380165 | 0.174380165 |
| $a_{TS}^{(2)}$ | 0 | 0 | 0 | 0 |
| $a_{TS}^{(1)}$ | −3.979714537 | −3.979714537 | −3.979714537 | −3.979714537 |
| $b_{TS}^{(2)}$ | 0 | 0 | 0 | 0 |
| $c_{TS}$ | 0.150413223 | 0.150413223 | 0.150413223 | 0.150413223 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −0.865040993 | −0.865040993 | −0.865040993 | −0.865040993 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.245867769 | 0.245867769 | 0.245867769 | 0.245867769 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 5.87537E−07 | 5.87537E−07 | 5.87537E−07 | 5.87537E−07 |
| $a_{\psi Si}^{(3)}$ | −8.59015E−07 | −8.59015E−07 | −8.59015E−07 | −8.59015E−07 |
| $a_{\psi Si}^{(2)}$ | −0.001948222 | −0.001948222 | −0.001948222 | −0.001948222 |
| $a_{\psi Si}^{(1)}$ | −0.027558032 | −0.027558032 | −0.027558032 | −0.027558032 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 1129197.497 | 1129197.497 | 1129197.497 | 1129197.497 |
| $b_{\psi Si}^{(3)}$ | −1524.372996 | −1524.372996 | −1524.372996 | −1524.372996 |
| $b_{\psi Si}^{(2)}$ | 776.3813947 | 776.3813947 | 776.3813947 | 776.3813947 |
| $c_{\psi Si}$ | 41.52892562 | 41.52892562 | 41.52892562 | 41.52892562 |
| $a_{\theta LT}^{(2)}$ | 0 | 0 | 0 | 0 |
| $a_{\theta LT}^{(1)}$ | 0.018744549 | 0.018744549 | 0.018744549 | 0.018744549 |
| $b_{\theta LT}^{(2)}$ | 0 | 0 | 0 | 0 |
| $c_{\theta LT}$ | −49.25619835 | −49.25619835 | −49.25619835 | −49.25619835 |
| $d_{TLTTS}$ | 140.6234074 | 140.6234074 | 140.6234074 | 140.6234074 |
| $d_{TLTTE}$ | −25.20654793 | −25.20654793 | −25.20654793 | −25.20654793 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0 | 0 | 0 | 0 |
| e | −1.789519626 | −1.789519626 | −1.789519626 | −1.789519626 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599; |

TABLE 18

Si(110)
$0.2 \leq T_{LT} \leq 3.5$
$0 \leq T_S < 0.2$

| | $0.05 \leq T_E < 0.25$ | | $0.25 \leq T_E \leq 0.45$ | |
| --- | --- | --- | --- | --- |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 39.68139696 | 39.68139696 |
| $a_{TLT}^{(1)}$ | −3.912934705 | −3.912934705 | −3.801935963 | −3.801935963 |
| $b_{TLT}^{(2)}$ | 0 | 0 | 0.00692398 | 0.00692398 |
| $c_{TLT}$ | 0.306451613 | 0.306451613 | 0.297857143 | 0.297857143 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |

TABLE 18-continued

| | Si(110) $0.2 \leq T_{LT} \leq 3.5$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TE}^{(2)}$ | 0 | 0 | 0 | 0 |
| $a_{TE}^{(1)}$ | 1.912614784 | 1.912614784 | −6.089810932 | −6.089810932 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.148924731 | 0.148924731 | 0.347857143 | 0.347857143 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 8.78847E−06 | 8.78847E−06 |
| $a_{\psi Si}^{(2)}$ | −0.0004718 | −0.0004718 | −0.000160567 | −0.000160567 |
| $a_{\psi Si}^{(1)}$ | 0.003265633 | 0.003265633 | −0.023574651 | −0.023574651 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 2351.597668 | 2351.597668 |
| $b_{\psi Si}^{(2)}$ | 847.4765869 | 847.4765869 | 880.2091837 | 880.2091837 |
| $c_{\psi Si}$ | 35.32258065 | 35.32258065 | 43.07142857 | 43.07142857 |
| $a_{\theta LT}^{(2)}$ | 0.005014741 | 0.005014741 | 0 | 0 |
| $a_{\theta LT}^{(1)}$ | 0.023115164 | 0.023115164 | 0.030121011 | 0.030121011 |
| $b_{\theta LT}^{(2)}$ | 67.0626662 | 67.0626662 | 0 | 0 |
| $c_{\theta LT}$ | −49.62365591 | −49.62365591 | −51.28571429 | −51.28571429 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0.125572529 | 0.125572529 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0.563162206 | 0.563162206 | −0.417002414 | −0.417002414 |
| $d_{\psi Si\theta LT}$ | 0 | 0 | 0 | 0 |
| $e$ | −2.002512986 | −2.002512986 | −2.550158637 | −2.550158637 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599; |

TABLE 19

| | Si(110) $0 < T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | 2.992014692 | 2.992014692 | −1.461725087 | −1.461725087 |
| $b_{TLT}^{(2)}$ | 0 | 0 | 0 | 0 |
| $c_{TLT}$ | 0.156390977 | 0.156390977 | 0.155345912 | 0.155345912 |
| $a_{TS}^{(2)}$ | 0 | 0 | 0 | 0 |
| $a_{TS}^{(1)}$ | −9.089925228 | −9.089925228 | −1.247751383 | −1.247751383 |
| $b_{TS}^{(2)}$ | 0 | 0 | 0 | 0 |
| $c_{TS}$ | 0.305263158 | 0.305263158 | 0.327672956 | 0.327672956 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −130.6388144 | −130.6388144 |
| $a_{TE}^{(1)}$ | 5.773590917 | 5.773590917 | −0.010504162 | −0.010504162 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.006662711 | 0.006662711 |
| $c_{TE}$ | 0.166541353 | 0.166541353 | 0.341823899 | 0.341823899 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 1.03604E−05 | 1.03604E−05 |

TABLE 19-continued

| | Si(110) $0 < T_{LT} < 0.2$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{\psi Si}^{(2)}$ | −0.000377109 | −0.000377109 | −0.000138558 | −0.000138558 |
| $a_{\psi Si}^{(1)}$ | −0.013702515 | −0.013702515 | −0.028102653 | −0.028102653 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 3096.349671 | 3096.349671 |
| $b_{\psi Si}^{(2)}$ | 792.2381141 | 792.2381141 | 957.6361695 | 957.6361695 |
| $c_{\psi Si}$ | 41.39097744 | 41.39097744 | 43.20754717 | 43.20754717 |
| $a_{\theta LT}^{(2)}$ | 0 | 0 | 0 | 0 |
| $a_{\theta LT}^{(1)}$ | 0.015804666 | 0.015804666 | 0.028892246 | 0.028892246 |
| $b_{\theta LT}^{(2)}$ | 0 | 0 | 0 | 0 |
| $c_{\theta LT}$ | −49.32330827 | −49.32330827 | −49.62264151 | −49.62264151 |
| $d_{TLTTS}$ | 0 | 0 | −44.5976835 | −44.5976835 |
| $d_{TLTTE}$ | 80.90186655 | 80.90186655 | −150.2428298 | −150.2428298 |
| $d_{TLT\psi Si}$ | 0 | 0 | 0.225109644 | 0.225109644 |
| $d_{TLT\theta LT}$ | 0 | 0 | 0 | 0 |
| $d_{TSTE}$ | 29.68261053 | 29.68261053 | 47.35851038 | 47.35851038 |
| $d_{TS\psi Si}$ | 0.136750854 | 0.136750854 | 0 | 0 |
| $d_{TS\theta LT}$ | 0 | 0 | 0 | 0 |
| $d_{TE\psi Si}$ | −0.146211814 | −0.146211814 | 0 | 0 |
| $d_{TE\theta LT}$ | 0.41229257 | 0.41229257 | 0 | 0 |
| $d_{\psi Si\theta LT}$ | 0 | 0 | 0 | 0 |
| e | −2.596813807 | −2.596813807 | −2.049341112 | −2.049341112 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599; |

TABLE 20

| | Si(110) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −2.80791074 | −2.80791074 | 0 | 0 |
| $b_{TLT}^{(2)}$ | 0 | 0 | 0 | 0 |
| $c_{TLT}$ | 0.3069869 | 0.3069869 | 0 | 0 |
| $a_{TS}^{(2)}$ | 0 | 0 | 0 | 0 |
| $a_{TS}^{(1)}$ | −5.618098986 | −5.618098986 | 0 | 0 |
| $b_{TS}^{(2)}$ | 0 | 0 | 0 | 0 |
| $c_{TS}$ | 0.286462882 | 0.286462882 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | −73.23839461 | −73.23839461 |
| $a_{TE}^{(1)}$ | 8.962154821 | 8.962154821 | −5.710295136 | −5.710295136 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007310763 | 0.007310763 |
| $c_{TE}$ | 0.167467249 | 0.167467249 | 0.330930233 | 0.330930233 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.003677309 | 0.003677309 | 0 | 0 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 40.93886463 | 40.93886463 | 0 | 0 |
| $a_{\theta LT}^{(2)}$ | 0.00527863 | 0.00527863 | 0 | 0 |
| $a_{\theta LT}^{(1)}$ | 0.008431458 | 0.008431458 | 0 | 0 |

TABLE 20-continued

| | Si(110) $0.2 \leq T_{LT} \leq 3.5$ $0.2 \leq T_S \leq 2.0$ | | | |
|---|---|---|---|---|
| | $0.05 \leq T_F < 0.25$ | | $0.25 \leq T_F \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $b_{\theta LT}^{(2)}$ | 66.00179249 | 66.00179249 | 0 | 0 |
| $c_{\theta LT}$ | −50.61135371 | −50.61135371 | −90 | −90 |
| $d_{TLTTS}$ | 63.6265441 | 63.6265441 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 57.20229582 | 57.20229582 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | −0.098212695 | −0.098212695 | 0 | 0 |
| $d_{TE\theta LT}$ | 0.32576925 | 0.32576925 | 0 | 0 |
| $d_{\psi Si \theta LT}$ | 0 | 0 | 0 | 0 |
| e | −2.431352404 | −2.431352404 | −2.39032093 | −2.39032093 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599; |

TABLE 21

| | Si(111) $0 < T_{LT} < 0.2$ $0 \leq T_S < 0.2$ | | | |
|---|---|---|---|---|
| | $0.05 \leq T_F < 0.25$ | | $0.25 \leq T_F \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −26.67263869 | −6.49243933 | −20.61574251 | −21.06290014 |
| $b_{TLT}^{(2)}$ | 0 | 0 | 0 | 0 |
| $c_{TLT}$ | 0.15443038 | 0.175438596 | 0.160759494 | 0.156896552 |
| $a_{TS}^{(2)}$ | 0 | 0 | 0 | 0 |
| $a_{TS}^{(1)}$ | −7.971316395 | 7.232224634 | −16.40433051 | −3.920556446 |
| $b_{TS}^{(2)}$ | 0 | 0 | 0 | 0 |
| $c_{TS}$ | 0.14556962 | 0.133333333 | 0.144303797 | 0.144827586 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | −110.7824708 | −133.1826499 | 0 |
| $a_{TE}^{(1)}$ | 12.77975858 | −10.04988717 | 5.027045348 | −5.686378626 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0.006463527 | 0.006582278 | 0 |
| $c_{TE}$ | 0.151265823 | 0.144736842 | 0.35 | 0.35862069 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | −0.007219474 | 0 |
| $a_{\psi Si}^{(1)}$ | 0.028716852 | 0.04192074 | −0.016815807 | 0.008780601 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 125.0280404 | 0 |
| $c_{\psi Si}$ | 9.683544304 | 50 | 11.58227848 | 48.10344828 |
| $a_{\theta LT}^{(2)}$ | 0.01035547 | 0 | 0 | 0.014789077 |
| $a_{\theta LT}^{(1)}$ | 0.162093889 | 0.106646805 | 0.164306798 | 0.04587348 |
| $b_{\theta LT}^{(2)}$ | 61.8811088 | 0 | 0 | 55.43995244 |
| $c_{\theta LT}$ | −49.62025316 | −50.35087719 | −51.01265823 | −51.20689655 |
| $d_{TLTTS}$ | −609.1883956 | −724.6623011 | −297.9828576 | −203.214973 |
| $d_{TLTTE}$ | −215.420422 | 0 | 159.6303697 | 0 |
| $d_{TLT\psi Si}$ | 0 | −3.771938969 | 2.003207828 | −2.014745526 |
| $d_{TLT\theta LT}$ | 1.80686724 | 0 | 2.218853872 | 0 |
| $d_{TSTE}$ | 0 | −307.4269587 | 0 | 0 |
| $d_{TS\psi Si}$ | 0 | 0 | −1.097992723 | 0 |
| $d_{TS\theta LT}$ | 1.985202008 | 0 | 2.104127874 | 0 |
| $d_{TE\psi Si}$ | 0 | 0 | −1.45135593 | 0 |

TABLE 21-continued

| | Si(111) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $d_{TE\theta LT}$ | −203.386471 | 1.145649707 | 0 | 0 |
| $d_{\psi Si\theta LT}$ | 2.42647485 | 0.004357557 | 0 | 0 |
| e | −5.019952207 | −2.13826109 | −3.235663805 | −3.326865691 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599; |

TABLE 22

| | Si(111) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 45.51074293 | −94.44342524 | 0 |
| $a_{TLT}^{(1)}$ | 0.788515154 | −3.454988617 | −9.832405019 | −3.192556866 |
| $b_{TLT}^{(2)}$ | 0 | 0.006485261 | 0.006459172 | 0 |
| $c_{TLT}$ | 0.298058252 | 0.295238095 | 0.298461538 | 0.298913043 |
| $a_{TS}^{(2)}$ | 0 | 0 | 0 | 0 |
| $a_{TS}^{(1)}$ | −8.97795964 | 1.31344944 | 0 | 0 |
| $b_{TS}^{(2)}$ | 0 | 0 | 0 | 0 |
| $c_{TS}$ | 0.142718447 | 0.147619048 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | 9.791468713 | 0.170587985 | −0.71523762 | −10.72534988 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.15776699 | 0.124603175 | 0.356153846 | 0.347826087 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0.003924448 | 0.001661439 | 0 | 0.00657999 |
| $a_{\psi Si}^{(1)}$ | 0.15776699 | −0.024952541 | 0.02404454 | −0.067389114 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 148.4588557 | 132.0861678 | 0 | 152.6937618 |
| $c_{\psi Si}$ | 15.29126214 | 46.9047619 | 14.19230769 | 43.04347826 |
| $a_{\theta LT}^{(2)}$ | 0 | 0 | 0 | 0 |
| $a_{\theta LT}^{(1)}$ | 0.06700163 | 0.042141715 | 0.055240362 | 0.061747926 |
| $b_{\theta LT}^{(2)}$ | 0 | 0 | 0 | 0 |
| $c_{\theta LT}$ | −48.73786408 | −50.15873016 | −49.76923077 | −49.45652174 |
| $d_{TLTTS}$ | 116.7290786 | −78.78450728 | 0 | 0 |
| $d_{TLTTE}$ | 0 | 85.46351406 | −49.85282875 | 0 |
| $d_{TLT\psi Si}$ | −0.70199108 | 0.445481139 | 0 | 0.604657146 |
| $d_{TLT\theta LT}$ | −0.726496636 | 0 | 0 | 0 |
| $d_{TSTE}$ | 0 | −116.360096 | 0 | 0 |
| $d_{TS\psi Si}$ | 0 | −0.622709588 | 0 | 0 |
| $d_{TS\theta LT}$ | 2.041329502 | −0.339115637 | 0 | 0 |
| $d_{TE\psi Si}$ | 0 | 0.20688896 | 0 | 0 |
| $d_{TE\theta LT}$ | 0.774150432 | 0.439880407 | −0.6608739 | −1.068569294 |
| $d_{\psi Si\theta LT}$ | −0.005400114 | 0.002667922 | −0.004937546 | 0.006290209 |
| e | −4.209434885 | −1.791078273 | −3.48174155 | −3.934527612 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599; |

TABLE 23

| | Si(111) $0 < T_{LT} < 0.2$ $0.2 \le T_S \le 2.0$ | | | |
|---|---|---|---|---|
| | $0.05 \le T_E < 0.25$ | | $0.25 \le TE \le 0.45$ | |
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | 0 | 0 | 0 | 0 |
| $a_{TLT}^{(1)}$ | −4.673850215 | 0 | −8.8586067 | −1.957300157 |
| $b_{TLT}^{(2)}$ | 0 | 0 | 0 | 0 |
| $c_{TLT}$ | 0.141509434 | 0 | 0.153125 | 0.16 |
| $a_{TS}^{(2)}$ | 82.42811022 | 0 | 87.42203531 | 0 |
| $a_{TS}^{(1)}$ | −7.905282467 | −4.948155925 | −0.569845134 | 0.521030757 |
| $b_{TS}^{(2)}$ | 0.006949092 | 0 | 0.006037326 | 0 |
| $c_{TS}$ | 0.294339623 | 0.314583333 | 0.297916667 | 0.285 |
| $a_{TE}^{(4)}$ | 0 | 0 | 0 | 0 |
| $a_{TE}^{(3)}$ | 0 | 0 | 0 | 0 |
| $a_{TE}^{(2)}$ | 53.51232744 | −79.38404758 | 0 | 0 |
| $a_{TE}^{(1)}$ | 10.58973083 | 10.26534018 | 8.135327356 | −7.251553825 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.006016376 | 0.005677083 | 0 | 0 |
| $c_{TE}$ | 0.183962264 | 0.1375 | 0.336458333 | 0.37 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0.001429494 |
| $a_{\psi Si}^{(1)}$ | 0.010122468 | 0.039888924 | −0.016592245 | −0.004853684 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 145.6875 |
| $c_{\psi Si}$ | 11.88679245 | 48.4375 | 14.0625 | 45.75 |
| $a_{\theta LT}^{(2)}$ | 0 | 0 | 0 | 20 |
| $a_{\theta LT}^{(1)}$ | −0.005093912 | 0.011098836 | 0.047530531 | 0.04750516 |
| $b_{\theta LT}^{(2)}$ | 0 | 0 | 0 | 0 |
| $c_{\theta LT}$ | −50 | −50.4166667 | −50.72916667 | −49.75 |
| $d_{TLTTS}$ | 0 | 0 | 91.19418307 | 251.5375225 |
| $d_{TLTTE}$ | 0 | 0 | −156.3654518 | 0 |
| $d_{TLT\psi Si}$ | 0.322255595 | 0 | 0 | −0.289820964 |
| $d_{TLT\theta LT}$ | −0.768436344 | 0 | −0.735737765 | 0 |
| $d_{TSTE}$ | 0 | 75.51836907 | 0 | 0 |
| $d_{TS\psi Si}$ | −0.512402643 | 0.300543357 | −0.724013025 | 0.245746891 |
| $d_{TS\theta LT}$ | 0 | 0 | 0 | 0 |
| $d_{TE\psi Si}$ | 0 | 0 | −0.50556971 | 0 |
| $d_{TE\theta LT}$ | 0 | 0 | 0 | 0 |
| $d_{\psi Si\theta LT}$ | 0 | 0.002842264 | 0 | 0 |
| e | −2.770026639 | −2.638591885 | −1.980941925 | −2.412296494 |
| $a_{TP}$ | 0 | 0 | 0 | 0 |
| $b_{TP}$ | 0 | 0 | 0 | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599; | and

TABLE 24

| | Si(111) $0.2 \le T_{LT} \le 3.5$ $0.2 \le T_S \le 2.0$ | | | |
|---|---|---|---|---|
| | $0.05 \le T_E < 0.25$ | | $0.25 \le T_E \le 0.45$ | |
| | $0 \le \psi_{Si} < 30$ | $30 \le \psi_{Si} \le 60$ | $0 \le \psi_{Si} < 30$ | $30 \le \psi_{Si} \le 60$ |
| $a_{TLT}^{(2)}$ | 0 | 0 | 0 | 0 |
| $a_{TLT}^{(1)}$ | 4.449764983 | 0 | −13.78321665 | −10.59163435 |
| $b_{TLT}^{(2)}$ | 0 | 0 | 0 | 0 |
| $c_{TLT}$ | 0.321052632 | 0 | 0.309146341 | 0.303164557 |
| $a_{TS}^{(2)}$ | 0 | 0 | 0 | 0 |
| $a_{TS}^{(1)}$ | 0 | −3.433673203 | −1.746861763 | 3.363230821 |
| $b_{TS}^{(2)}$ | 0 | 0 | 0 | 0 |
| $c_{TS}$ | 0 | 0.283443709 | 0.287804878 | 0.293037975 |
| $a_{TE}^{(4)}$ | 0 | 0 | 0 | 0 |

TABLE 24-continued

| | Si(111) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TE}^{(3)}$ | 0 | 0 | 0 | 0 |
| $a_{TE}^{(2)}$ | 0 | 0 | 86.18383552 | 0 |
| $a_{TE}^{(1)}$ | 3.853394073 | 8.768511808 | −1.86755053 | −15.6861606 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0.007157942 | 0 |
| $c_{TE}$ | 0.181578947 | 0.135430464 | 0.356097561 | 0.363291139 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | 0.014178515 | 0.049910217 | −0.008697771 | 0.012742666 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 12.63157895 | 45.99337748 | 15.09146341 | 45 |
| $a_{\theta LT}^{(2)}$ | 0 | 0 | 0 | 0 |
| $a_{\theta LT}^{(1)}$ | 0 | 0.061867934 | 0.051566965 | 0.028929641 |
| $b_{\theta LT}^{(2)}$ | 0 | 0 | 0 | 0 |
| $c_{\theta LT}$ | −90 | −50.59602649 | −50.30487805 | −50.56962025 |
| $d_{TLTTS}$ | 0 | 0 | 0 | −103.0440888 |
| $d_{TLTTE}$ | 0 | 0 | 0 | 0 |
| $d_{TLT\psi Si}$ | −0.181721459 | 0 | 0 | 0 |
| $d_{TLT\theta LT}$ | 0 | 0 | 0 | −0.608943868 |
| $d_{TSTE}$ | 0 | 113.1914268 | −75.04640382 | −82.04954672 |
| $d_{TS\psi Si}$ | 0 | 0 | −0.554356722 | 0.673316097 |
| $d_{TS\theta LT}$ | 0 | 0 | 0 | 0 |
| $d_{TE\psi Si}$ | 0 | 0 | −0.512800103 | 0 |
| $d_{TE\theta LT}$ | 0 | 0 | −0.656702553 | 0 |
| $d_{\psi Si\theta LT}$ | 0 | 0 | 0 | 0 |
| e | −2.401219798 | −3.18651044 | −3.93030224 | −4.143483981 |
| $a_{TP}$ | 0 | 0 | 00 | 0 |
| $b_{TP}$ | 0 | 0 | | 0 |
| $c_{TP}$ | −15.448 | −15.448 | −15.448 | −15.448 |
| $d_{TP}$ | −2.9188 | −2.9188 | −2.9188 | −2.9188 |
| $f_{TP}$ | 1.0599 | 1.0599 | 1.0599 | 1.0599. |

14. An acoustic wave filter comprising:
a plurality of resonators; wherein
at least one of the plurality of resonators is defined by the acoustic wave device according to claim 13.

15. A composite filter device comprising:
N band pass filters having different pass bands where N is two or more; wherein
one terminal of each of the N band pass filters is connected in common on an antenna terminal side;
at least one of the N band pass filters excluding a band pass filter having a highest pass band includes one or more acoustic wave resonators; and
at least one of the one or more acoustic wave resonators is the acoustic wave device according to claim 13.

16. The acoustic wave device according to claim 13, wherein a thickness of the lithium tantalate film is equal to or less than about 3.5λ.

17. An acoustic wave device comprising:
a silicon support substrate;
a silicon oxide film laminated above the silicon support substrate;
a lithium tantalate film laminated above the silicon oxide film;
an IDT electrode having an electrode finger and being provided above the lithium tantalate film; and
a protection film covering at least a portion of the IDT electrode; wherein
when a wavelength determined by an electrode finger pitch of the IDT electrode is denoted by o, a wavelength normalized film thickness of the lithium tantalate film is denoted by $T_{LT}$, θ of an Euler angle of the lithium tantalate film is denoted by $\theta_{LT}$, a wavelength normalized film thickness of the silicon oxide film is denoted by $T_S$, a wavelength normalized film thickness of the IDT electrode in terms of aluminum thickness being a product of a wavelength normalized film thickness of the IDT electrode and a value obtained when density of the IDT electrode is divided by density of aluminum is denoted by $T_E$, a wavelength normalized film thickness of the protection film being a product of a value obtained when density of the protection film is divided by density of silicon oxide and a wavelength normalized film thickness which is a thickness of the protection film normalized by the wavelength λ is denoted by $T_P$, a propagation direction in the silicon support substrate is denoted by $\psi_{Si}$, and a wavelength normalized film thickness which is a thickness of the silicon support substrate normalized by the wavelength λ is denoted by $T_{Si}$, $T_{LT}$, $\theta_{LT}$, $T_S$, $T_E$, $T_P$, and $\psi_{Si}$ are set such that a value represented by Formula (1) below is larger than about −2.4;

$$I_h = \left(a_{T_{LT}}^{(2)}\left((T_{LT} - c_{T_{LT}})^2 - b_{T_{LT}}^{(2)}\right) + \right.$$

$$a_{T_{LT}}^{(1)}(T_{LT} - c_{T_{LT}}) + a_{T_S}^{(2)}\left((T_S - c_{T_S})^2 - b_{T_S}^{(2)}\right) + a_{T_S}^{(1)}(T_S - c_{T_S}) +$$

$$a_{T_E}^{(4)}\left((T_E - c_{T_E})^4 - b_{T_E}^{(4)}\right) + a_{T_E}^{(3)}\left((T_E - c_{T_E})^3 - b_{T_E}^{(3)}\right) +$$

$$a_{T_E}^{(2)}\left((T_E - c_{T_E})^2 - b_{T_E}^{(2)}\right) + a_{T_E}^{(1)}(T_E - c_{T_E}) +$$

$$a_{\Psi_{Si}}^{(6)}\left((\Psi_{Si} - c_{\Psi_{Si}})^6 - b_{\Psi_{Si}}^{(6)}\right) + a_{\Psi_{Si}}^{(5)}\left((\Psi_{Si} - c_{\Psi_{Si}})^5 - b_{\Psi_{Si}}^{(5)}\right) +$$

$$a_{\Psi_{Si}}^{(4)}\left((\Psi_{Si} - c_{\Psi_{Si}})^4 - b_{\Psi_{Si}}^{(4)}\right) + a_{\Psi_{Si}}^{(3)}\left((\Psi_{Si} - c_{\Psi_{Si}})^3 - b_{\Psi_{Si}}^{(3)}\right) +$$

$$a_{\Psi_{Si}}^{(2)}\left((\Psi_{Si} - c_{\Psi_{Si}})^2 - b_{\Psi_{Si}}^{(2)}\right) + a_{\Psi_{Si}}^{(1)}(\Psi_{Si} - c_{\Psi_{Si}}) +$$

$$a_{\theta_{LT}}^{(2)}\left((\theta_{LT} - c_{\theta_{LT}})^2 - b_{\theta_{LT}}^{(2)}\right) + a_{\theta_{LT}}^{(1)}(\theta_{LT} - c_{\theta_{LT}}) +$$

$$d_{T_{LT}T_S}(T_{LT} - c_{T_{LT}})(T_S - c_{T_S}) + d_{T_{LT}T_E}(T_{LT} - c_{T_{LT}})$$

$$(T_E - c_{T_E}) + d_{T_{LT}\Psi_{Si}}(T_{LT} - c_{T_{LT}})(\Psi_{Si} - c_{\Psi_{Si}}) +$$

$$d_{T_{LT}\theta_{LT}}(T_{LT} - c_{T_{LT}})(\theta_{LT} - c_{\theta_{LT}}) + d_{T_S T_E}(T_S - c_{T_S})(T_E - c_{T_E}) +$$

$$d_{T_S\Psi_{Si}}(T_S - c_{T_S})(\Psi_{Si} - c_{\Psi_{Si}}) + d_{T_S\theta_{LT}}(T_S - c_{T_S})(\theta_{LT} - c_{\theta_{LT}}) +$$

$$d_{T_E\Psi_{Si}}(T_E - c_{T_E})(\Psi_{Si} - c_{\Psi_{Si}}) + d_{T_E\theta_{LT}}(T_E - c_{T_E})(\theta_{LT} - c_{\theta_{LT}}) +$$

$$\left. d_{\Psi_{Si}\theta_{LT}}(\Psi_{Si} - c_{\Psi_{Si}})(\theta_{LT} - c_{\theta_{LT}}) + e\right)$$

$$\left(a_{T_P}T_P^4 + b_{T_P}T_P^3 + c_{T_P}T_P^2 + d_{T_P}T_P + f_{T_P}\right);$$

Formula (1)

where, coefficients a, b, c, d, e, and f in Formula (1) are values described in Table 25 to Table 36 below that are determined in accordance with a crystal orientation of the silicon support substrate and a range of $T_S$, $T_{LT}$, and $\Psi_{Si}$:

TABLE 25

| | Si(100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $a_{T_{LT}}^{(2)}$ | 0 | 0 |
| $a_{T_{LT}}^{(1)}$ | −16.39135605 | −16.39135605 |
| $b_{T_{LT}}^{(2)}$ | 0 | 0 |
| $c_{T_{LT}}$ | 0.196774194 | 0.196774194 |
| $a_{T_S}^{(2)}$ | 0 | 0 |
| $a_{T_S}^{(1)}$ | −4.824831305 | −4.824831305 |
| $b_{T_S}^{(2)}$ | 0 | 0 |
| $c_{T_S}$ | 0.170967742 | 0.170967742 |
| $a_{T_E}^{(4)}$ | 0 | 0 |
| $a_{T_E}^{(3)}$ | 0 | 0 |
| $a_{T_E}^{(2)}$ | −45.57608817 | −45.57608817 |
| $a_{T_E}^{(1)}$ | −10.80005563 | −10.80005563 |
| $b_{T_E}^{(4)}$ | 0 | 0 |
| $b_{T_E}^{(3)}$ | 0 | 0 |
| $b_{T_E}^{(2)}$ | 0.018296046 | 0.018296046 |
| $c_{T_E}$ | 0.303225806 | 0.303225806 |
| $a_{\Psi_{Si}}^{(6)}$ | 0 | 0 |
| $a_{\Psi_{Si}}^{(5)}$ | 0 | 0 |
| $a_{\Psi_{Si}}^{(4)}$ | 0 | 0 |
| $a_{\Psi_{Si}}^{(3)}$ | 0.000172048 | 0.000172048 |
| $a_{\Psi_{Si}}^{(2)}$ | −0.00384923 | −0.00384923 |
| $a_{\Psi_{Si}}^{(1)}$ | −0.009826773 | −0.009826773 |
| $b_{\Psi_{Si}}^{(6)}$ | 0 | 0 |
| $b_{\Psi_{Si}}^{(5)}$ | 0 | 0 |
| $b_{\Psi_{Si}}^{(4)}$ | 0 | 0 |
| $b_{\Psi_{Si}}^{(3)}$ | 143.0843208 | 143.0843208 |
| $b_{\Psi_{Si}}^{(2)}$ | 215.8688866 | 215.8688866 |
| $c_{\Psi_{Si}}$ | 22.25806452 | 22.25806452 |
| $a_{\theta_{LT}}^{(2)}$ | 0 | 0 |
| $a_{\theta_{LT}}^{(1)}$ | 0.066799879 | 0.066799879 |
| $b_{\theta_{LT}}^{(2)}$ | 0 | 0 |
| $c_{\theta_{LT}}$ | −50.16129032 | −50.16129032 |
| $d_{T_{LT}T_S}$ | 0 | 0 |
| $d_{T_{LT}T_E}$ | −112.847682 | −112.847682 |
| $d_{T_{LT}\Psi_{Si}}$ | 0 | 0 |

TABLE 25-continued

| | Si(100) $0 < T_{LT} < 0.2$ $0 \leq T_S < 0.2$ | |
|---|---|---|
| | $0.05 \leq T_E < 0.25$ | $0.25 \leq T_E \leq 0.45$ |
| $d_{T_{LT}\theta_{LT}}$ | 0 | 0 |
| $d_{T_S T_E}$ | 0 | 0 |
| $d_{T_S\Psi_{Si}}$ | −1.750763196 | −1.750763196 |
| $d_{T_S\theta_{LT}}$ | 0 | 0 |
| $d_{T_E\Psi_{Si}}$ | 0 | 0 |
| $d_{T_E\theta_{LT}}$ | 0.466692151 | 0.466692151 |
| $d_{\Psi_{Si}\theta_{LT}}$ | 0 | 0 |
| e | −2.904746788 | −2.904746788 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978; |

TABLE 26

| | Si(100) $0.2 \leq T_{LT} \leq 3.5$ $0 \leq T_S < 0.2$ | |
|---|---|---|
| | $0.05 \leq T_E < 0.25$ | $0.25 \leq T_E \leq 0.45$ |
| $a_{T_{LT}}^{(2)}$ | 0 | 0 |
| $a_{T_{LT}}^{(1)}$ | −8.135537689 | −8.135537689 |
| $b_{T_{LT}}^{(2)}$ | 0 | 0 |
| $c_{T_{LT}}$ | 0.311659193 | 0.311659193 |
| $a_{T_S}^{(2)}$ | 0 | 0 |
| $a_{T_S}^{(1)}$ | −20.38200282 | −20.38200282 |
| $b_{T_S}^{(2)}$ | 0 | 0 |
| $c_{T_S}$ | 0.149327354 | 0.149327354 |
| $a_{T_E}^{(4)}$ | 0 | 0 |
| $a_{T_E}^{(3)}$ | 0 | 0 |
| $a_{T_E}^{(2)}$ | 0 | 0 |
| $a_{T_E}^{(1)}$ | −3.460675692 | −3.460675692 |
| $b_{T_E}^{(4)}$ | 0 | 0 |
| $b_{T_E}^{(3)}$ | 0 | 0 |
| $b_{T_E}^{(2)}$ | 0 | 0 |
| $c_{T_E}$ | 0.267488789 | 0.267488789 |
| $a_{\Psi_{Si}}^{(6)}$ | 0 | 0 |
| $a_{\Psi_{Si}}^{(5)}$ | 0 | 0 |
| $a_{\Psi_{Si}}^{(4)}$ | 0 | 0 |
| $a_{\Psi_{Si}}^{(3)}$ | 0 | 0 |
| $a_{\Psi_{Si}}^{(2)}$ | −0.003759233 | −0.003759233 |
| $a_{\Psi_{Si}}^{(1)}$ | 0.015931998 | 0.015931998 |
| $b_{\Psi_{Si}}^{(6)}$ | 0 | 0 |
| $b_{\Psi_{Si}}^{(5)}$ | 0 | 0 |
| $b_{\Psi_{Si}}^{(4)}$ | 0 | 0 |
| $b_{\Psi_{Si}}^{(3)}$ | 0 | 0 |
| $b_{\Psi_{Si}}^{(2)}$ | 239.0395946 | 239.0395946 |
| $c_{\Psi_{Si}}$ | 18.90134529 | 18.90134529 |
| $a_{\theta_{LT}}^{(2)}$ | 0 | 0 |
| $a_{\theta_{LT}}^{(1)}$ | 0.017576249 | 0.017576249 |
| $b_{\theta_{LT}}^{(2)}$ | 0 | 0 |
| $c_{\theta_{LT}}$ | −49.9103139 | −49.9103139 |
| $d_{T_{LT}T_S}$ | −152.1817236 | −152.1817236 |
| $d_{T_{LT}T_E}$ | 0 | 0 |
| $d_{T_{LT}\Psi_{Si}}$ | −0.359387178 | −0.359387178 |
| $d_{T_{LT}\theta_{LT}}$ | 0 | 0 |
| $d_{T_S T_E}$ | 0 | 0 |
| $d_{T_S\Psi_{Si}}$ | 0 | 0 |
| $d_{T_S\theta_{LT}}$ | 0.911415415 | 0.911415415 |
| $d_{T_E\Psi_{Si}}$ | 0 | 0 |
| $d_{T_E\theta_{LT}}$ | 0.275815872 | 0.275815872 |
| $d_{\Psi_{Si}\theta_{LT}}$ | 0 | 0 |
| e | −3.952626598 | −3.952626598 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978; |

TABLE 27

Si(100)
$0 < T_{LT} < 0.2$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −26.36951471 | −26.36951471 |
| $b_{TLT}^{(2)}$ | 0 | 0 |
| $c_{TLT}$ | 0.161538462 | 0.161538462 |
| $a_{TS}^{(2)}$ | 0 | 0 |
| $a_{TS}^{(1)}$ | −10.09828536 | −10.09828536 |
| $b_{TS}^{(2)}$ | 0 | 0 |
| $c_{TS}$ | 0.321025641 | 0.321025641 |
| $a_{TE}^{(4)}$ | 0 | 0 |
| $a_{TE}^{(3)}$ | 0 | 0 |
| $a_{TE}^{(2)}$ | −21.38297597 | −21.38297597 |
| $a_{TE}^{(1)}$ | −2.383287449 | −2.383287449 |
| $b_{TE}^{(4)}$ | 0 | 0 |
| $b_{TE}^{(3)}$ | 0 | 0 |
| $b_{TE}^{(2)}$ | 0.01947666 | 0.01947666 |
| $c_{TE}$ | 0.270512821 | 0.270512821 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000176024 | 0.000176024 |
| $a_{\psi Si}^{(2)}$ | −0.001397911 | −0.001397911 |
| $a_{\psi Si}^{(1)}$ | −0.107515297 | −0.107515297 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | −282.3623122 | −282.3623122 |
| $b_{\psi Si}^{(2)}$ | 255.2071006 | 255.2071006 |
| $c_{\psi Si}$ | 23.84615385 | 23.84615385 |
| $a_{\theta LT}^{(2)}$ | 0 | 0 |
| $a_{\theta LT}^{(1)}$ | 0.085112984 | 0.085112984 |
| $b_{\theta LT}^{(2)}$ | 0 | 0 |
| $c_{\theta LT}$ | −48.97435897 | −48.97435897 |
| $d_{TLTTS}$ | 0 | 0 |
| $d_{TLTTE}$ | 0 | 0 |
| $d_{TLT\psi Si}$ | −0.816828716 | −0.816828716 |
| $d_{TLT\theta LT}$ | 0.865519967 | 0.865519967 |
| $d_{TSTE}$ | 0 | 0 |
| $d_{TS\psi Si}$ | −0.538336559 | −0.538336559 |
| $d_{TS\theta LT}$ | 0 | 0 |
| $d_{TE\psi Si}$ | 0 | 0 |
| $d_{TE\theta LT}$ | 0 | 0 |
| $d_{\psi Si\theta LT}$ | 0.002971652 | 0.002971652 |
| e | −3.504362202 | −3.504362202 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978; |

TABLE 28

Si(100)
$0.2 \leq T_{LT} \leq 3.5$
$0.2 \leq T_S \leq 2.0$

| | $0.05 \leq T_E < 0.25$ | $0.25 \leq T_E \leq 0.45$ |
|---|---|---|
| $a_{TLT}^{(2)}$ | 0 | 0 |
| $a_{TLT}^{(1)}$ | −6.371850196 | −6.371850196 |
| $b_{TLT}^{(2)}$ | 0 | 0 |
| $c_{TLT}$ | 0.292192192 | 0.292192192 |
| $a_{TS}^{(2)}$ | 0 | 0 |
| $a_{TS}^{(1)}$ | −0.609606885 | −0.609606885 |
| $b_{TS}^{(2)}$ | 0 | 0 |
| $c_{TS}$ | 0.2996997 | 0.2996997 |
| $a_{TE}^{(4)}$ | 0 | 0 |
| $a_{TE}^{(3)}$ | 0 | 0 |
| $a_{TE}^{(2)}$ | 0 | 0 |
| $a_{TE}^{(1)}$ | 0 | 0 |
| $b_{TE}^{(4)}$ | 0 | 0 |
| $b_{TE}^{(3)}$ | 0 | 0 |
| $b_{TE}^{(2)}$ | 0 | 0 |
| $c_{TE}$ | 0 | 0 |
| $a_{\psi Si}^{(6)}$ | 0 | 0 |
| $a_{\psi Si}^{(5)}$ | 0 | 0 |
| $a_{\psi Si}^{(4)}$ | 0 | 0 |
| $a_{\psi Si}^{(3)}$ | 0.000224133 | 0.000224133 |
| $a_{\psi Si}^{(2)}$ | −0.004048532 | −0.004048532 |
| $a_{\psi Si}^{(1)}$ | −0.126847922 | −0.126847922 |
| $b_{\psi Si}^{(6)}$ | 0 | 0 |
| $b_{\psi Si}^{(5)}$ | 0 | 0 |
| $b_{\psi Si}^{(4)}$ | 0 | 0 |
| $b_{\psi Si}^{(3)}$ | 1375.85979 | 1375.85979 |
| $b_{\psi Si}^{(2)}$ | 281.2555799 | 281.2555799 |
| $c_{\psi Si}$ | 19.77477477 | 19.77477477 |
| $a_{\theta LT}^{(2)}$ | 0 | 0 |
| $a_{\theta LT}^{(1)}$ | 0.056146223 | 0.056146223 |
| $b_{\theta LT}^{(2)}$ | 0 | 0 |
| $c_{\theta LT}$ | −49.48948949 | −49.48948949 |
| $d_{TLTTS}$ | 94.47145497 | 94.47145497 |
| $d_{TLTTE}$ | 0 | 0 |
| $d_{TLT\psi Si}$ | 0 | 0 |
| $d_{TLT\theta LT}$ | 0 | 0 |
| $d_{TSTE}$ | 0 | 0 |
| $d_{TS\psi Si}$ | 0 | 0 |
| $d_{TS\theta LT}$ | −0.568942451 | −0.568942451 |
| $d_{TE\psi Si}$ | 0 | 0 |
| $d_{TE\theta LT}$ | 0 | 0 |
| $d_{\psi Si\theta LT}$ | 0.005654813 | 0.005654813 |
| e | −4.940340284 | −4.940340284 |
| $a_{TP}$ | 0 | 0 |
| $b_{TP}$ | 0 | 0 |
| $c_{TP}$ | 19.811 | 19.811 |
| $d_{TP}$ | −11.953 | −11.953 |
| $f_{TP}$ | 1.1978 | 1.1978; |

TABLE 29

Si(110)
$0 < T_{LT} < 0.2$
$0 \leq T_S < 0.2$

| | $0.05 \leq T_E < 0.25$ | | $0.25 \leq T_E \leq 0.45$ | |
|---|---|---|---|---|
| | $0 \leq \psi Si < 45$ | $45 \leq \psi Si \leq 90$ | $0 \leq \psi Si < 45$ | $45 \leq \psi Si \leq 90$ |
| $a_{TLT}^{(2)}$ | 0 | 0 | 0 | 0 |
| $a_{TLT}^{(1)}$ | −11.04825287 | −11.04825287 | −11.04825287 | −11.04825287 |
| $b_{TLT}^{(2)}$ | 0 | 0 | 0 | 0 |
| $c_{TLT}$ | 0.164705882 | 0.164705882 | 0.164705882 | 0.164705882 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.86806521 | −12.86806521 | −12.86806521 | −12.86806521 |
| $a_{TE}^{(1)}$ | 39.88235294 | 39.88235294 | 39.88235294 | 39.88235294 |

TABLE 29-continued

| | | | | |
|---|---|---|---|---|
| $b_{TE}^{(4)}$ | 0 | 0 | 0 | 0 |
| $b_{TE}^{(3)}$ | 0 | 0 | 0 | 0 |
| $b_{TE}^{(2)}$ | 0.019258131 | 0.019258131 | 0.019258131 | 0.019258131 |
| $c_{TE}$ | 0.286470588 | 0.286470588 | 0.286470588 | 0.286470588 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.000762445 | −0.000762445 | −0.000762445 | −0.000762445 |
| $a_{\psi Si}^{(1)}$ | −0.031584918 | −0.031584918 | −0.031584918 | −0.031584918 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 749.7716263 | 749.7716263 | 749.7716263 | 749.7716263 |
| $c_{\psi Si}$ | 52.58823529 | 52.58823529 | 52.58823529 | 52.58823529 |
| $a_{\theta LT}^{(2)}$ | −0.004115091 | −0.004115091 | −0.004115091 | −0.004115091 |
| $a_{\theta LT}^{(1)}$ | 0.023260981 | 0.023260981 | 0.023260981 | 0.023260981 |
| $b_{\theta LT}^{(2)}$ | 81.16262976 | 81.16262976 | 81.16262976 | 81.16262976 |
| $c_{\theta LT}$ | −50.11764706 | −50.11764706 | −50.11764706 | −50.11764706 |
| $d_{TLTTS}$ | 0 | 0 | 0 | 0 |
| $d_{TLTTE}$ | −32.35244505 | −32.35244505 | −32.35244505 | −32.35244505 |
| $d_{TLT\psi Si}$ | 0.348515389 | 0.348515389 | 0.348515389 | 0.348515389 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | 0.000823202 | 0.000823202 | 0.000823202 | 0.000823202 |
| $e$ | −1.678155024 | −1.678155024 | −1.678155024 | −1.678155024 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978; |

TABLE 30

| | Si(110) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{si} < 45$ | $45 \leq \psi_{si} \leq 90$ | $0 \leq \psi_{si} < 45$ | $45 \leq \psi_{si} \leq 90$ |
| $a_{TLT}^{(2)}$ | 0 | 0 | 34.01092867 | 34.01092867 |
| $a_{TLT}^{(1)}$ | −3.294448859 | −3.294448859 | −2.996122319 | −2.996122319 |
| $b_{TLT}^{(2)}$ | 0 | 0 | 0.005572031 | 0.005572031 |
| $c_{TLT}$ | 0.328378378 | 0.328378378 | 0.31344086 | 0.31344086 |
| $a_{TS}^{(2)}$ | 0 | 0 | 0 | 0 |
| $a_{TS}^{(1)}$ | 2.752851676 | 2.752851676 | −1.564359965 | −1.564359965 |
| $b_{TS}^{(2)}$ | 0 | 0 | 0 | 0 |
| $c_{TS}$ | 0.162837838 | 0.162837838 | 0.160752688 | 0.160752688 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −4.548790211 | −4.548790211 | −1.370514553 | −1.370514553 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.165540541 | 0.165540541 | 0.355913978 | 0.355913978 |
| $a_{\psi Si}^{(6)}$ | 0 | 0 | 0 | 0 |
| $a_{\psi Si}^{(5)}$ | −7.03888E−08 | −7.03888E−08 | −3.78178E−08 | −3.78178E−08 |
| $a_{\psi Si}^{(4)}$ | 1.4265E−06 | 1.4265E−06 | 9.79065E−07 | 9.79065E−07 |
| $a_{\psi Si}^{(3)}$ | 0.000180358 | 0.000180358 | 9.73597E−05 | 9.73597E−05 |
| $a_{\psi Si}^{(2)}$ | −0.002681874 | −0.002681874 | −0.00192926 | −0.00192926 |
| $a_{\psi Si}^{(1)}$ | −0.092266284 | −0.092266284 | −0.04329175 | −0.04329175 |
| $b_{\psi Si}^{(6)}$ | 0 | 0 | 0 | 0 |
| $b_{\psi Si}^{(5)}$ | 11701030.08 | 11701030.08 | 24265475.25 | 24265475.25 |
| $b_{\psi Si}^{(4)}$ | 1439156.296 | 1439156.296 | 1705613.393 | 1705613.393 |
| $b_{\psi Si}^{(3)}$ | 1798.436559 | 1798.436559 | 6938.899332 | 6938.899332 |
| $b_{\psi Si}^{(2)}$ | 930.5183985 | 930.5183985 | 1060.880593 | 1060.880593 |
| $c_{\psi Si}$ | 40.23648649 | 40.23648649 | 40.08064516 | 40.08064516 |
| $a_{\theta LT}^{(2)}$ | 0 | 0 | 0 | 0 |
| $a_{\theta LT}^{(1)}$ | 0.046000242 | 0.046000242 | 0.001380272 | 0.001380272 |

TABLE 30-continued

| | | | | |
|---|---|---|---|---|
| $b_{\theta LT}^{(2)}$ | 0 | 0 | 0 | 0 |
| $c_{\theta LT}$ | −49.52702703 | −49.52702703 | −50.05376344 | −50.05376344 |
| $d_{TLTTS}$ | −136.9978702 | −136.9978702 | −73.06084164 | −73.06084164 |
| $d_{TLTTE}$ | 0 | 0 | 0 | 0 |
| $d_{TLT\psi Si}$ | 0 | 0 | 0.096651605 | 0.096651605 |
| $d_{TLT\theta LT}$ | 0 | 0 | 0 | 0 |
| $d_{TSTE}$ | 0 | 0 | −56.78924979 | −56.78924979 |
| $d_{TS\psi Si}$ | 0 | 0 | 0 | 0 |
| $d_{TS\theta LT}$ | 0 | 0 | 0 | 0 |
| $d_{TE\psi Si}$ | 0.081014811 | 0.081014811 | 0 | 0 |
| $d_{TE\theta LT}$ | 0 | 0 | −0.194432704 | −0.194432704 |
| $d_{\psi Si\theta LT}$ | 0 | 0 | 0.000875955 | 0.000875955 |
| e | −2.543790382 | −2.543790382 | −2.964933907 | −2.964933907 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978; |

TABLE 31

| | Si(110) $0 < T_{LT} < 0.2$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −13.1565646 | −13.1565646 | −13.1565646 | −13.1565646 |
| $b_{TLT}^{(2)}$ | 0 | 0 | 0 | 0 |
| $c_{TLT}$ | 0.179661017 | 0.179661017 | 0.179661017 | 0.179661017 |
| $a_{TS}^{(2)}$ | −54.97015257 | −54.97015257 | −54.97015257 | −54.97015257 |
| $a_{TS}^{(1)}$ | 1.195559996 | 1.195559996 | 1.195559996 | 1.195559996 |
| $b_{TS}^{(2)}$ | 0.006496856 | 0.006496856 | 0.006496856 | 0.006496856 |
| $c_{TS}$ | 0.299435028 | 0.299435028 | 0.299435028 | 0.299435028 |
| $a_{TE}^{(4)}$ | 0 | 0 | 0 | 0 |
| $a_{TE}^{(3)}$ | 0 | 0 | 0 | 0 |
| $a_{TE}^{(2)}$ | −12.83875925 | −12.83875925 | −12.83875925 | −12.83875925 |
| $a_{TE}^{(1)}$ | −2.591177902 | −2.591177902 | −2.591177902 | −2.591177902 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.02062115 | 0.02062115 | 0.02062115 | 0.02062115 |
| $c_{TE}$ | 0.282768362 | 0.282768362 | 0.282768362 | 0.282768362 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | −0.00094978 | −0.00094978 | −0.00094978 | −0.00094978 |
| $a_{\psi Si}^{(1)}$ | −0.016861509 | −0.016861509 | −0.016861509 | −0.016861509 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | −0.00094978 | −0.00094978 | −0.00094978 | −0.00094978 |
| $c_{\psi Si}$ | 44.83050847 | 44.83050847 | 44.83050847 | 44.83050847 |
| $a_{\theta LT}^{(2)}$ | 0 | 0 | 0 | 0 |
| $a_{\theta LT}^{(1)}$ | 0.020120147 | 0.020120147 | 0.020120147 | 0.020120147 |
| $b_{\theta LT}^{(2)}$ | 0 | 0 | 0 | 0 |
| $c_{\theta LT}$ | −50.50847458 | −50.50847458 | −50.50847458 | −50.50847458 |
| $d_{TLTTS}$ | 0 | 0 | 0 | 0 |
| $d_{TLTTE}$ | 0 | 0 | 0 | 0 |
| $d_{TLT\psi Si}$ | 0.250474306 | 0.250474306 | 0.250474306 | 0.250474306 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0.031071552 | 0.031071552 | 0.031071552 | 0.031071552 |
| $d_{TE\theta LT}$ | 0 | 0 | 0 | 0 |
| $d_{\psi Si\theta LT}$ | 0 | 0 | 0 | 0 |
| e | −1.687640015 | −1.687640015 | −1.687640015 | −1.687640015 |
| $a_{TP}$ | 0 | 0 | 0 | 0 |
| $b_{TP}$ | 0 | 0 | 0 | 0 |

TABLE 31-continued

| | | | | |
|---|---|---|---|---|
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978; |

TABLE 32

| | Si(110) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 45$ | $45 \leq \psi_{Si} \leq 90$ | $0 \leq \psi_{Si} < 45$ | $45 \leq \psi_{Si} \leq 90$ |
| $a_{TLT}^{(2)}$ | 0 | 0 | 0 | 0 |
| $a_{TLT}^{(1)}$ | −8.387315737 | −8.387315737 | −11.34973266 | −6.017883428 |
| $b_{TLT}^{(2)}$ | 0 | 0 | 0 | 0 |
| $c_{TLT}$ | 0.313377926 | 0.313377926 | 0.291082803 | 0.294578313 |
| $a_{TS}^{(2)}$ | 0 | 0 | 0 | 0 |
| $a_{TS}^{(1)}$ | 0.140898252 | 0.140898252 | 3.107378473 | 2.287606243 |
| $b_{TS}^{(2)}$ | 0 | 0 | 0 | 0 |
| $c_{TS}$ | 0.299331104 | 0.299331104 | 0.277707006 | 0.296385542 |
| $a_{TE}^{(4)}$ | 0 | 0 | 0 | 0 |
| $a_{TE}^{(3)}$ | 0 | 0 | 0 | 0 |
| $a_{TE}^{(2)}$ | 0 | 0 | 0 | 0 |
| $a_{TE}^{(1)}$ | −1.209727849 | −1.209727849 | −4.259242642 | −1.280235687 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0 | 0 | 0 | 0 |
| $c_{TE}$ | 0.152006689 | 0.152006689 | 0.343630573 | 0.351204819 |
| $a_{\psi Si}^{(6)}$ | 0 | 0 | 0 | 0 |
| $a_{\psi Si}^{(5)}$ | −2.33027E−08 | −2.33027E−08 | 0 | 0 |
| $a_{\psi Si}^{(4)}$ | 7.78115E−07 | 7.78115E−07 | 0 | 0 |
| $a_{\psi Si}^{(3)}$ | 5.59108E−05 | 5.59108E−05 | −0.000194818 | 0 |
| $a_{\psi Si}^{(2)}$ | −0.002410767 | −0.002410767 | 0.000247924 | 0 |
| $a_{\psi Si}^{(1)}$ | −0.027662563 | −0.027662563 | 0.12904143 | −0.026766472 |
| $b_{\psi Si}^{(6)}$ | 0 | 0 | 0 | 0 |
| $b_{\psi Si}^{(5)}$ | 2083705.649 | 2083705.649 | 0 | 0 |
| $b_{\psi Si}^{(4)}$ | 1386257.115 | 1386257.115 | 0 | 0 |
| $b_{\psi Si}^{(3)}$ | −1267.41343 | −1267.41343 | 1811.750092 | 0 |
| $b_{\psi Si}^{(2)}$ | 895.5856198 | 895.5856198 | 293.105197 | 0 |
| $c_{\psi Si}$ | 42.14046823 | 42.14046823 | 19.39490446 | 67.95180723 |
| $a_{\theta LT}^{(2)}$ | 0 | 0 | 0 | 0 |
| $a_{\theta LT}^{(1)}$ | 0.020067585 | 0.020067585 | −0.011988832 | 0.032566601 |
| $b_{\theta LT}^{(2)}$ | 0 | 0 | 0 | 0 |
| $c_{\theta LT}$ | −49.73244147 | −49.73244147 | −49.61783439 | −50.96385542 |
| $d_{TLTTS}$ | 0 | 0 | 0 | 0 |
| $d_{TLTTE}$ | 0 | 0 | 0 | 41.29194486 |
| $d_{TLT\psi Si}$ | 0 | 0 | −0.203585177 | 0.376861254 |
| $d_{TLT\theta LT}$ | 0 | 0 | −0.273779971 | 0 |
| $d_{TSTE}$ | 0 | 0 | 0 | 0 |
| $d_{TS\psi Si}$ | 0 | 0 | 0 | −0.20937463 |
| $d_{TS\theta LT}$ | −0.349110894 | −0.349110894 | 0 | 0 |
| $d_{TE\psi Si}$ | 0 | 0 | 0 | 0 |
| $d_{TE\theta LT}$ | −0.216865482 | −0.216865482 | 0 | 0 |
| $d_{\psi Si\theta LT}$ | 0 | 0 | 0.00120304 | 0 |
| $e$ | −2.390757235 | −2.390757235 | −2.548464154 | −2.523994879 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978; |

TABLE 33

| | Si(111) $0 < T_{LT} < 0.2$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −3.047618237 | −3.047618237 | −3.047618237 | −3.047618237 |

TABLE 33-continued

| | | | | |
|---|---|---|---|---|
| $b_{TLT}^{(2)}$ | 0 | 0 | 0 | 0 |
| $c_{TLT}$ | 0.160869565 | 0.160869565 | 0.160869565 | 0.160869565 |
| $a_{TS}^{(2)}$ | 0 | 0 | 0 | 0 |
| $a_{TS}^{(1)}$ | 0 | 0 | 0 | 0 |
| $b_{TS}^{(2)}$ | 0 | 0 | 0 | 0 |
| $c_{TS}$ | 0 | 0 | 0 | 0 |
| $a_{TE}^{(4)}$ | 0 | 0 | 0 | 0 |
| $a_{TE}^{(3)}$ | 11.21750437 | 11.21750437 | 11.21750437 | 11.21750437 |
| $a_{TE}^{(2)}$ | −3.666215654 | −3.666215654 | −3.666215654 | −3.666215654 |
| $a_{TE}^{(1)}$ | −0.035248162 | −0.035248162 | −0.035248162 | −0.035248162 |
| $b_{TE}^{(4)}$ | 0 | 0 | 0 | 0 |
| $b_{TE}^{(3)}$ | 0.000381688 | 0.000381688 | 0.000381688 | 0.000381688 |
| $b_{TE}^{(2)}$ | 0.012589792 | 0.012589792 | 0.012589792 | 0.012589792 |
| $c_{TE}$ | 0.245652174 | 0.245652174 | 0.245652174 | 0.245652174 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.003582211 | −0.003582211 | −0.003582211 | −0.003582211 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 35.86956522 | 35.86956522 | 35.86956522 | 35.86956522 |
| $a_{\theta LT}^{(2)}$ | −0.000596775 | −0.000596775 | −0.000596775 | −0.000596775 |
| $a_{\theta LT}^{(1)}$ | 0.003385783 | 0.003385783 | 0.003385783 | 0.003385783 |
| $b_{\theta LT}^{(2)}$ | 77.88279773 | 77.88279773 | 77.88279773 | 77.88279773 |
| $c_{\theta LT}$ | −47.82608696 | −47.82608696 | −47.82608696 | −47.82608696 |
| $d_{TLTTS}$ | 0 | 0 | 0 | 0 |
| $d_{TLTTE}$ | −2.939323227 | −2.939323227 | −2.939323227 | −2.939323227 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.000442922 | −0.000442922 | −0.000442922 | −0.000442922 |
| $e$ | −0.277577227 | −0.277577227 | −0.277577227 | −0.277577227 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978; |

TABLE 34

| | Si(111) $0.2 \leq T_{LT} \leq 3.5$ $0 \leq T_S < 0.2$ | | | |
|---|---|---|---|---|
| | $0.05 \leq T_E < 0.25$ | | $0.25 \leq T_E \leq 0.45$ | |
| | $0 \leq \psi Si < 30$ | $30 \leq \psi Si \leq 60$ | $0 \leq \psi Si < 30$ | $30 \leq \psi Si \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 6.03484153 | 6.03484153 | 6.03484153 | 6.03484153 |
| $b_{TS}^{(2)}$ | 0 | 0 | 0 | 0 |
| $c_{TS}$ | 0.183333333 | 0.183333333 | 0.183333333 | 0.183333333 |
| $a_{TE}^{(4)}$ | −215.3850281 | −215.3850281 | −215.3850281 | −215.3850281 |
| $a_{TE}^{(3)}$ | 54.12265846 | 54.12265846 | 54.12265846 | 54.12265846 |
| $a_{TE}^{(2)}$ | 0.942905209 | 0.942905209 | 0.942905209 | 0.942905209 |
| $a_{TE}^{(1)}$ | −1.08045121 | −1.08045121 | −1.08045121 | −1.08045121 |
| $b_{TE}^{(4)}$ | 0.000339332 | 0.000339332 | 0.000339332 | 0.000339332 |
| $b_{TE}^{(3)}$ | 0.000317558 | 0.000317558 | 0.000317558 | 0.000317558 |
| $b_{TE}^{(2)}$ | 0.011265432 | 0.011265432 | 0.011265432 | 0.011265432 |
| $c_{TE}$ | 0.211111111 | 0.211111111 | 0.211111111 | 0.211111111 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |

TABLE 34-continued

| | | | | |
|---|---|---|---|---|
| $a_{\psi Si}^{(2)}$ | 0 | 0 | 0 | 0 |
| $a_{\psi Si}^{(1)}$ | −0.004526908 | −0.004526908 | −0.004526908 | −0.004526908 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 27.5 | 27.5 | 27.5 | 27.5 |
| $a_{\theta LT}^{(2)}$ | −0.00046365 | −0.00046365 | −0.00046365 | −0.00046365 |
| $a_{\theta LT}^{(1)}$ | 0.005349146 | 0.005349146 | 0.005349146 | 0.005349146 |
| $b_{\theta LT}^{(2)}$ | 57.09876543 | 57.09876543 | 57.09876543 | 57.09876543 |
| $c_{\theta LT}$ | −46.11111111 | −46.11111111 | −46.11111111 | −46.11111111 |
| $d_{TLTTS}$ | 0 | 0 | 0 | 0 |
| $d_{TLTTE}$ | 0 | 0 | 0 | 0 |
| $d_{TLT\psi Si}$ | 0 | 0 | 0 | 0 |
| $d_{TLT\theta LT}$ | 0 | 0 | 0 | 0 |
| $d_{TSTE}$ | 45.80413521 | 45.80413521 | 45.80413521 | 45.80413521 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | −0.071786246 | −0.071786246 | −0.071786246 | −0.071786246 |
| $d_{\psi Si\theta LT}$ | −0.000425881 | −0.000425881 | −0.000425881 | −0.000425881 |
| e | −0.446604617 | −0.446604617 | −0.446604617 | −0.446604617 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978; |

TABLE 35

Si(111)
$0 < T_{LT} < 0.2$
$0.2 \leq T_S \leq 2.0$

| | $0.05 \leq T_E < 0.25$ | | $0.25 \leq T_E \leq 0.45$ | |
|---|---|---|---|---|
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | −2.477108842 | −2.477108842 | −2.477108842 | −2.477108842 |
| $b_{TLT}^{(2)}$ | 0 | 0 | 0 | 0 |
| $c_{TLT}$ | 0.137349398 | 0.137349398 | 0.137349398 | 0.137349398 |
| $a_{TS}^{(2)}$ | 0 | 0 | 0 | 0 |
| $a_{TS}^{(1)}$ | −0.488747927 | −0.488747927 | −0.488747927 | −0.488747927 |
| $b_{TS}^{(2)}$ | 0 | 0 | 0 | 0 |
| $c_{TS}$ | 0.336144578 | 0.336144578 | 0.336144578 | 0.336144578 |
| $a_{TE}^{(4)}$ | 0 | 0 | 0 | 0 |
| $a_{TE}^{(3)}$ | 0 | 0 | 0 | 0 |
| $a_{TE}^{(2)}$ | −1.973253274 | −1.973253274 | −1.973253274 | −1.973253274 |
| $a_{TE}^{(1)}$ | −0.124870592 | −0.124870592 | −0.124870592 | −0.124870592 |
| $b_{TE}^{(4)}$ | 0 | 0 | 0 | 0 |
| $b_{TE}^{(3)}$ | 0 | 0 | 0 | 0 |
| $b_{TE}^{(2)}$ | 0.017915517 | 0.017915517 | 0.017915517 | 0.017915517 |
| $c_{TE}$ | 0.256024096 | 0.256024096 | 0.256024096 | 0.256024096 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 7.6083E−07 | 7.6083E−07 | 7.6083E−07 | 7.6083E−07 |
| $a_{\psi Si}^{(3)}$ | 7.21121E−06 | 7.21121E−06 | 7.21121E−06 | 7.21121E−06 |
| $a_{\psi Si}^{(2)}$ | −0.000857107 | −0.000857107 | −0.000857107 | −0.000857107 |
| $a_{\psi Si}^{(1)}$ | −0.00490823 | −0.00490823 | −0.00490823 | −0.00490823 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 105622.9088 | 105622.9088 | 105622.9088 | 105622.9088 |
| $b_{\psi Si}^{(3)}$ | −217.2019476 | −217.2019476 | −217.2019476 | −217.2019476 |
| $b_{\psi Si}^{(2)}$ | 208.4409929 | 208.4409929 | 208.4409929 | 208.4409929 |
| $c_{\psi Si}$ | 30.54216867 | 30.54216867 | 30.54216867 | 30.54216867 |
| $a_{\theta LT}^{(2)}$ | 0 | 0 | 0 | 0 |
| $a_{\theta LT}^{(1)}$ | 0 | 0 | 0 | 0 |
| $b_{\theta LT}^{(2)}$ | 0 | 0 | 0 | 0 |
| $c_{\theta LT}$ | −90 | −90 | −90 | −90 |
| $d_{TLTTS}$ | 4.821777856 | 4.821777856 | 4.821777856 | 4.821777856 |
| $d_{TLTTE}$ | −4.14067246 | −4.14067246 | −4.14067246 | −4.14067246 |
| $d_{TLT\psi Si}$ | 0 | 0 | 0 | 0 |
| $d_{TLT\theta LT}$ | 0 | 0 | 0 | 0 |
| $d_{TSTE}$ | 0 | 0 | 0 | 0 |
| $d_{TS\psi Si}$ | 0 | 0 | 0 | 0 |

TABLE 35-continued

| | | | | |
|---|---|---|---|---|
| $d_{TS\theta LT}$ | 0 | 0 | 0 | 0 |
| $d_{TE\psi Si}$ | 0.024454063 | 0.024454063 | 0.024454063 | 0.024454063 |
| $d_{TE\theta LT}$ | 0 | 0 | 0 | 0 |
| $d_{\psi Si\theta LT}$ | 0 | 0 | 0 | 0 |
| e | −0.240178915 | −0.240178915 | −0.240178915 | −0.240178915 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978; | and

TABLE 36

| | Si(111) $0.2 \leq T_{LT} \leq 3.5$ $0.2 \leq T_S \leq 2.0$ | | | |
|---|---|---|---|---|
| | $0.05 \leq T_E < 0.25$ | | $0.25 \leq T_E \leq 0.45$ | |
| | $0 \leq \psi_{Si} < 30$ | $30 \leq \psi_{Si} \leq 60$ | $0 \leq \psi_{Si} < 30$ | $30 \leq \psi_{Si} \leq 60$ |
| $a_{TLT}^{(2)}$ | 0 | 0 | 0 | 0 |
| $a_{TLT}^{(1)}$ | 0 | 0 | 0 | 0 |
| $b_{TLT}^{(2)}$ | 0 | 0 | 0 | 0 |
| $c_{TLT}$ | 0 | 0 | 0 | 0 |
| $a_{TS}^{(2)}$ | 0 | 0 | 0 | 0 |
| $a_{TS}^{(1)}$ | 0.380779889 | 0.380779889 | 0.380779889 | 0.380779889 |
| $b_{TS}^{(2)}$ | 0 | 0 | 0 | 0 |
| $c_{TS}$ | 0.285294118 | 0.285294118 | 0.285294118 | 0.285294118 |
| $a_{TE}^{(4)}$ | −165.3225345 | −165.3225345 | −165.3225345 | −165.3225345 |
| $a_{TE}^{(3)}$ | 23.65923214 | 23.65923214 | 23.65923214 | 23.65923214 |
| $a_{TE}^{(2)}$ | 2.256295059 | 2.256295059 | 2.256295059 | 2.256295059 |
| $a_{TE}^{(1)}$ | −0.292409126 | −0.292409126 | −0.292409126 | −0.292409126 |
| $b_{TE}^{(4)}$ | 0.00051583 | 0.00051583 | 0.00051583 | 0.00051583 |
| $b_{TE}^{(3)}$ | 0.00070344 | 0.00070344 | 0.00070344 | 0.00070344 |
| $b_{TE}^{(2)}$ | 0.015017301 | 0.015017301 | 0.015017301 | 0.015017301 |
| $c_{TE}$ | 0.220588235 | 0.220588235 | 0.220588235 | 0.220588235 |
| $a_{\psi Si}^{(6)}$ | 0 | 0 | 0 | 0 |
| $a_{\psi Si}^{(5)}$ | 0 | 0 | 0 | 0 |
| $a_{\psi Si}^{(4)}$ | 0 | 0 | 0 | 0 |
| $a_{\psi Si}^{(3)}$ | 0 | 0 | 0 | 0 |
| $a_{\psi Si}^{(2)}$ | 0 | 0 | 0 | 0 |
| $a_{\psi Si}^{(1)}$ | −0.004846255 | −0.004846255 | −0.004846255 | −0.004846255 |
| $b_{\psi Si}^{(6)}$ | 0 | 0 | 0 | 0 |
| $b_{\psi Si}^{(5)}$ | 0 | 0 | 0 | 0 |
| $b_{\psi Si}^{(4)}$ | 0 | 0 | 0 | 0 |
| $b_{\psi Si}^{(3)}$ | 0 | 0 | 0 | 0 |
| $b_{\psi Si}^{(2)}$ | 0 | 0 | 0 | 0 |
| $c_{\psi Si}$ | 29.55882353 | 29.55882353 | 29.55882353 | 29.55882353 |
| $a_{\theta LT}^{(2)}$ | 0 | 0 | 0 | 0 |
| $a_{\theta LT}^{(1)}$ | 0.00165846 | 0.00165846 | 0.00165846 | 0.00165846 |
| $b_{\theta LT}^{(2)}$ | 0 | 0 | 0 | 0 |
| $c_{\theta LT}$ | −48.52941176 | −48.52941176 | −48.52941176 | −48.52941176 |
| $d_{TLTTS}$ | −0.04933649 | −0.04933649 | −0.04933649 | −0.04933649 |
| $d_{TLTTE}$ | −0.021023839 | −0.021023839 | −0.021023839 | −0.021023839 |
| $d_{TLT\psi Si}$ | 0 | 0 | 0 | 0 |
| $d_{TLT\theta LT}$ | 0 | 0 | 0 | 0 |
| $d_{TSTE}$ | −7.074776252 | −7.074776252 | −7.074776252 | −7.074776252 |
| $d_{TS\psi Si}$ | 0 | 0 | 0 | 0 |
| $d_{TS\theta LT}$ | 0 | 0 | 0 | 0 |
| $d_{TE\psi Si}$ | 0 | 0 | 0 | 0 |
| $d_{TE\theta LT}$ | 0 | 0 | 0 | 0 |
| $d_{\psi Si\theta LT}$ | −0.00049898 | −0.00049898 | −0.00049898 | −0.00049898 |
| e | −0.3405485 | −0.3405485 | −0.3405485 | −0.3405485 |
| $a_{TP}$ | 0 | 0 | 0 | 0 |
| $b_{TP}$ | 0 | 0 | 0 | 0 |
| $c_{TP}$ | 19.811 | 19.811 | 19.811 | 19.811 |
| $d_{TP}$ | −11.953 | −11.953 | −11.953 | −11.953 |
| $f_{TP}$ | 1.1978 | 1.1978 | 1.1978 | 1.1978. |

18. An acoustic wave filter comprising:

a plurality of resonators; wherein at least one of the plurality of resonators is defined by the acoustic wave device according to claim 17.

19. A composite filter device comprising:

N band pass filters having different pass bands where N is two or more; wherein one terminal of each of the N band pass filters is connected in common on an antenna terminal side;

at least one of the N band pass filters excluding a band pass filter having a highest pass band includes one or more acoustic wave resonators; and at least one of the one or more acoustic wave resonators is the acoustic wave device according to claim 17.

20. The acoustic wave device according to claim 17, wherein a thickness of the lithium tantalate film is equal to or less than about $3.5\lambda$.

* * * * *